US012615754B2

(12) United States Patent
Chiu

(10) Patent No.: US 12,615,754 B2
(45) Date of Patent: Apr. 28, 2026

(54) SEMICONDUCTOR DEVICE INCLUDING BURIED WORD LINE

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 318 days.

(21) Appl. No.: 18/239,869

(22) Filed: Aug. 30, 2023

(65) Prior Publication Data

US 2024/0381615 A1     Nov. 14, 2024

Related U.S. Application Data

(62) Division of application No. 18/196,095, filed on May 11, 2023.

(51) Int. Cl.
H10B 12/00 (2023.01)

(52) U.S. Cl.
CPC ........... H10B 12/01 (2023.02); H10B 12/053 (2023.02); H10B 12/34 (2023.02); H10B 12/488 (2023.02)

(58) Field of Classification Search
CPC .............................. H10B 12/488; H10B 12/34
See application file for complete search history.

(56) References Cited

U.S. PATENT DOCUMENTS 7,034,408 B1 * 4/2006 Schloesser ............. H10D 1/716
257/908
8,188,552 B2 5/2012 Huang 2019/0067293 A1 * 2/2019 Lin ................... H01L 21/28097
2021/0091028 A1 * 3/2021 Hsu ........................ H10B 12/37
2021/0391337 A1 * 12/2021 Pandey ................ H10B 12/488
2023/0262958 A1 * 8/2023 Lu ........................ H10B 12/488
2024/0032273 A1 * 1/2024 Chen ...................... G11C 5/063
2024/0381614 A1 * 11/2024 Chiu ...................... H10B 12/01

FOREIGN PATENT DOCUMENTS

TW      200703624 A      1/2007
TW      200840034 A      10/2008
TW      201349353 A      12/2013
TW      201403750 A      1/2014
TW      202105490 A      2/2021

OTHER PUBLICATIONS

Office Action and Search Report mailed on Sep. 23, 2024 related to Taiwanese Application No. 113108165.
Office Action and Search Report mailed on May 23, 2024 related to Taiwanese Application No. 112124634.
Office Action and Search Report mailed on Sep. 18, 2025 related to U.S. Appl. No. 18/196,095, wherein this application is a DIV of U.S. Appl. No. 18/196,095.

* cited by examiner

*Primary Examiner* — Steven M Page
(74) *Attorney, Agent, or Firm* — Xuan Zhang

(57)     ABSTRACT

A semiconductor device and a method of manufacturing the same are provided. The semiconductor device includes a substrate, a first word line, a bit line, and a first capacitor. The substrate has a first surface and a second surface opposite to the first surface. The first word line is disposed within the substrate. The bit line is disposed on the first surface of the substrate. The first capacitor is disposed on the second surface of the substrate.

13 Claims, 128 Drawing Sheets

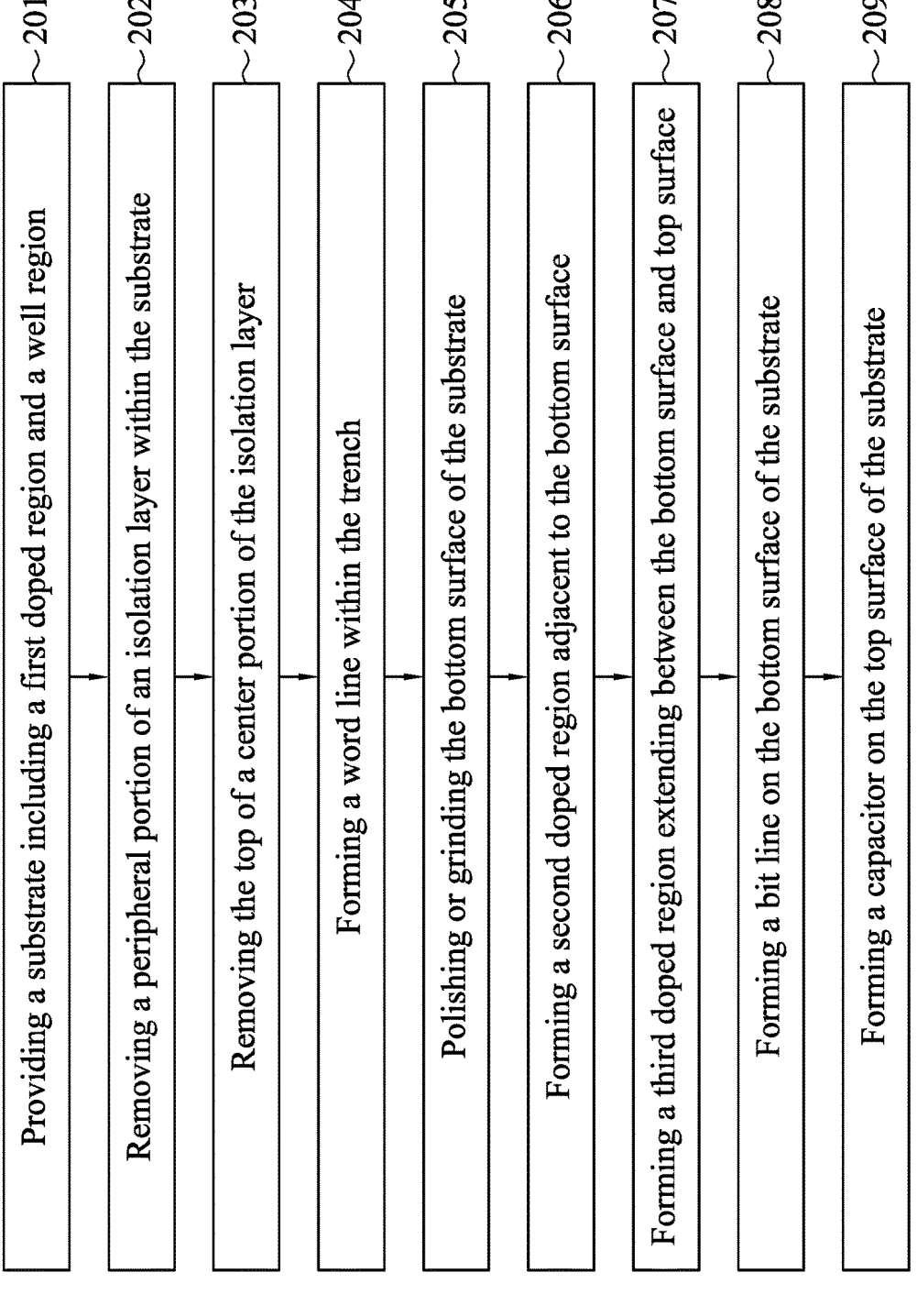

201   Providing a substrate including a first doped region and a well region

202   Removing a peripheral portion of an isolation layer within the substrate

203   Removing the top of a center portion of the isolation layer

204   Forming a word line within the trench

205   Polishing or grinding the bottom surface of the substrate

206   Forming a second doped region adjacent to the bottom surface

207   Forming a third doped region extending between the bottom surface and top surface 208   Forming a bit line on the bottom surface of the substrate 209   Forming a capacitor on the top surface of the substrate

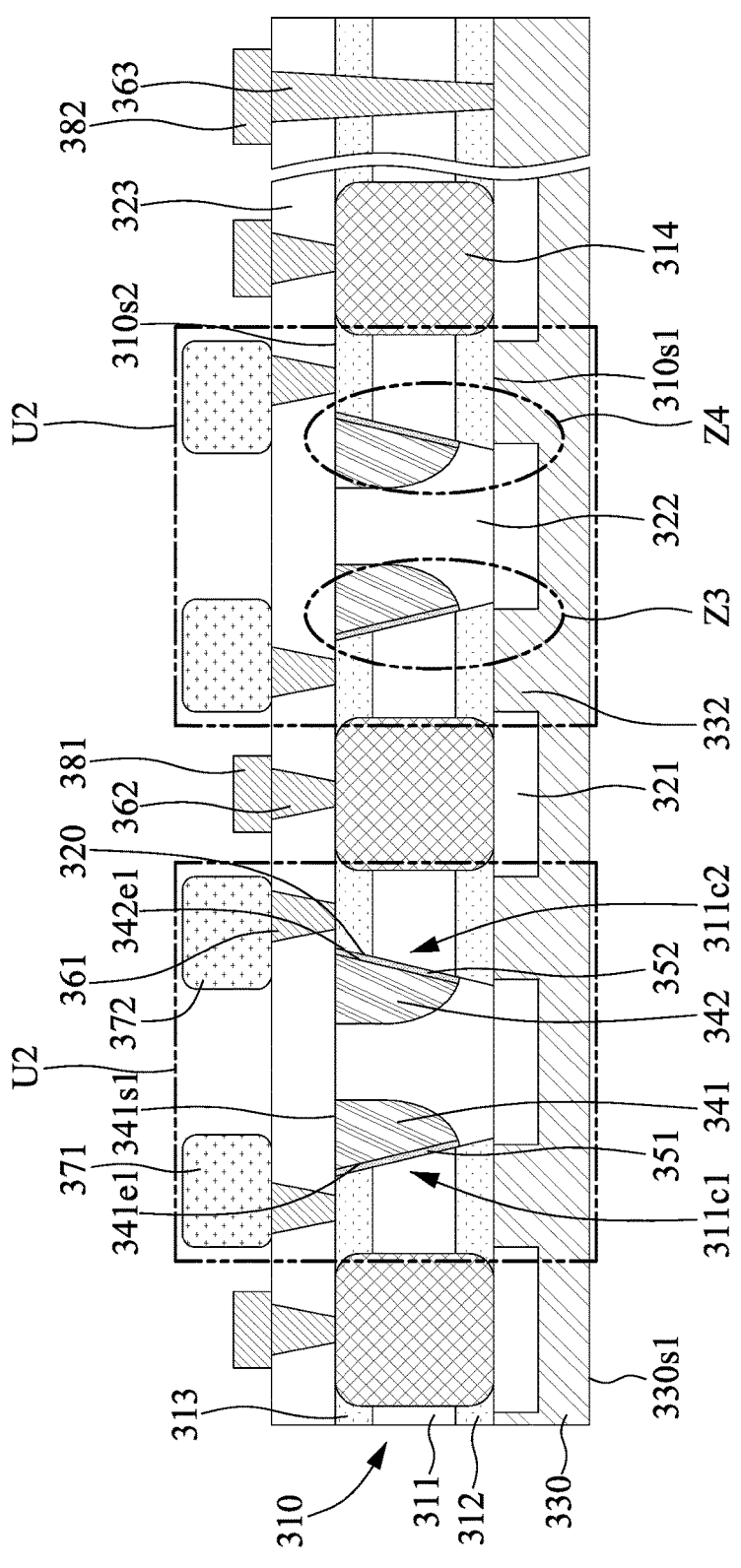
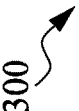
FIG. 44B

SEMICONDUCTOR DEVICE INCLUDING BURIED WORD LINE

CROSS-REFERENCE TO RELATED APPLICATION

This application is a divisional application of U.S. Non-Provisional application Ser. No. 18/196,095 filed May 11, 2023, which is incorporated herein by reference in its entirety.

TECHNICAL FIELD

The present disclosure relates to a semiconductor device and a method of manufacturing the same, and in particularly to a semiconductor device including a buried word line.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, in which F represents the photolithographic minimum feature width or critical dimension (CD). However, recently, DRAM manufacturers are facing significant challenges in minimizing memory cell area as word line spacing continues to be reduced.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first word line, a bit line, and a first capacitor. The substrate has a first surface and a second surface opposite to the first surface. The first word line is disposed within the substrate. The bit line is disposed on the first surface of the substrate. The first capacitor is disposed on the second surface of the substrate.

Another aspect of the present disclosure provides a semiconductor device. The semiconductor device includes a substrate, a first word line, and a bit line. The substrate has a first surface and a second surface opposite to the first surface. The first word line is disposed within the substrate. The first word line is embedded within the substrate and exposed from the second surface of the substrate. The bit line is disposed on the first surface of the substrate.

Another aspect of the present disclosure provides a method for manufacturing a semiconductor device. The method includes: providing a substrate having a first surface and a second surface opposite to the first surface; forming a word line within the substrate; forming a bit line on the first surface of the substrate; and forming a first capacitor on the second surface of the substrate.

The embodiments of the present disclosure provide a semiconductor device. The semiconductor device includes a substrate, a word line, a bit line, and a capacitor. The word line is buried within the trench of the substrate. The bit line and the capacitor are disposed on two opposite sides of the substrate. Each units of the semiconductor device may include two transistors and a capacitor, which enhances the driving current. Further, the word line can function as a common switch to turn and/or turn off two transistors, which reduces the size of the semiconductor device. In comparison with conventional semiconductor devices, the semiconductor device of the present disclosure has a better performance.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 2 is a flowchart illustrating a method of manufacturing a semiconductor device, in accordance with some embodiments of the present disclosure.

FIG. 44A, FIG. 44B, and FIG. 44C illustrate one or more stages of an exemplary method for manufacturing a semiconductor device according to some embodiments of the present disclosure in different perspectives.

DETAILED DESCRIPTION

Figure 1A:
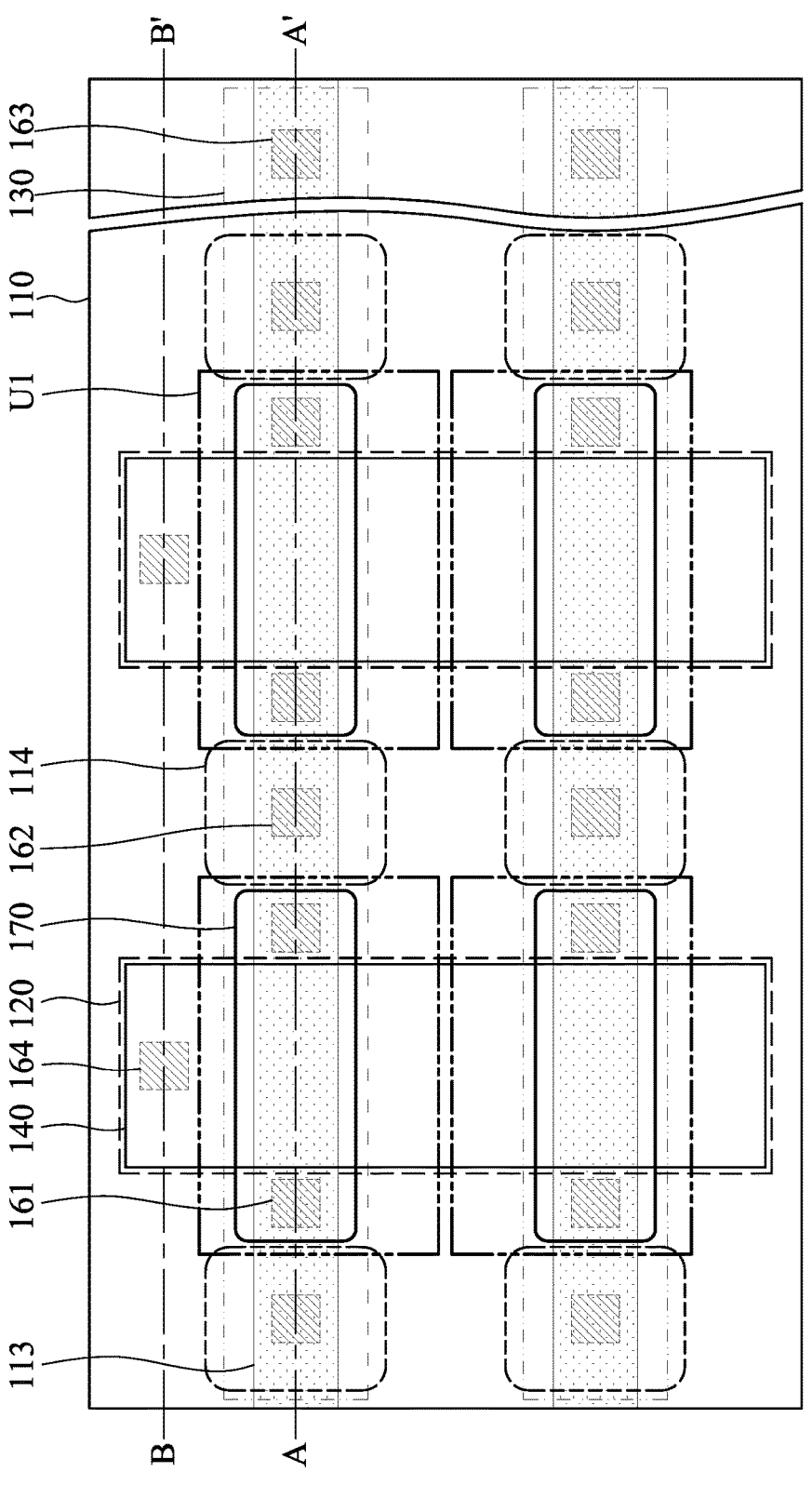
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Figure 1B:
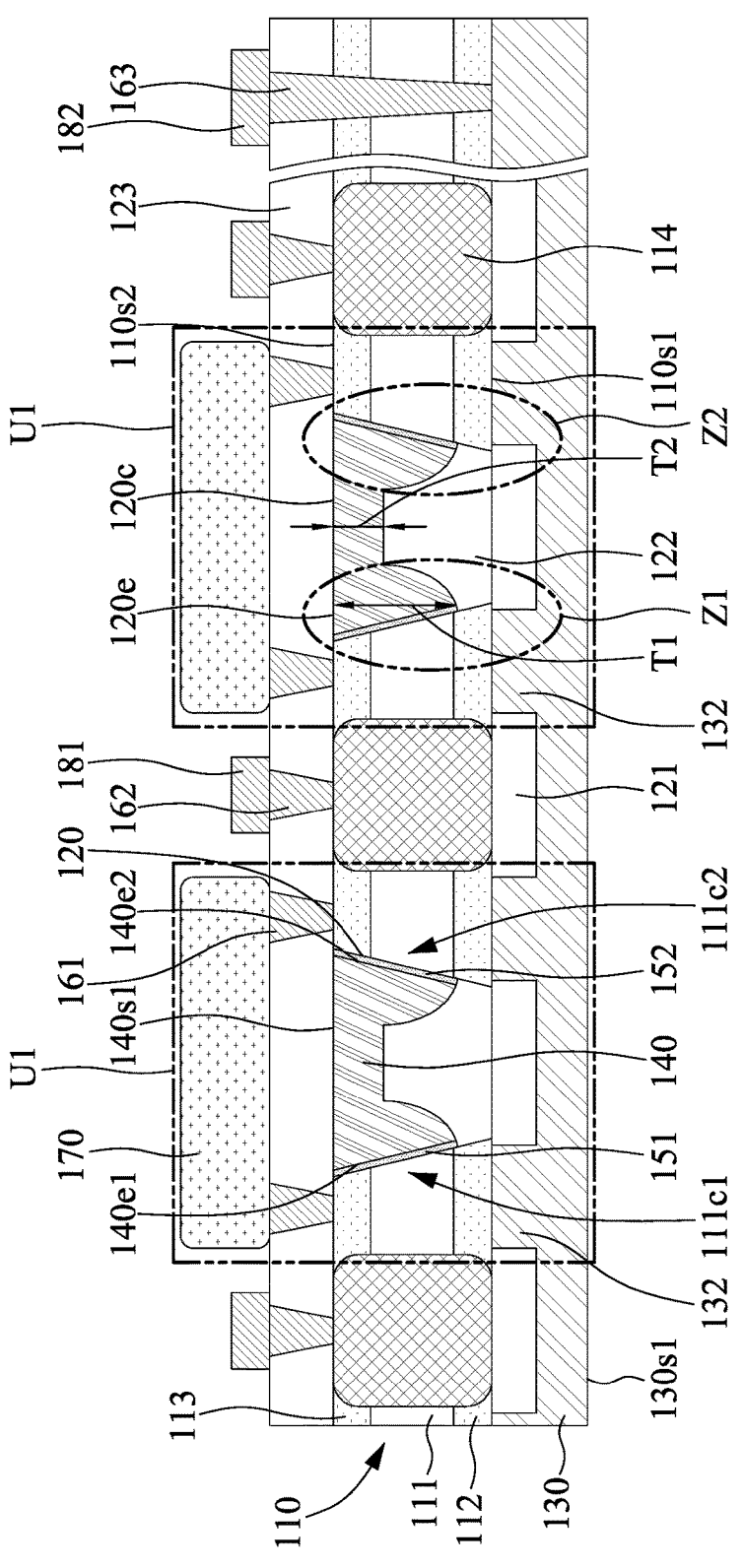
FIG. 1B is a cross-section along line A-A' of the semiconductor device as shown in FIG. 1A, in accordance with some embodiments of the present disclosure.
Figure 1C:
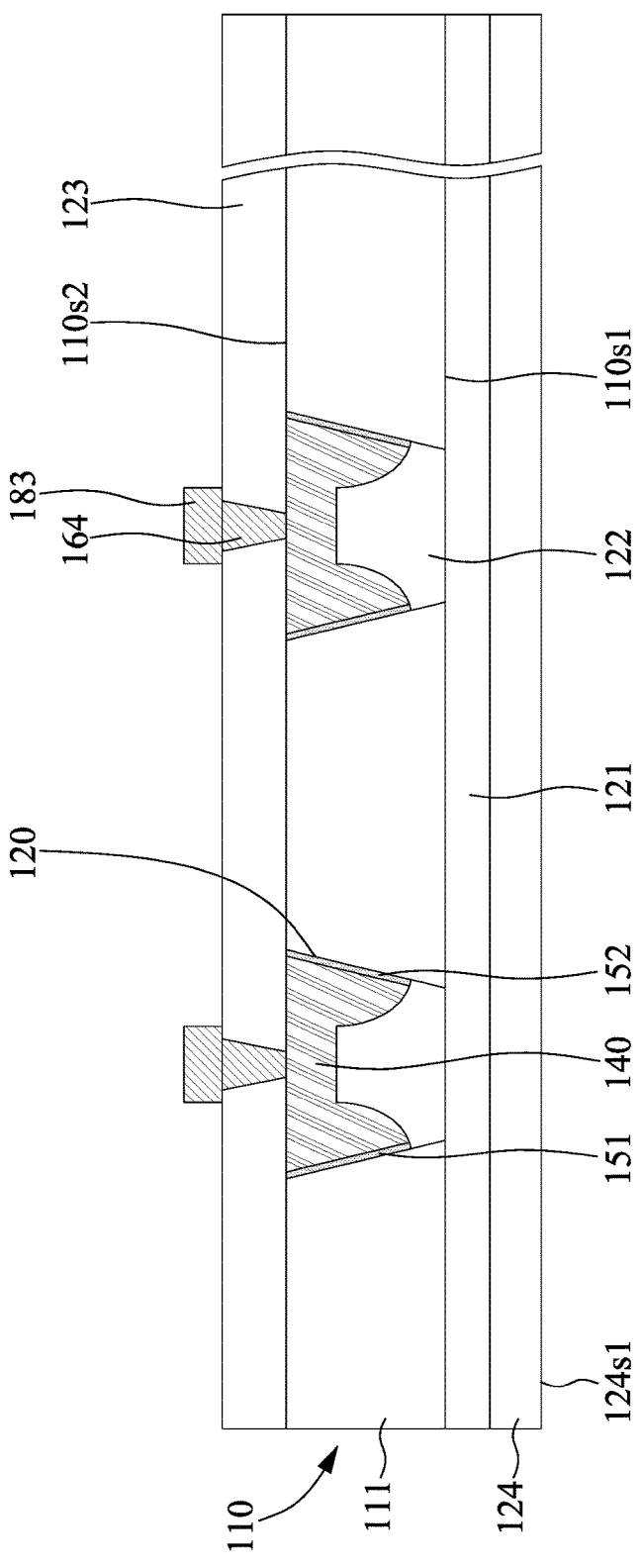
FIG. 1C is a cross-section along line B-B' of the semiconductor device as shown in FIG. 1A, in accordance with some embodiments of the present disclosure.

Referring to FIG. 1A, FIG. 1B, and FIG. 1C, FIG. 1A is a top view of a semiconductor device 100, FIG. 1B is a cross-section along line A-A' of the semiconductor device 100 as shown in FIG. 1A, and FIG. 1C is a cross-section along line B-B' of the semiconductor device 100 as shown in FIG. 1A, in accordance with some embodiments of the present disclosure. The semiconductor device 100 may be included in a memory device. The memory device may include, for example, a dynamic random access memory (DRAM) device, a one-time programming (OTP) memory device, a static random access memory (SRAM) device, or other suitable memory devices. During read operation, a word line can be asserted, turning on the transistor. The enabled transistor allows the voltage across the capacitor(s) to be read by a sense amplifier through a bit line. During a write operation, the data to be written can be provided on the bit line when the word line is asserted.

As shown in FIG. 1A, the semiconductor device 100 may include a plurality of unit cells U1. In some embodiments, each of the unit cells U1 may include two transistors (such as denotations Z1 and Z2 labeled in FIG. 1B) and one capacitor 170. The semiconductor device 100 may include a substrate 110. In some embodiments, the substrate 110 may define a plurality of openings 120. The opening 120 may have a strip profile. The substrate 110 may include a plurality of doped regions 113. In some embodiments, the region of the substrate 110 corresponding to the doped region 113 may also be referred to as an active region. The semiconductor device 100 may include a plurality of doped regions 114. Each of the doped regions 114 may be configured to isolate adjacent unit cells U1. The semiconductor device 100 may include a plurality of bit lines 130. The semiconductor device 100 may include a plurality of word lines 140, each of which may extend across multiple bit lines 130. In some embodiments, each of the word lines 140 may be located or embedded within the corresponding opening 120 of the substrate 110. Each of the openings 120 may extend across multiple bit lines 130. The semiconductor device 100 may include conductive vias 161, 162, 163, and 164. The conductive via 161 may be electrically connected to the doped region 113. The conductive via 162 may be electrically connected to the doped region 114. The conductive via 163 may be disposed at an end of the bit line 130 and electrically connected to the bit line 130. The conductive via 164 may be disposed at an end of the word line 140 and electrically connected to the word line 140.

As shown in FIG. 1B, the substrate 110 may have a surface 110$s1$ (or a bottom surface) and a surface 110$s2$ (or a top surface) opposite to the surface 110$s1$. The substrate 110 may be a semiconductor substrate, such as a bulk semiconductor, a semiconductor-on-insulator (SOI) substrate, or the like. The substrate 110 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 110 may have a multilayer structure, or the substrate 110 may include a multilayer compound semiconductor structure. It should be noted that some doped regions, isolation structures, and/or other features may be formed within the substrate 110.

The substrate 110 may have a well region 111. The well region 111 may have a relatively small dopant concentration. The well region 111 may have a first conductive type. In some embodiments, the first conductive type may be an n type or a p type. In some embodiments, n type dopants may include, for example, arsenic (As), phosphorus (P), other group V elements, or any combination thereof. In some embodiments, p type dopants may include, for example, boron (B), other group III elements, or any combination thereof.

The substrate 110 may have a doped region 112. The doped region 112 may be disposed adjacent to the surface 110s1 of the substrate 110. The doped region 112 may have the first conductive type. The doped region 112 may be in contact with the well region 111. The doped region 112 may have a relatively large dopant concentration. The dopant concentration of the doped region 112 may be greater than that of the well region 111.

The doped region 113 may be disposed adjacent to the surface 110s2 of the substrate 110. The doped region 113 may have the first conductive type. The doped region 113 may be in contact with the well region 111. The doped region 113 may have a relatively large dopant concentration. The dopant concentration of the doped region 113 may be greater than that of the well region 111. The well region 111 may be disposed between the doped regions 112 and 113.

The substrate 110 may have a doped region 114. In some embodiments, the doped region 114 may be disposed over or within the active region. In some embodiments, the doped region 114 may continuously extend between the surface 110s1 and surface 110s2 of the substrate 110. In some embodiments, the doped region 114 may have a second conductive type different from the first conductive type. The doped region 114 may have a relatively large dopant concentration. The dopant concentration of the doped region 114 may be greater than that of the well region 111. In some embodiments, the doped region 114 may be disposed between adjacent unit cells U1. In some embodiments, the doped region 114 may serve as an isolation feature configured to isolate an electrical path between unit cells U1 through the substrate 110.

The opening 120 may penetrate substrate 110. In some embodiments, the opening 120 may be tapered along a direction from the surface 110s2 toward the surface 110s1 of the substrate 110.

The semiconductor device 100 may include a dielectric layer 121. In some embodiments, the dielectric layer 121 may be disposed on the surface 110s1 of the substrate 110. In some embodiments, the dielectric layer 121 may cover the doped region 114. In some embodiments, the dielectric layer 121 may vertically overlap the word line 140. In some embodiments, the dielectric layer 121 may define a pattern exposing a portion of the well region 111. The dielectric layer 121 may include silicon oxide, silicon nitride, silicon oxynitride, or a combination thereof.

The semiconductor device 100 may include an isolation layer 122. In some embodiments, the isolation layer 122 may be disposed on the dielectric layer 121. In some embodiments, the isolation layer 122 may be disposed within the opening 120 defined by the substrate 110. In some embodiments, the isolation layer 122 may include silicon oxide, silicon nitride, silicon oxynitride, or a combination thereof. In some embodiments, a trench may be defined by the substrate 110 and the isolation layer 122, and the word line 140 is located within the trench.

The semiconductor device 100 may include a dielectric layer 123. In some embodiments, the dielectric layer 123 may be disposed on the surface 110s2 of the substrate 110. In some embodiments, the dielectric layer 123 may cover the word line 140. The dielectric layer 123 may include silicon oxide, silicon nitride, silicon oxynitride, or a combination thereof.

In some embodiments, the bit line 130 may be disposed on the dielectric layer 121. In some embodiments, the bit line 130 may be disposed on the surface 110s1 of the substrate 110. The bit line 130 may include conductive materials, such as tungsten, copper, aluminum, tantalum, tantalum nitride, titanium, titanium nitride, the like, and/or a combination thereof.

The semiconductor device 100 may include a conductive via 132. In some embodiments, the conductive via 132 may fill the openings defined by the dielectric layer 121. The conductive via 132 may extend between the surface 110s1 of the substrate 110 and the bit line 130. The conductive via 132 may include conductive materials, such as tungsten, copper, aluminum, tantalum, tantalum nitride, titanium, titanium nitride, the like, and/or a combination thereof.

In some embodiments, the word line 140 may be disposed within the opening 120 defined by the substrate 110. In some embodiments, the word line 140 may be disposed within the trench defined by the substrate 110 and the isolation layer 122. In some embodiments, the word line 140 may cover the isolation layer 122. In some embodiments, the word line 140 may be at least partially tapered from the surface 110s2 toward the surface 110s1 of the substrate 110. In some embodiments, the word line 140 may be spaced apart from the bit line 130 by the dielectric layer 121 and the isolation layer 122. The word line 140 may include conductive materials, such as tungsten, copper, aluminum, tantalum, tantalum nitride, titanium, titanium nitride, the like, and/or a combination thereof. In some embodiments, the word line 140 may include a semiconductor material, such as polysilicon. The word line 140 may have a surface 140s1 (or a top surface). In some embodiments, the surface 140s1 of the word line 140 may be exposed from the substrate 110. In some embodiments, the surface 140s1 of the word line 140 may be substantially coplanar with the surface 110s2 of the substrate 110.

In some embodiments, the word line 140 may have different thickness along a direction from the surface 110s2 to the surface 110s1 of the substrate 110. The word line 140 may have a thickness T1 at an edge portion 120e of the opening 120. The word line 140 may have a thickness T2 at a center portion 120c of the opening 120. In some embodiments, the thickness T1 may be different from the thickness T2. In some embodiments, the thickness T1 may be greater than the thickness T2.

The semiconductor device 100 may include a gate dielectric layer 151 and a gate dielectric layer 152. In some embodiments, the gate dielectric layer 151 may be disposed within the opening 120 defined by the substrate 110. In some embodiments, the gate dielectric layer 151 may be disposed at a side 140e1 of the word line 140. In some embodiments, a top surface (not annotated) of the gate dielectric layer 151 may be substantially coplanar with the surface 110s2 of the substrate 110. In some embodiments, the top surface of the gate dielectric layer 151 may be substantially coplanar with the surface 140s1 of the word line 140. In some embodiments, the gate dielectric layer 151 may be in contact with the isolation layer 122. The bottom of the gate dielectric layer 151 may be connected to the isolation layer 122. In some embodiments, the word line 140 may be spaced apart from the substrate 110 by the gate dielectric layer 151.

In some embodiments, the gate dielectric layer 152 may be disposed within the opening 120 defined by the substrate 110. In some embodiments, the gate dielectric layer 152 may be disposed at a side 140e2 of the word line 140. In some embodiments, a top surface (not annotated) of the gate dielectric layer 152 may be substantially coplanar with the surface 110s2 of the substrate 110. In some embodiments, the top surface of the gate dielectric layer 152 may be substantially coplanar with the surface 140s1 of the word line 140. The bottom of the gate dielectric layer 152 may be connected to the isolation layer 122. In some embodiments, the gate dielectric layer 151 may be nonparallel to the gate dielectric layer 152. Each of the gate dielectric layers 151 and 152 may include silicon oxide, silicon nitride, silicon oxynitride, or a combination thereof. In some embodiments, each of the gate dielectric layers 151 and 152 may include a high-k dielectric material(s). The high-k dielectric material may have a dielectric constant (k value) exceeding 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

In some embodiments, the substrate 110 may define a channel 111c1 abutting the gate dielectric layer 151. In some embodiments, the substrate 110 may define a channel 111c2 abutting the gate dielectric layer 152. In some embodiments, the substrate 110, the bit line 130, and the word line 140 may collectively define transistors Z1 and Z2. The word line 140 may serve as a common gate to turn on and/or turn off the transistors Z1 and Z2. The doped regions 112 and 113 may serve as a source/drain feature. In some embodiments, the transistors Z1 and Z2 may at least partially located within the same opening 120.

The conductive via 161 may be disposed on the surface 110s2 of the substrate 110. The conductive via 161 may be disposed within the dielectric layer 123. The conductive via 161 may be electrically connected to the doped region 113.

The conductive via 162 may be disposed on the surface 110s2 of the substrate 110. The conductive via 162 may be disposed within the dielectric layer 123. The conductive via 162 may be electrically connected to the doped region 114.

The conductive via 163 may penetrate the substrate 110. The conductive via 163 may penetrate the dielectric layer 123. The conductive via 163 may be electrically connected to the bit line 130. In some embodiments, each of the conductive vias 161, 162, and 163 may include conductive materials, such as tungsten, copper, aluminum, tantalum, tantalum nitride, titanium, titanium nitride, the like, and/or a combination thereof.

In some embodiments, the capacitor 170 may be disposed on the surface 110s2 of the substrate 110. The capacitor 170 may be disposed on the dielectric layer 123. In some embodiments, the capacitor 170 may be electrically connected to the conductive via 161. The capacitor 170 may cover the word line 140. The capacitor 170 may extend across the side 140e1 and side 140e2 of the word line 140. In some embodiments, the capacitor 170 may be electrically connected to both the transistors Z1 and Z2. In some embodiments, the capacitor 170 may include a capacitor dielectric layer and two capacitor electrodes. The capacitor dielectric layer may include hafnium oxide, zirconium oxide, lanthanum oxide, yttrium oxide, aluminum oxide, titanium oxide or another applicable material. The capacitor electrode may include conductive materials, such as tungsten, copper, aluminum, tantalum, molybdenum, tantalum nitride, titanium, titanium nitride, the like, and/or a combination thereof.

The semiconductor device 100 may include a conductive trace 181. The conductive trace 181 may be disposed on the conductive via 162. The conductive trace 181 may be electrically connected to the conductive via 162.

The semiconductor device 100 may include a conductive trace 182. The conductive trace 182 may be disposed on the conductive via 163. The conductive trace 182 may be electrically connected to the conductive via 163. Each of the conductive traces 181 and 182 may include conductive materials, such as tungsten, copper, aluminum, tantalum, tantalum nitride, titanium, titanium nitride, the like, and/or a combination thereof.

As shown in FIG. 1C, the semiconductor device 100 may include a fill layer 124. In some embodiments, the fill layer 124 may be disposed on the surface 110s1 of the substrate 110. The fill layer 124 may be disposed on the dielectric layer 121. The fill layer 124 may have a surface 124s1 (or a bottom surface). In some embodiments, the surface 124s1 of the fill layer 124 may be substantially coplanar with a surface 130s1 (or a bottom surface), as shown in FIG. 1B, of the bit line 130.

In some embodiments, the fill layer 124 and the bit line 130 may be collectively configured to define a hybrid bonding structure. The hybrid bonding structure may be bonded to other devices (not shown), such as a wafer, a redistribution structure, or other suitable devices.

The conductive via 164 may penetrate the dielectric layer 123. The conductive via 163 may be electrically connected to the word line 140.

The semiconductor device 100 may include a conductive trace 183. The conductive trace 183 may be disposed on the conductive via 164. The conductive trace 183 may be electrically connected to the conductive via 164.

In this embodiments, the word line 140 is buried within the substrate 110. The bit line 130 and the capacitor 170 are disposed on two opposite sides of the substrate 110. Each units U1 of the semiconductor device 100 includes two transistors and a capacitor, which enhances the driving current. Further, the word line 140 functions as a common switch to turn and/or turn off two transistors, which reduces the size of the semiconductor device. In comparison with conventional semiconductor devices, the semiconductor device 100 of the present disclosure has a better performance.

FIG. 2 is a flowchart illustrating a method 200 of manufacturing a semiconductor device, in accordance with some embodiments of the present disclosure.

The method 200 begins with operation 201 in which a substrate is provided. The substrate has a bottom surface and a top surface. The substrate may have a well region with a first conductive type. A first doped region with the first conductive type may be formed adjacent to the top surface of the substrate. A trench may be formed and recessed from the top surface of the substrate.

The method 200 continues with operation 202 in which a peripheral portion of an isolation layer within the trench may be removed. A gate dielectric layer may be formed on the sidewall of the trench.

The method 200 continues with operation 203 in which the top of a center portion of the isolation layer may be removed.

The method 200 continues with operation 204 in which a word line may be formed within the trench.

The method 200 continues with operation 205 in which the bottom surface of the substrate may be polished or grinded. The bottom of the isolation feature is exposed.

The method 200 continues with operation 206 in which a second doped region with the first conductive type may be formed adjacent to the bottom surface of the substrate.

The method 200 continues with operation 207 in which a third doped region with a second conductive type may be formed between the top surface and the bottom surface of the substrate.

The method 200 continues with operation 208 in which a bit line may be formed on the bottom surface of the substrate.

The method 200 continues with operation 209 in which a capacitor may be formed on the top surface of the substrate.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 2. In some embodiments, the method 200 can include one or more operations depicted in FIG. 2.

Figure 3A:
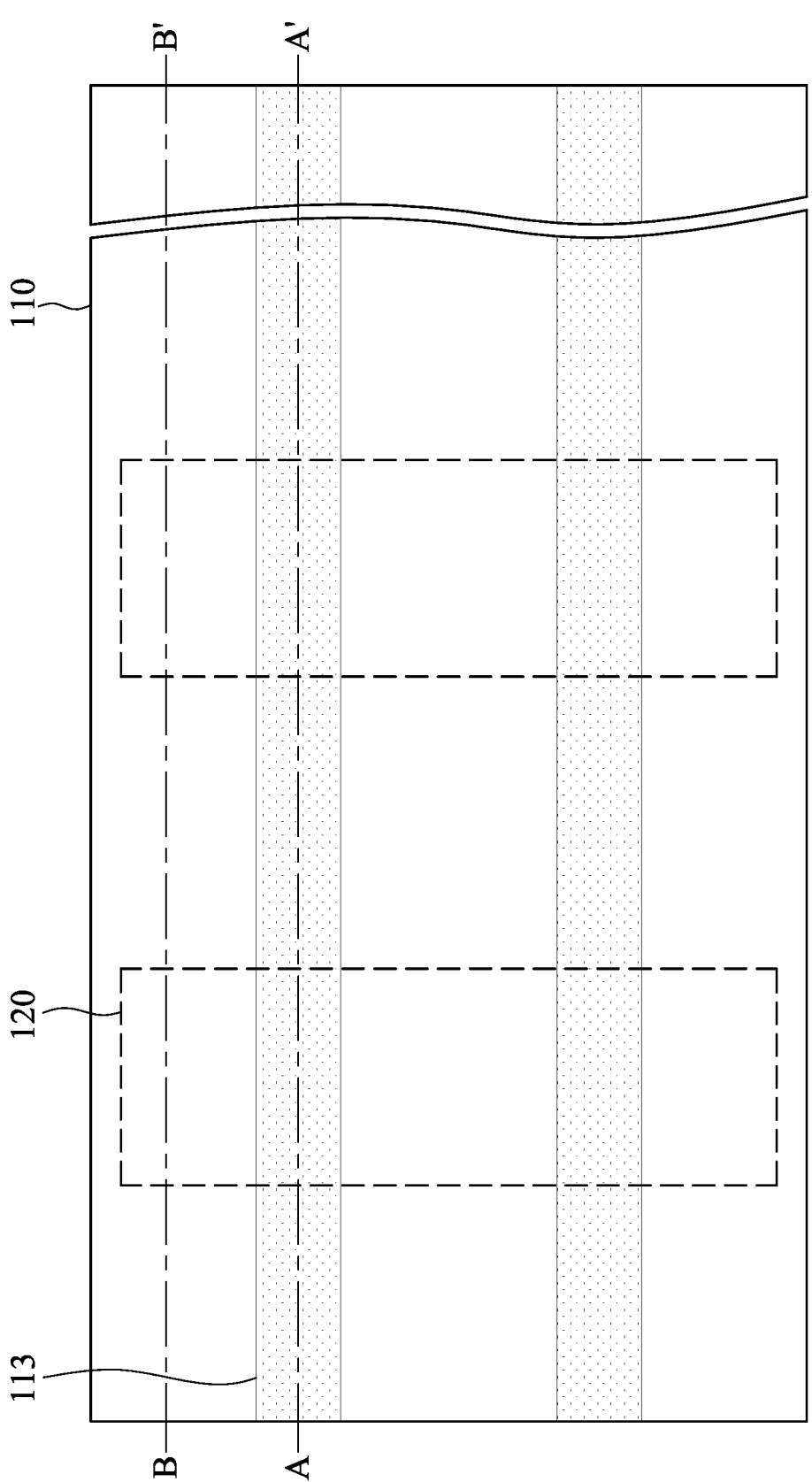
FIG. 3A, FIG. 3B, and FIG. 3C illustrate one or more stages of an exemplary method for manufacturing a semiconductor device according to some embodiments of the present disclosure in different perspectives.
Figure 3B:
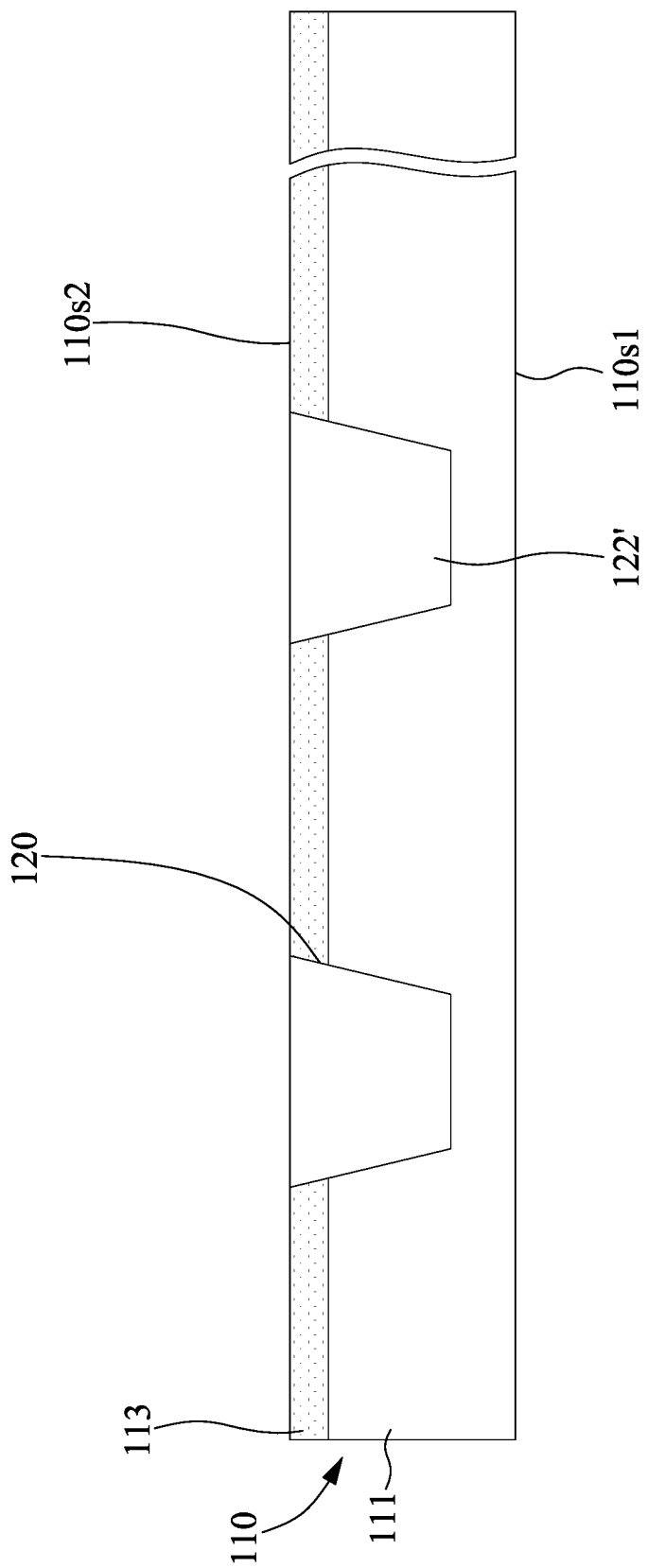
Figure 3C:
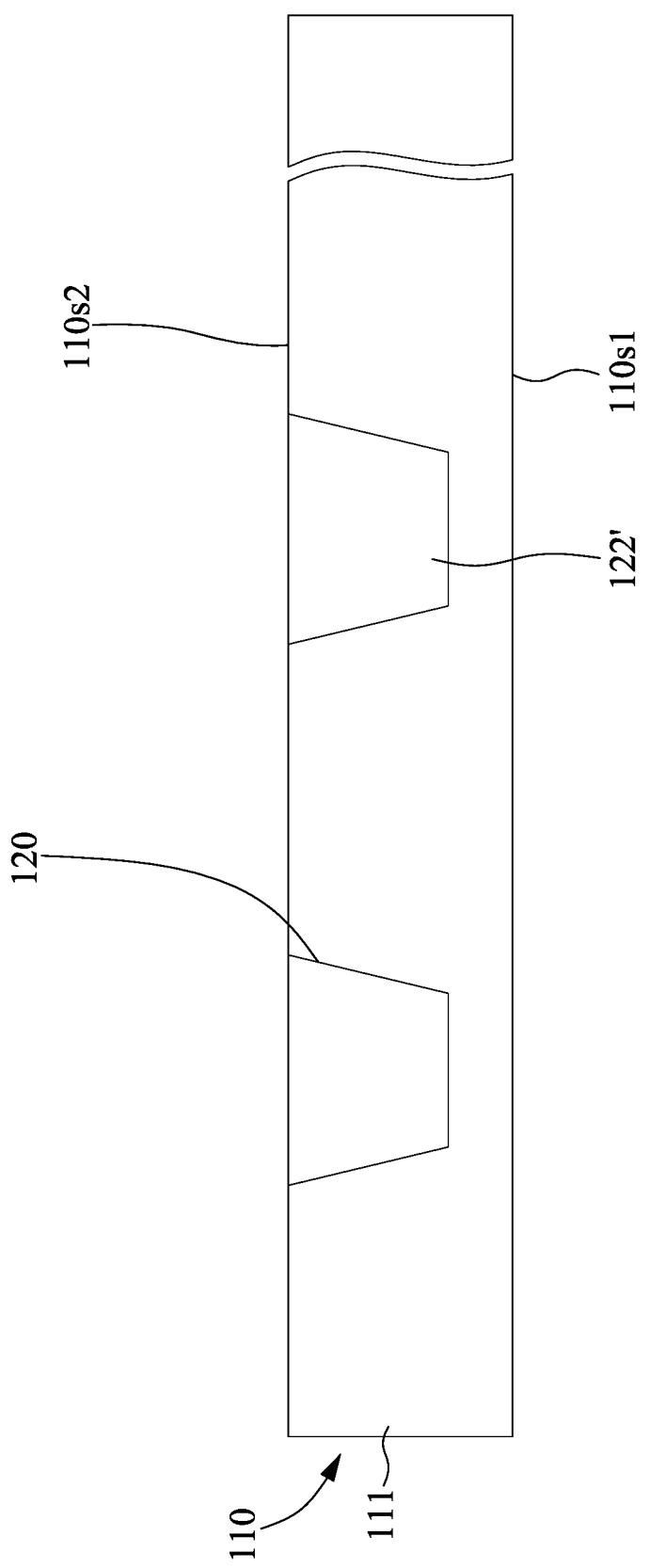

Referring to FIG. 3A, FIG. 3B, and FIG. 3C, a substrate 110 may be provided. The substrate 110 may have a well region 111 therein. A doped region 113 may be formed adjacent to the surface 110s2 of the substrate 110. A plurality of openings (or trenches) 120 may be formed. The opening 120 may be recessed from the surface 110s2 of the substrate 110. An isolation layer 122' may be formed within the opening 120. The isolation layer 122' may include silicon oxide, silicon nitride, silicon oxynitride, or a combination thereof.

Figure 4A:
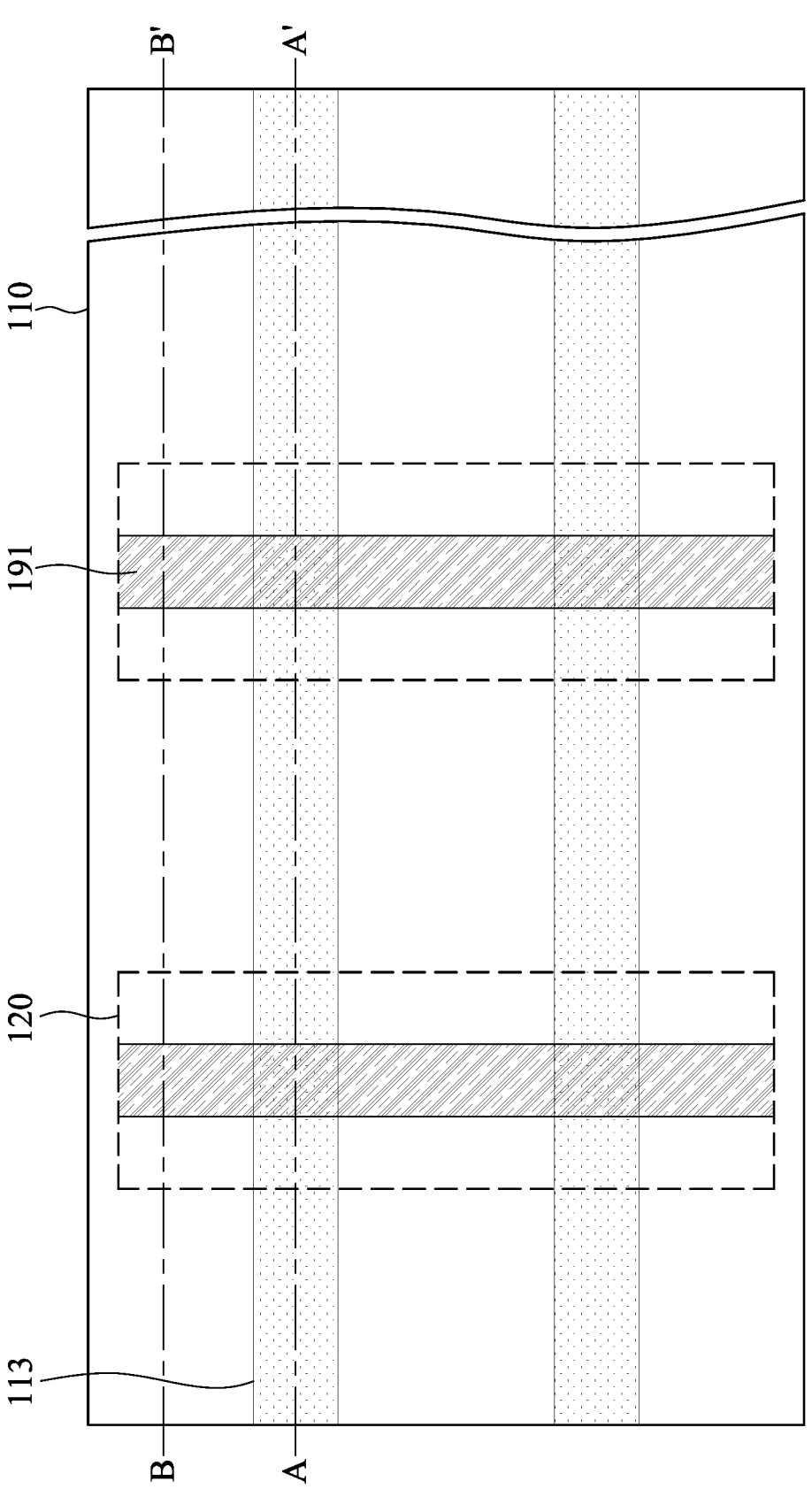
FIG. 4A, FIG. 4B, and FIG. 4C illustrate one or more stages of an exemplary method for manufacturing a semiconductor device according to some embodiments of the present disclosure in different perspectives.
Figure 4B:
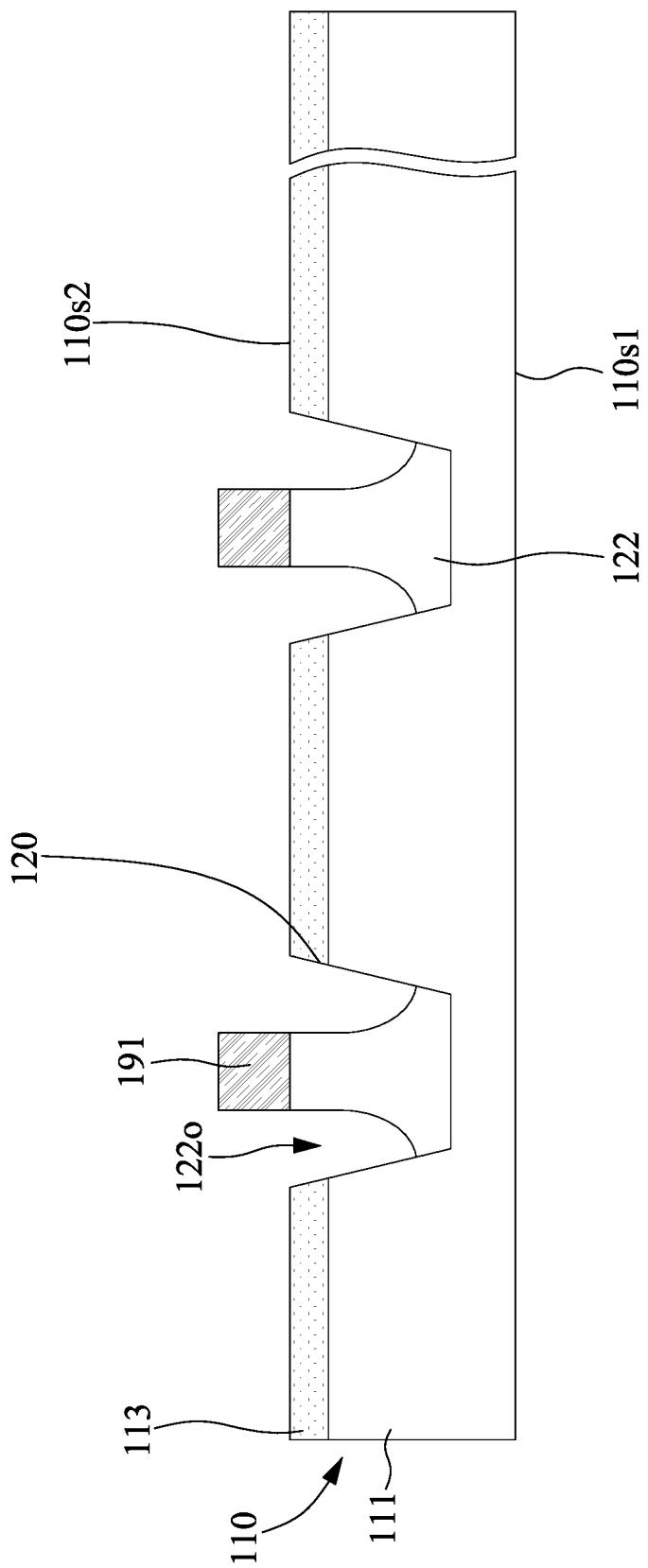
Figure 4C:
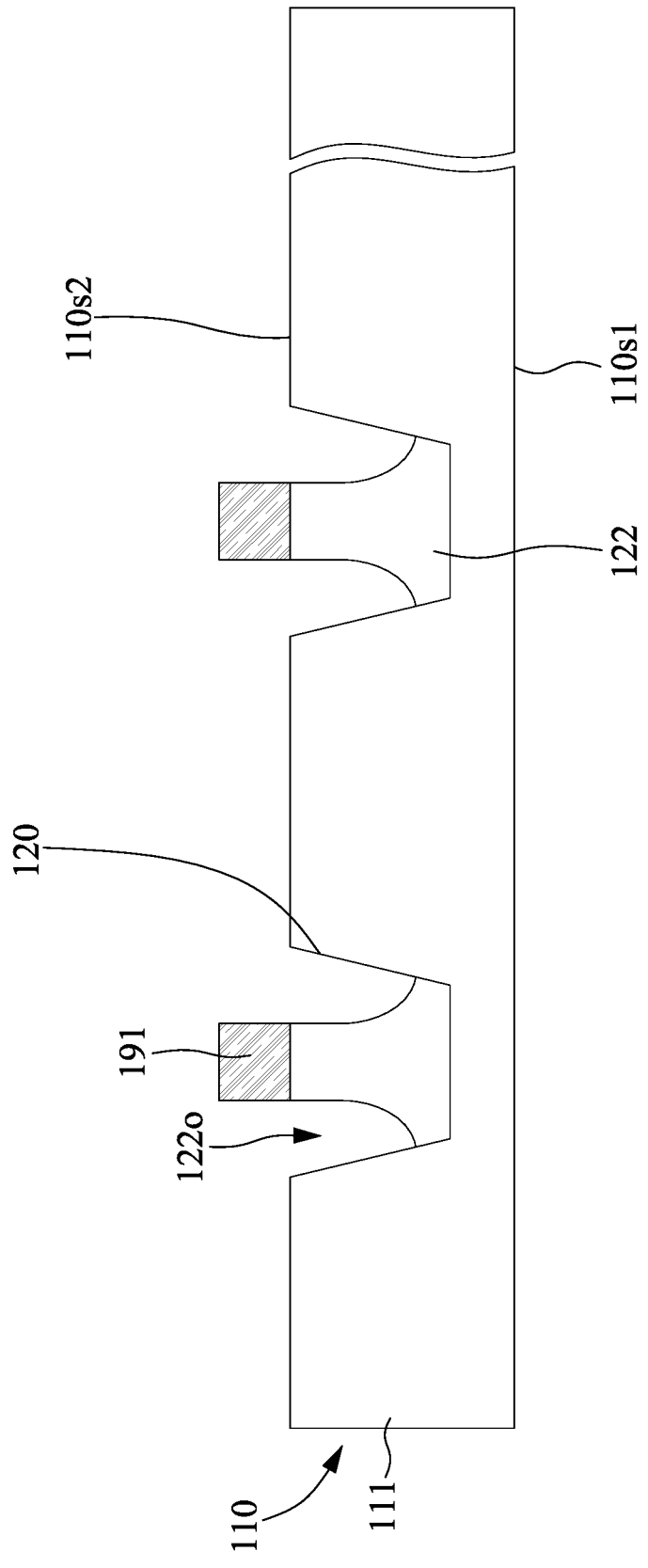

Referring to FIG. 4A, FIG. 4B, and FIG. 4C, a pattern 191 may be formed on the isolation layer 122'. The pattern 191 may serve as a mask configured to define an etched portion during an etch process. The pattern 191 may be formed on a center portion (not annotated) of the isolation layer 122'. An etching process may be performed to remove a peripheral portion (not annotated) of the isolation layer 122'. The isolation layer 122' may be removed by, for example, a wet etching. An isolation layer 122 may be defined within the opening 120. Openings 1220 may be formed. The opening 1220 may be recessed from the surface 110s2 of the substrate 110.

Figure 5A:
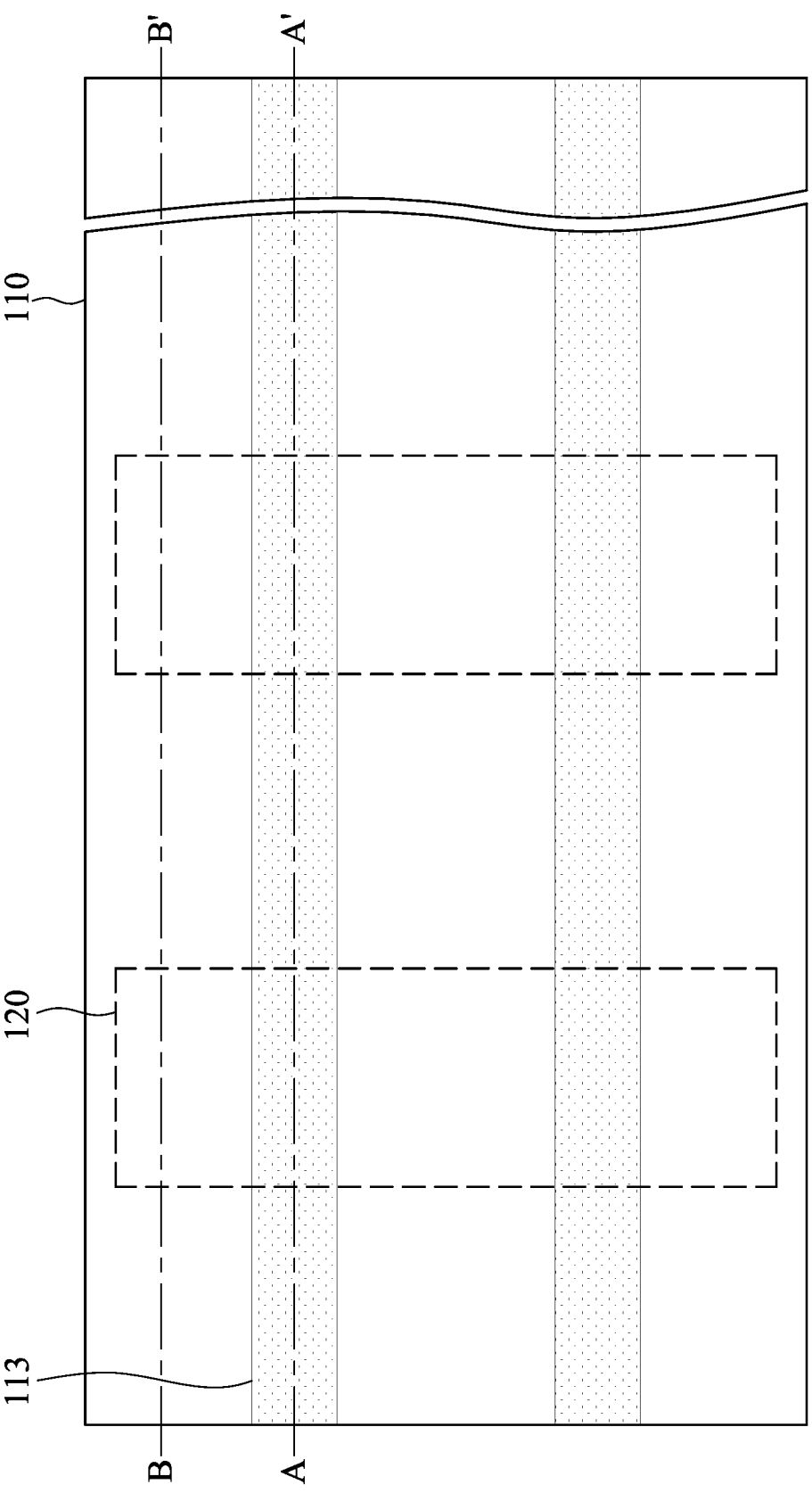
FIG. 5A, FIG. 5B, and FIG. 5C illustrate one or more stages of an exemplary method for manufacturing a semiconductor device according to some embodiments of the present disclosure in different perspectives.
Figure 5B:
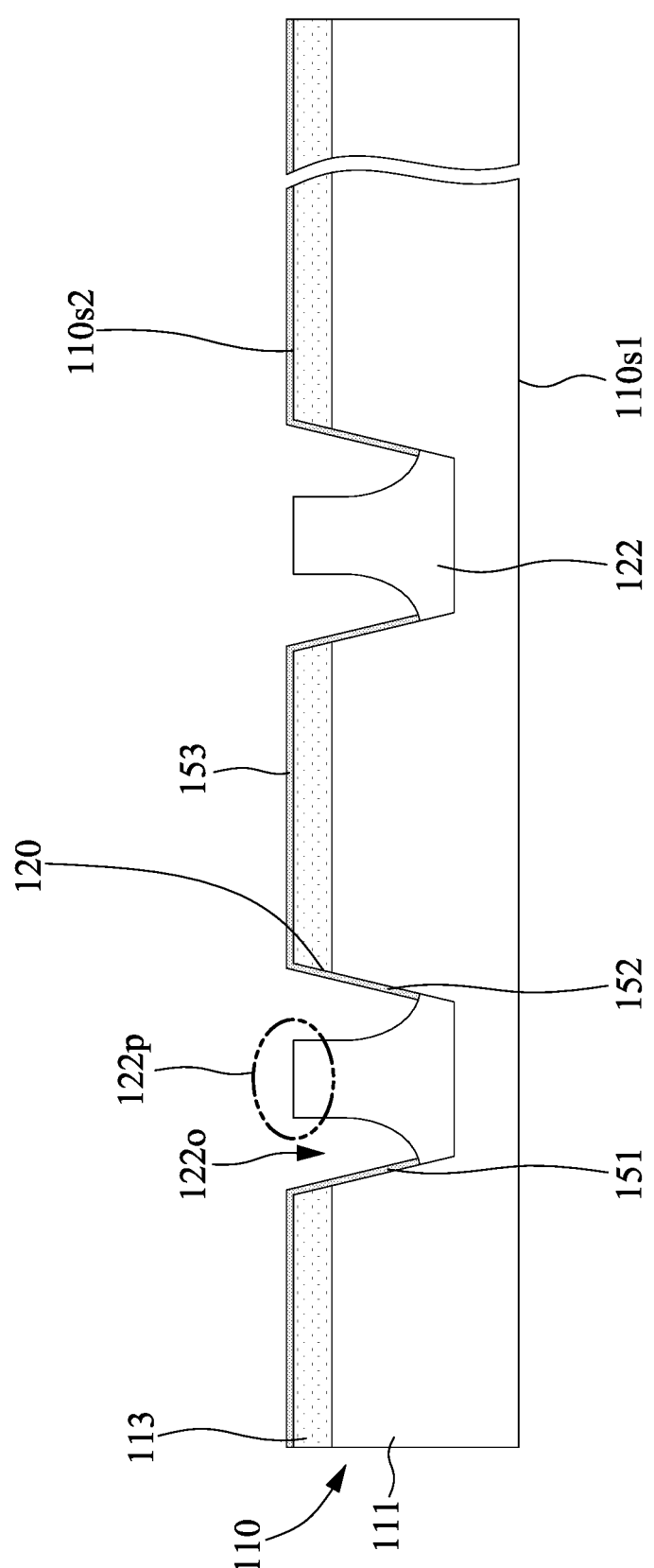
Figure 5C:
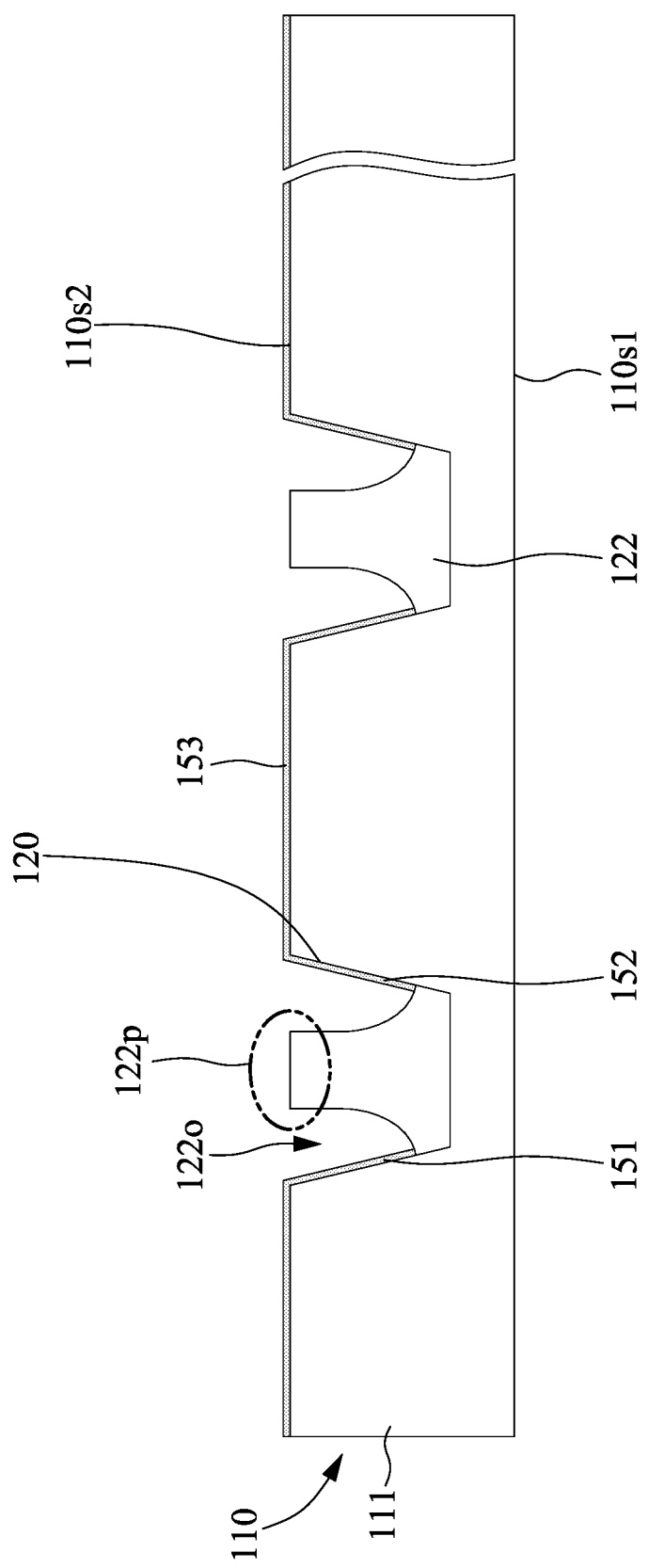

Referring to FIG. 5A, FIG. 5B, and FIG. 5C, the pattern 191 may be removed. A top portion 122p of the center portion of the isolation layer 122 may be exposed. A gate dielectric layer 151, a gate dielectric layer 152, and a dielectric layer 153 may be formed. The dielectric layer 153 may be connected to the gate dielectric layers 151 and 152. The gate dielectric layers 151 and 152 may be formed within the sidewall (not annotated) of the opening 120 and on the isolation layer 122. The dielectric layer 153 may be formed on the surface 110s2 of the substrate 110. The gate dielectric layer 151, gate dielectric layer 152, and dielectric layer 153 may include silicon oxide, silicon nitride, silicon oxynitride, or high-k dielectric material(s). The gate dielectric layer 151, gate dielectric layer 152, and dielectric layer 153 may be formed by, for example, chemical vapor deposition (CVD), low-pressure chemical vapor deposition (LPCVD), plasma-enhanced CVD (PECVD), atomic layer deposition (ALD), physical vapor deposition (PVD), or other suitable processes.

Figure 6A:
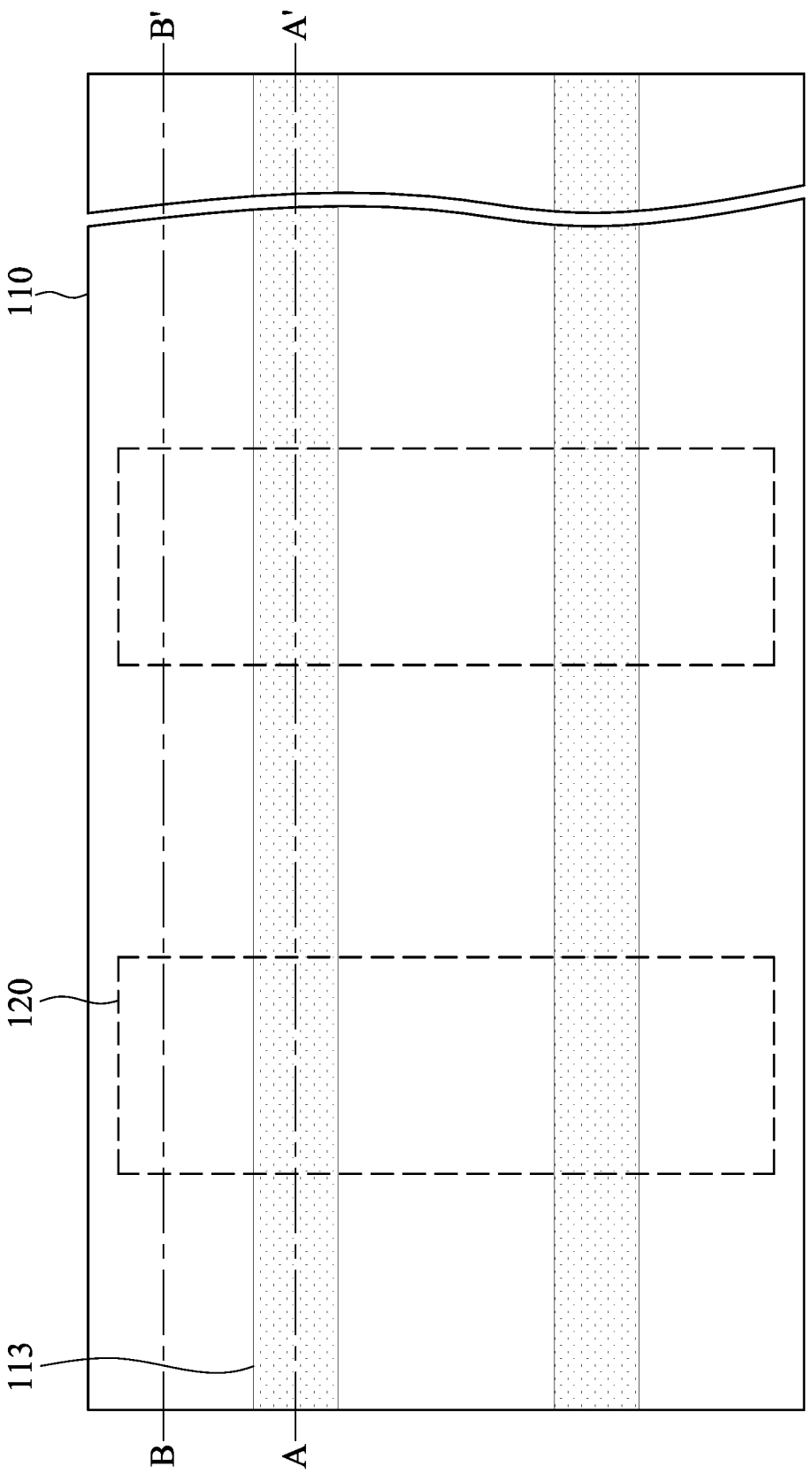
FIG. 6A, FIG. 6B, and FIG. 6C illustrate one or more stages of an exemplary method for manufacturing a semiconductor device according to some embodiments of the present disclosure in different perspectives.
Figure 6B:
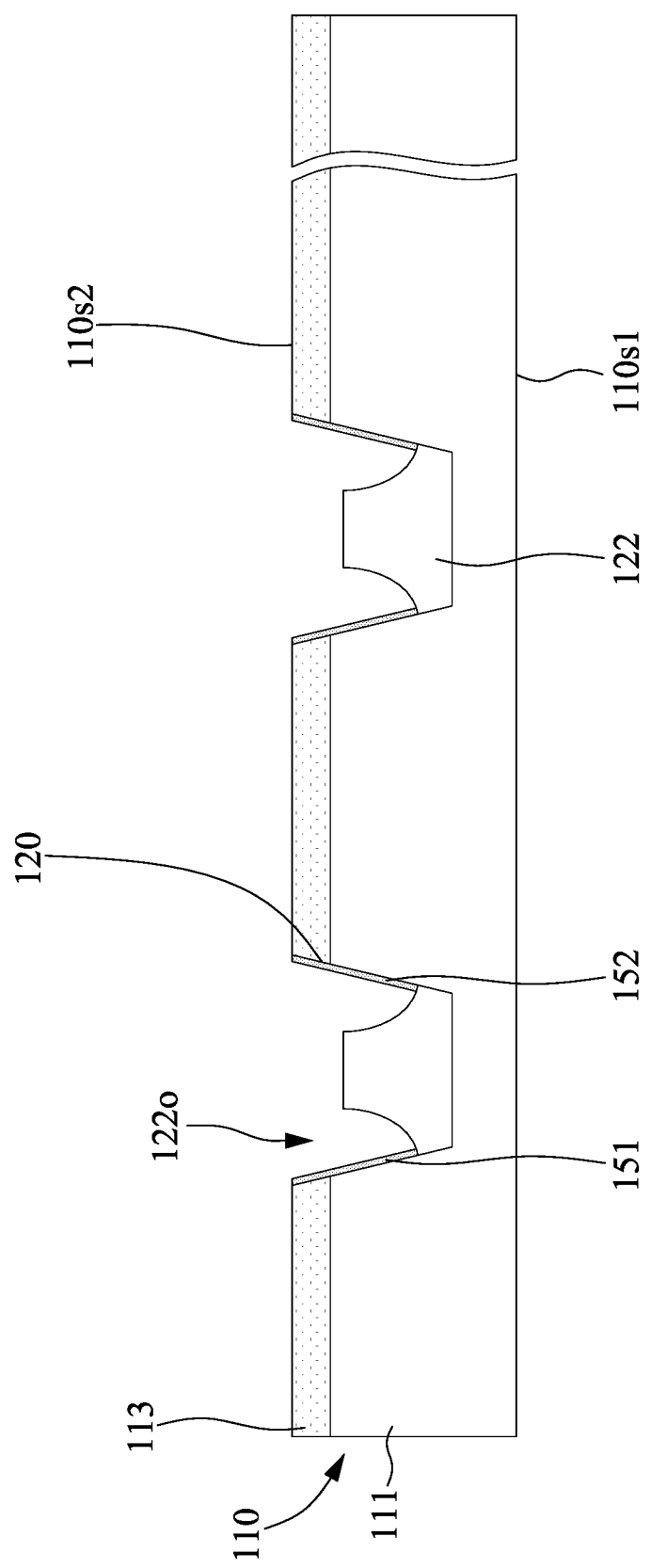
Figure 6C:
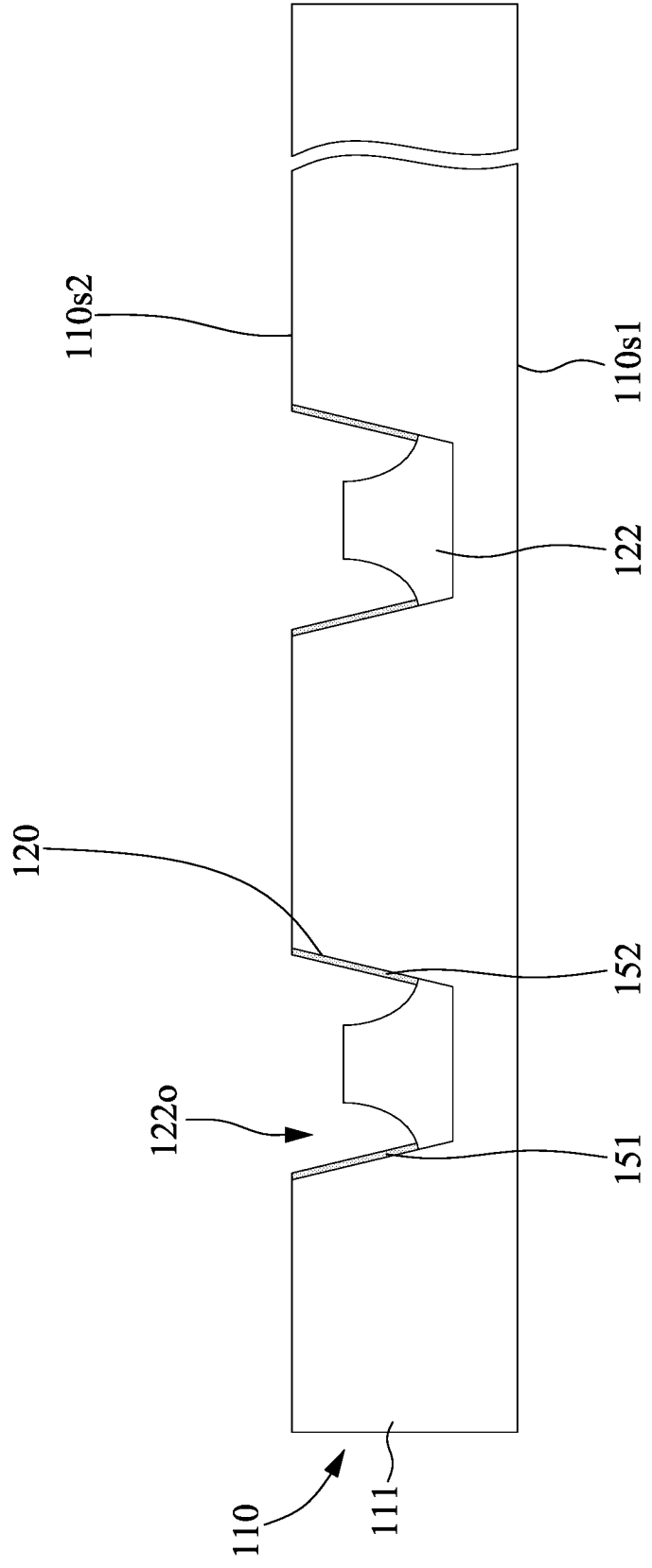

Referring to FIG. 6A, FIG. 6B, and FIG. 6C, the dielectric layer 153 may be removed. In some embodiments, the top portion 122p of the isolation layer 122 may be removed. The dielectric layer 153 and isolation layer 122 may be removed by, for example, chemical mechanical polishing process, grinding process, etching process, or other suitable processes.

Figure 7A:
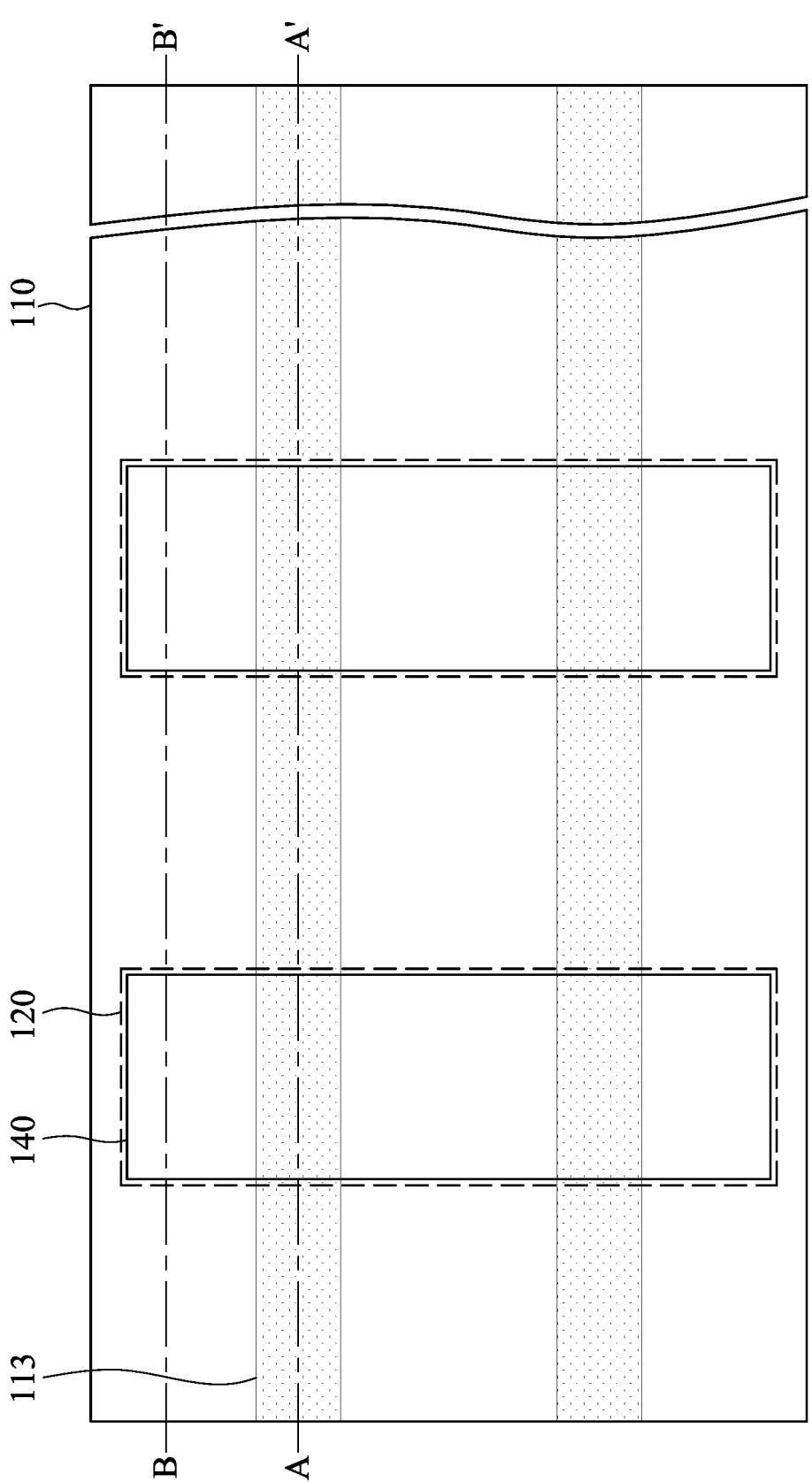
FIG. 7A, FIG. 7B, and FIG. 7C illustrate one or more stages of an exemplary method for manufacturing a semiconductor device according to some embodiments of the present disclosure in different perspectives.
Figure 7B:
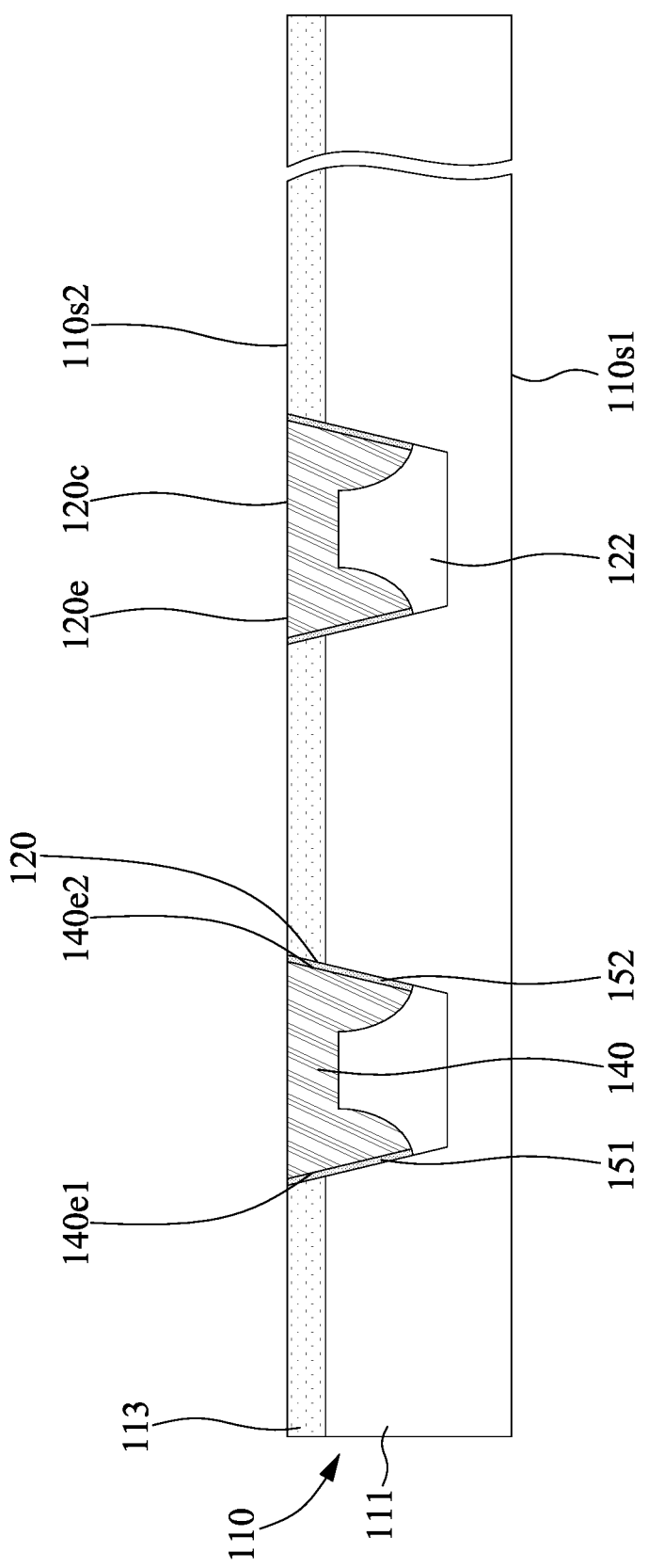
Figure 7C:
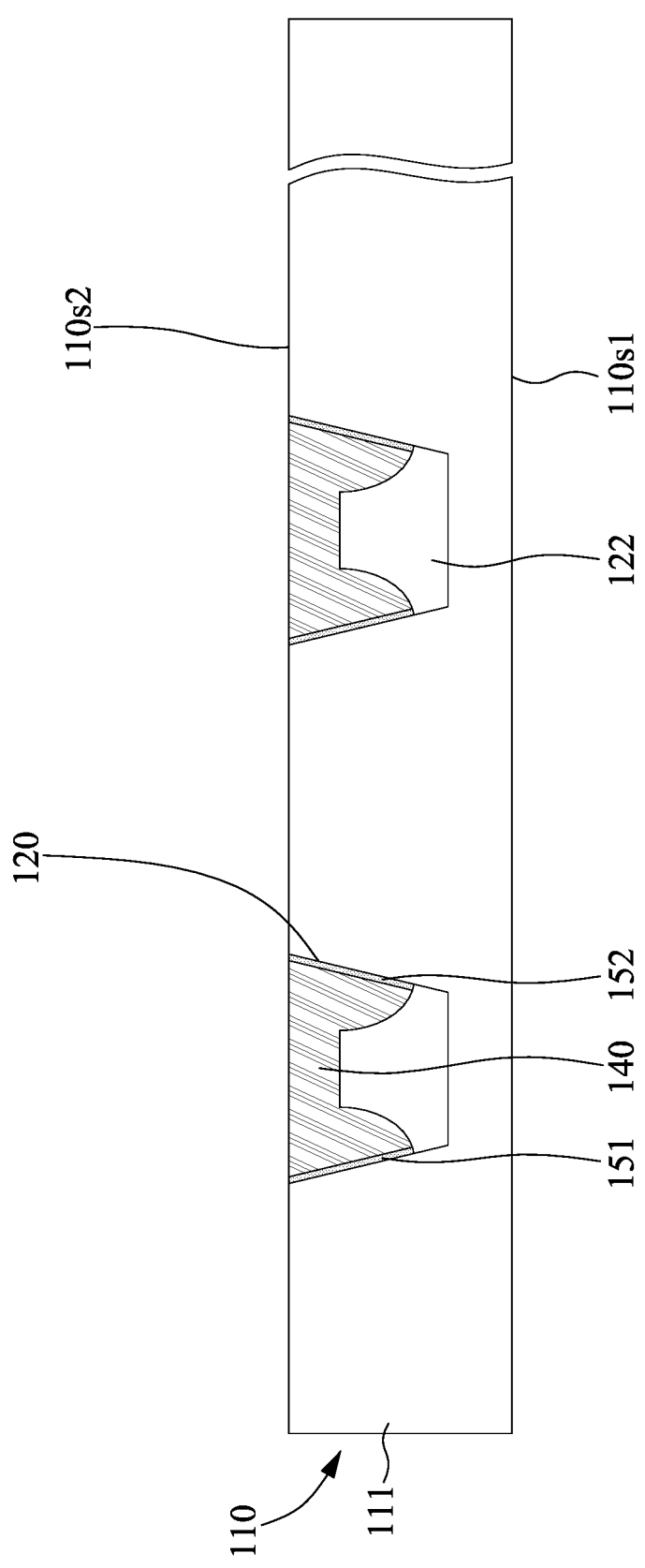

Referring to FIG. 7A, FIG. 7B, and FIG. 7C, a word line 140 may be formed within the opening 120. The word line 140 may fill the opening 1220. The word line 140 may be formed on the gate dielectric layers 151 and 152. The word line 140 may be formed by PVD, CVD, ALD, LPCVD, PECVD, or other suitable processes.

Figure 8A:
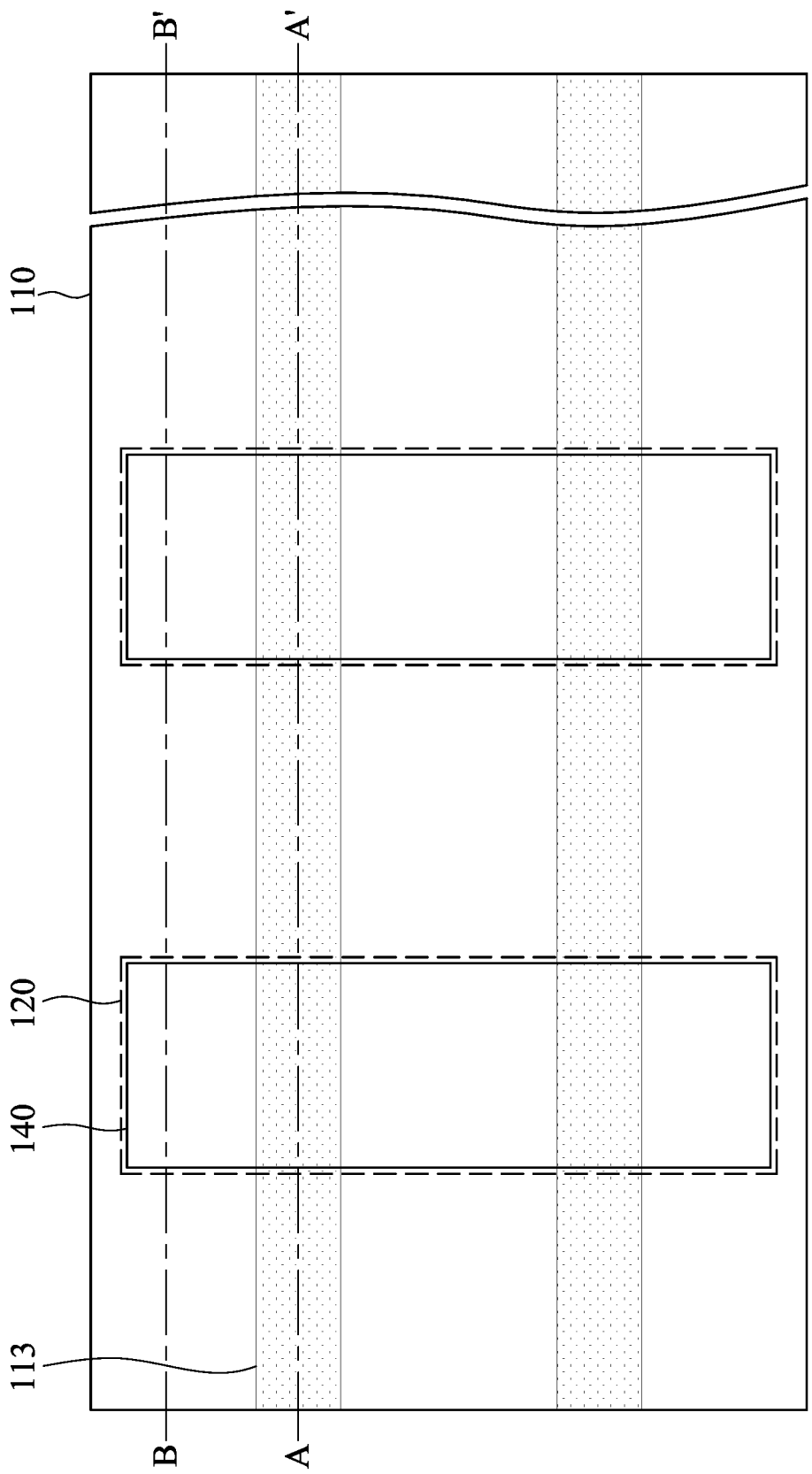
FIG. 8A, FIG. 8B, and FIG. 8C illustrate one or more stages of an exemplary method for manufacturing a semiconductor device according to some embodiments of the present disclosure in different perspectives.
Figure 8B:
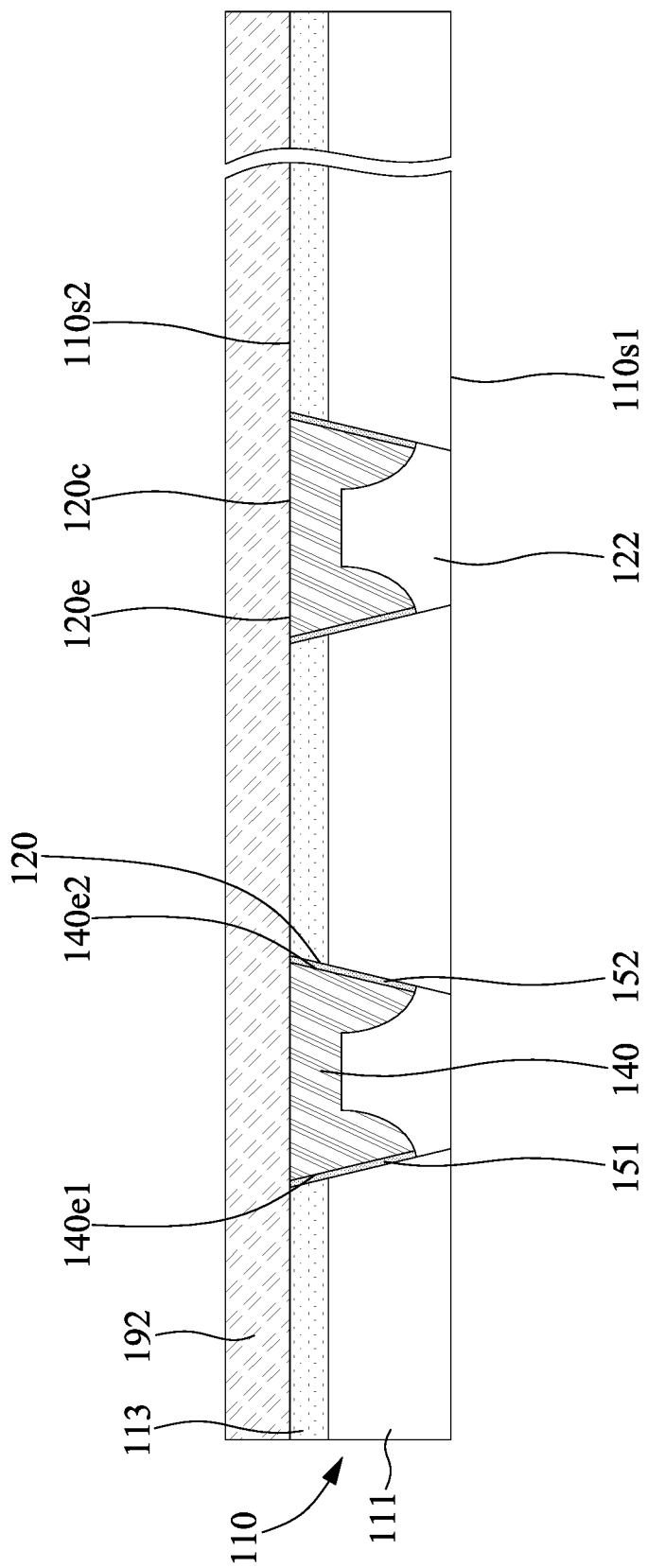
Figure 8C:
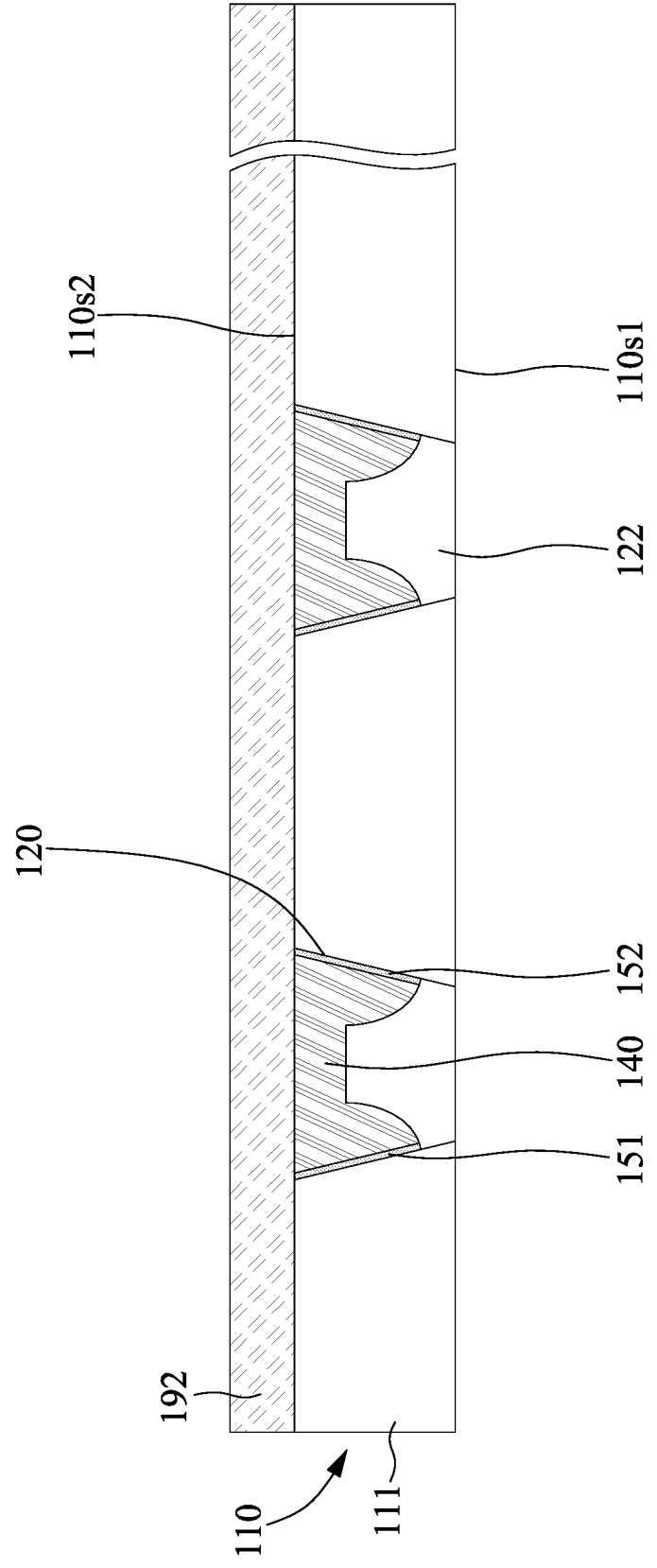

Referring to FIG. 8A, FIG. 8B, and FIG. 8C, the surface 110s2 of the substrate 110 may be attached to a supporter 192. The supporter 192 may include a plastic supporter, a glass supporter, a ceramic supporter, or other suitable supporters.

Figure 9A:
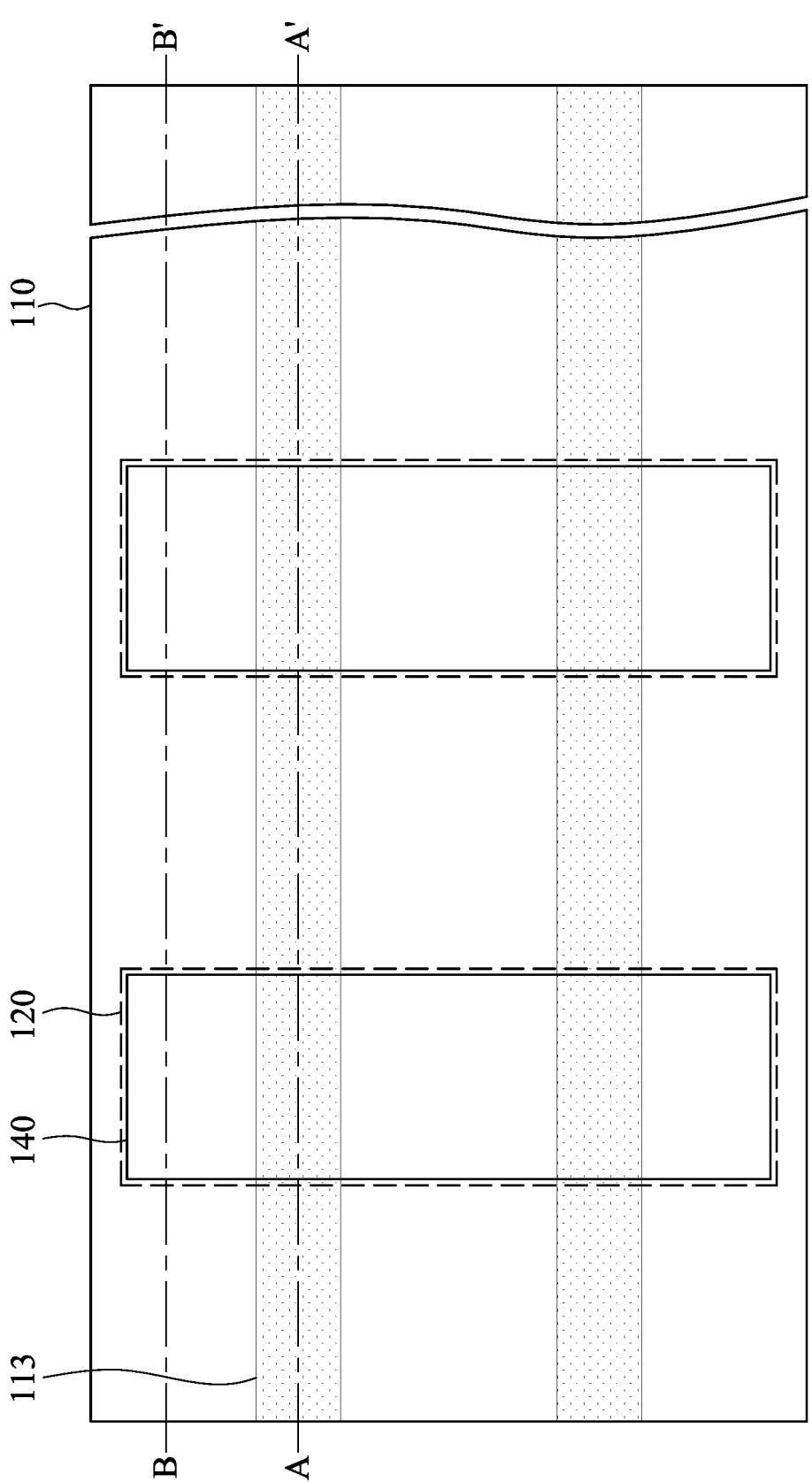
FIG. 9A, FIG. 9B, and FIG. 9C illustrate one or more stages of an exemplary method for manufacturing a semiconductor device according to some embodiments of the present disclosure in different perspectives.
Figure 9B:
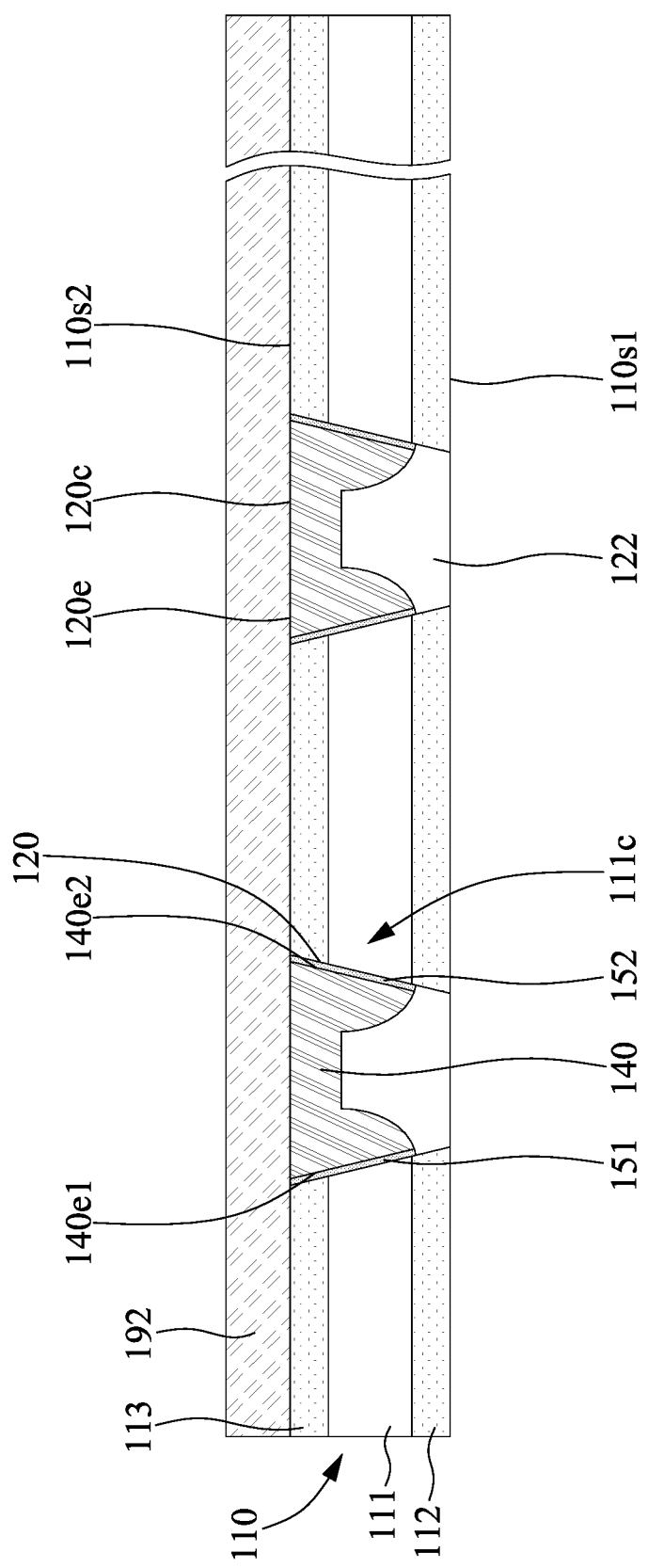
Figure 9C:
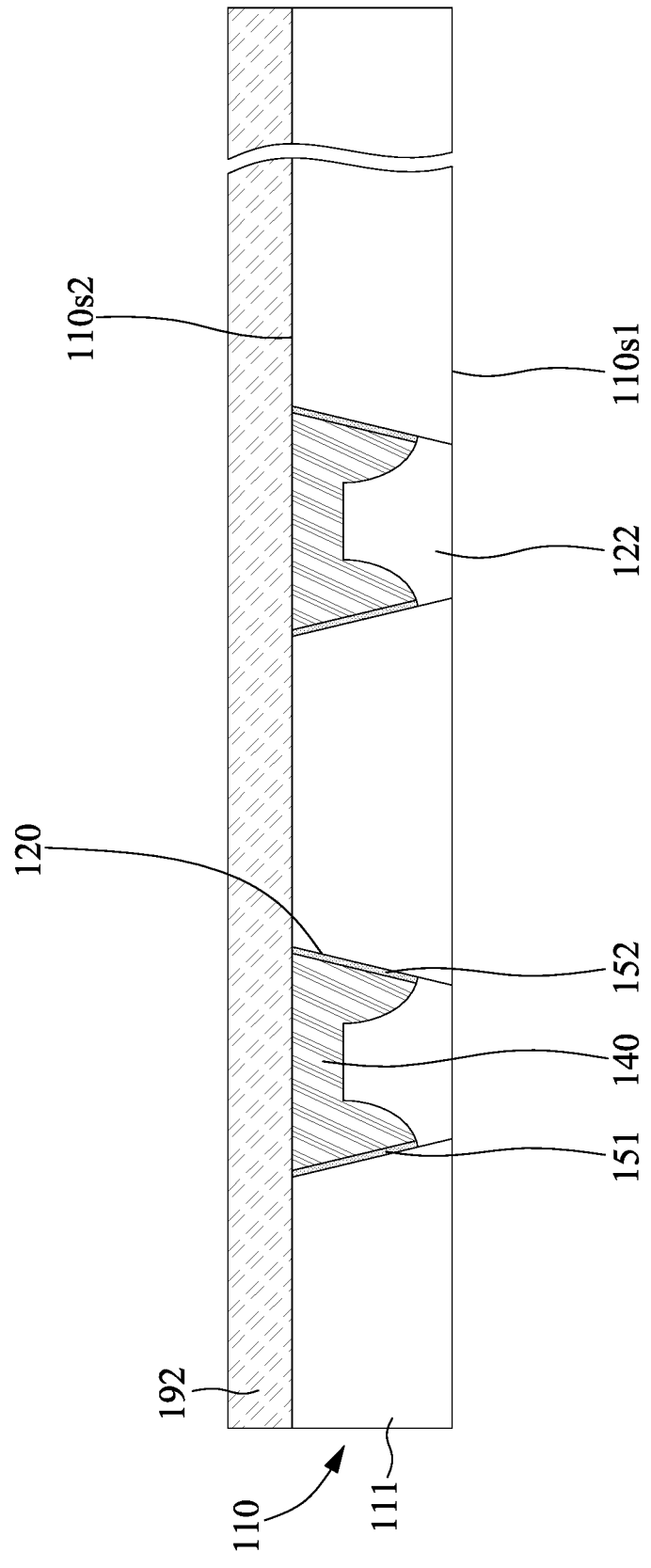

Referring to FIG. 9A, FIG. 9B, and FIG. 9C, a portion of the substrate 110 may be removed. In some embodiments, the surface 110s1 of the substrate 110 may be grinded or polished by chemical mechanical polishing process, grinding process, or other suitable processes. The bottom of the isolation layer 122 may be exposed from the surface 110s1 of the substrate 110. A doped region 112 may be formed adjacent to the surface 110s1 of the substrate 110.

Figure 10A:
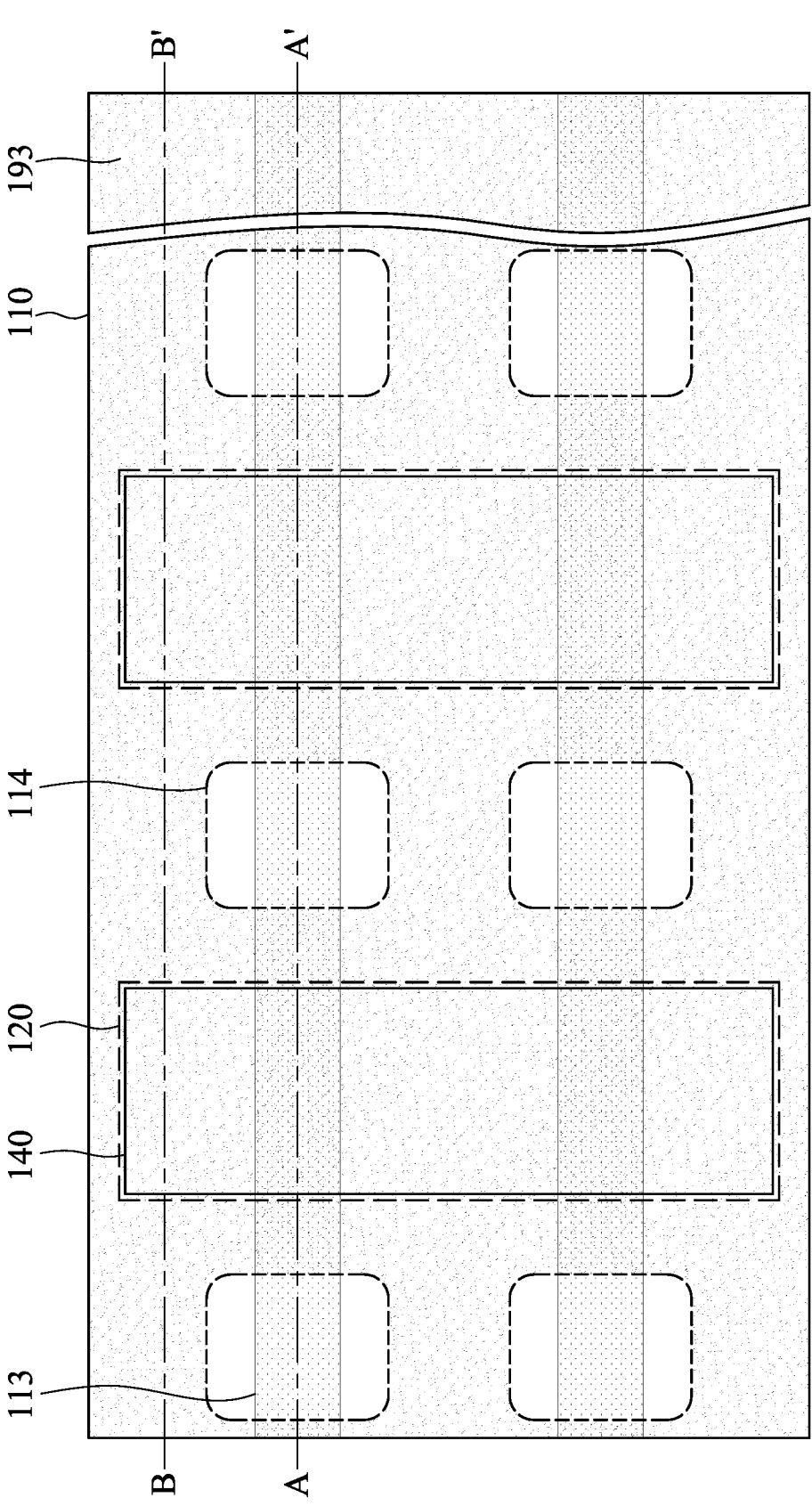
FIG. 10A, FIG. 10B, and FIG. 10C illustrate one or more stages of an exemplary method for manufacturing a semiconductor device according to some embodiments of the present disclosure in different perspectives.
Figure 10B:
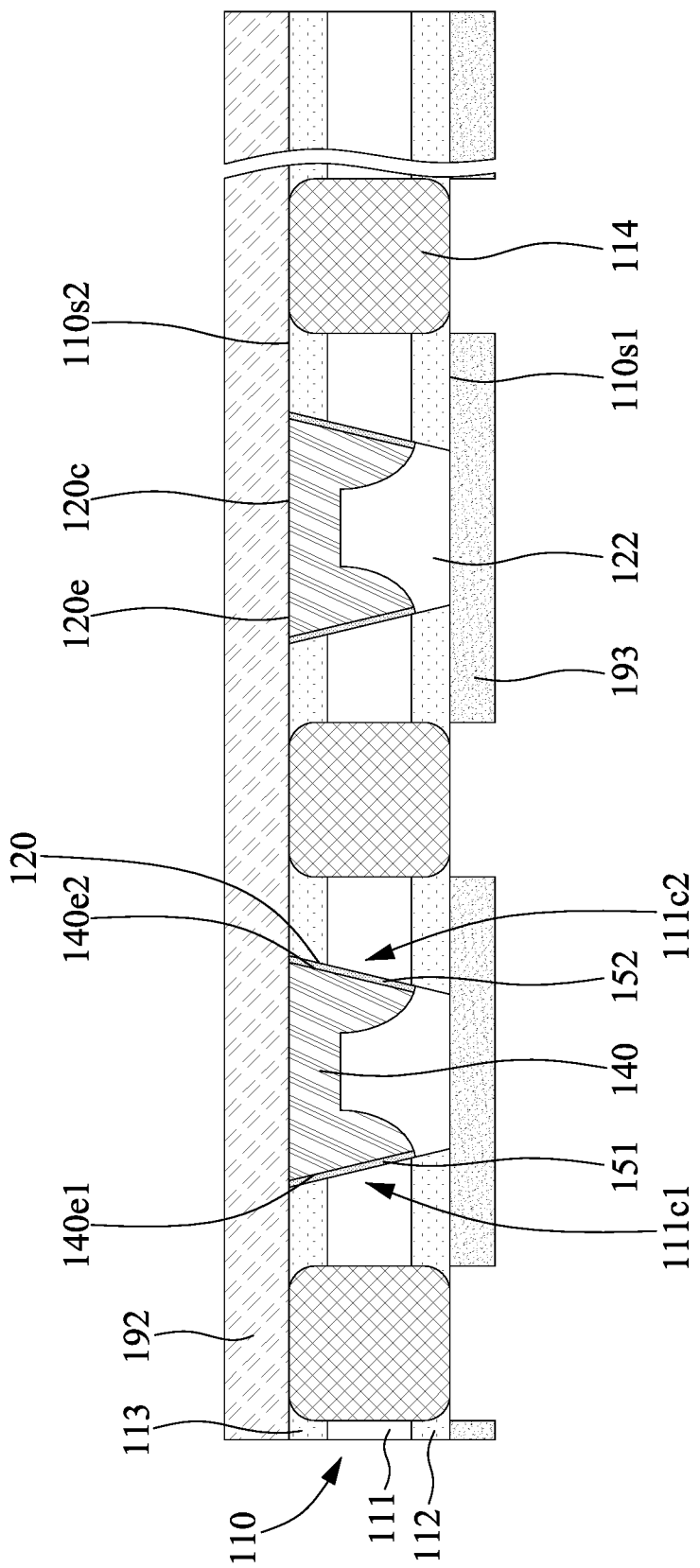
Figure 10C:
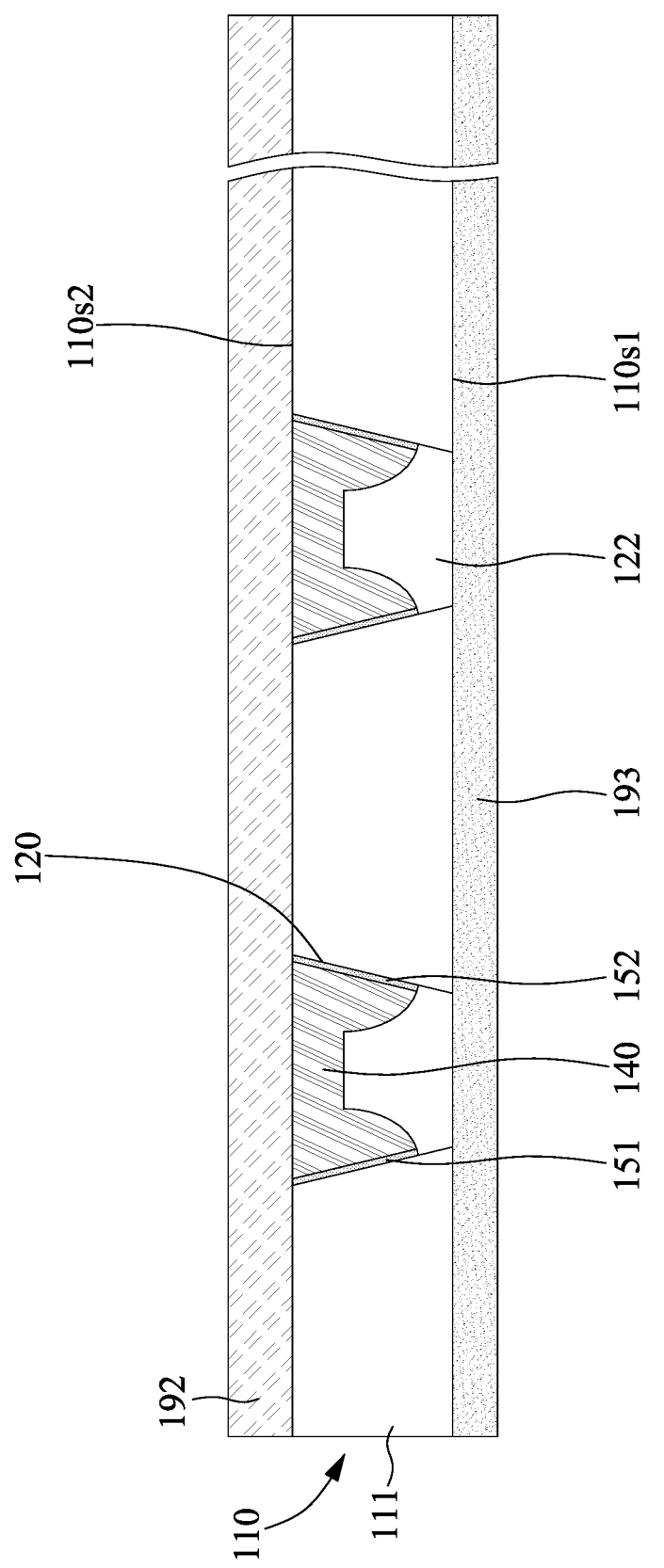

Referring to FIG. 10A, FIG. 10B, and FIG. 10C, a pattern 193 may be formed on the surface 110s1 of the substrate 110 to define a pattern of a doped region 114. The doped region 114 may be formed within the substrate 110. The doped region 114 may have a conductive type different from that of the doped region 112 (or 113).

Figure 11A:
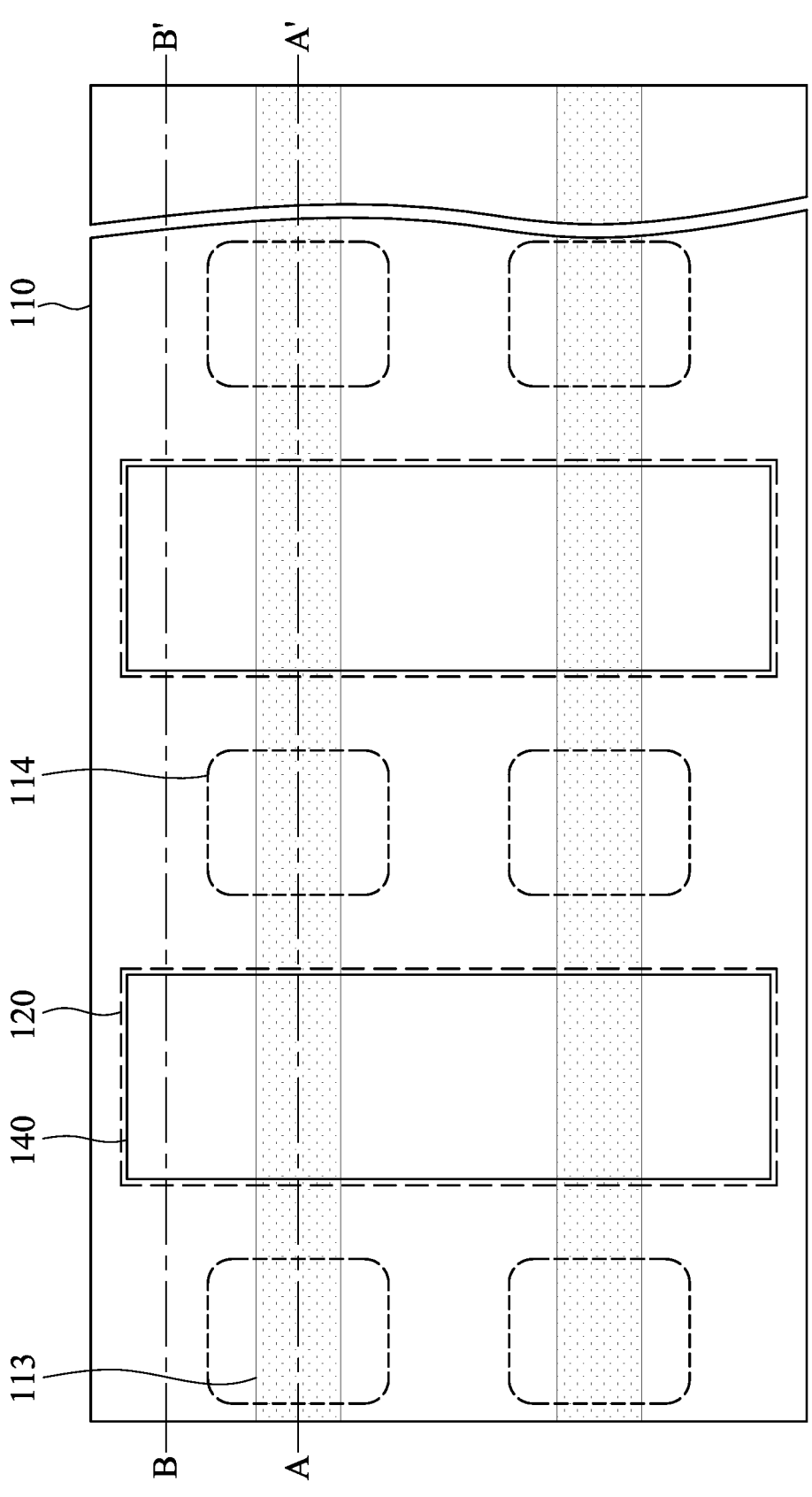
FIG. 11A, FIG. 11B, and FIG. 11C illustrate one or more stages of an exemplary method for manufacturing a semiconductor device according to some embodiments of the present disclosure in different perspectives.
Figure 11B:
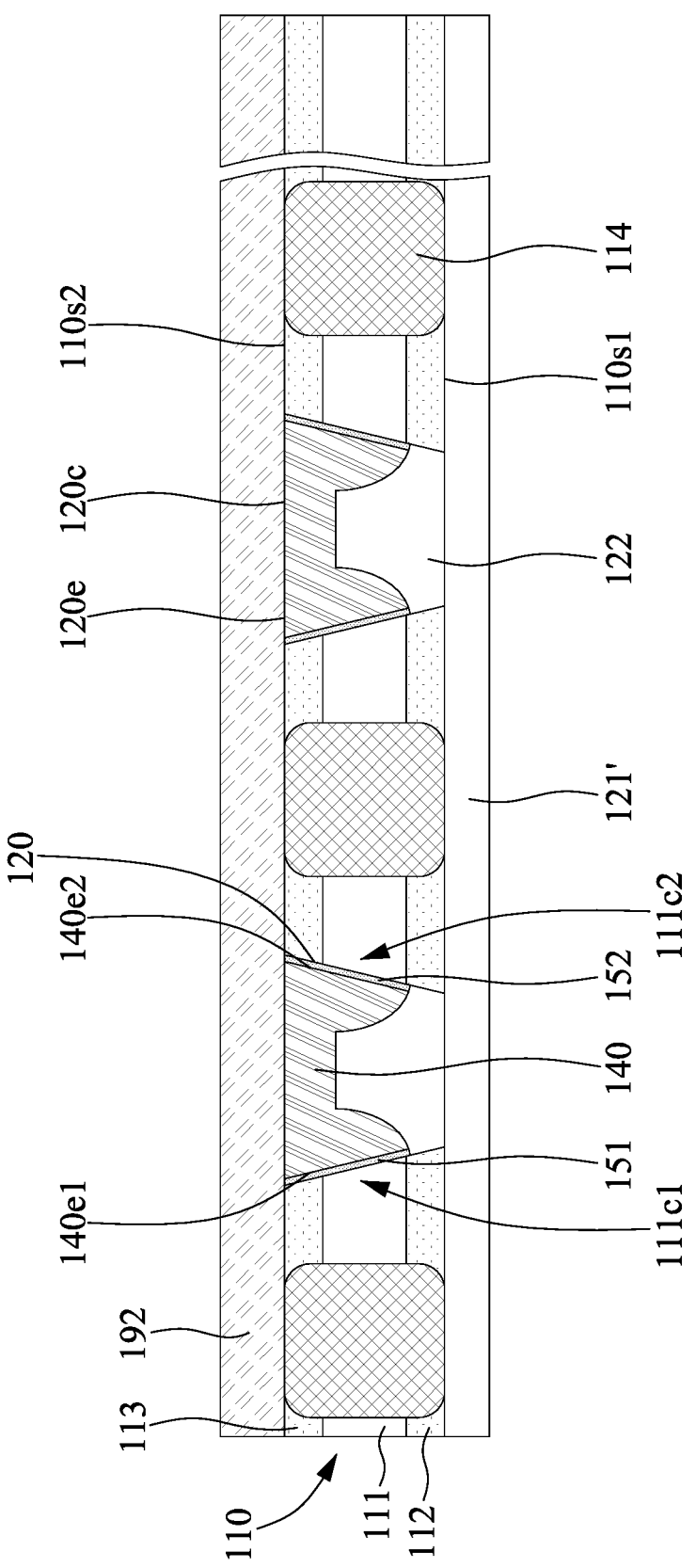
Figure 11C:
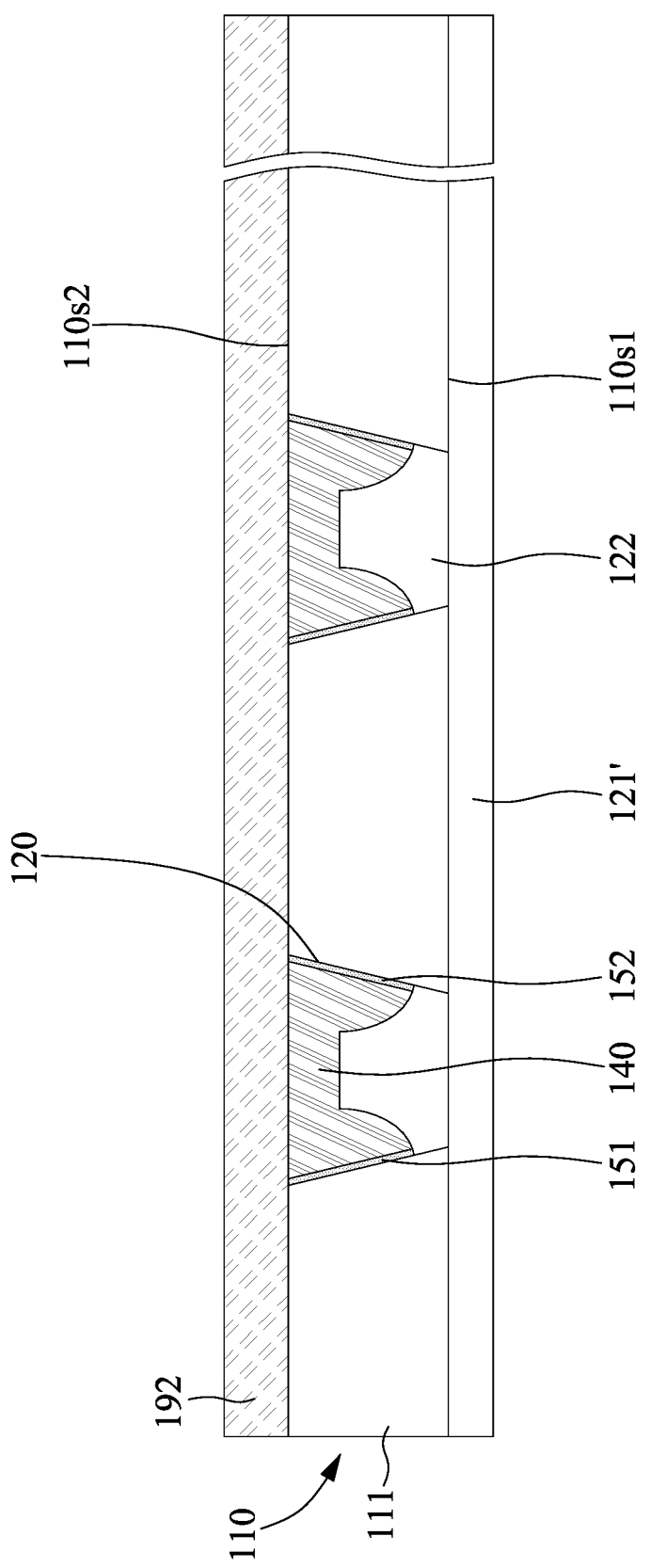

Referring to FIG. 11A, FIG. 11B, and FIG. 11C, the pattern 193 may be removed. A dielectric layer 121' may be formed on the surface 110s1 of the substrate 110. The dielectric layer 121' may include silicon oxide, silicon nitride, silicon oxynitride, or high-k dielectric material(s).

Figure 12A:
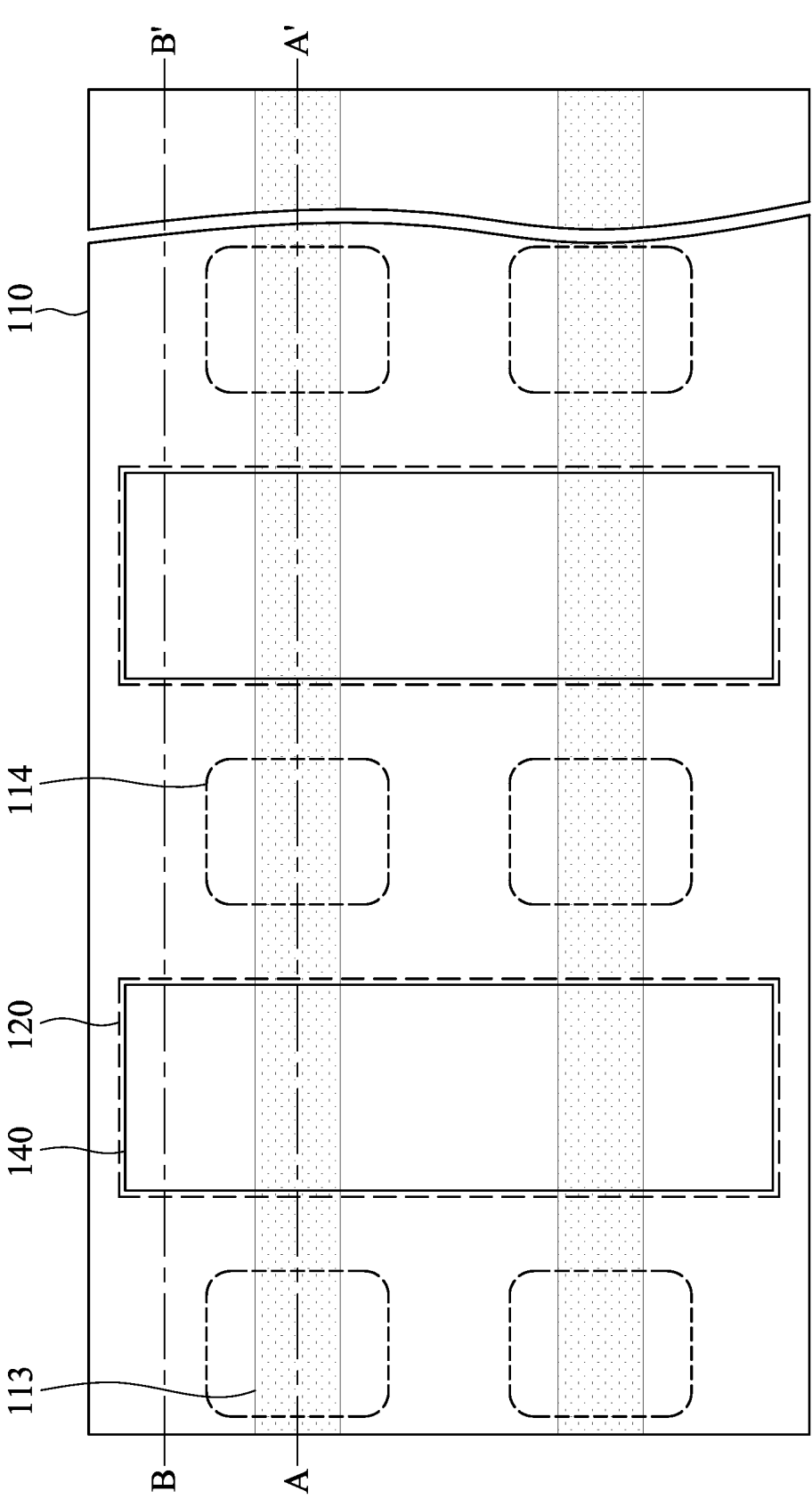
FIG. 12A, FIG. 12B, and FIG. 12C illustrate one or more stages of an exemplary method for manufacturing a semiconductor device according to some embodiments of the present disclosure in different perspectives.
Figure 12B:
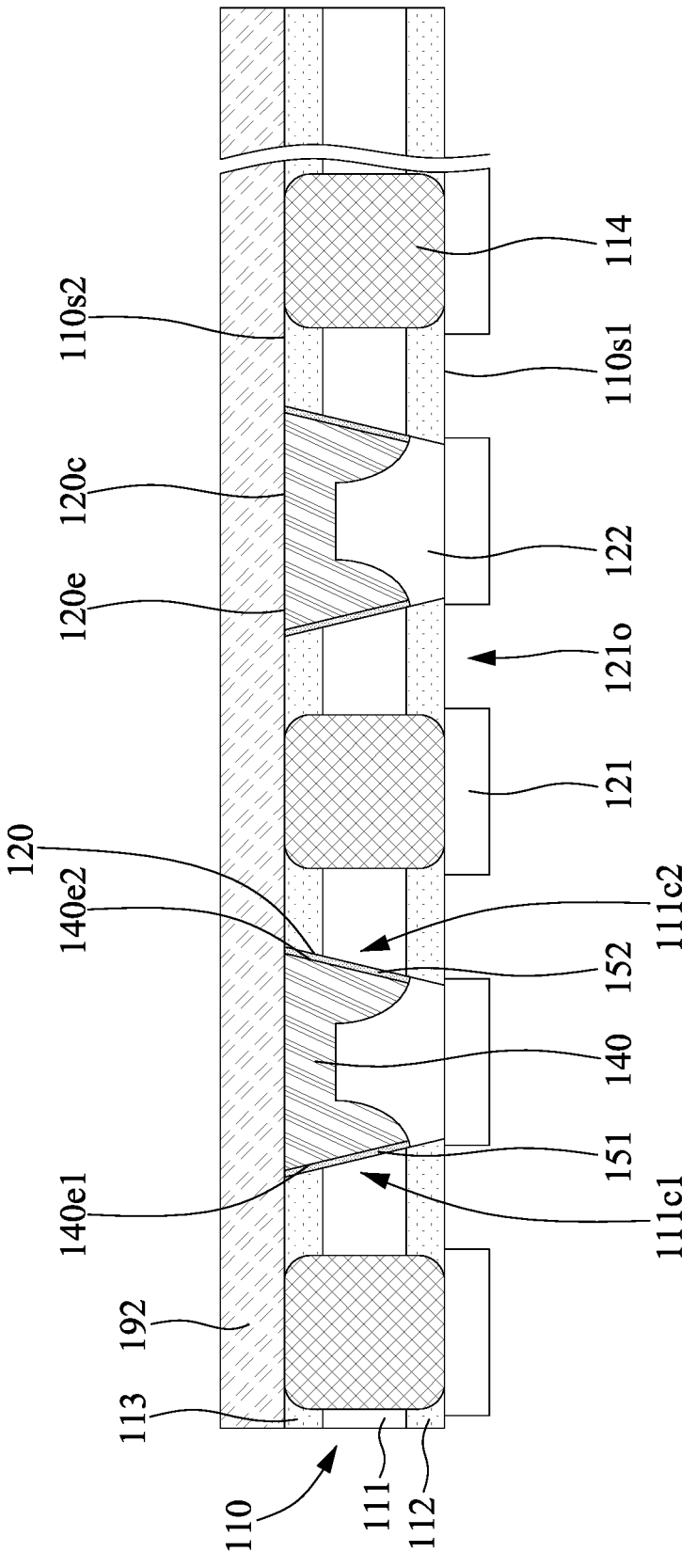
Figure 12C:
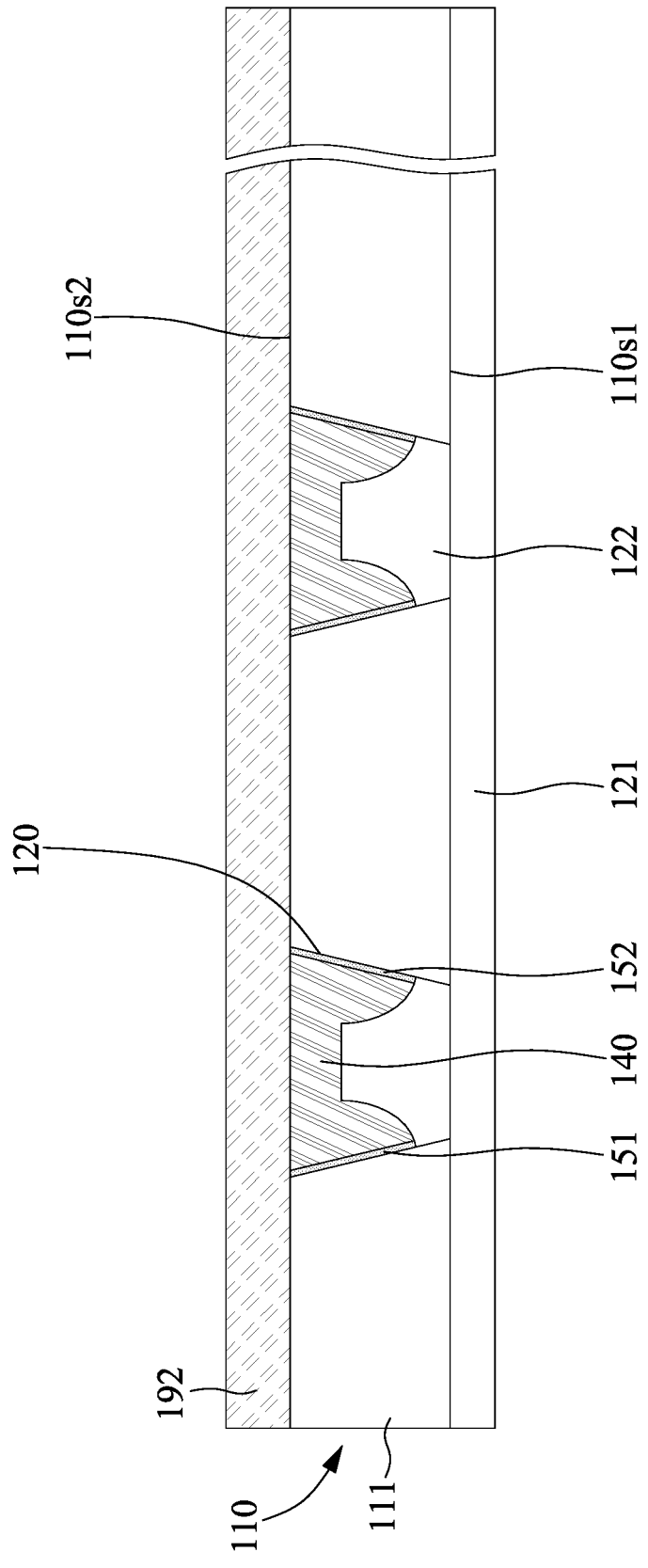

Referring to FIG. 12A, FIG. 12B, and FIG. 12C, the dielectric layer 121' may be patterned to form the dielectric layer 121. The dielectric layer 121 may have openings 1210 exposing the surface 110s1 of the substrate 110. The doped region 114 may be covered by the dielectric layer 121.

Figure 13A:
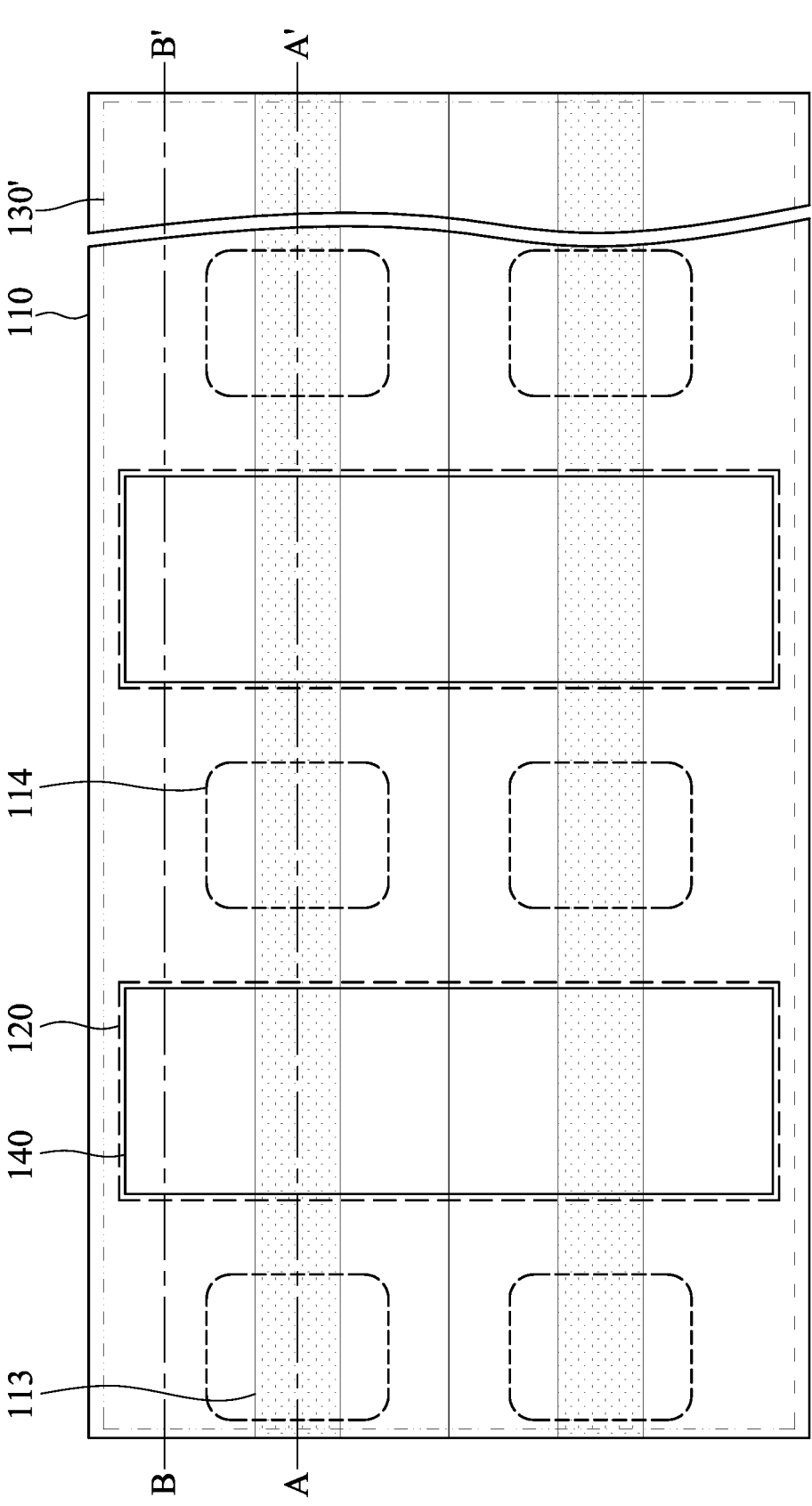
FIG. 13A, FIG. 13B, and FIG. 13C illustrate one or more stages of an exemplary method for manufacturing a semiconductor device according to some embodiments of the present disclosure in different perspectives.
Figure 13B:
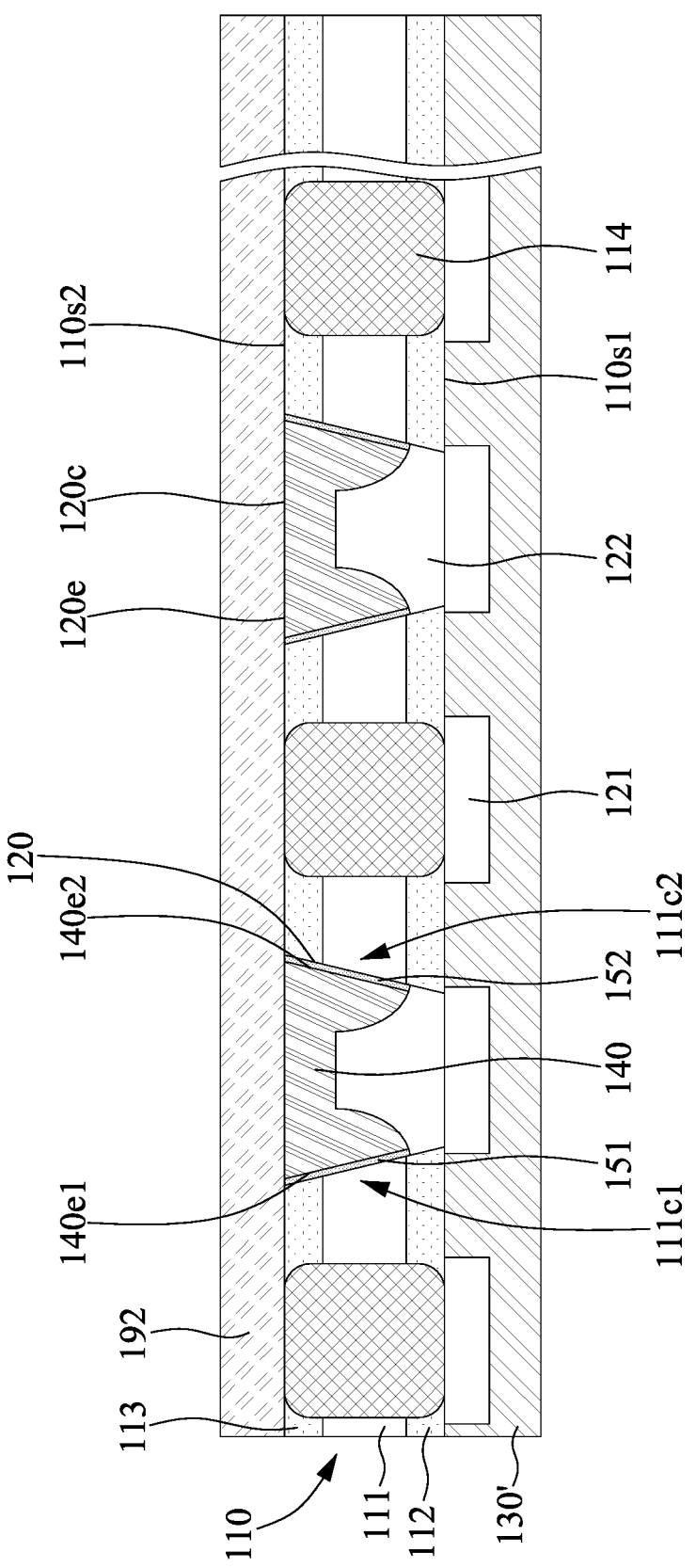
Figure 13C:
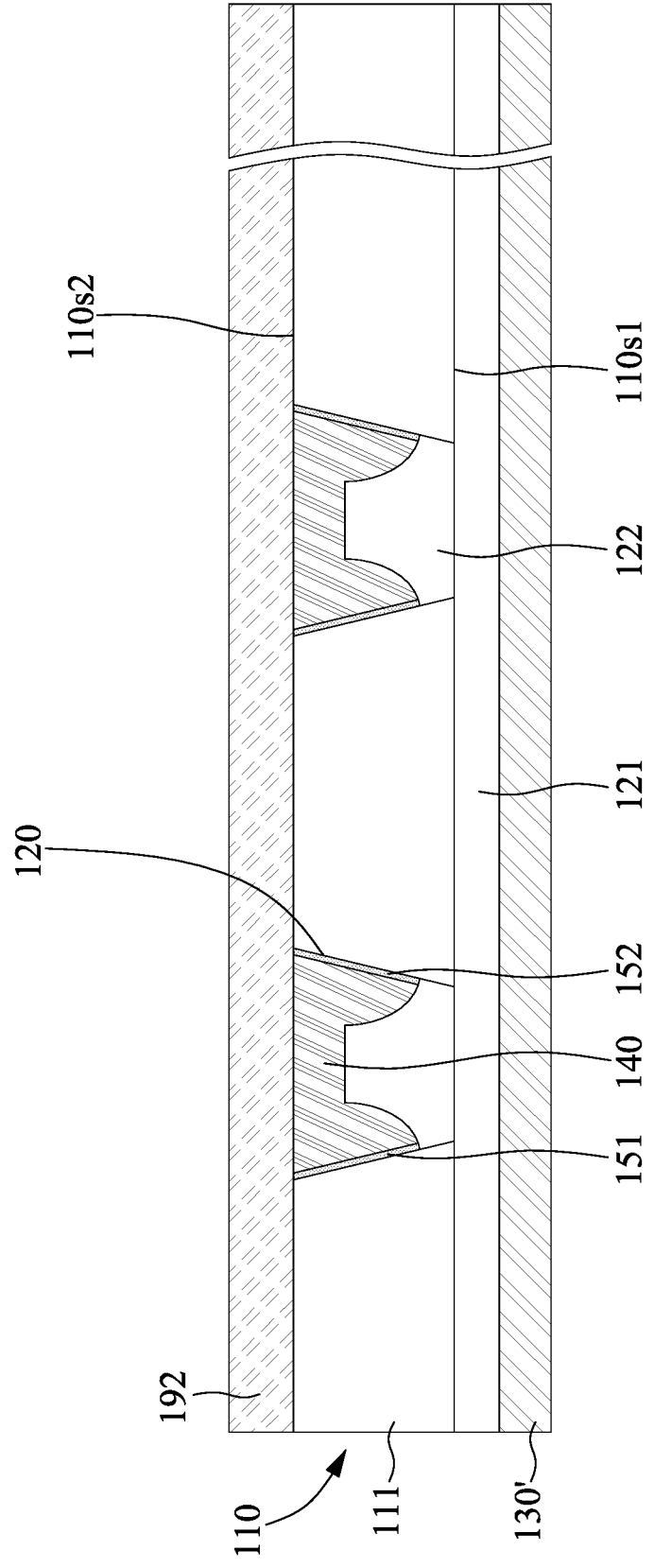

Referring to FIG. 13A, FIG. 13B, and FIG. 13C, a metallization layer 130' may be formed on the surface 110s1 of the substrate 110. The metallization layer 130' may fill the openings 1210 as shown in FIG. 12B. The metallization layer 130' may include conductive materials, such as tungsten, copper, aluminum, tantalum, tantalum nitride, titanium, titanium nitride, the like, and/or a combination thereof. The metallization layer 130' may be formed by PVD, CVD, ALD, LPCVD, PECVD, or other suitable processes.

Figure 14A:
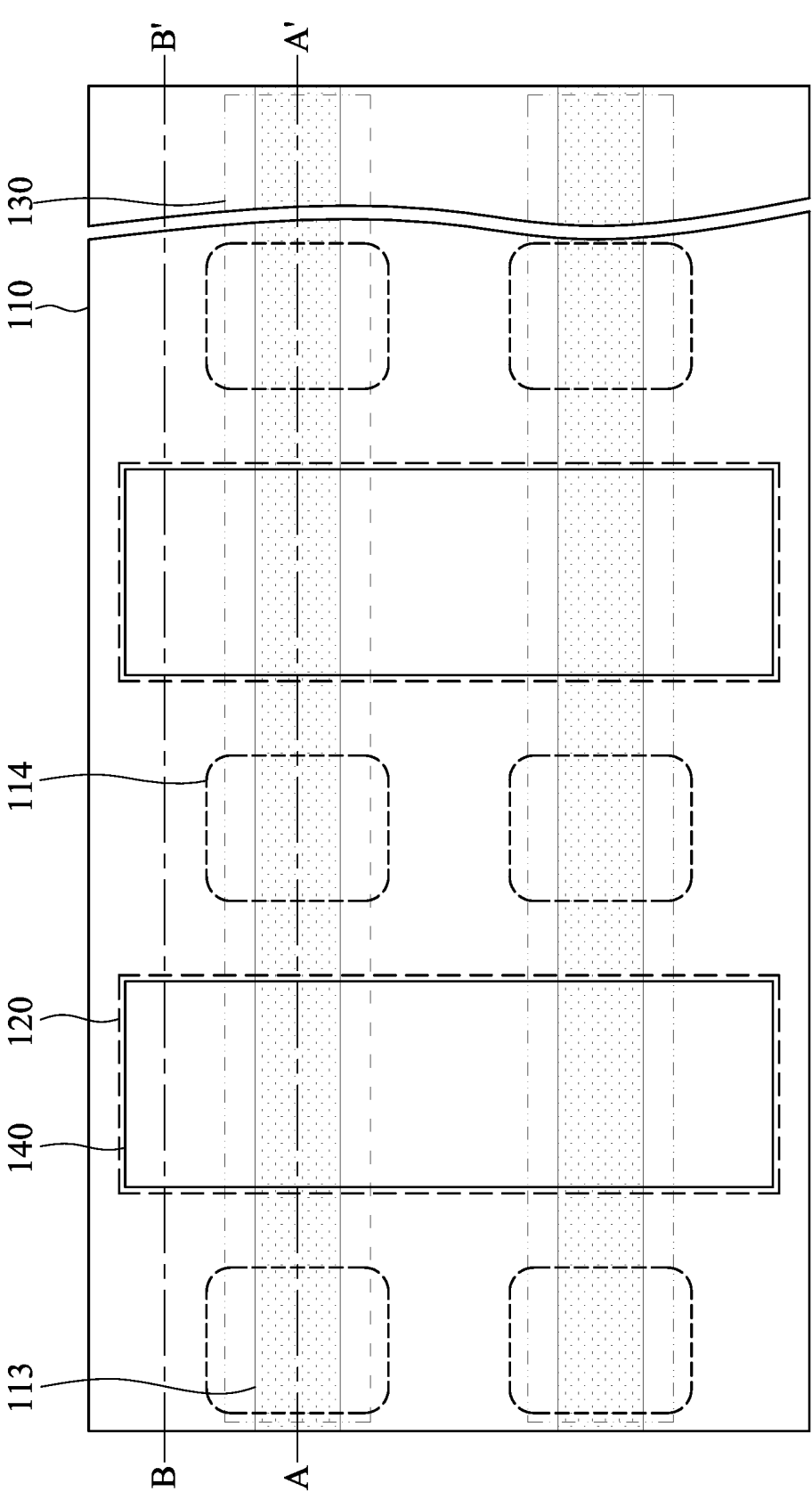
FIG. 14A, FIG. 14B, and FIG. 14C illustrate one or more stages of an exemplary method for manufacturing a semiconductor device according to some embodiments of the present disclosure in different perspectives.
Figure 14B:
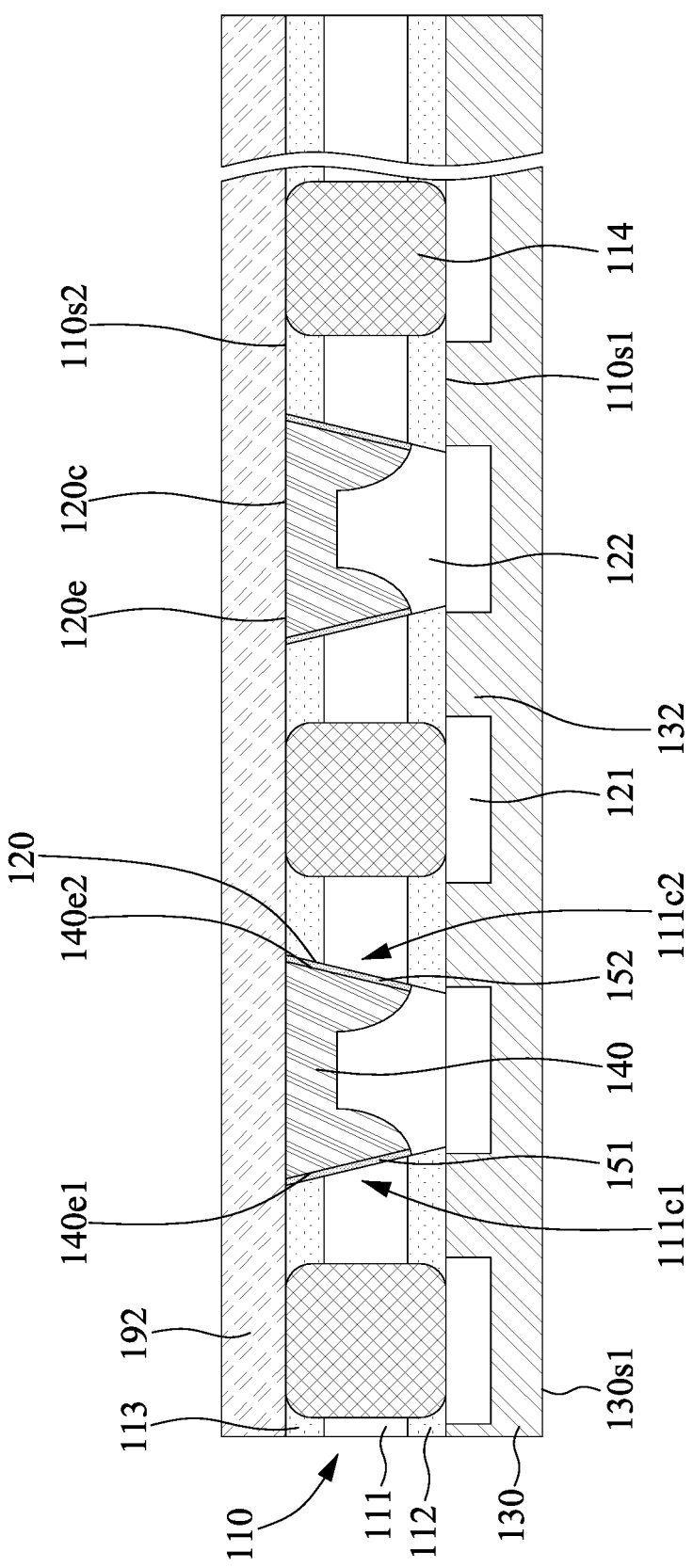
Figure 14C:
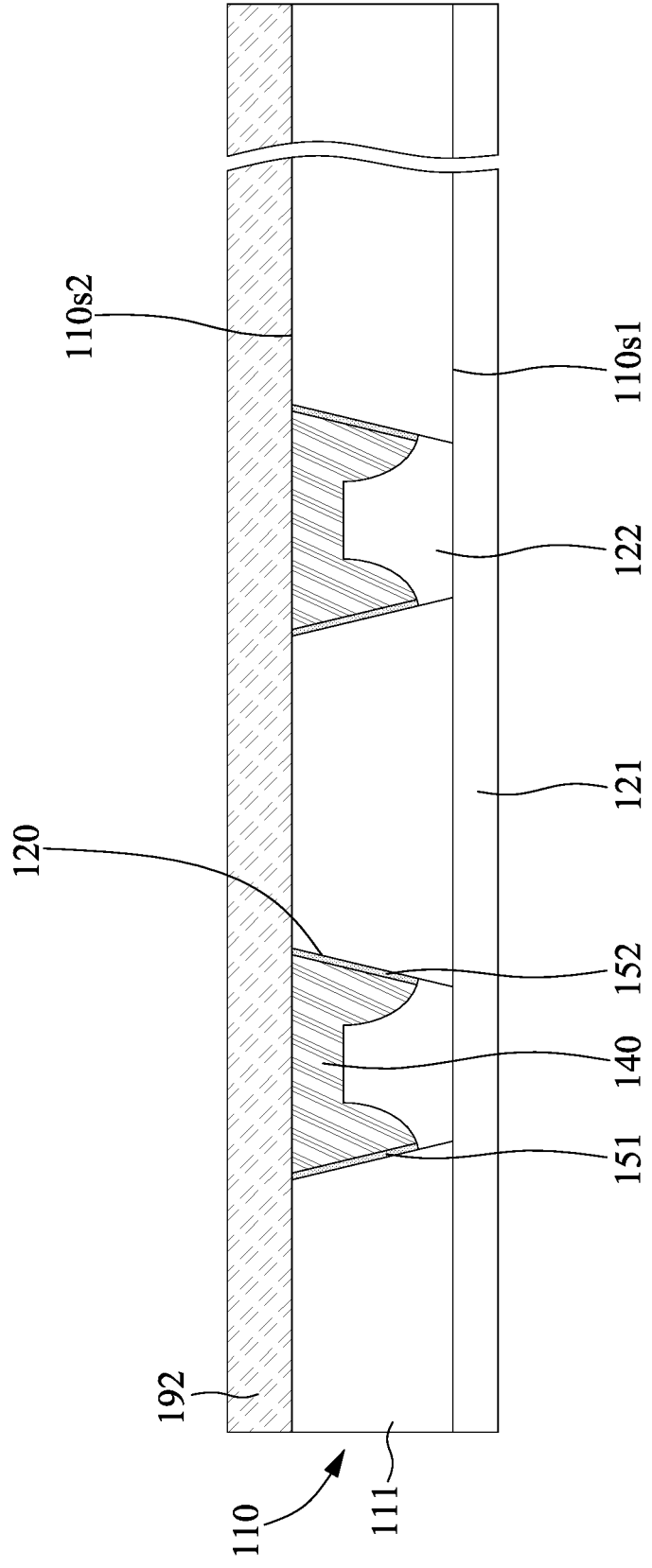

Referring to FIG. 14A, FIG. 14B, and FIG. 14C, the metallization layer 130' may be patterned to form bit lines 130 and conductive vias 132 over the active region. In some embodiments, the bit line 130 may be protruded from the dielectric layer 121. The metallization layer 130' may be patterned by wet etching, dry etching, or other suitable processes.

Figure 15A:
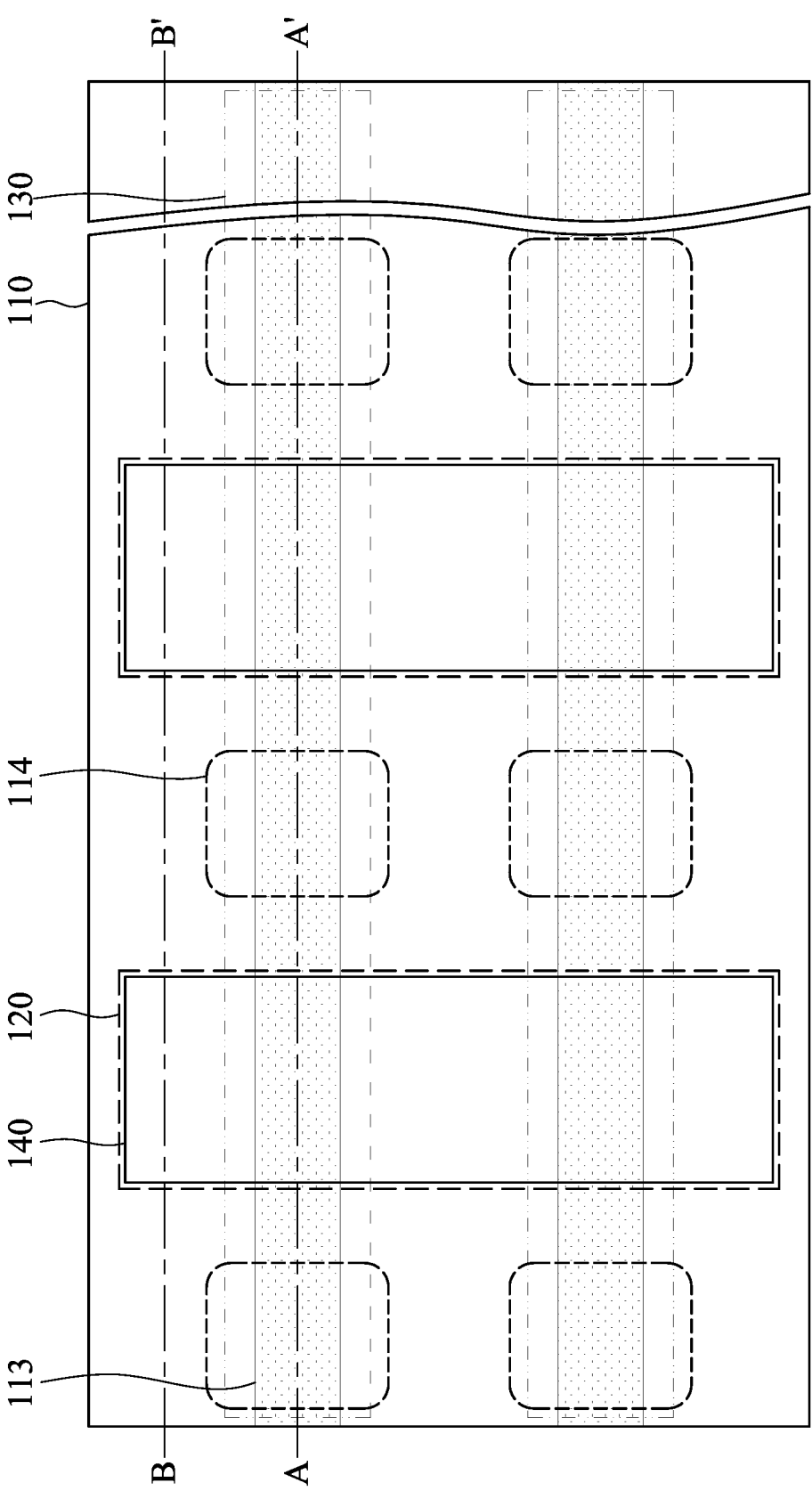
FIG. 15A, FIG. 15B, and FIG. 15C illustrate one or more stages of an exemplary method for manufacturing a semiconductor device according to some embodiments of the present disclosure in different perspectives.
Figure 15B:
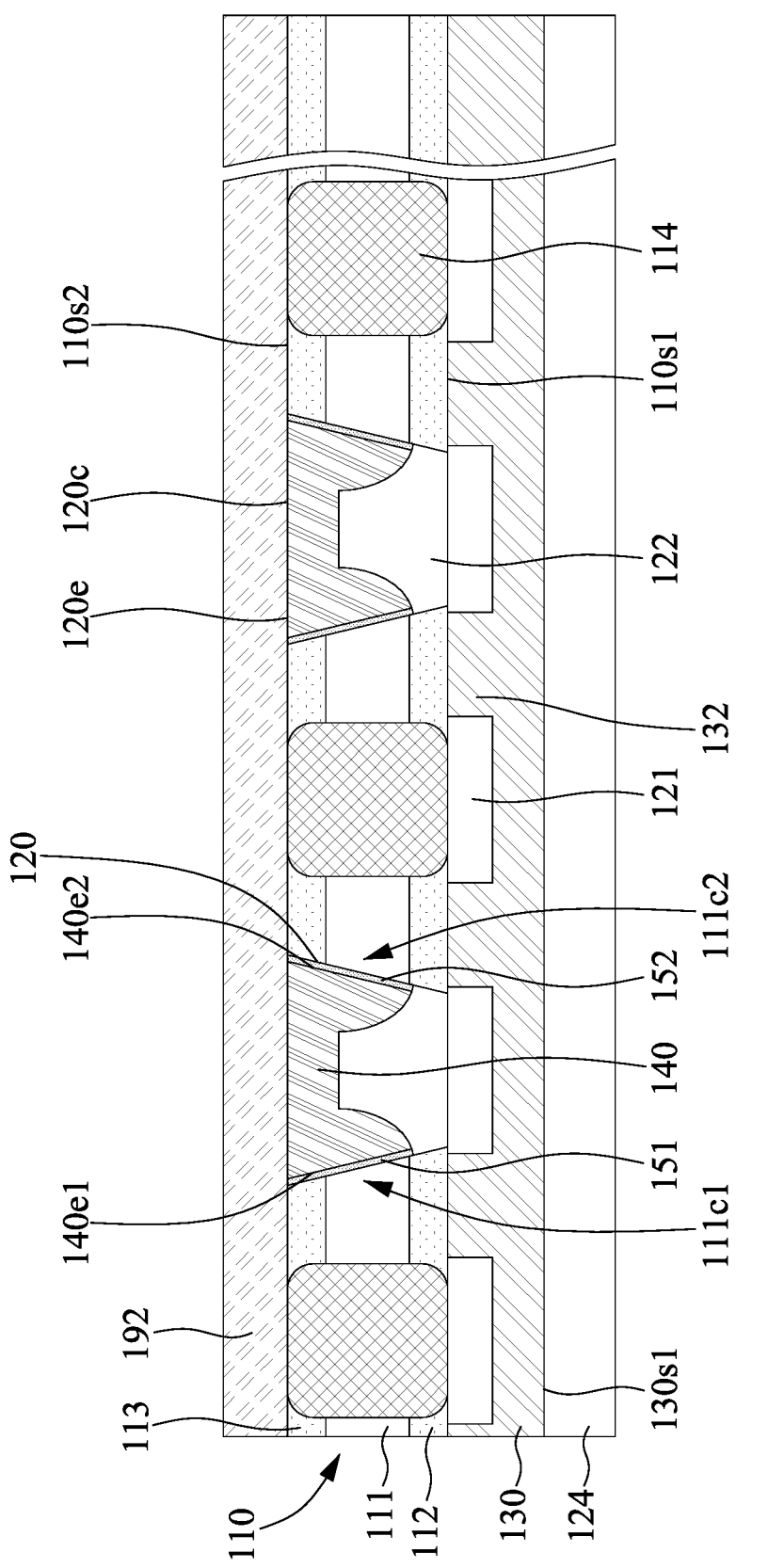
Figure 15C:
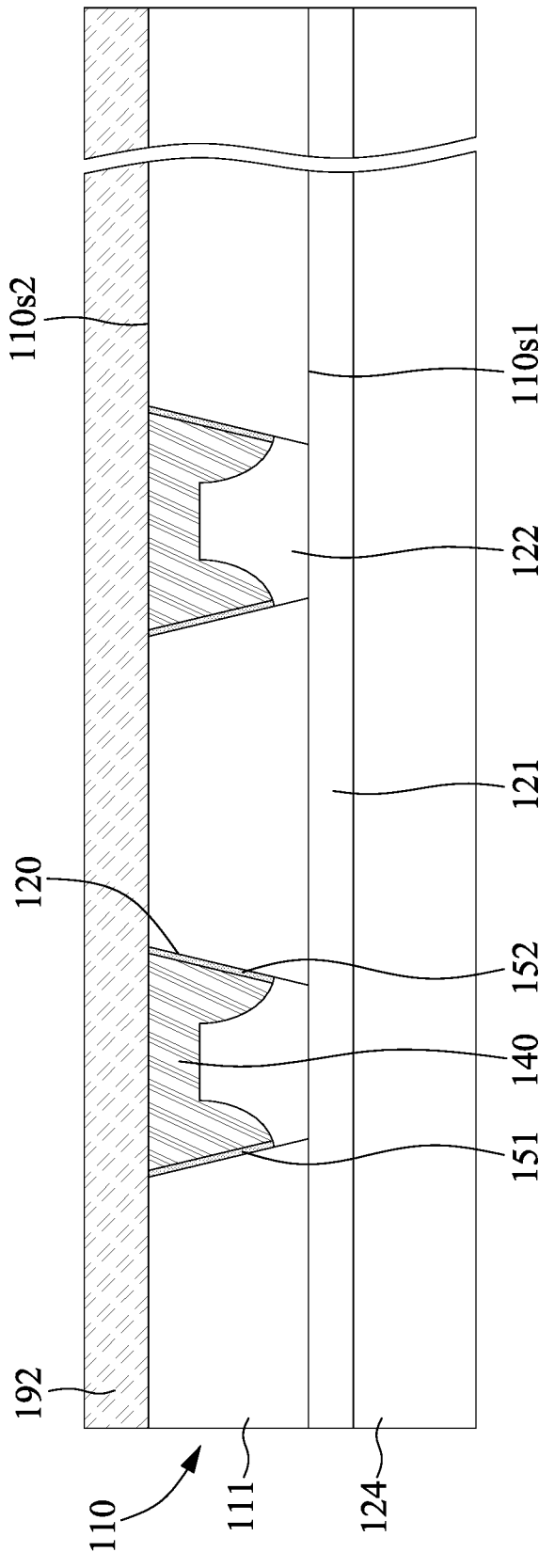

Referring to FIG. 15A, FIG. 15B, and FIG. 15C, a fill layer 124 may be formed. The fill layer 124 may cover the dielectric layer 121. The fill layer 124 may cover the bit line 130. The fill layer 124 may fill openings defined by the bit line 130. The fill layer 124 may be formed by CVD, ALD, LPCVD, PECVD, PVD, or other suitable processes.

Figure 16A:
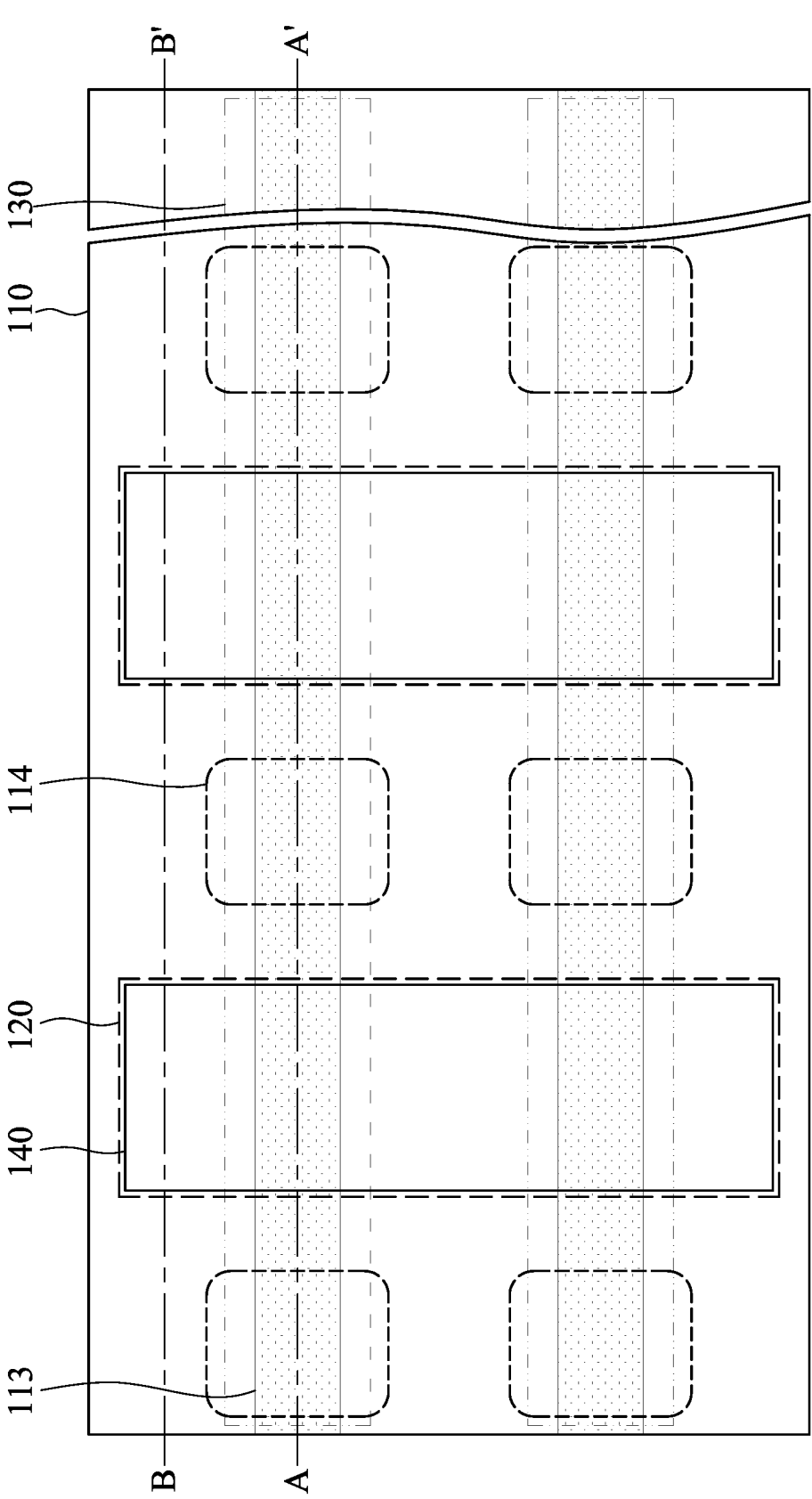
FIG. 16A, FIG. 16B, and FIG. 16C illustrate one or more stages of an exemplary method for manufacturing a semiconductor device according to some embodiments of the present disclosure in different perspectives.
Figure 16B:
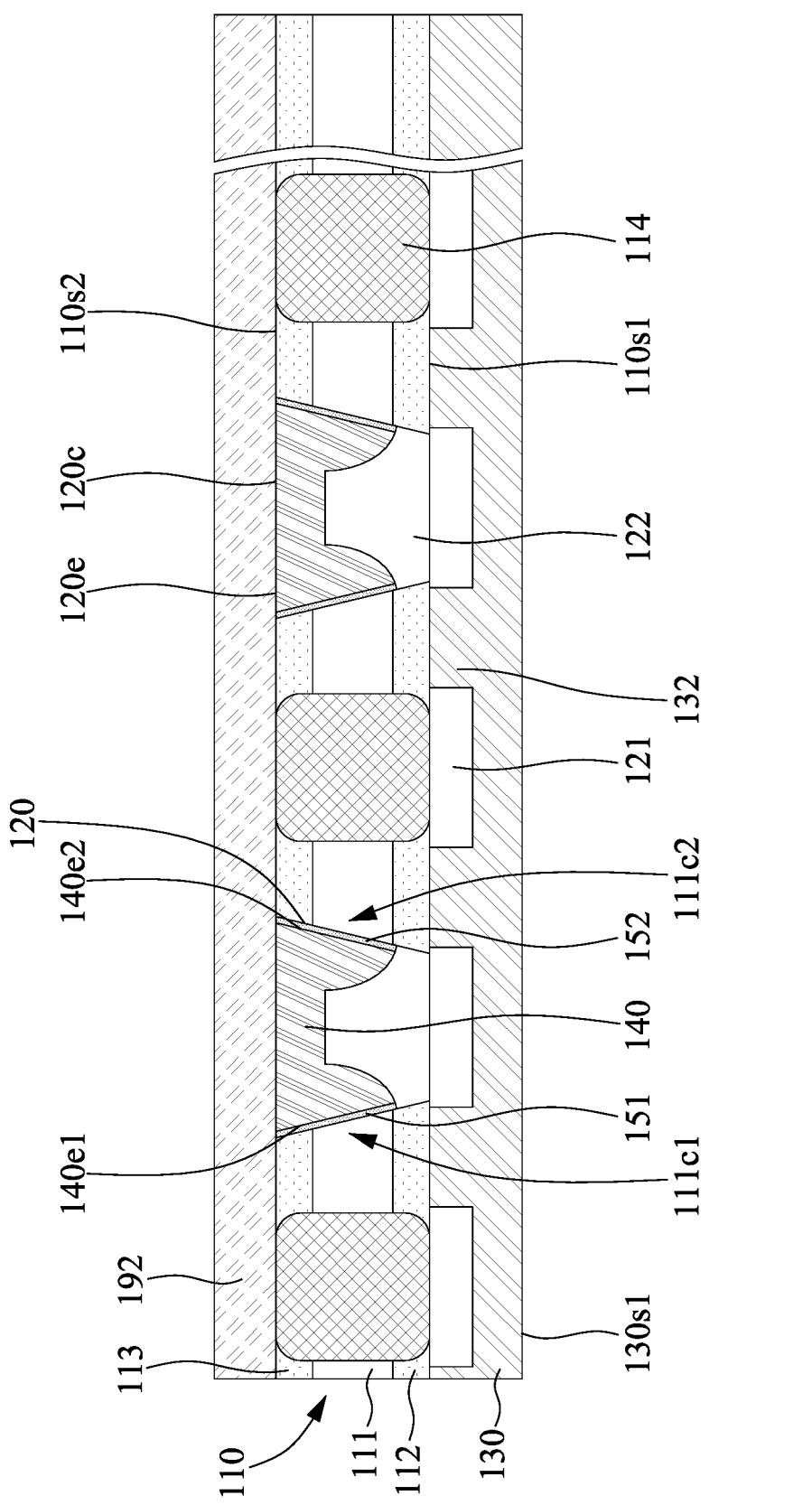
Figure 16C:
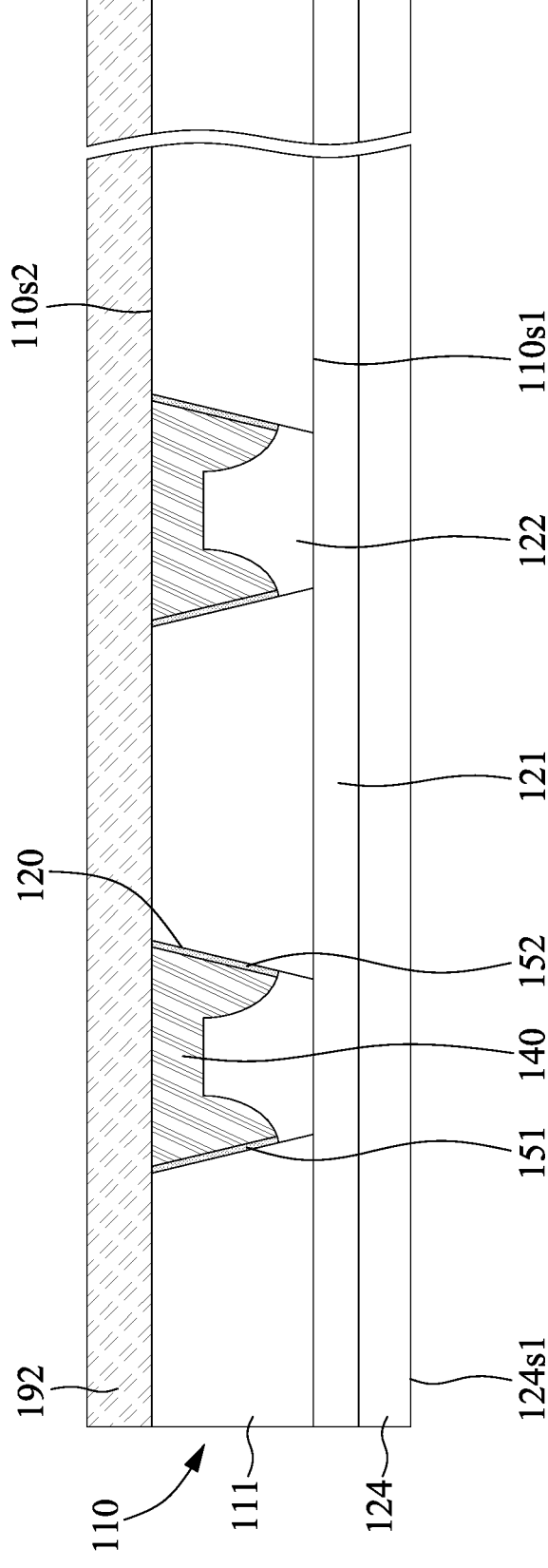

Referring to FIG. 16A, FIG. 16B, and FIG. 16C, a portion of the fill layer 124 may be removed. As a result, the surface 124s1 of the fill layer 124 may be coplanar with the surface 130s1 of the bit line 130. The fill layer 124 may be removed by, for example, CVD, grinding, or other suitable processes.

Figure 17A:
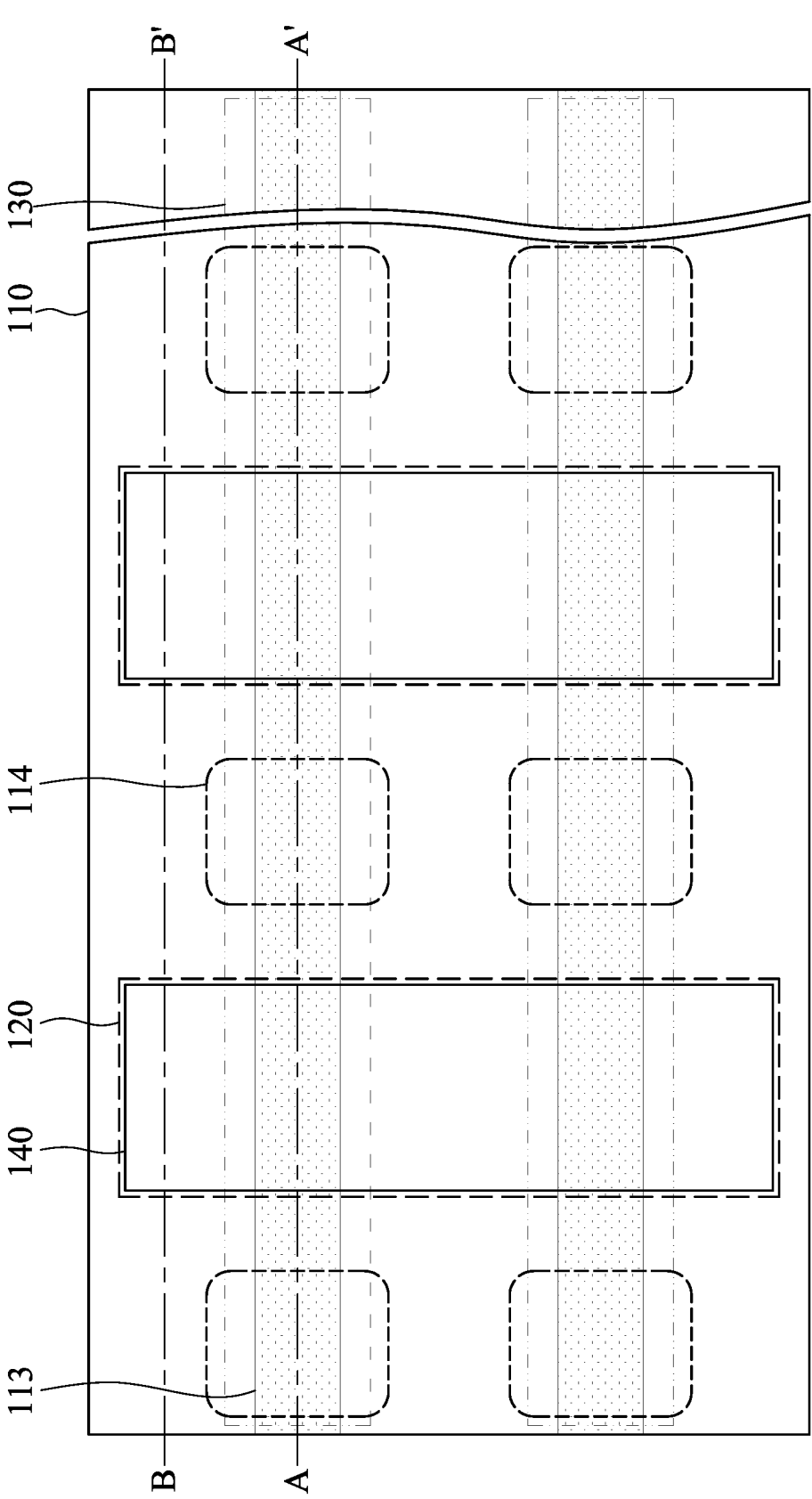
FIG. 17A, FIG. 17B, and FIG. 17C illustrate one or more stages of an exemplary method for manufacturing a semiconductor device according to some embodiments of the present disclosure in different perspectives.
Figure 17B:
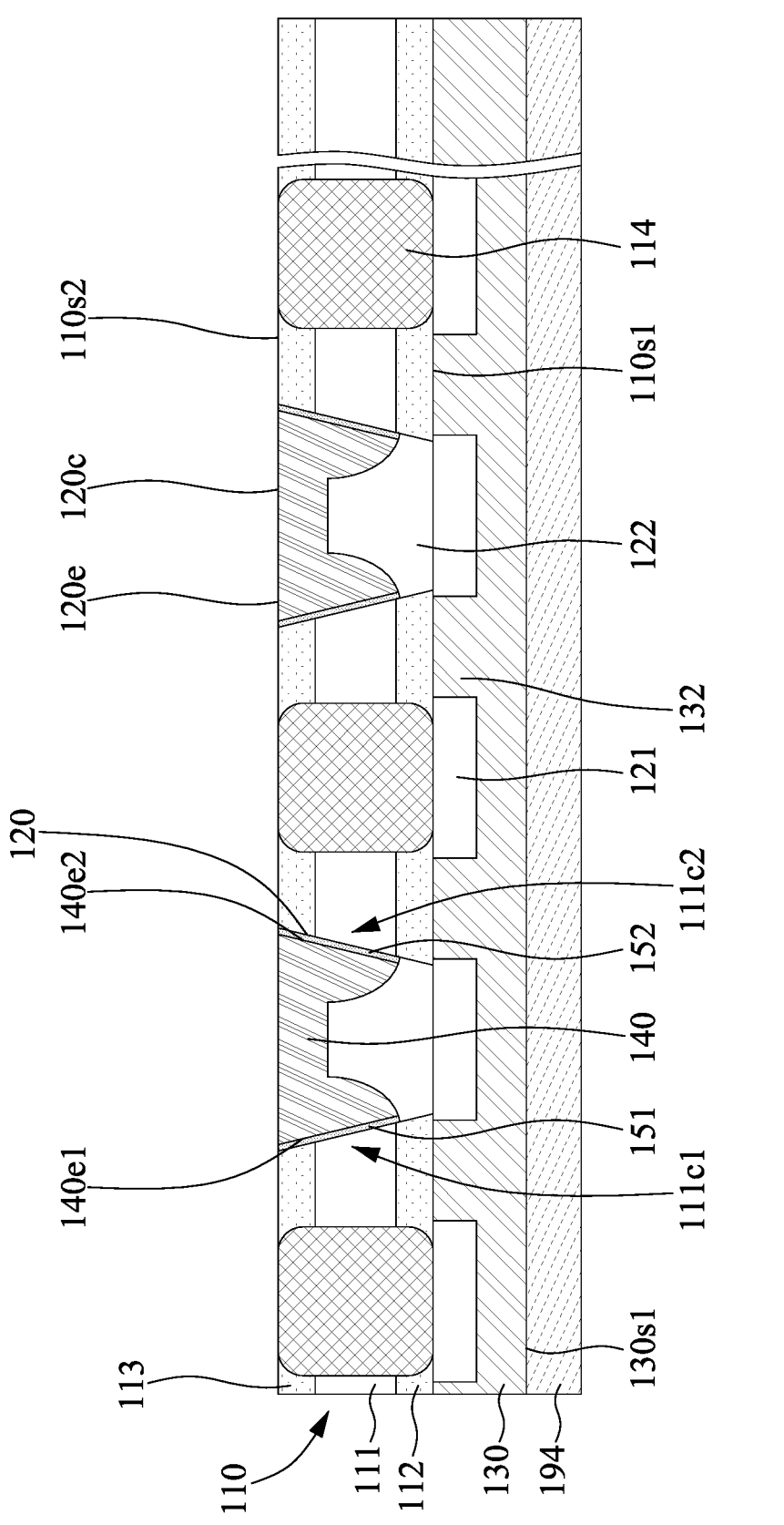
Figure 17C:
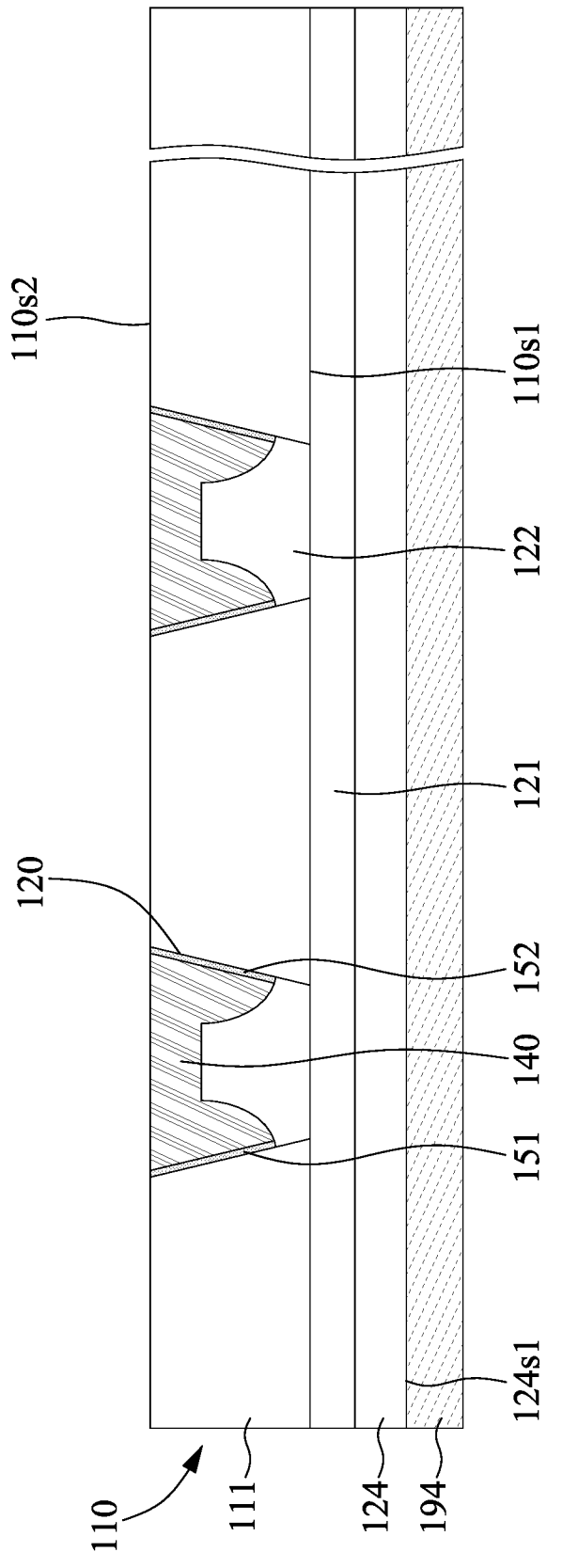

Referring to FIG. 17A, FIG. 17B, and FIG. 17C, the supporter 192 may be removed. The word line 140 may be exposed. The bit line 130 and the fill layer 124 may be attached to a supporter 194. The supporter 194 may include a glass supporter, a ceramic supporter, or other suitable supporters.

Figure 18A:
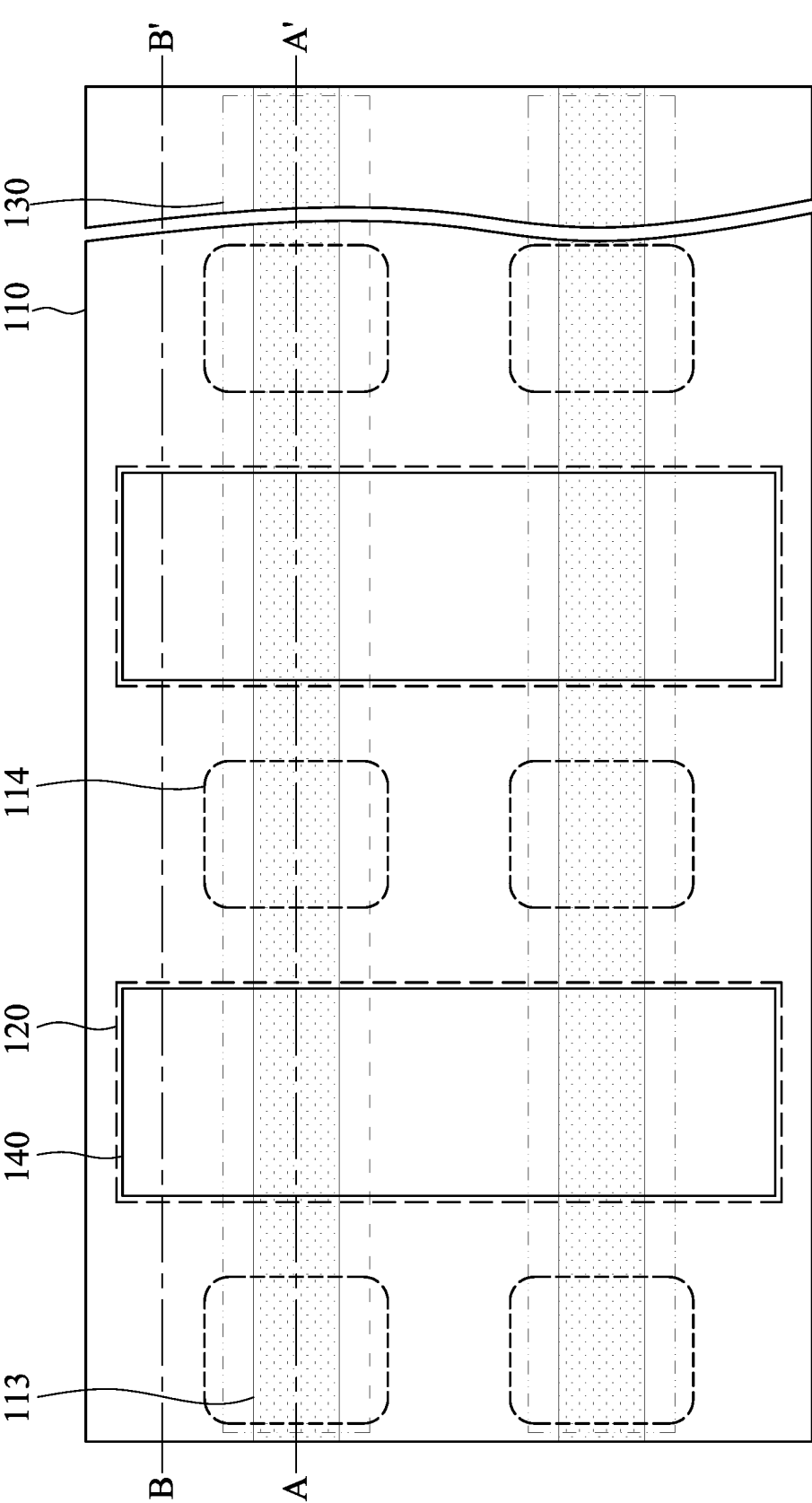
FIG. 18A, FIG. 18B, and FIG. 18C illustrate one or more stages of an exemplary method for manufacturing a semiconductor device according to some embodiments of the present disclosure in different perspectives.
Figure 18B:
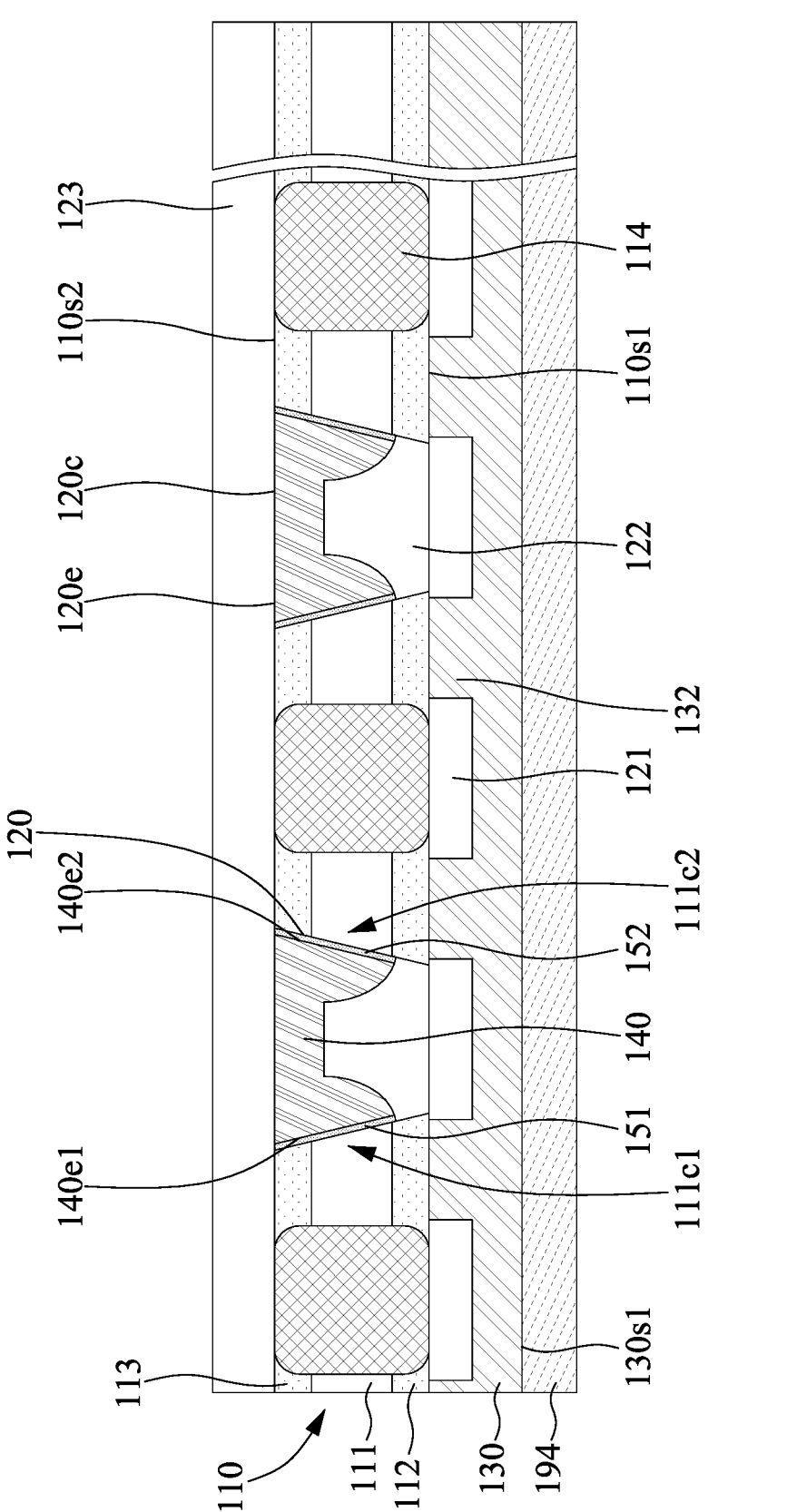
Figure 18C:
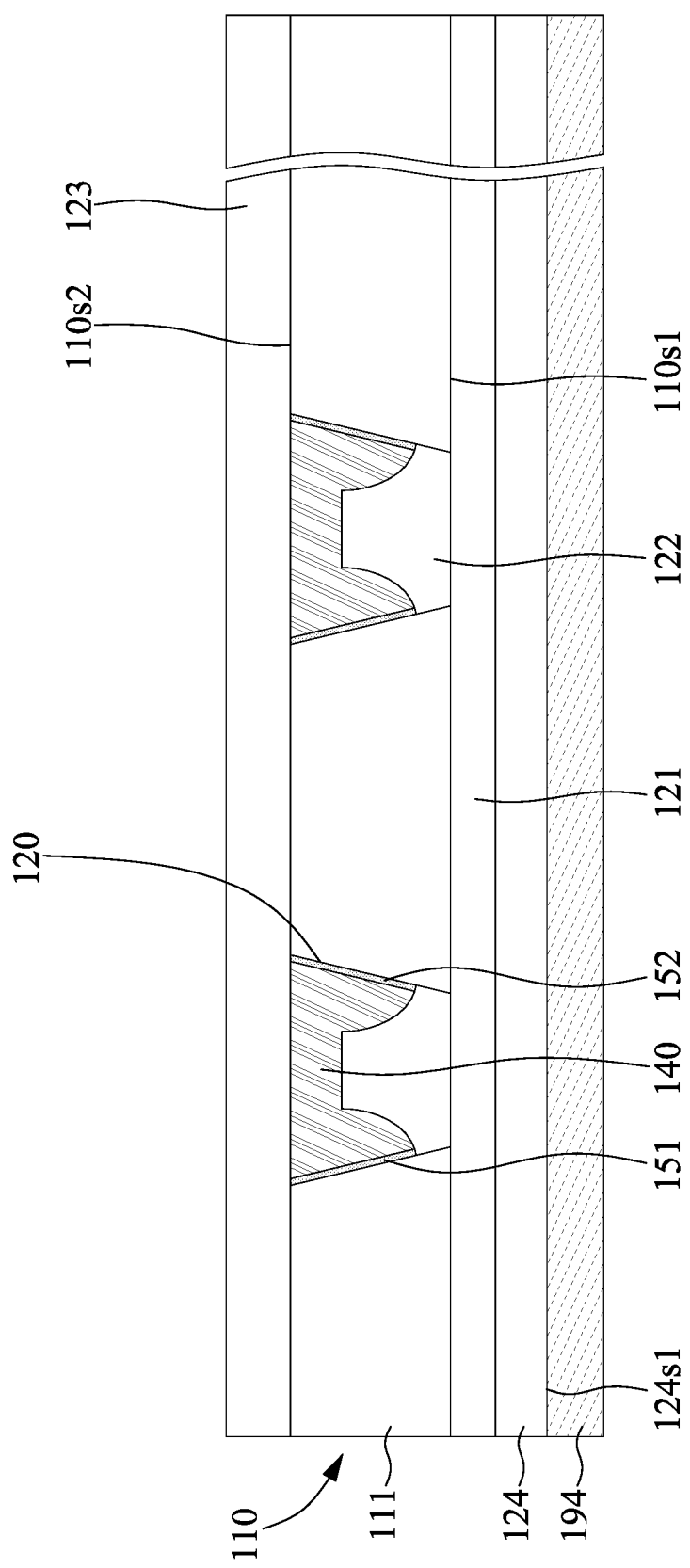

Referring to FIG. 18A, FIG. 18B, and FIG. 18C, a dielectric layer 123 may be formed on the word line 140. The dielectric layer 123 may be formed on the surface 110s2 of the substrate 110. The dielectric layer 123 may be formed by CVD, ALD, LPCVD, PECVD, PVD, or other suitable processes.

Figure 19A:
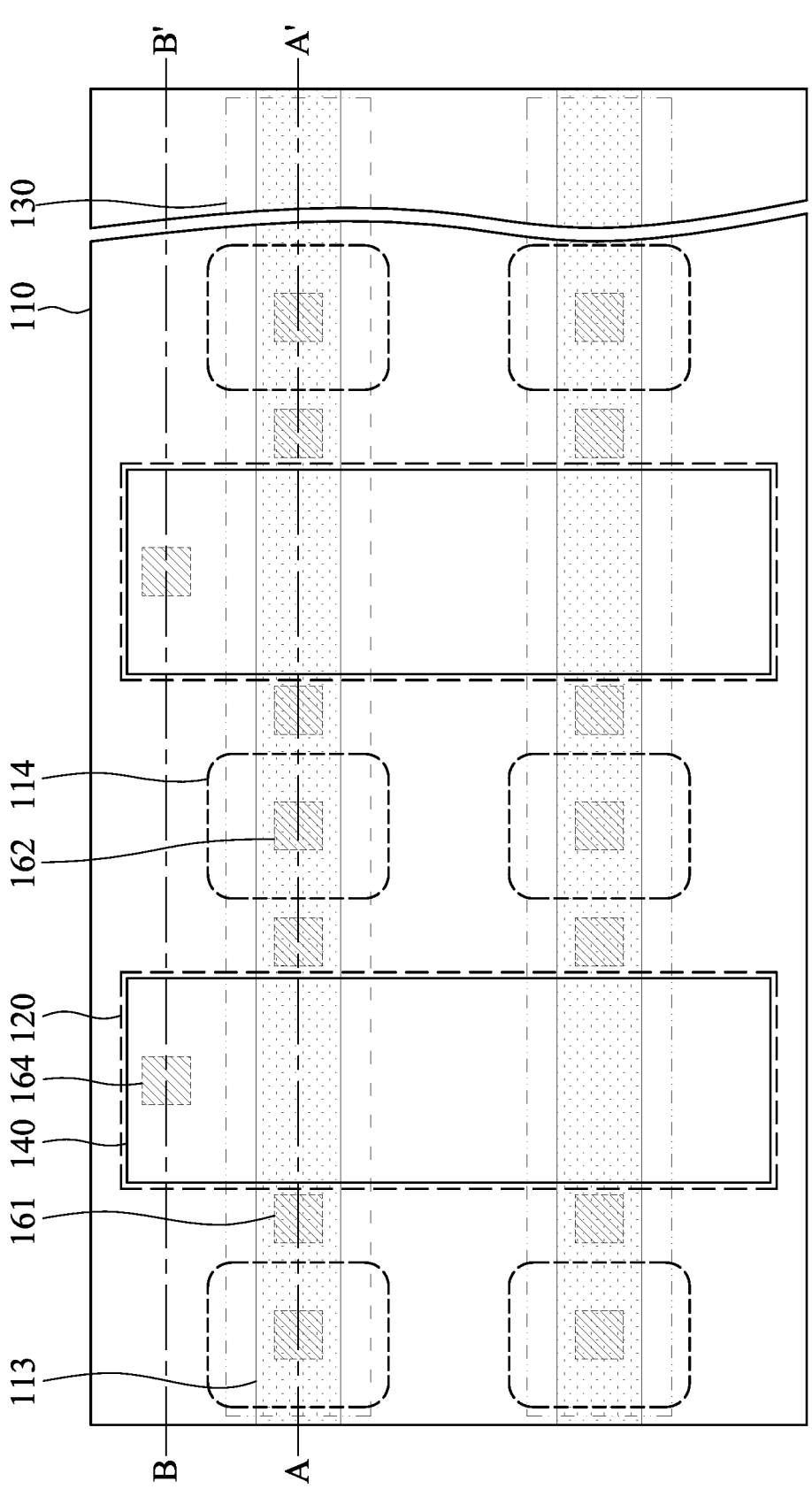
FIG. 19A, FIG. 19B, and FIG. 19C illustrate one or more stages of an exemplary method for manufacturing a semiconductor device according to some embodiments of the present disclosure in different perspectives.
Figure 19B:
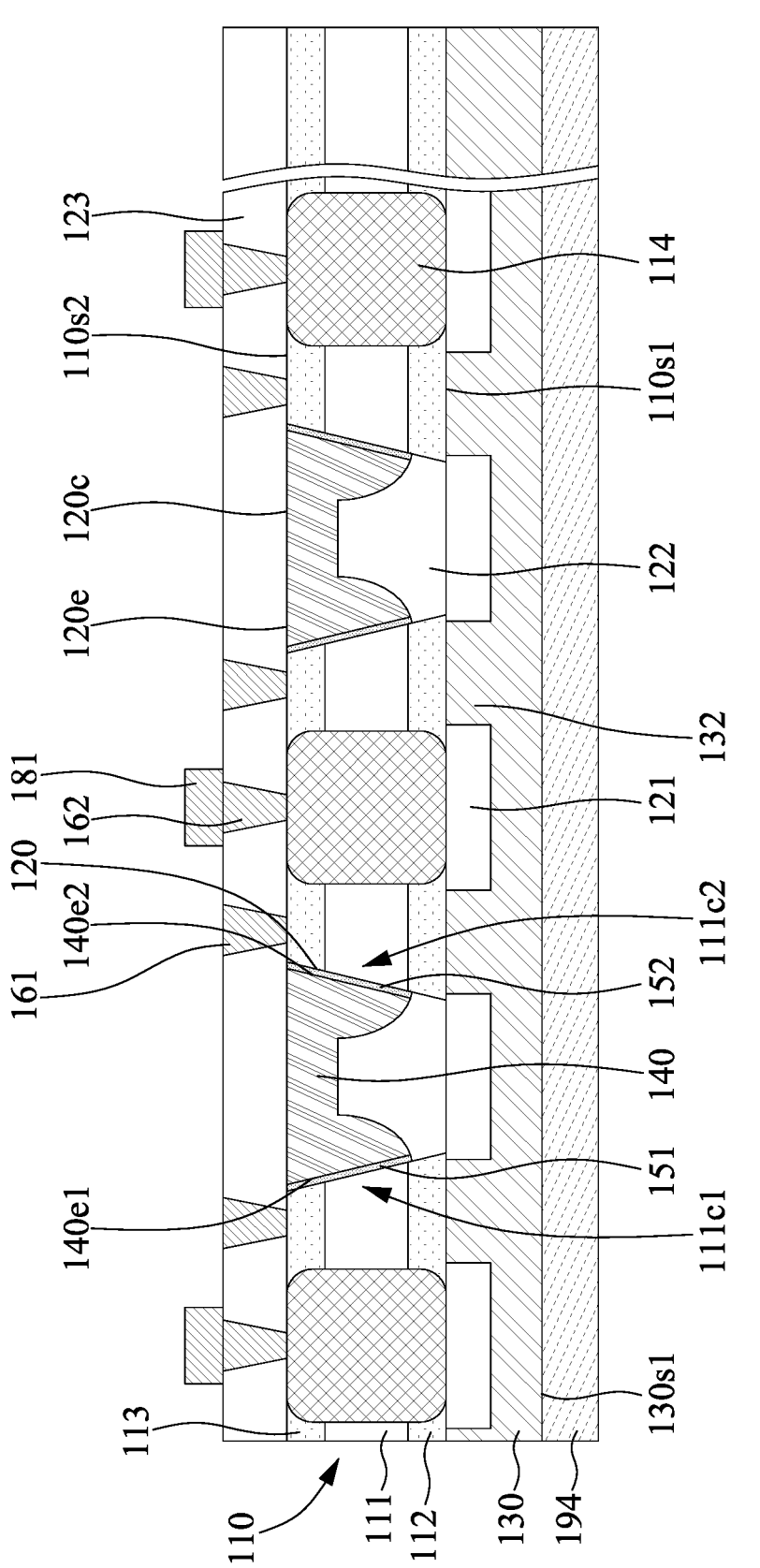
Figure 19C:
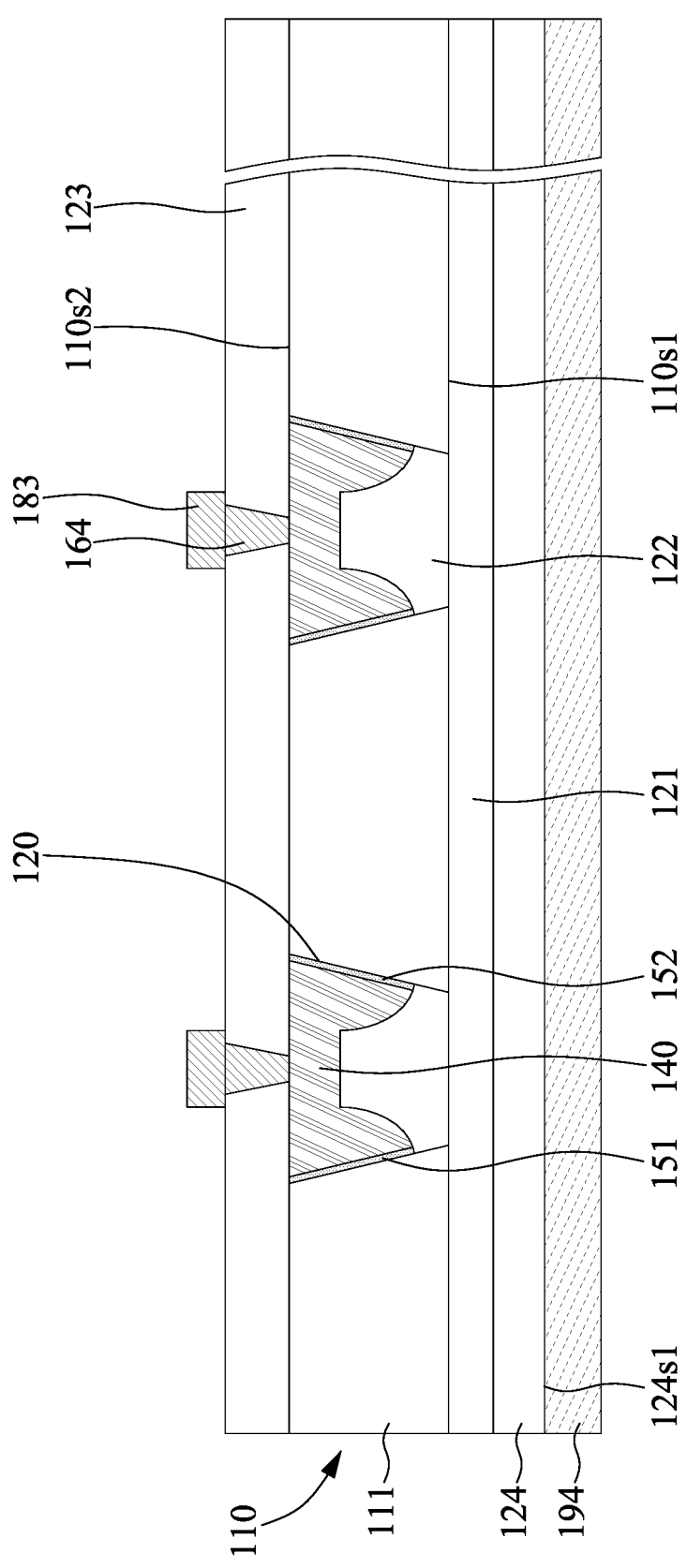

Referring to FIG. 19A, FIG. 19B, and FIG. 19C, conductive vias 161, 162, and 164 may be formed. Conductive traces 181 and 183 may be formed. The dielectric layer 123 may be patterned to define openings, a conductive layer may be formed on the dielectric layer 123 and fill the openings, and the conductive layer may be patterned to form the conductive vias 161, 162, and 164 as well as the conductive traces 181 and 183.

Figure 20A:
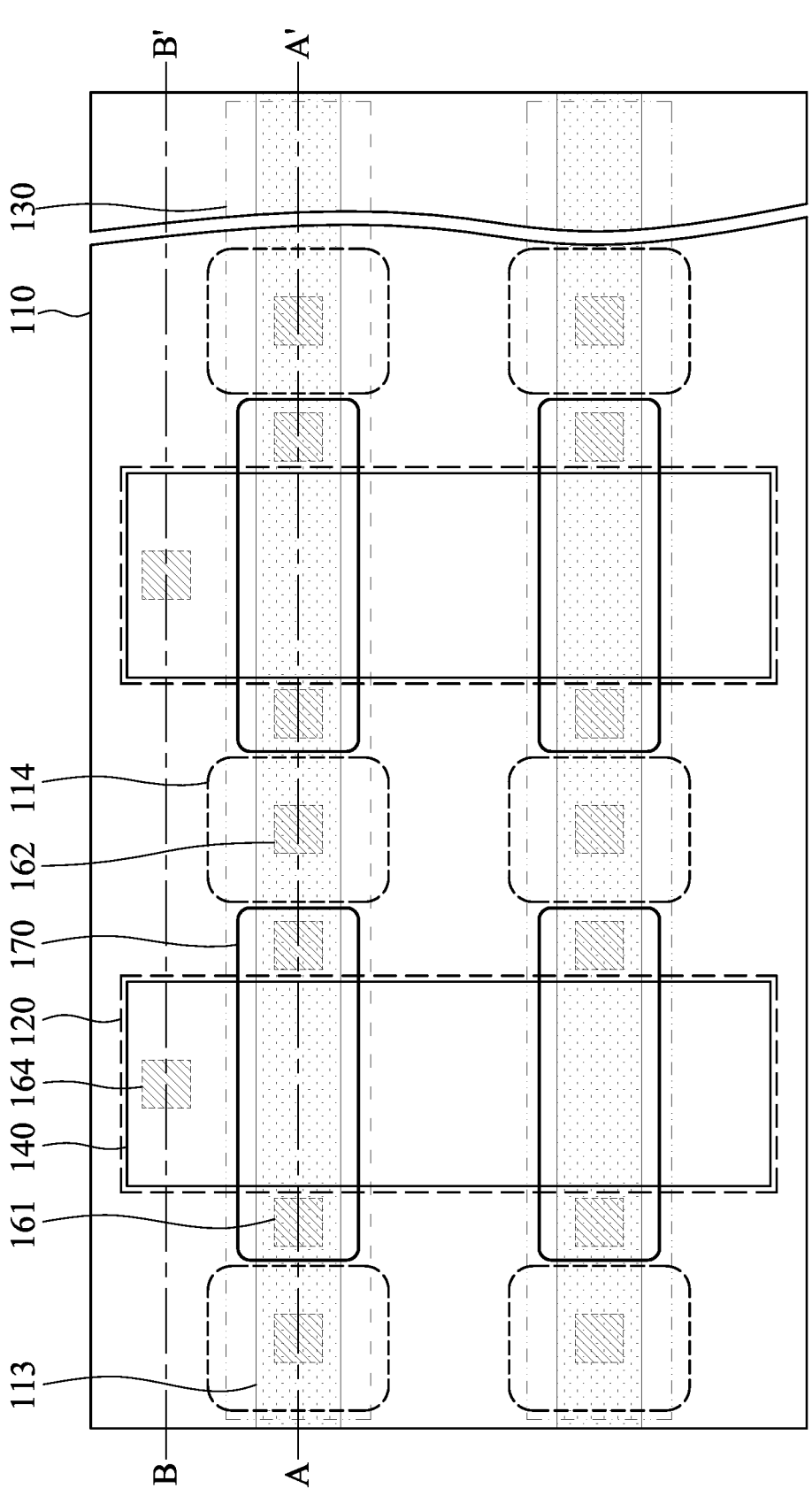
FIG. 20A, FIG. 20B, and FIG. 20C illustrate one or more stages of an exemplary method for manufacturing a semiconductor device according to some embodiments of the present disclosure in different perspectives.
Figure 20B:
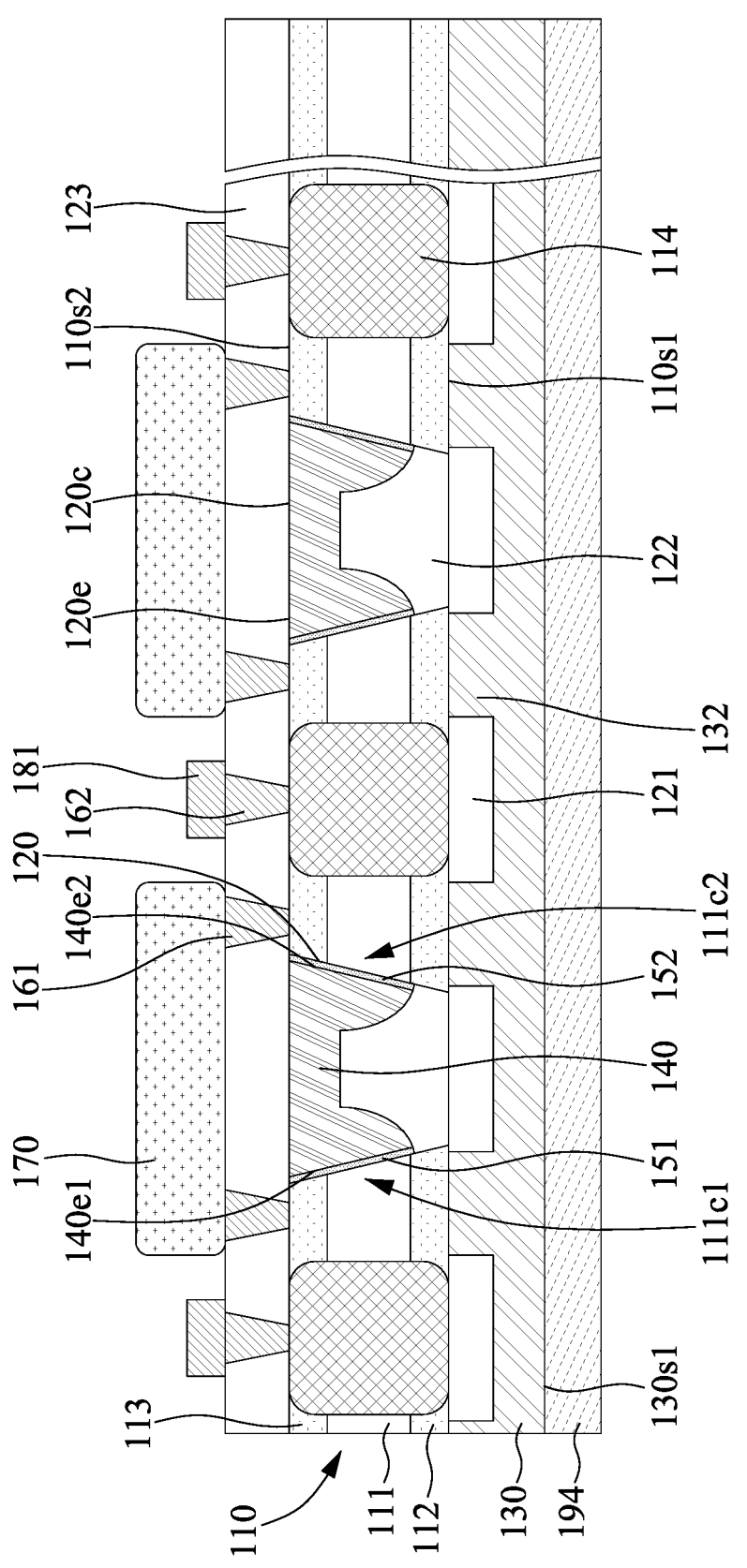
Figure 20C:
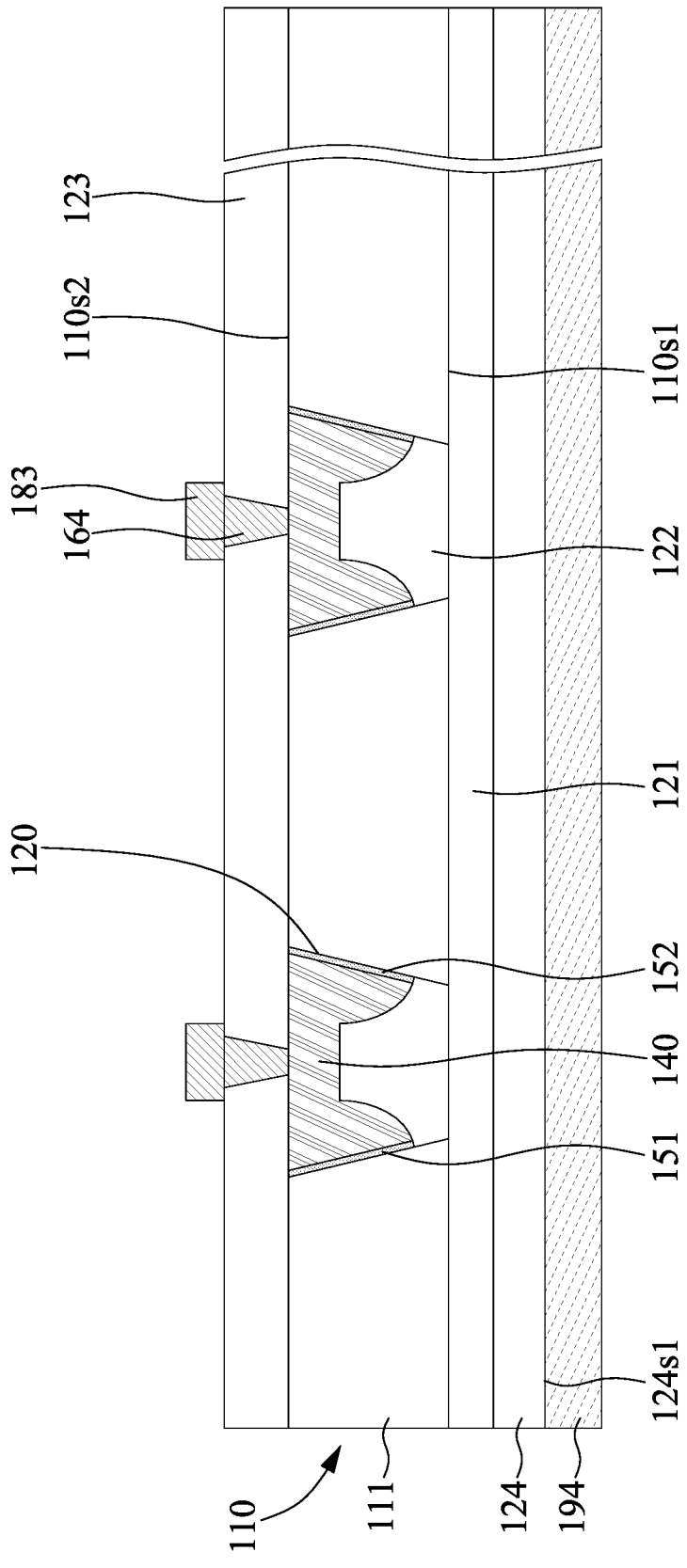

Referring to FIG. 20A, FIG. 20B, and FIG. 20C, a capacitor 170 may be formed on the dielectric layer 123. The capacitor 170 may be electrically connected to the conductive via 161.

Figure 21A:
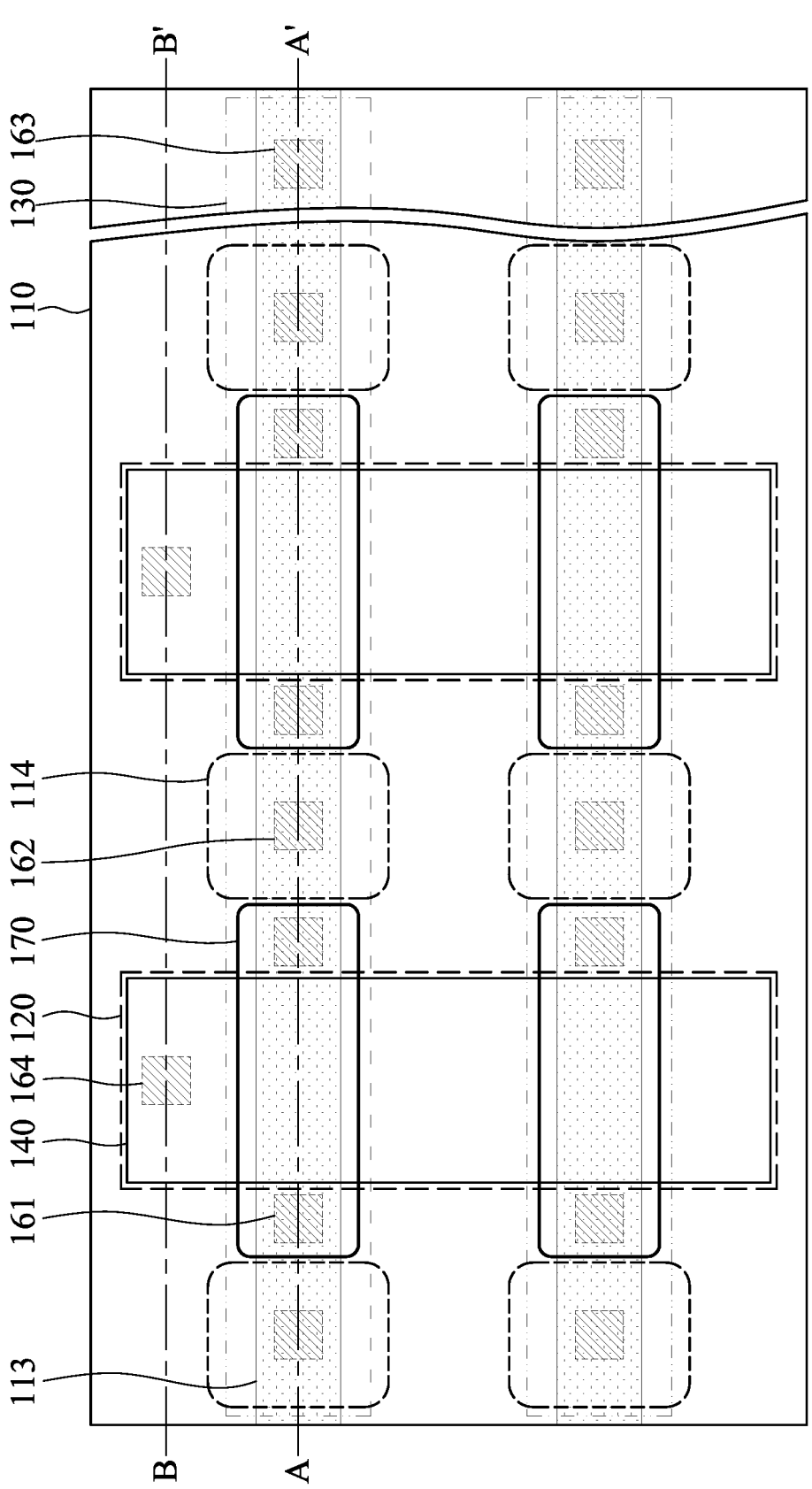
FIG. 21A, FIG. 21B, and FIG. 21C illustrate one or more stages of an exemplary method for manufacturing a semiconductor device according to some embodiments of the present disclosure in different perspectives.
Figure 21B:
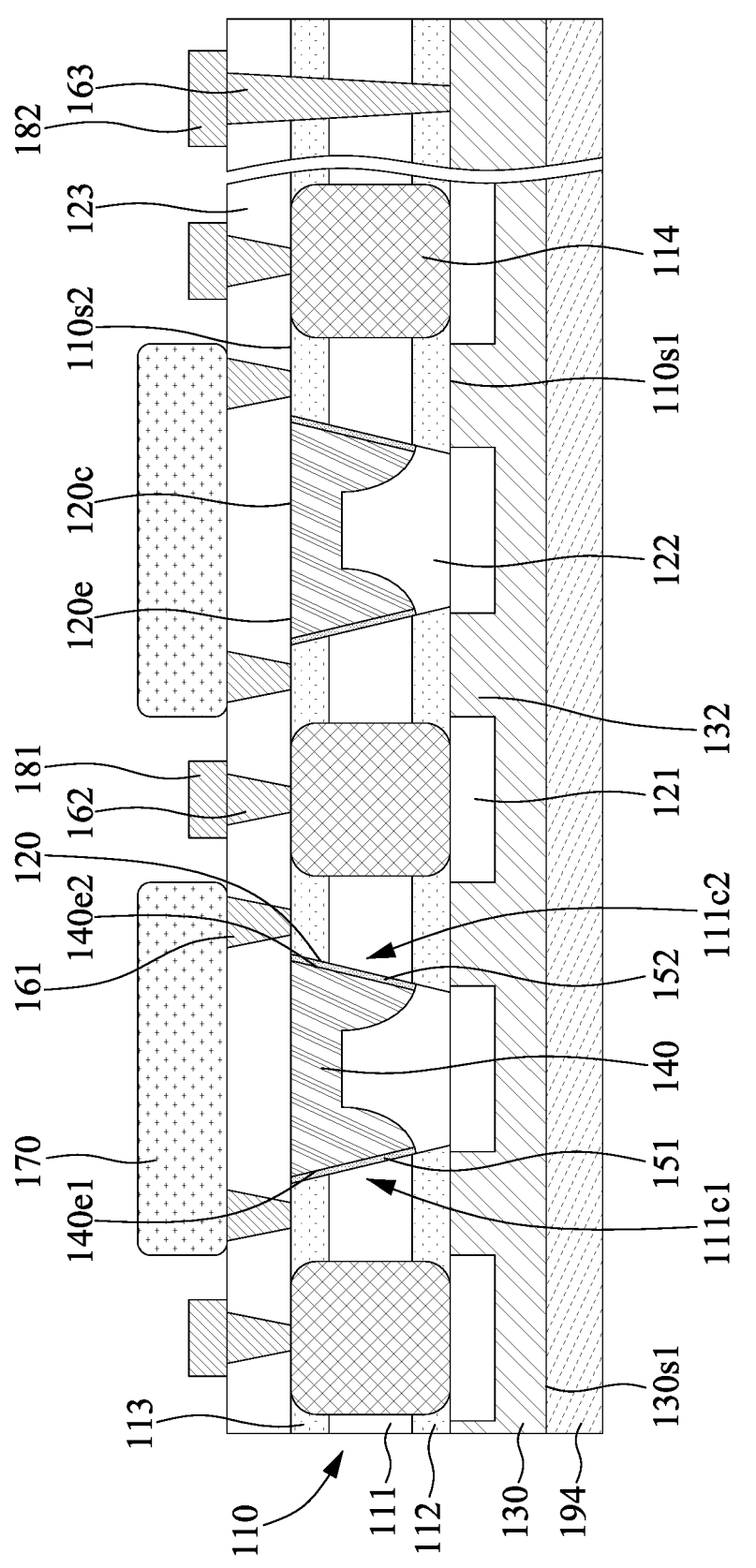
Figure 21C:
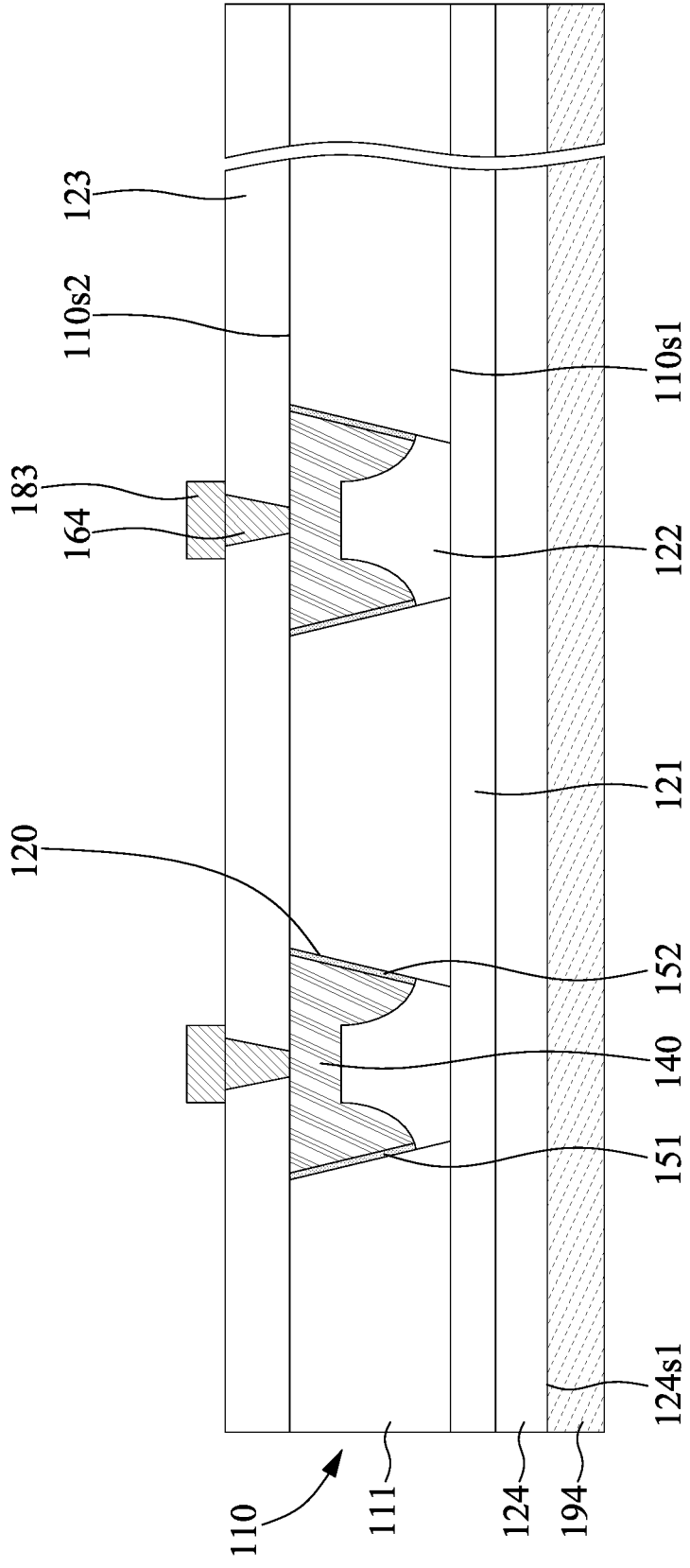

Referring to FIG. 21A, FIG. 21B, and FIG. 21C, a conductive via 163 and a conductive trace 182 may be formed. In some embodiments, an etching process, such as dry etching, may be performed to form an opening penetrating the dielectric layer 123 and the substrate 110 to expose the bit line 130, a conductive layer may be formed on the dielectric layer 123 and fill the openings, and the conductive layer may be patterned to form the conductive via 163 and the conductive trace 182.

Figure 22A:
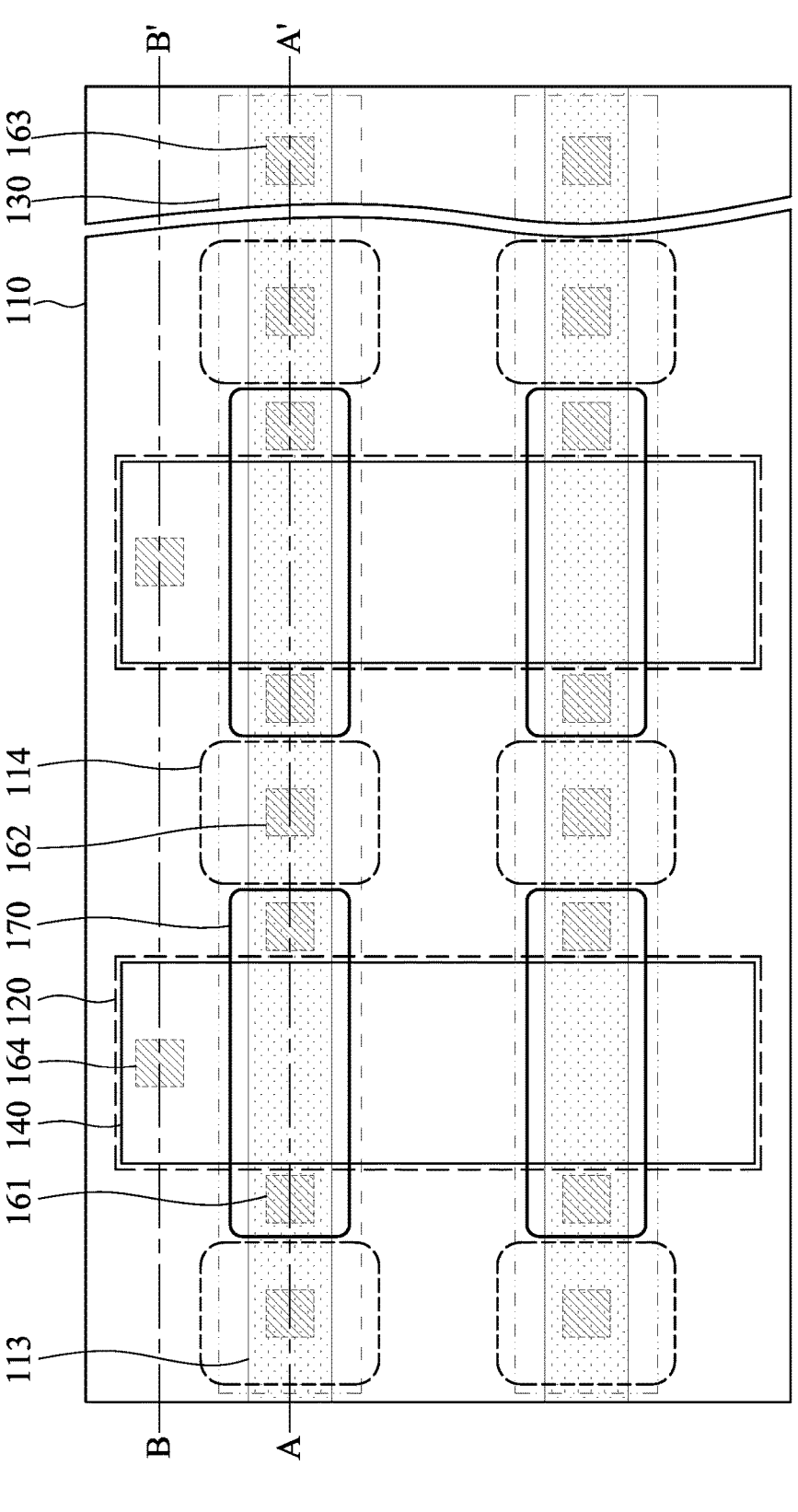
FIG. 22A, FIG. 22B, and FIG. 22C illustrate one or more stages of an exemplary method for manufacturing a semiconductor device according to some embodiments of the present disclosure in different perspectives.
Figure 22B:
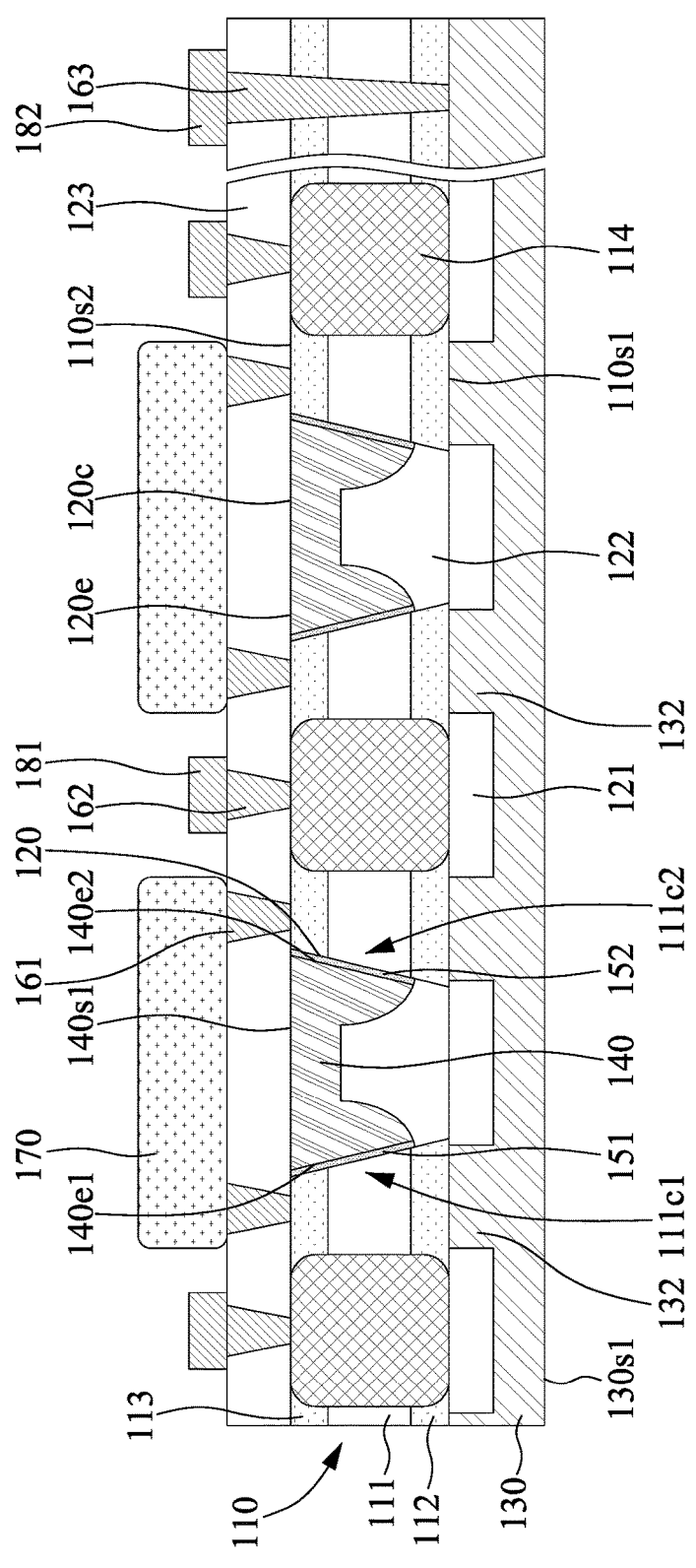
Figure 22C:
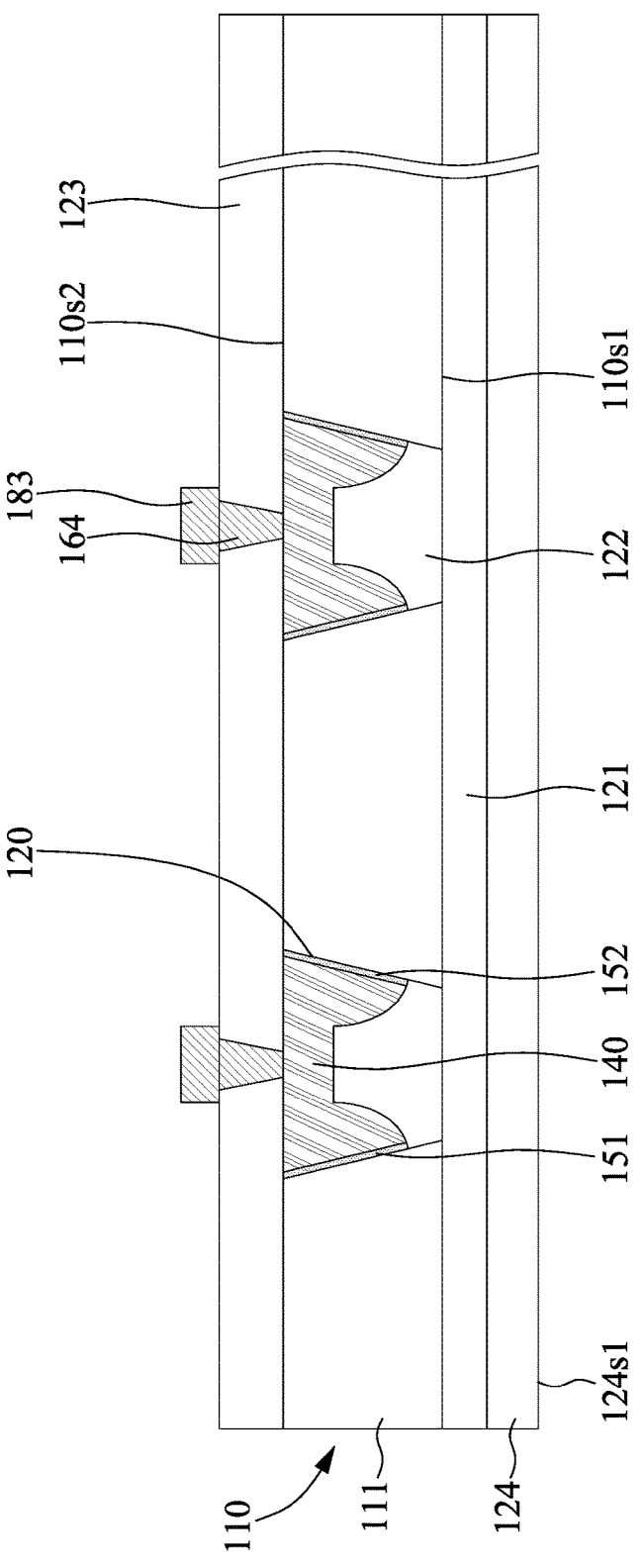

Referring to FIG. 22A, FIG. 22B, and FIG. 22C, the supporter 194 may be removed. As a result, a semiconductor device, such as the semiconductor device 100 as shown in FIG. 1A, FIG. 1B, and FIG. 1C, may be produced. The fill layer 124 and the bit line 130 may collectively define a hybrid bonding structure so that the semiconductor device 100 may be bonded to another device.

Figure 23A:
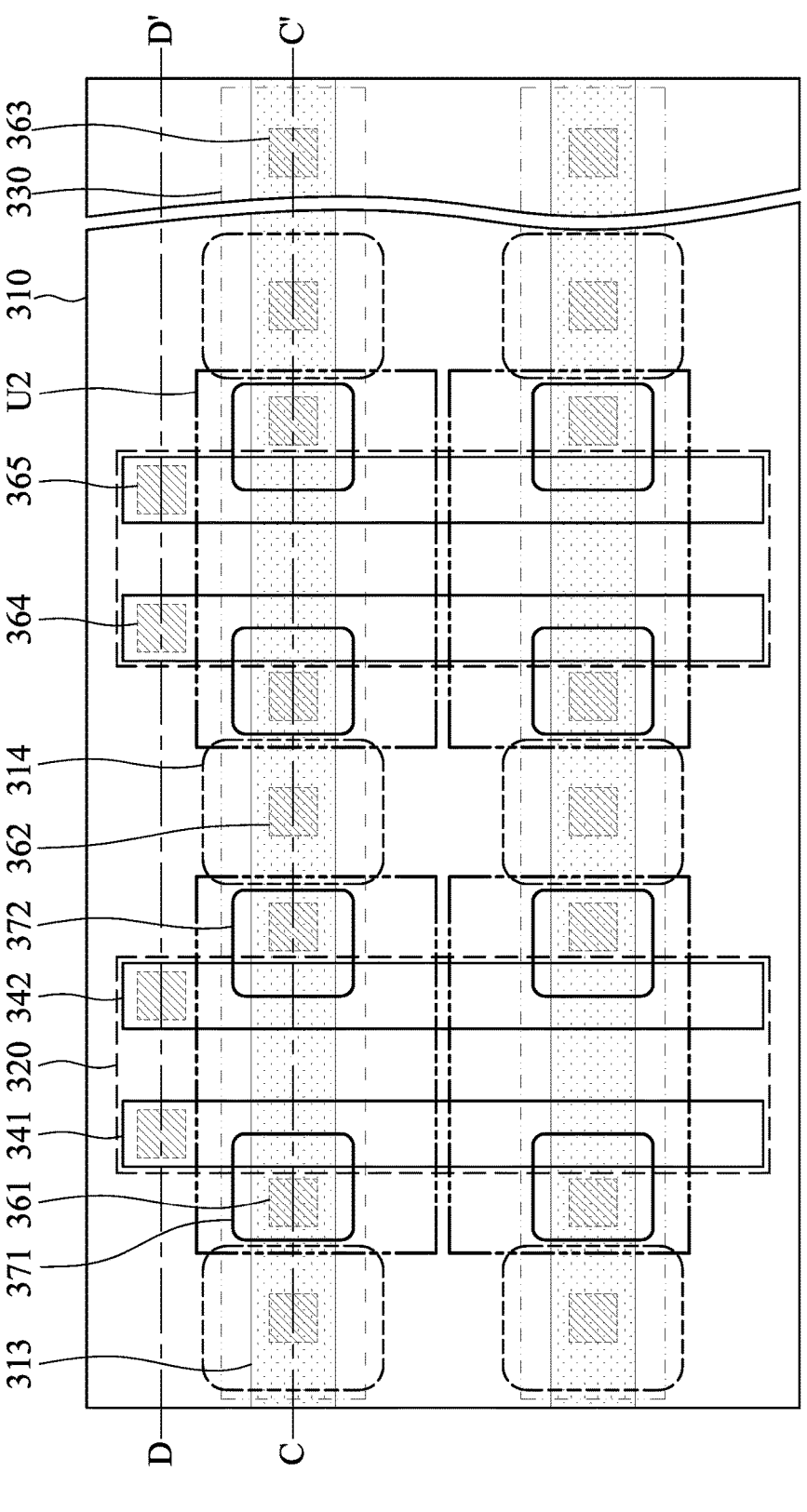
FIG. 23A is a top view of a semiconductor device, in accordance with some embodiments of the present disclosure.
Figure 23B:
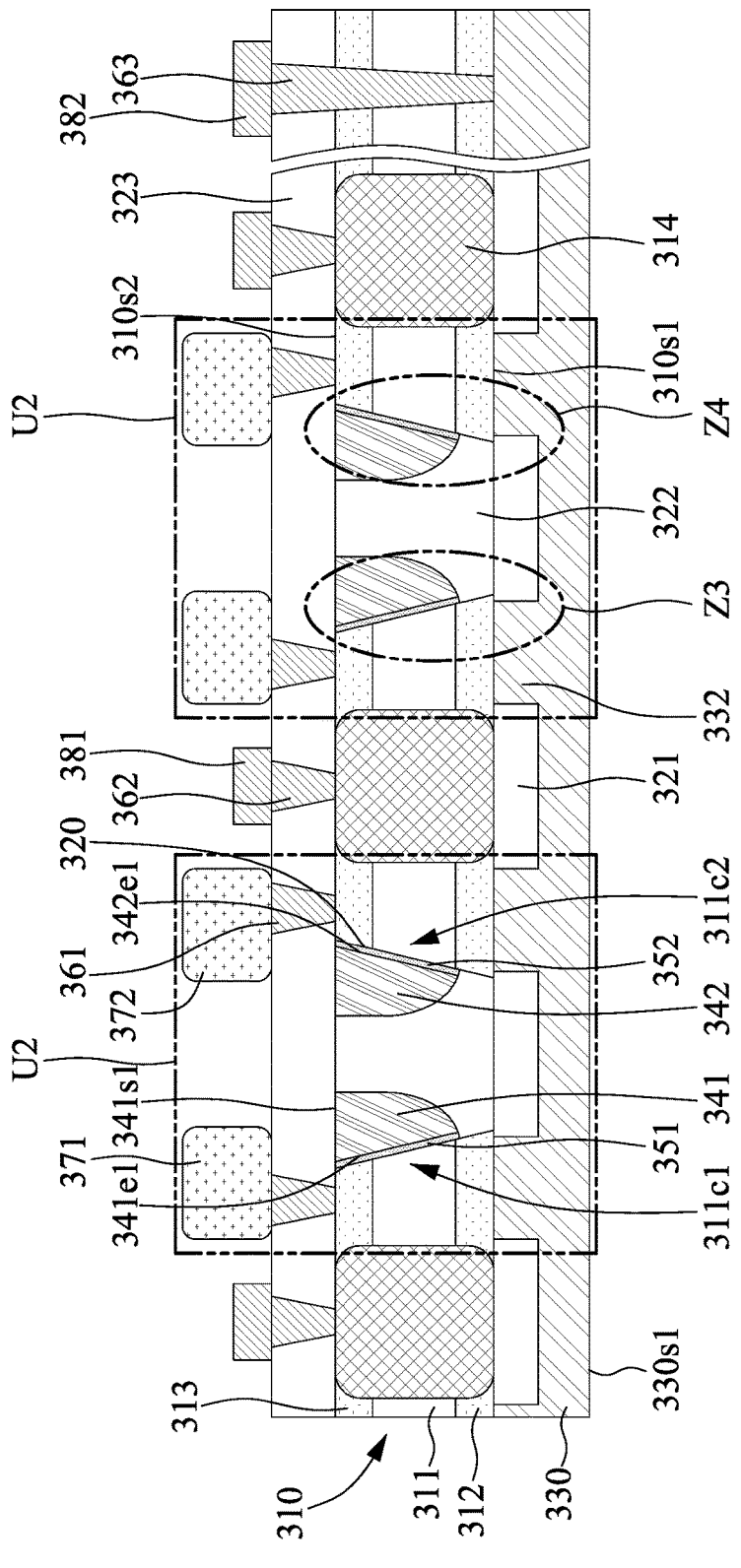
FIG. 23B is a cross-section along line C-C' of the semiconductor device as shown in FIG. 23A, in accordance with some embodiments of the present disclosure.
Figure 23C:
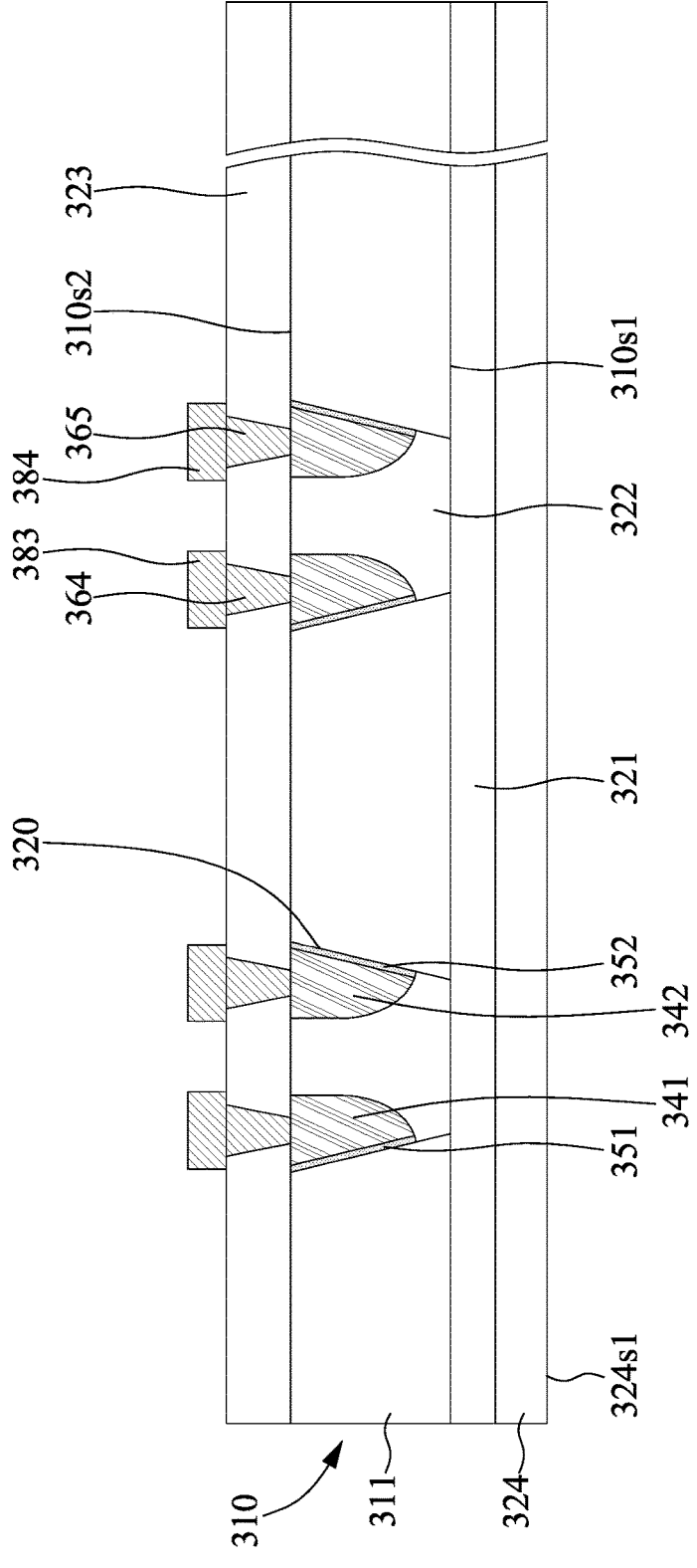
FIG. 23C is a cross-section along line D-D' of the semiconductor device as shown in FIG. 23A, in accordance with some embodiments of the present disclosure.

Referring to FIG. 23A, FIG. 23B, and FIG. 23C, FIG. 23A is a top view of a semiconductor device 300, FIG. 23B is a cross-section along line C-C' of the semiconductor device 300 as shown in FIG. 23A, and FIG. 23C is a cross-section along line D-D' of the semiconductor device 300 as shown in FIG. 23A, in accordance with some embodiments of the present disclosure. The semiconductor device 300 may be included in a memory device. The memory device may include, for example, a DRAM device, an OTP memory device, a SRAM device, or other suitable memory devices.

As shown in FIG. 23A, the semiconductor device 300 may include a plurality of unit cells U2. In some embodiments, each of the unit cells U2 may include two transistors (such as denotations Z3 and Z4 labeled in FIG. 23B) and two capacitors 371 and 372. The semiconductor device 300 may include a substrate 310. In some embodiments, the semiconductor device 300 may include a plurality of openings 320. The opening 320 may have a strip profile. The substrate 310 may include a plurality of doped regions 313. In some embodiments, the region of the substrate 310 corresponding to the doped region 313 may also be referred to as an active region. The semiconductor device 300 may include a plurality of doped regions 314. Each of the doped regions 314 may be configured to isolate adjacent unit cells U2. The semiconductor device 300 may include a plurality of bit lines 330. The semiconductor device 300 may include a plurality of word lines 341 extending across the plurality of bit lines 330. The semiconductor device 300 may include a plurality of word lines 342 extending across multiple bit lines 330. In some embodiments, each of the word lines 341 and 342 may be located or embedded within the corresponding opening 320 defined by the substrate 310. Each of the openings 320 may extend across multiple bit lines 330. The semiconductor device 300 may include conductive vias 361, 362, 363, 364, and 365. The conductive via 361 may be electrically connected to the doped region 313. The conductive via 362 may be electrically connected to the doped region 314. The conductive via 363 may be disposed at an end of the bit line 330 and electrically connected to the bit line 330. The conductive via 364 may be disposed at an end of the word line 341 and electrically connected to the word line 341. The conductive via 365 may be disposed at an end of the word line 342 and electrically connected to the word line 342.

As shown in FIG. 23B, the substrate 310 may have a surface 310s1 (or a bottom surface) and a surface 310s2 (or a top surface) opposite to the surface 310s1. The substrate 310 may be a semiconductor substrate, such as a bulk semiconductor, a semiconductor-on-insulator (SOI) substrate, or the like. The substrate 310 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 310 may have a multilayer structure, or the substrate 310 may include a multilayer compound semiconductor structure. It should be noted that some doped regions, isolation structures, and/or other features may be formed within the substrate 310.

The substrate 310 may have a well region 311. The well region 311 may have a relatively small dopant concentration. The well region 311 may have a first conductive type. In some embodiments, the first conductive type may be an n type or a p type. In some embodiments, n type dopants may include, for example, arsenic (As), phosphorus (P), other group V elements, or any combination thereof. In some embodiments, p type dopants may include, for example, boron (B), other group III elements, or any combination thereof.

The substrate 310 may have a doped region 312. The doped region 312 may be disposed adjacent to the surface 310s1 of the substrate 310. The doped region 312 may have the first conductive type. The doped region 312 may be in contact with the well region 311. The doped region 312 may have a relatively large dopant concentration. The dopant concentration of the doped region 312 may be greater than that of the well region 311.

The doped region 313 may be disposed adjacent to the surface 310s2 of the substrate 310. The doped region 313 may have the first conductive type. The doped region 313 may be in contact with the well region 311. The doped region 313 may have a relatively large dopant concentration. The dopant concentration of the doped region 313 may be greater than that of the well region 311. The well region 311 may be disposed between the doped regions 312 and 313.

The substrate 310 may have a doped region 314. In some embodiments, the doped region 314 may be disposed over or within the active region. In some embodiments, the doped region 314 may continuously extend between the surface 310s1 and surface 310s2 of the substrate 310. In some embodiments, the doped region 314 may have a second conductive type different from the first conductive type. The doped region 314 may have a relatively large dopant concentration. The dopant concentration of the doped region 314 may be greater than that of the well region 311. In some embodiments, the doped region 314 may be disposed between adjacent unit cells U2. In some embodiments, the doped region 314 may serve as an isolation feature configured to isolate an electrical path between unit cells U2 through the substrate 310.

The opening 320 may penetrate substrate 310. In some embodiments, the opening 320 may be tapered from the surface 310s2 toward the surface 310s1 of the substrate 310.

The semiconductor device 300 may include a dielectric layer 321. In some embodiments, the dielectric layer 321 may be disposed on the surface 310s1 of the substrate 310. In some embodiments, the dielectric layer 321 may cover the doped region 314. In some embodiments, the dielectric layer 321 may vertically overlap the word lines 341 and 342. In some embodiments, the dielectric layer 321 may define a pattern exposing a portion of the well region 311. The dielectric layer 321 may include silicon oxide, silicon nitride, silicon oxynitride, or a combination thereof.

The semiconductor device 300 may include an isolation layer 322. In some embodiments, the isolation layer 322 may be disposed on the dielectric layer 321. In some embodiments, the isolation layer 322 may be disposed within the opening 320 defined by the substrate 310. In some embodiments, the isolation layer 322 may include silicon oxide, silicon nitride, silicon oxynitride, or a combination thereof. In some embodiments, a trench may be defined by the substrate 310 and the isolation layer 322. The word lines 341 and 342 are located within the same trench.

The semiconductor device 300 may include a dielectric layer 323. In some embodiments, the dielectric layer 323 may be disposed on the surface 310s2 of the substrate 310. In some embodiments, the dielectric layer 323 may cover the word lines 341 and 342. The dielectric layer 323 may include silicon oxide, silicon nitride, silicon oxynitride, or a combination thereof.

In some embodiments, the bit line 330 may be disposed on the dielectric layer 321. In some embodiments, the bit line 330 may be disposed on the surface 310s1 of the substrate 310. The bit line 330 may include conductive materials, such as tungsten, copper, aluminum, tantalum, tantalum nitride, titanium, titanium nitride, the like, and/or a combination thereof.

The semiconductor device 300 may include a conductive via 332. In some embodiments, the conductive via 332 may fill the openings defined by the dielectric layer 321. The conductive via 332 may extend between the surface 310s1 of the substrate 310 and the bit line 330. The conductive via 332 may include conductive materials, such as tungsten, copper, aluminum, tantalum, tantalum nitride, titanium, titanium nitride, the like, and/or a combination thereof.

In some embodiments, each of the word lines 341 and 342 may be disposed within the opening 320 defined by the substrate 310. In some embodiments, each of the word lines 341 and 342 may be disposed within the trench defined by the substrate 310 and the isolation layer 322. In some embodiments, each of the word lines 341 and 342 may cover the isolation layer 322. In some embodiments, each of the word lines 341 and 342 may be at least partially tapered along a direction from the surface 310s2 toward the surface 310s1 of the substrate 310. In some embodiments, each of the word lines 341 and 342 may be spaced apart from the bit line 330 by the dielectric layer 321 and the isolation layer 322. The word lines 341 and 342 may include conductive materials, such as tungsten, copper, aluminum, tantalum, tantalum nitride, titanium, titanium nitride, the like, and/or a combination thereof. In some embodiments, the word lines 341 and 342 may include a semiconductor material, such as polysilicon. The word line 341 may have a surface 341s1 (or a top surface). In some embodiments, the surface 341s1 of the word line 341 may be exposed from the substrate 310. In some embodiments, the surface 341s1 of the word line 341 may be substantially coplanar with the surface 310s2 of the substrate 310. In some embodiments, the word line 341 may be spaced apart from the word line 342 by the isolation layer 322.

The semiconductor device 300 may include a gate dielectric layer 351 and a gate dielectric layer 352. In some embodiments, the gate dielectric layer 351 may be disposed within the opening 320 defined by the substrate 310. In some embodiments, the gate dielectric layer 351 may be disposed at a side 341e1 of the word line 341. In some embodiments, a top surface (not annotated) of the gate dielectric layer 351 may be substantially coplanar with the surface 310s2 of the substrate 310. In some embodiments, the top surface of the gate dielectric layer 351 may be substantially coplanar with the surface 341s1 of the word line 341. In some embodiments, the gate dielectric layer 351 may be in contact with the isolation layer 322. The bottom of the gate dielectric layer 351 may be connected to the isolation layer 322. In some embodiments, the word line 341 may be spaced apart from the substrate 310 by the gate dielectric layer 351.

In some embodiments, the gate dielectric layer 352 may be disposed within the opening 320 defined by the substrate 310. In some embodiments, the gate dielectric layer 352 may be disposed at a side 342e1 of the word line 342. In some embodiments, a top surface (not annotated) of the gate dielectric layer 352 may be substantially coplanar with the surface 310s2 of the substrate 310. The word line 342 may be spaced apart from the substrate 310 by the gate dielectric layer 352. In some embodiments, the top surface of the gate dielectric layer 152 may be substantially coplanar with the surface 341s1 of the word line 341. The bottom of the gate dielectric layer 352 may be connected to the isolation layer 322. In some embodiments, the gate dielectric layer 351 may be nonparallel to the gate dielectric layer 352. Each of the gate dielectric layers 351 and 352 may include silicon oxide, silicon nitride, silicon oxynitride, or a combination thereof. In some embodiments, each of the gate dielectric layers 351 and 352 may include a high-k dielectric material(s). The high-k dielectric material may have a dielectric constant (k value) exceeding 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material.

In some embodiments, the substrate 310 may define a channel 311$c$1 abutting the gate dielectric layer 351. In some embodiments, the substrate 310 may define a channel 311$c$2 abutting the gate dielectric layer 352. In some embodiments, the substrate 310, the bit line 330, and the word line 341 may define a transistor Z3. In some embodiments, the substrate 310, the bit line 330, and the word line 342 may define a transistor Z4. The doped regions 312 and 313 may serve as a source/drain feature. In some embodiments, the transistors Z3 and Z4 may at least partially located within the same opening 320 defined by the substrate 310.

The conductive via 361 may be disposed on the surface 310$s$2 of the substrate 310. The conductive via 361 may be disposed within the dielectric layer 323. The conductive via 361 may be electrically connected to the doped region 313.

The conductive via 362 may be disposed on the surface 310$s$2 of the substrate 310. The conductive via 362 may be disposed within the dielectric layer 323. The conductive via 362 may be electrically connected to the doped region 314.

The conductive via 363 may penetrate the substrate 310. The conductive via 363 may penetrate the dielectric layer 323. The conductive via 363 may be electrically connected to the bit line 330. In some embodiments, each of the conductive vias 361, 362, and 363 may include conductive materials, such as tungsten, copper, aluminum, tantalum, tantalum nitride, titanium, titanium nitride, the like, and/or a combination thereof.

In some embodiments, the capacitors 371 and 372 may be disposed on the surface 310$s$2 of the substrate 310. The capacitors 371 and 372 may be disposed on the dielectric layer 323. In some embodiments, the capacitors 371 and/or 372 may be electrically connected to the conductive via 361. The capacitor 371 may cover the word line 341. The capacitor 372 may cover the word line 342. In some embodiments, the capacitor 371 may be electrically connected to the transistor Z3. In some embodiments, the capacitor 372 may be electrically connected to the transistor Z4. In some embodiments, each of the capacitors 371 and 372 may include a capacitor dielectric layer and two capacitor electrodes. The capacitor dielectric layer may include hafnium oxide, zirconium oxide, lanthanum oxide, yttrium oxide, aluminum oxide, titanium oxide or another applicable material. The capacitor electrode may include conductive materials, such as tungsten, copper, aluminum, tantalum, molybdenum, tantalum nitride, titanium, titanium nitride, the like, and/or a combination thereof.

The semiconductor device 300 may include a conductive trace 381. The conductive trace 381 may be disposed on the conductive via 362. The conductive trace 381 may be electrically connected to the conductive via 362.

The semiconductor device 300 may include a conductive trace 382. The conductive trace 382 may be disposed on the conductive via 363. The conductive trace 382 may be electrically connected to the conductive via 363. Each of the conductive traces 381 and 382 may include conductive materials, such as tungsten, copper, aluminum, tantalum, tantalum nitride, titanium, titanium nitride, the like, and/or a combination thereof.

As shown in FIG. 23C, the semiconductor device 300 may include a fill layer 324. In some embodiments, the fill layer 324 may be disposed on the surface 310$s$1 of the substrate 310. The fill layer 324 may be disposed on the dielectric layer 321. The fill layer 324 may have a surface 324$s$1 (or a bottom surface). In some embodiments, the surface 324$s$1 of the fill layer 324 may be substantially coplanar with a surface 330$s$1 (or a bottom surface), as shown in FIG. 23B, of the bit line 330.

In some embodiments, the fill layer 324 and the bit line 330 may be collectively configured to define a hybrid bonding structure. The hybrid bonding structure may be bonded to other devices (not shown), such as a wafer, a redistribution structure, or other suitable devices.

Each of the conductive vias 364 and 365 may penetrate the dielectric layer 323. The conductive via 364 may be electrically connected to the word line 341. The conductive via 365 may be electrically connected to the word line 342.

The semiconductor device 300 may include conductive traces 383 and 384. The conductive trace 383 may be disposed on the conductive via 364. The conductive trace 383 may be electrically connected to the conductive via 364. The conductive trace 384 may be disposed on the conductive via 365. The conductive trace 384 may be electrically connected to the conductive via 365.

In this embodiments, the word lines 341 and 342 are buried within the substrate 310. The bit line 330 and the capacitors (e.g., 371 and 372) are disposed on two opposite sides of the substrate 310. Each units U2 of the semiconductor device 300 includes two transistors and two capacitors, which enhances the density of transistors per cell. In comparison with conventional semiconductor devices, the semiconductor device 300 of the present disclosure has a better performance.

Figure 24:
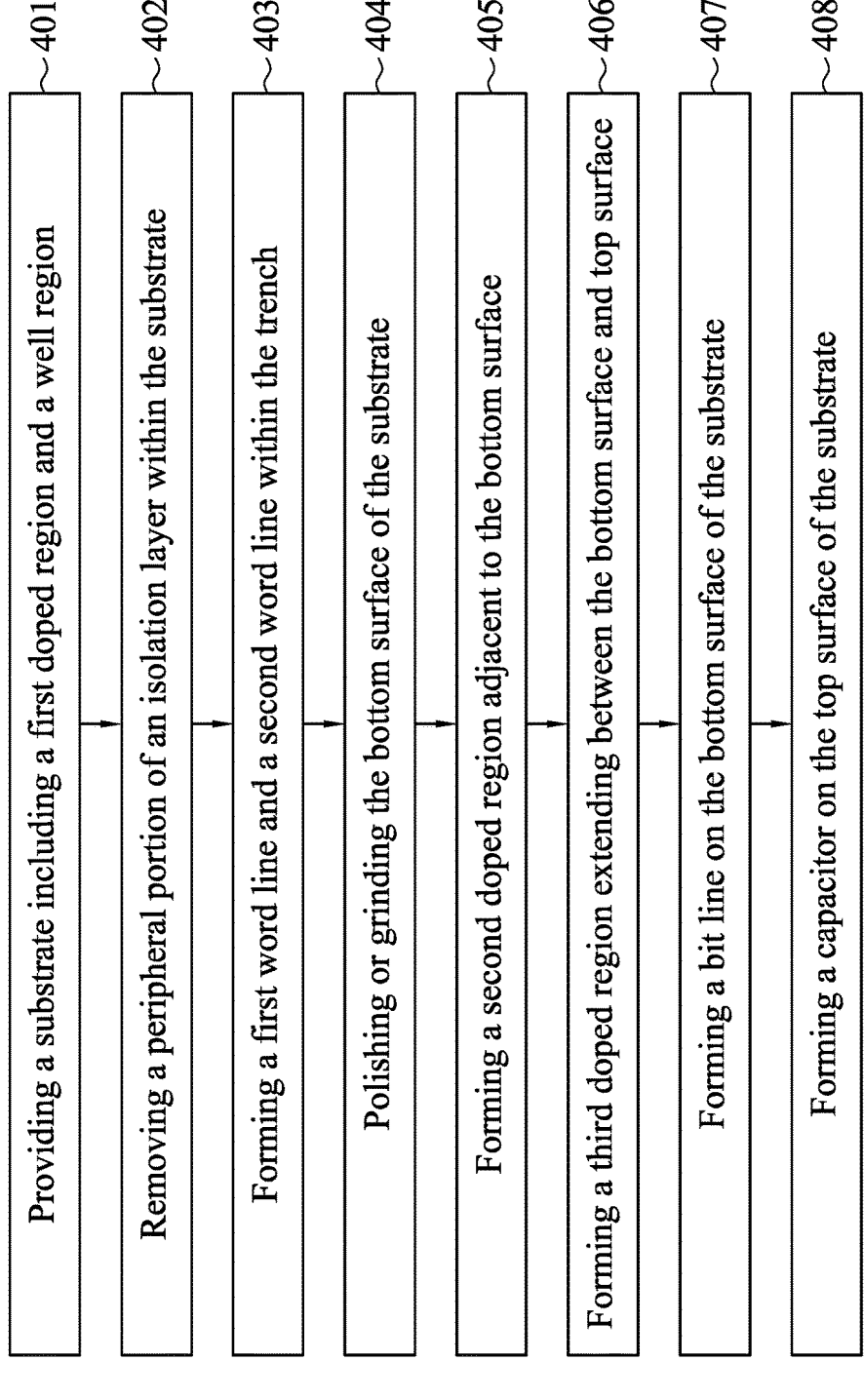
FIG. 24 is a flowchart illustrating a method of manufacturing a semiconductor device, in accordance with some embodiments of the present disclosure.

FIG. 24 is a flowchart illustrating a method 400 of manufacturing a semiconductor device, in accordance with some embodiments of the present disclosure.

The method 400 begins with operation 401 in which a substrate is provided. The substrate has a bottom surface and a top surface. The substrate may have a well region with a first conductive type. A first doped region with the first conductive type may be formed adjacent to the top surface of the substrate. A trench may be formed and recessed from the top surface of the substrate.

The method 400 continues with operation 402 in which a peripheral portion of an isolation layer within the trench may be removed. A first gate dielectric layer and a second gate dielectric layer may be formed on two opposite sidewalls of the trench.

The method 400 continues with operation 403 in which a first word line and a second word line may be formed within the trench.

The method 400 continues with operation 404 in which the bottom surface of the substrate may be polished or grinded. The bottom of the isolation feature is exposed.

The method 400 continues with operation 405 in which a second doped region with the first conductive type may be formed adjacent to the bottom surface of the substrate.

The method 400 continues with operation 406 in which a third doped region with a second conductive type may be formed between the top surface and the bottom surface of the substrate.

The method 400 continues with operation 407 in which a bit line may be formed on the bottom surface of the substrate.

The method 400 continues with operation 408 in which a first capacitor and a second capacitor may be formed on the top surface of the substrate The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 24. In some embodiments, the method 400 can include one or more operations depicted in FIG. 24.

Figure 25A:
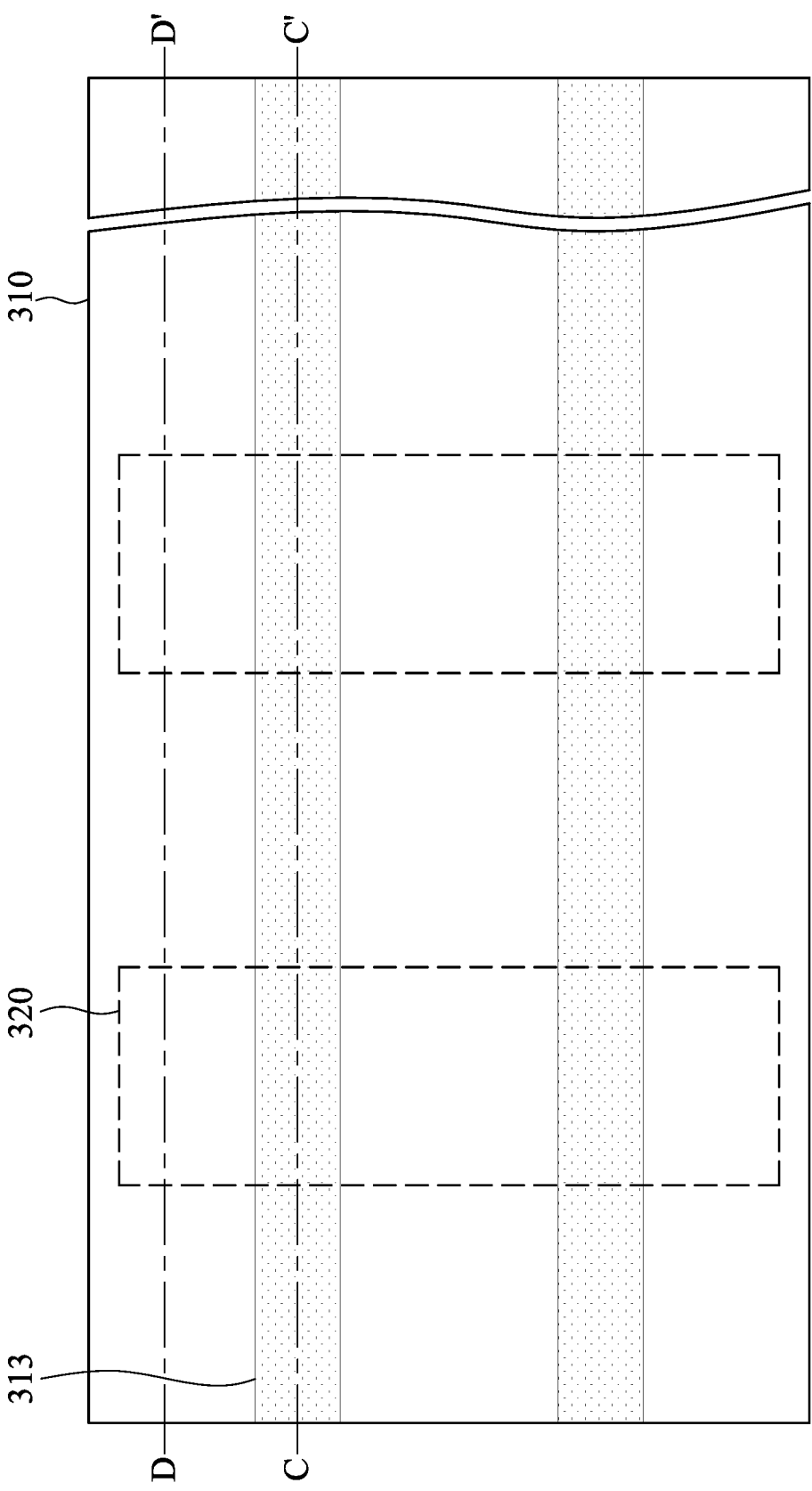
FIG. 25A, FIG. 25B, and FIG. 25C illustrate one or more stages of an exemplary method for manufacturing a semiconductor device according to some embodiments of the present disclosure in different perspectives.
Figure 25B:
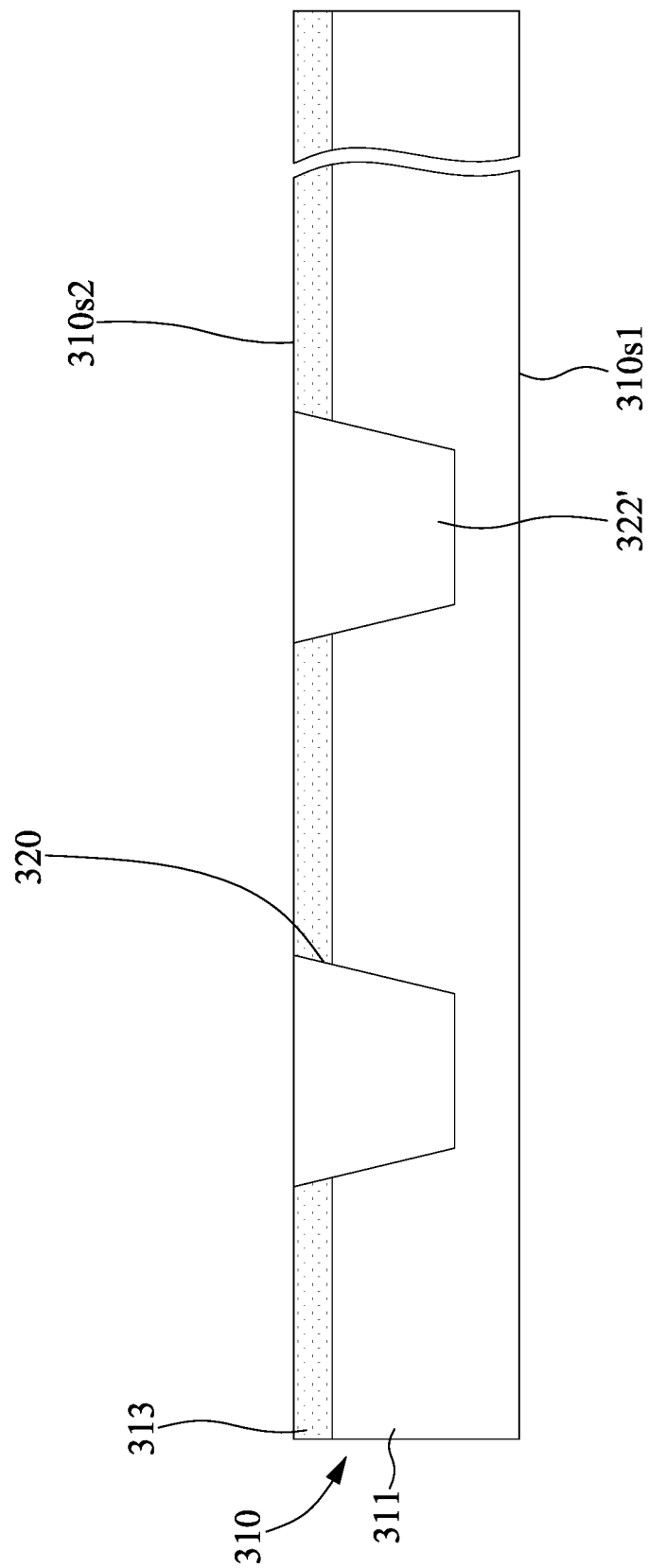
Figure 25C:
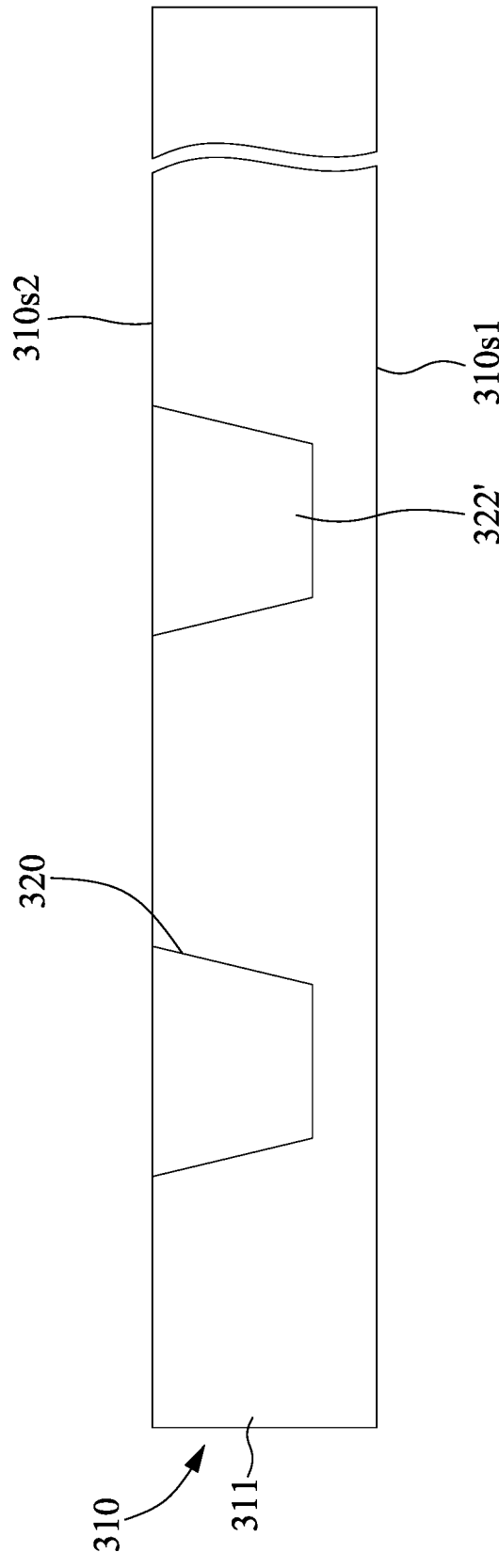

Referring to FIG. 25A, FIG. 25B, and FIG. 25C, a substrate 310 may be provided. The substrate 310 may have a well region 311 therein. A doped region 313 may be formed adjacent to the surface 310s2 of the substrate 310. A plurality of openings 320 (or trenches) may be formed. The opening 320 may be recessed from the surface 310s2 of the substrate 310. An isolation layer 322' may be formed within the opening 320. The isolation layer 322' may include silicon oxide, silicon nitride, silicon oxynitride, or a combination thereof.

Figure 26A:
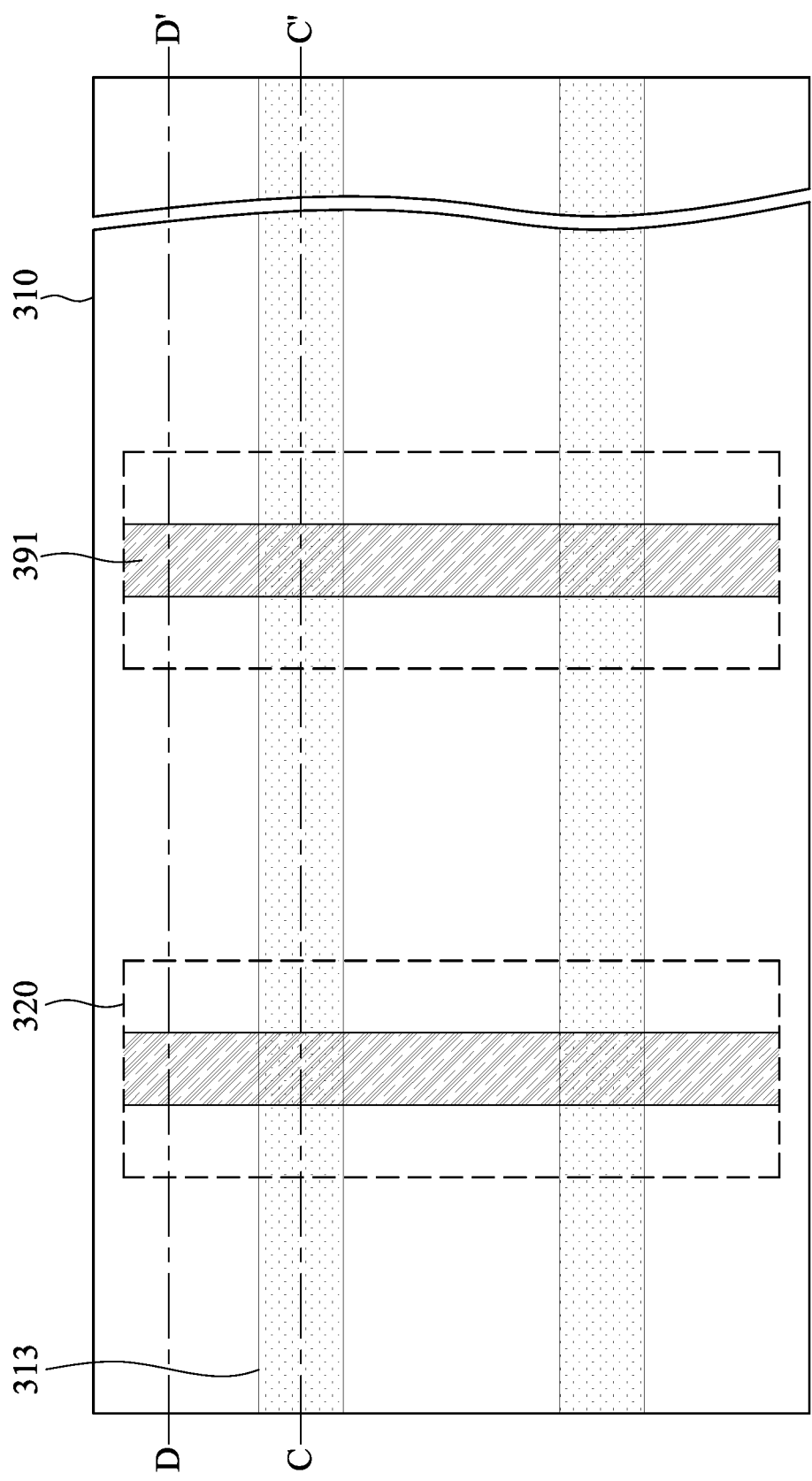
FIG. 26A, FIG. 26B, and FIG. 26C illustrate one or more stages of an exemplary method for manufacturing a semiconductor device according to some embodiments of the present disclosure in different perspectives.
Figure 26B:
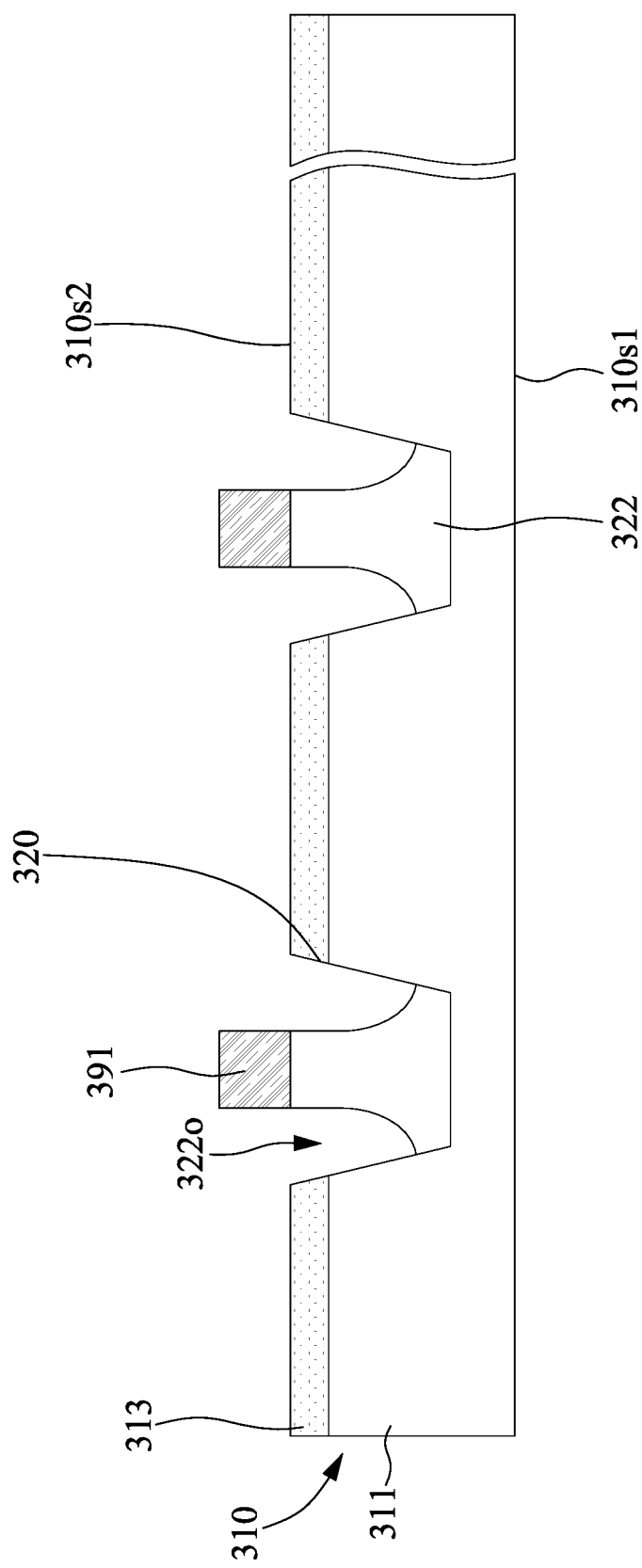
Figure 26C:
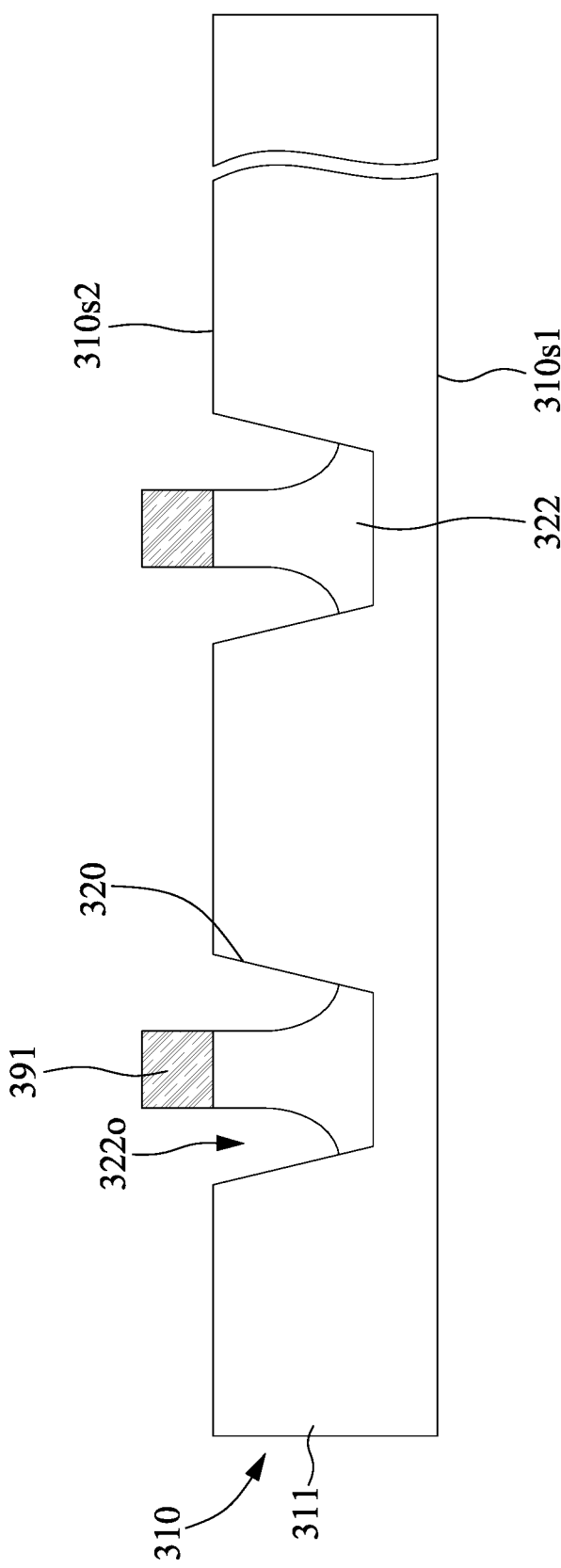

Referring to FIG. 26A, FIG. 26B, and FIG. 26C, a pattern 391 may be formed on the isolation layer 322'. The pattern 391 may serve as a mask configured to define an etched portion during an etch process. The pattern 391 may be formed on a center portion (not annotated) of the isolation layer 322'. An etching process may be performed to remove a peripheral portion of the isolation layer 322'. The isolation layer 322' may be removed by, for example, a wet etching. An isolation layer 322 may be defined within the opening 320. Openings 3220 (or trench) may be formed. The opening 3220 may be recessed from the surface 310s2 of the substrate 310.

Figure 27A:
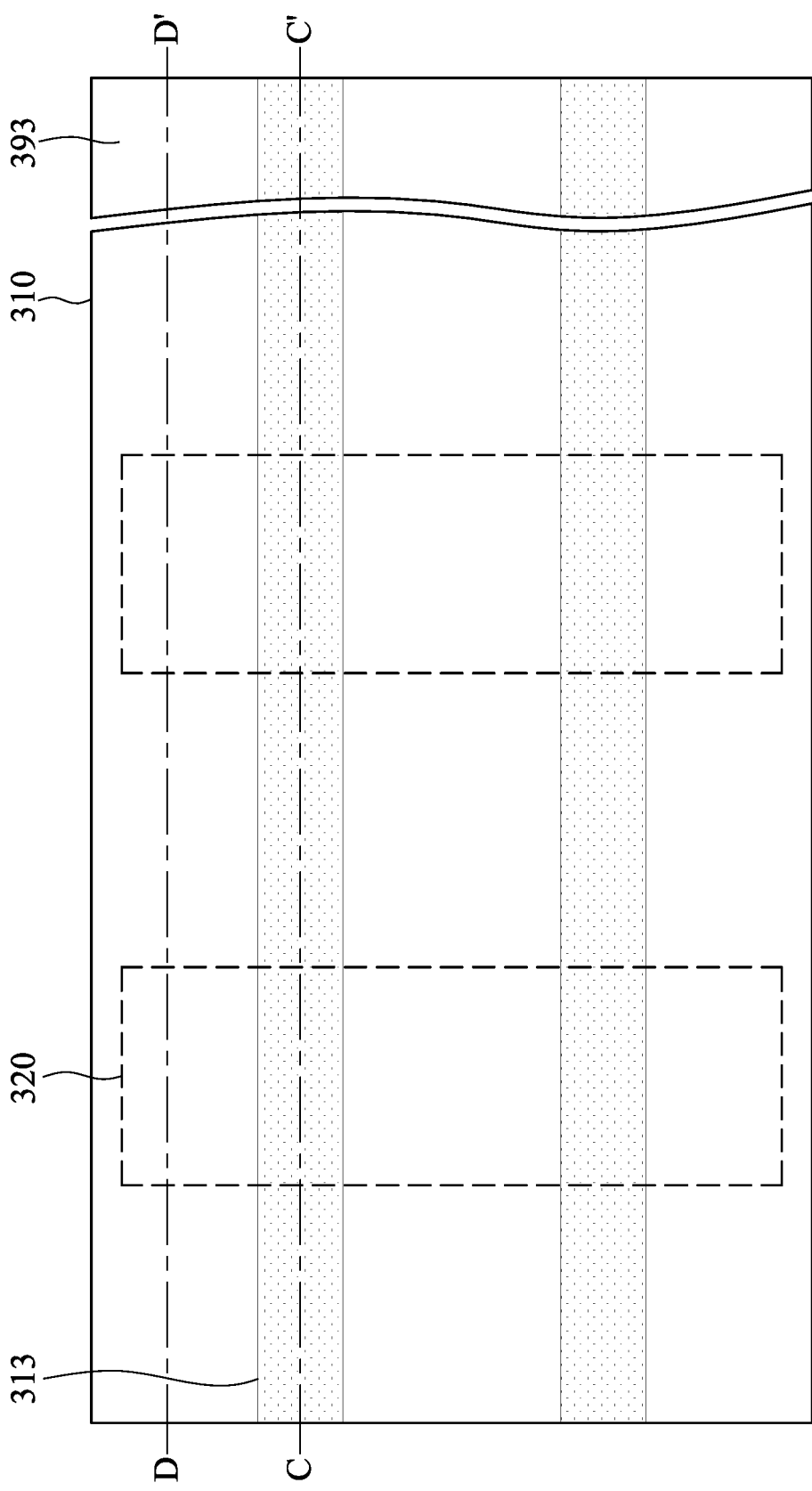
FIG. 27A, FIG. 27B, and FIG. 27C illustrate one or more stages of an exemplary method for manufacturing a semiconductor device according to some embodiments of the present disclosure in different perspectives.
Figure 27B:
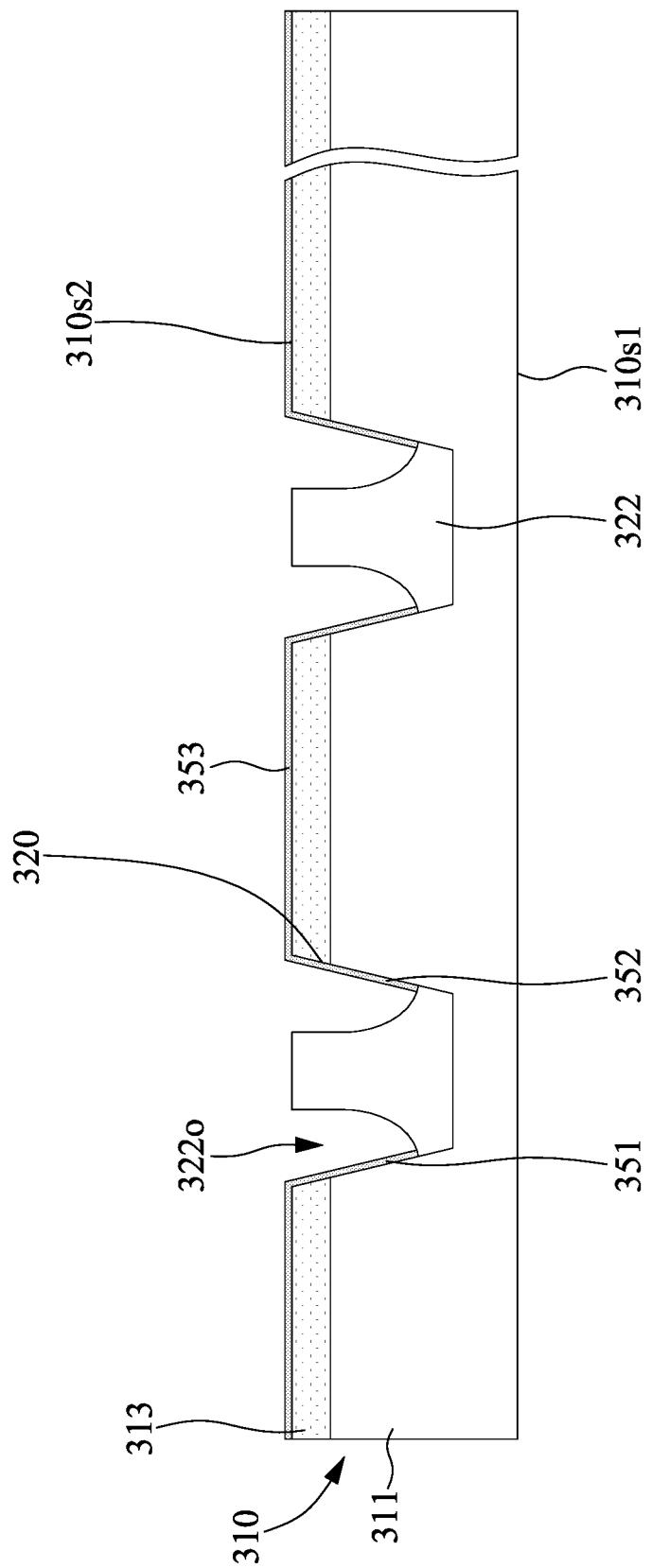
Figure 27C:
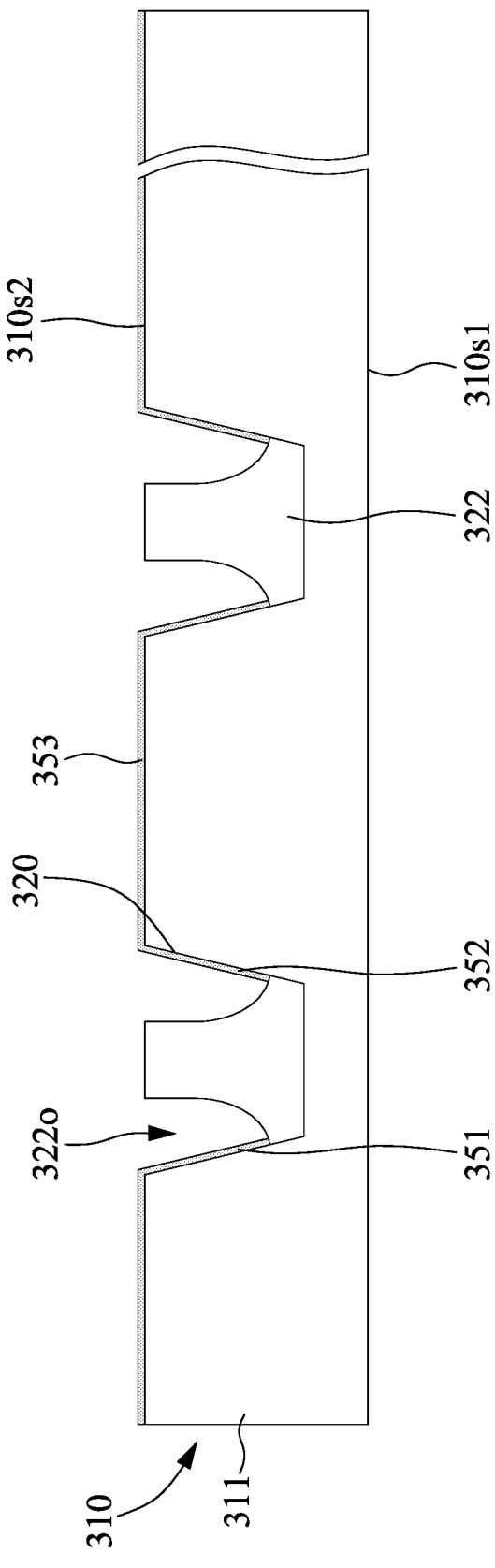

Referring to FIG. 27A, FIG. 27B, and FIG. 27C, the pattern 391 may be removed. A gate dielectric layer 351, a gate dielectric layer 352, and a dielectric layer 353 may be formed. The dielectric layer 353 may be connected to the gate dielectric layers 351 and 352. The gate dielectric layers 351 and 352 may be formed within the sidewall (not annotated) of the opening 320 and on the isolation layer 322. The dielectric layer 353 may be formed on the surface 310s2 of the substrate 310. The gate dielectric layer 351, gate dielectric layer 352, and dielectric layer 353 may include silicon oxide, silicon nitride, silicon oxynitride, or high-k dielectric material(s). The gate dielectric layer 351, gate dielectric layer 352, and dielectric layer 353 may be formed by, for example, PVD, CVD, ALD, LPCVD, PECVD, or other suitable processes.

Figure 28A:
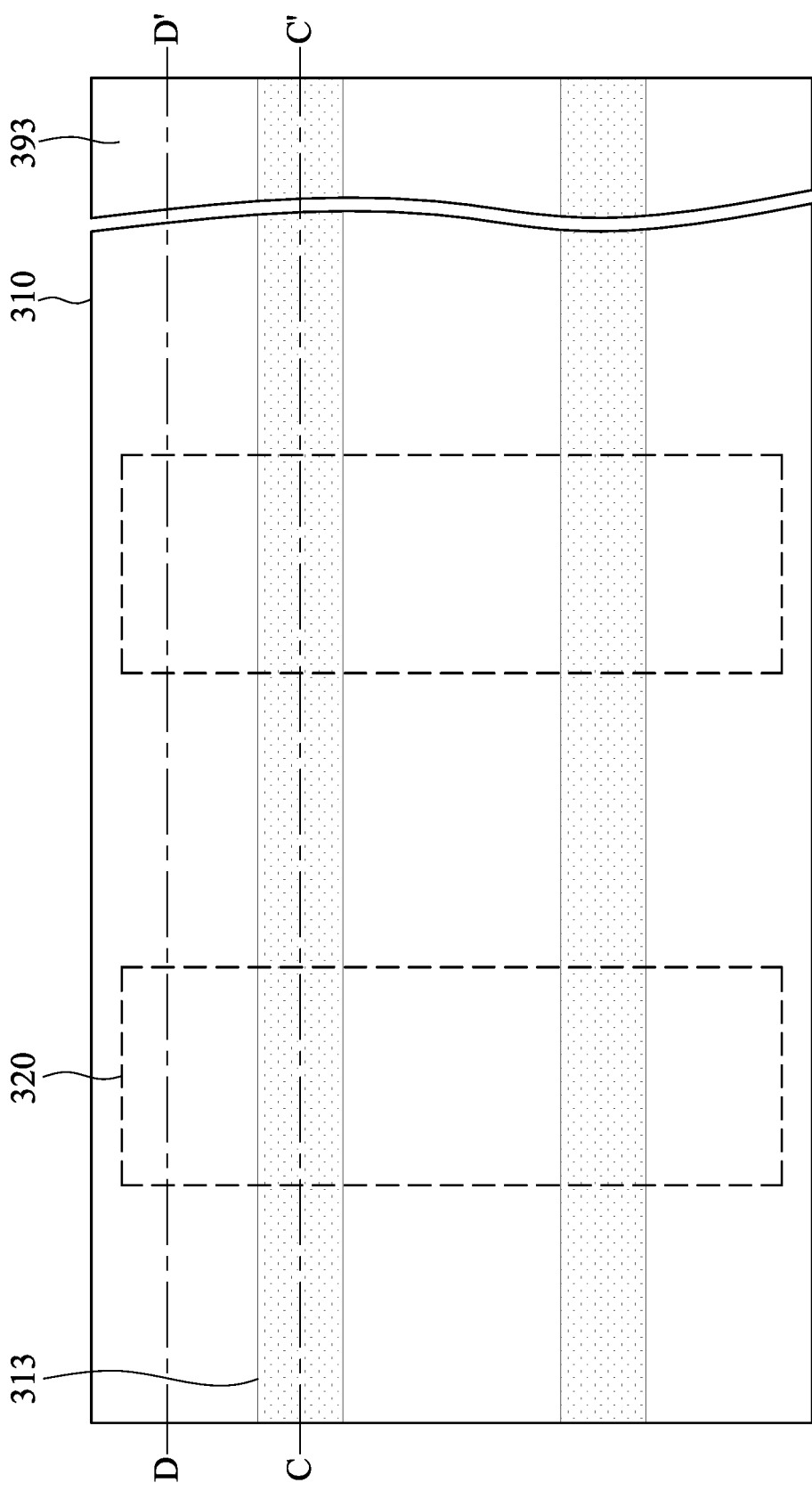
FIG. 28A, FIG. 28B, and FIG. 28C illustrate one or more stages of an exemplary method for manufacturing a semiconductor device according to some embodiments of the present disclosure in different perspectives.
Figure 28B:
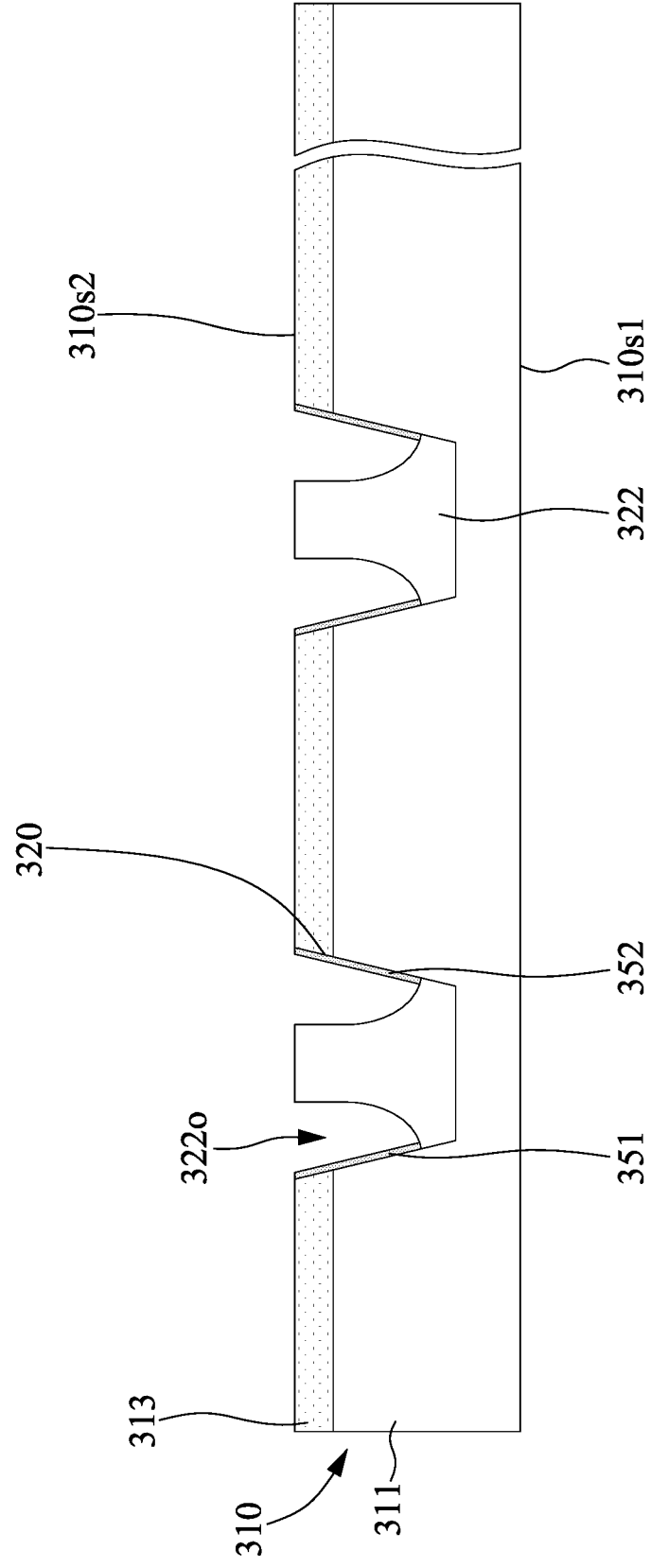
Figure 28C:
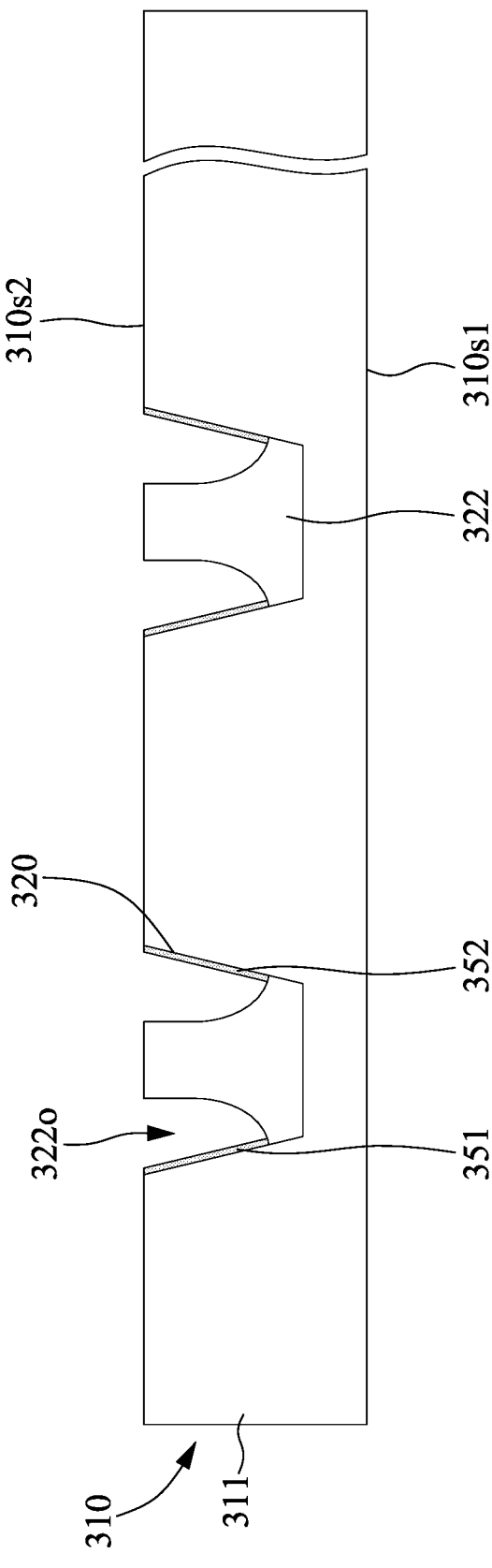

Referring to FIG. 28A, FIG. 28B, and FIG. 28C, the dielectric layer 353 may be removed. The dielectric layer 353 may be removed by, for example, chemical mechanical polishing process, grinding process, etching process, or other suitable processes.

Figure 29A:
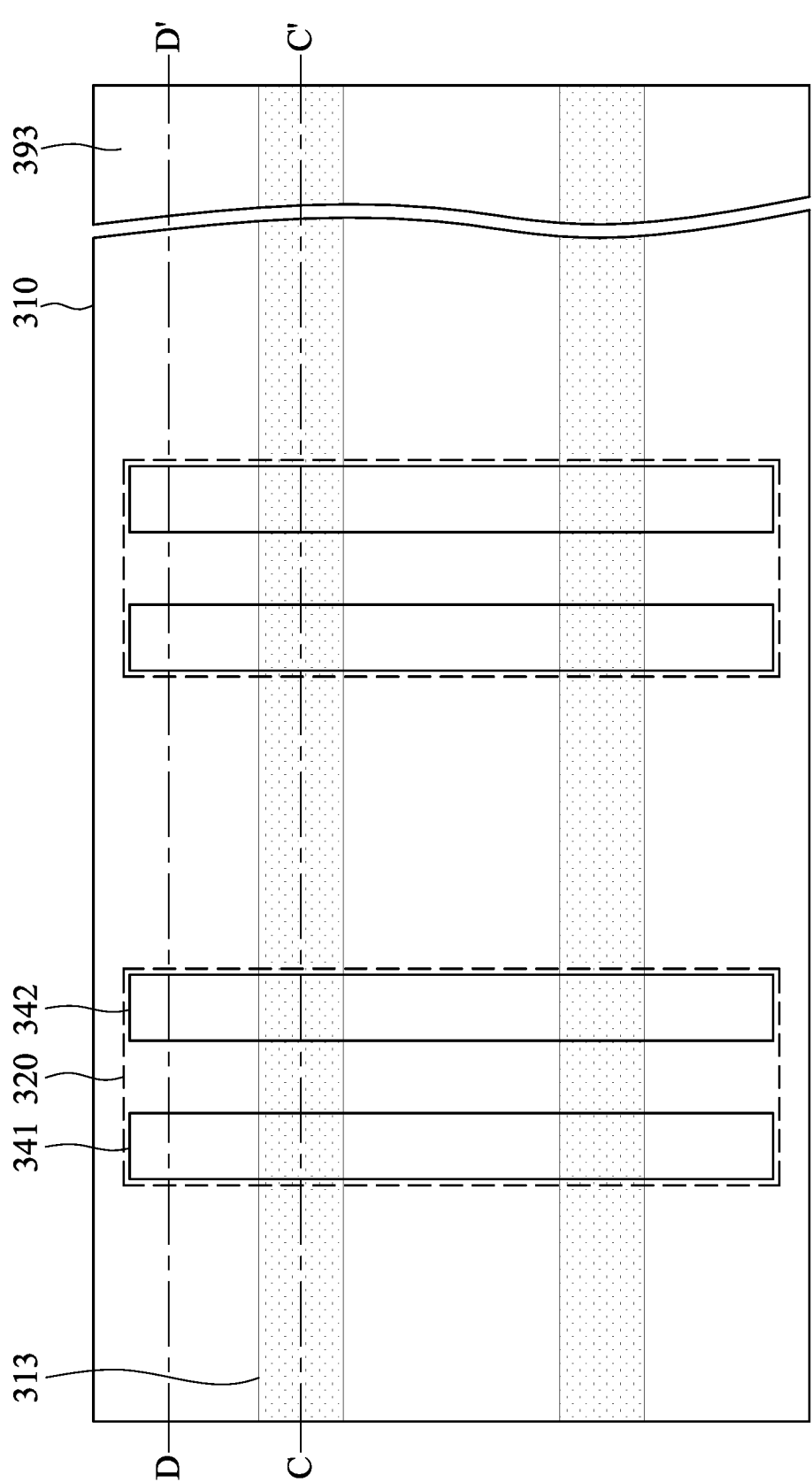
FIG. 29A, FIG. 29B, and FIG. 29C illustrate one or more stages of an exemplary method for manufacturing a semiconductor device according to some embodiments of the present disclosure in different perspectives.
Figure 29B:
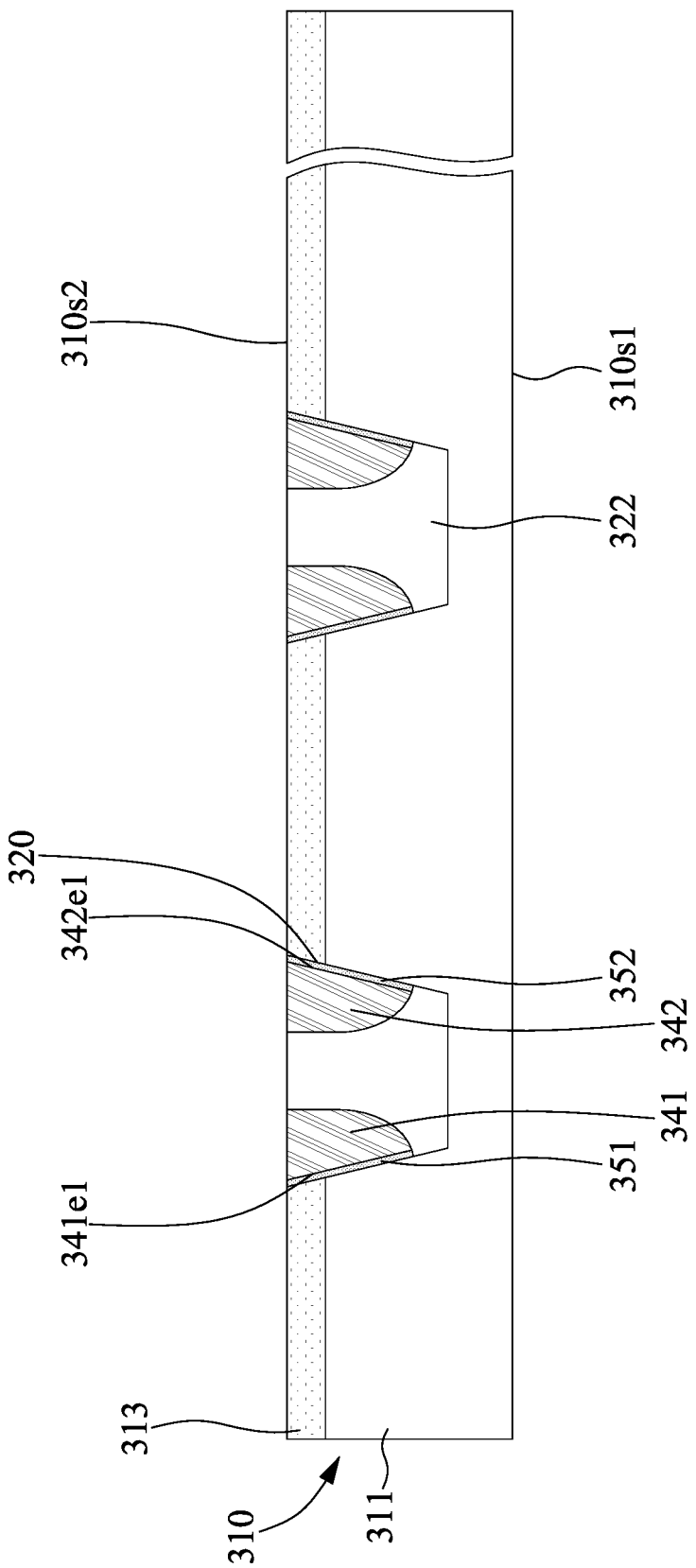
Figure 29C:
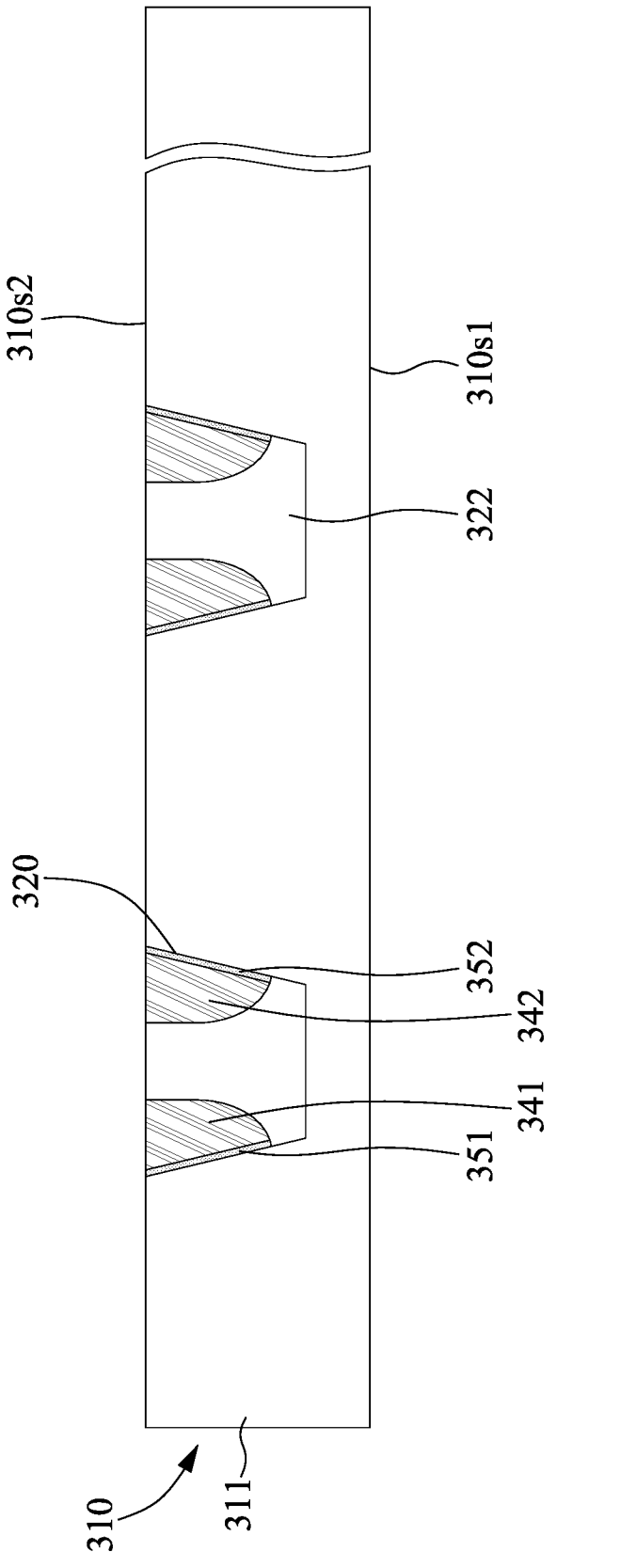

Referring to FIG. 29A, FIG. 29B, and FIG. 29C, word lines 341 and 342 may be formed within the opening 320. The word lines 341 and 342 may fill the openings 3220. The word line 341 may be formed on the gate dielectric layer 351. The word line 342 may be formed on the gate dielectric layer 352. The word lines 341 and 342 may be formed by PVD, CVD, ALD, LPCVD, PECVD, or other suitable processes.

Figure 30A:
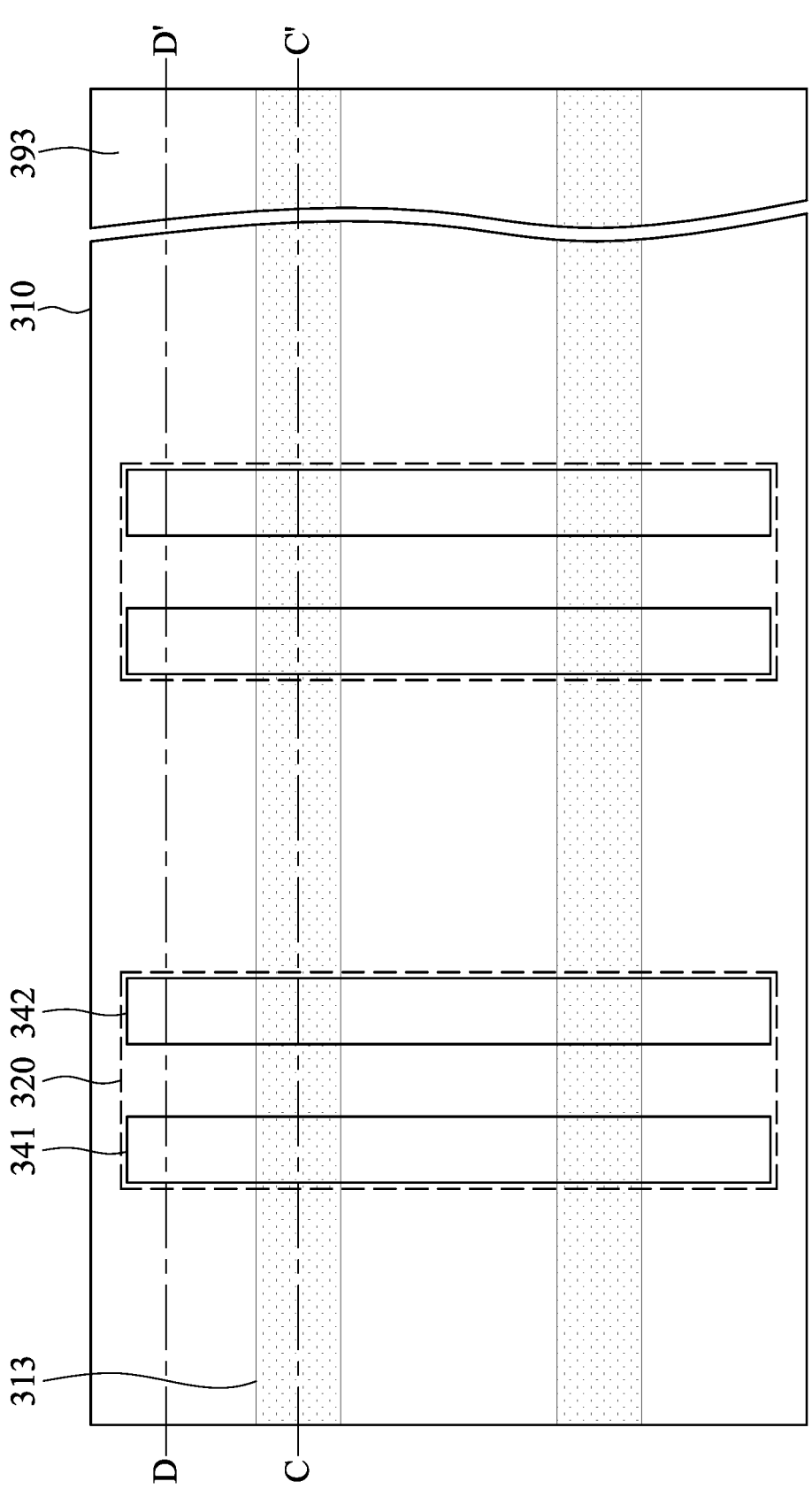
FIG. 30A, FIG. 30B, and FIG. 30C illustrate one or more stages of an exemplary method for manufacturing a semiconductor device according to some embodiments of the present disclosure in different perspectives.
Figure 30B:
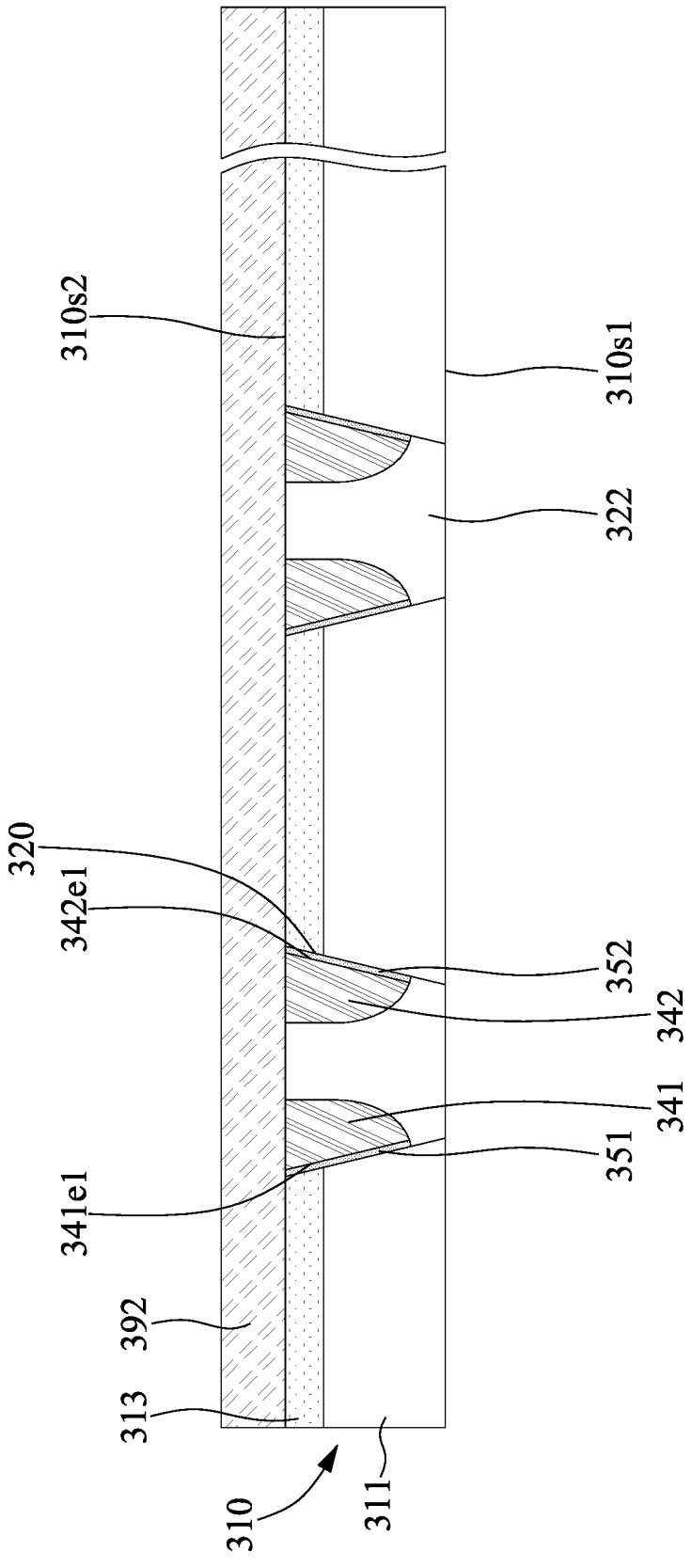
Figure 30C:
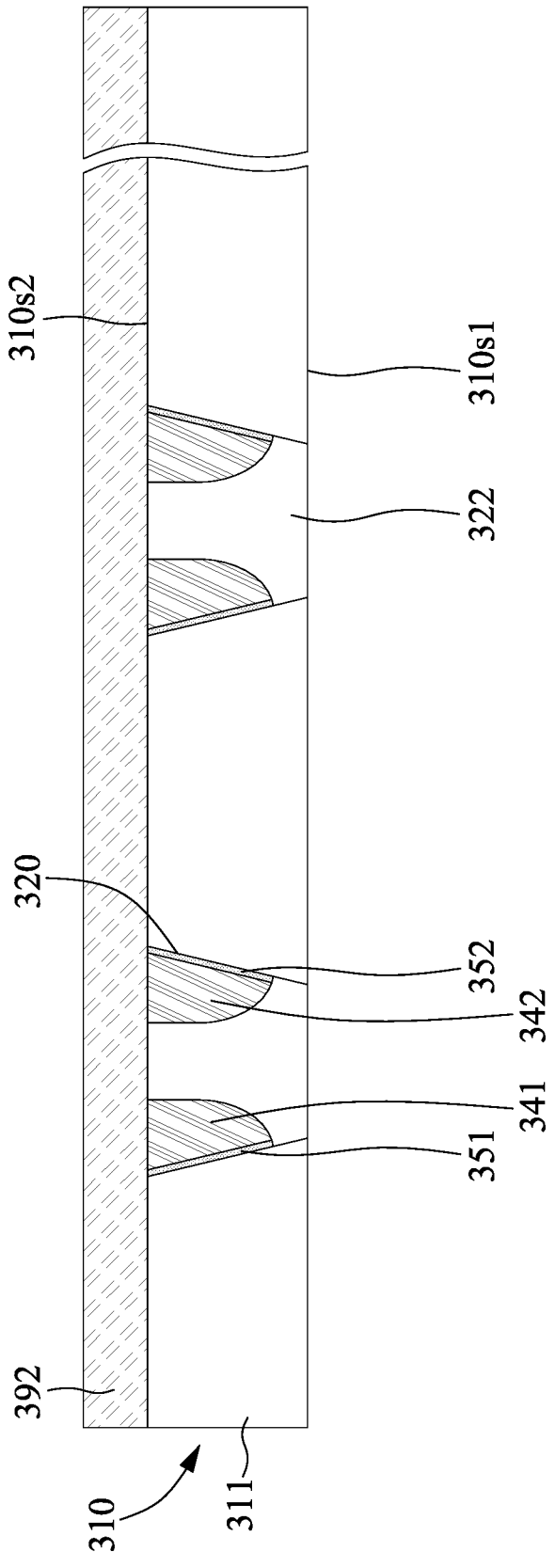

Referring to FIG. 30A, FIG. 30B, and FIG. 30C, the surface 310s2 of the substrate 310 may be attached to a supporter 392. The supporter 392 may include a plastic supporter, a glass supporter, a ceramic supporter, or other suitable supporters.

Figure 31A:
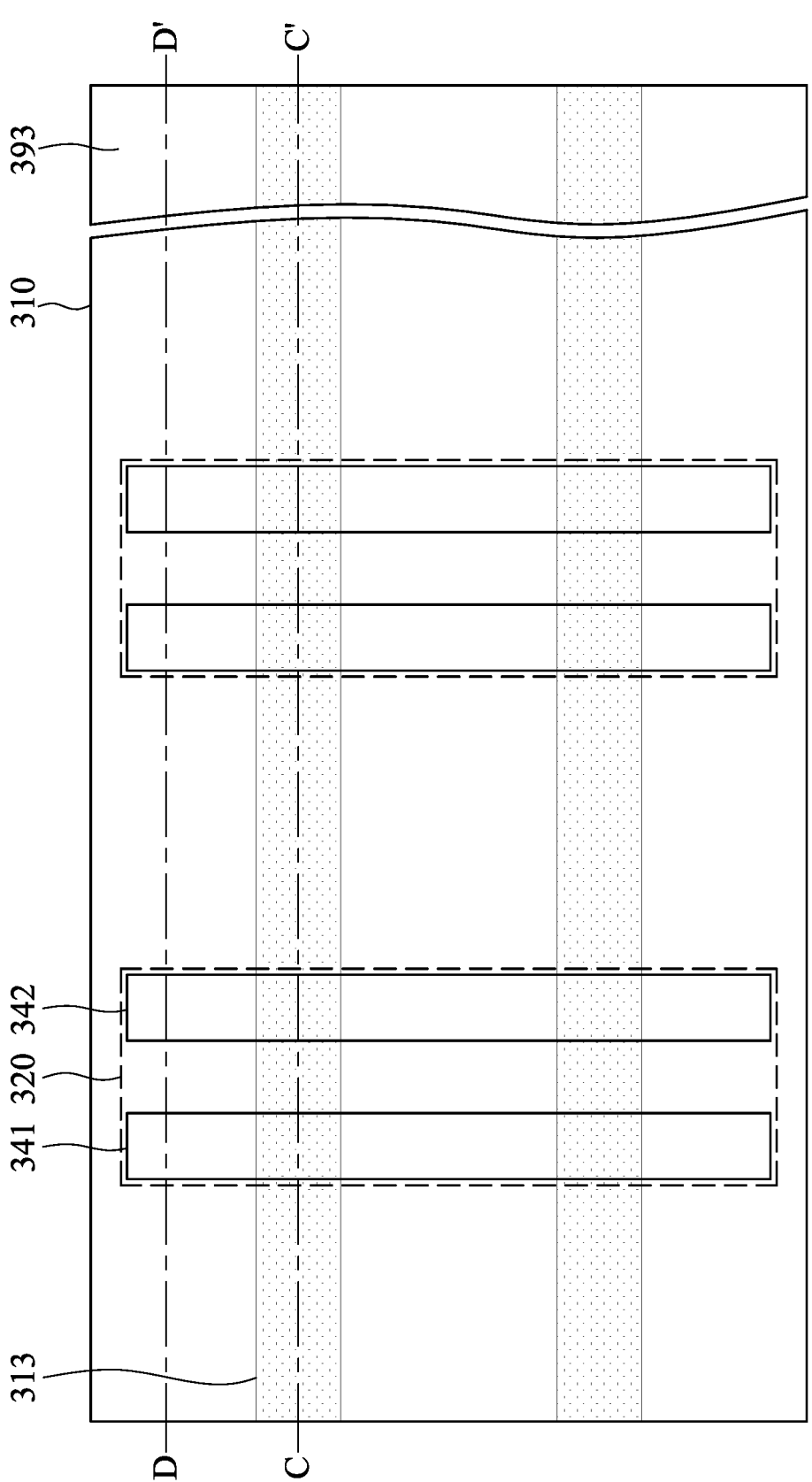
FIG. 31A, FIG. 31B, and FIG. 31C illustrate one or more stages of an exemplary method for manufacturing a semiconductor device according to some embodiments of the present disclosure in different perspectives.
Figure 31B:
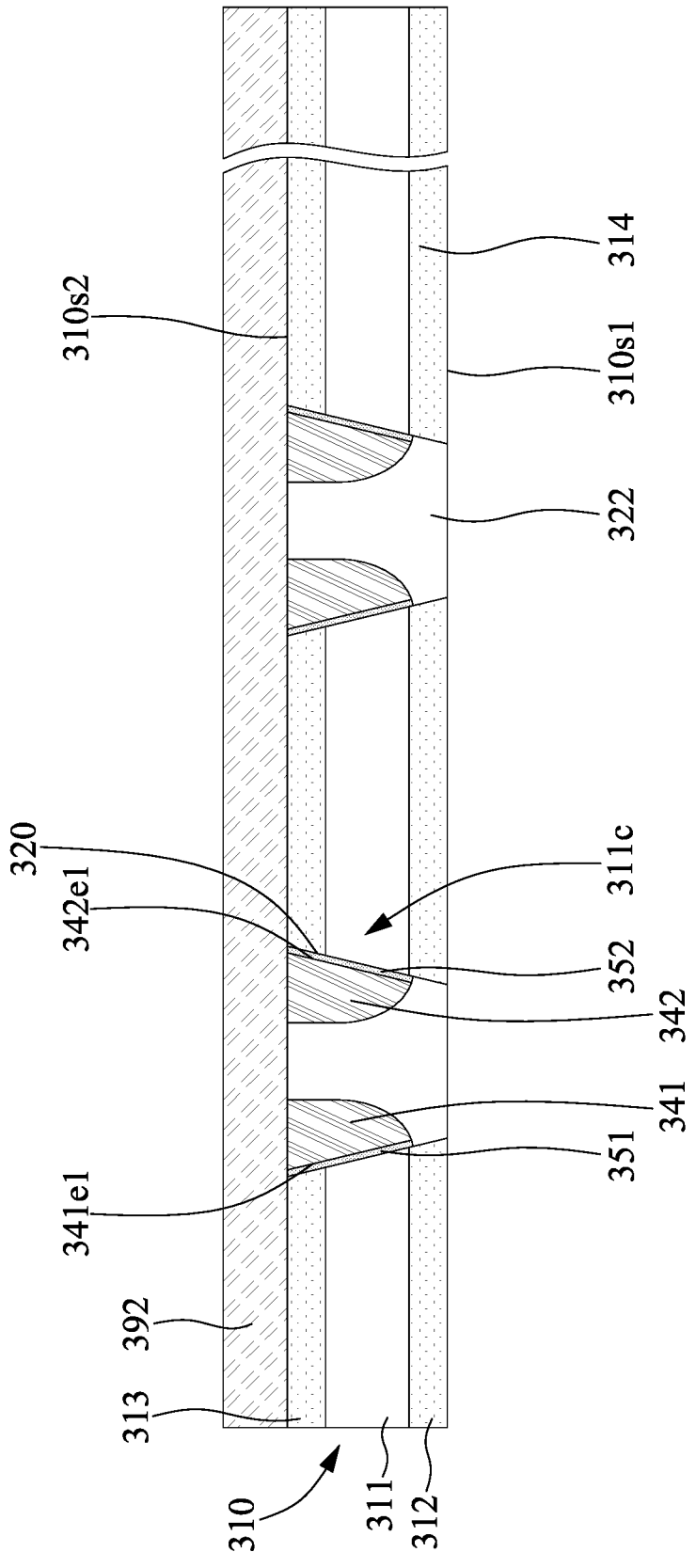
Figure 31C:
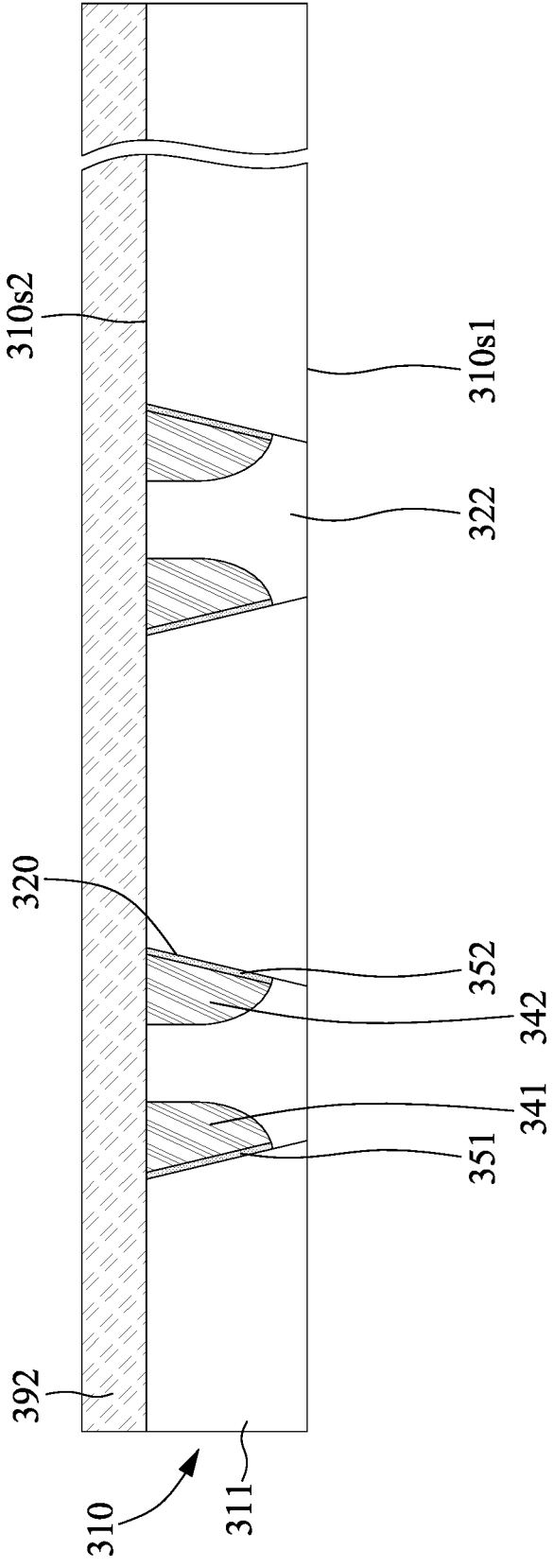

Referring to FIG. 31A, FIG. 31B, and FIG. 31C, a portion of the substrate 310 may be removed. In some embodiments, the surface 310s1 of the substrate 310 may be grinded or polished by chemical mechanical polishing process, grinding process, or other suitable processes. The bottom of the isolation layer 322 may be exposed from the surface 310s1 of the substrate 310. A doped region 312 may be formed adjacent to the surface 310s1 of the substrate 310.

Figure 32A:
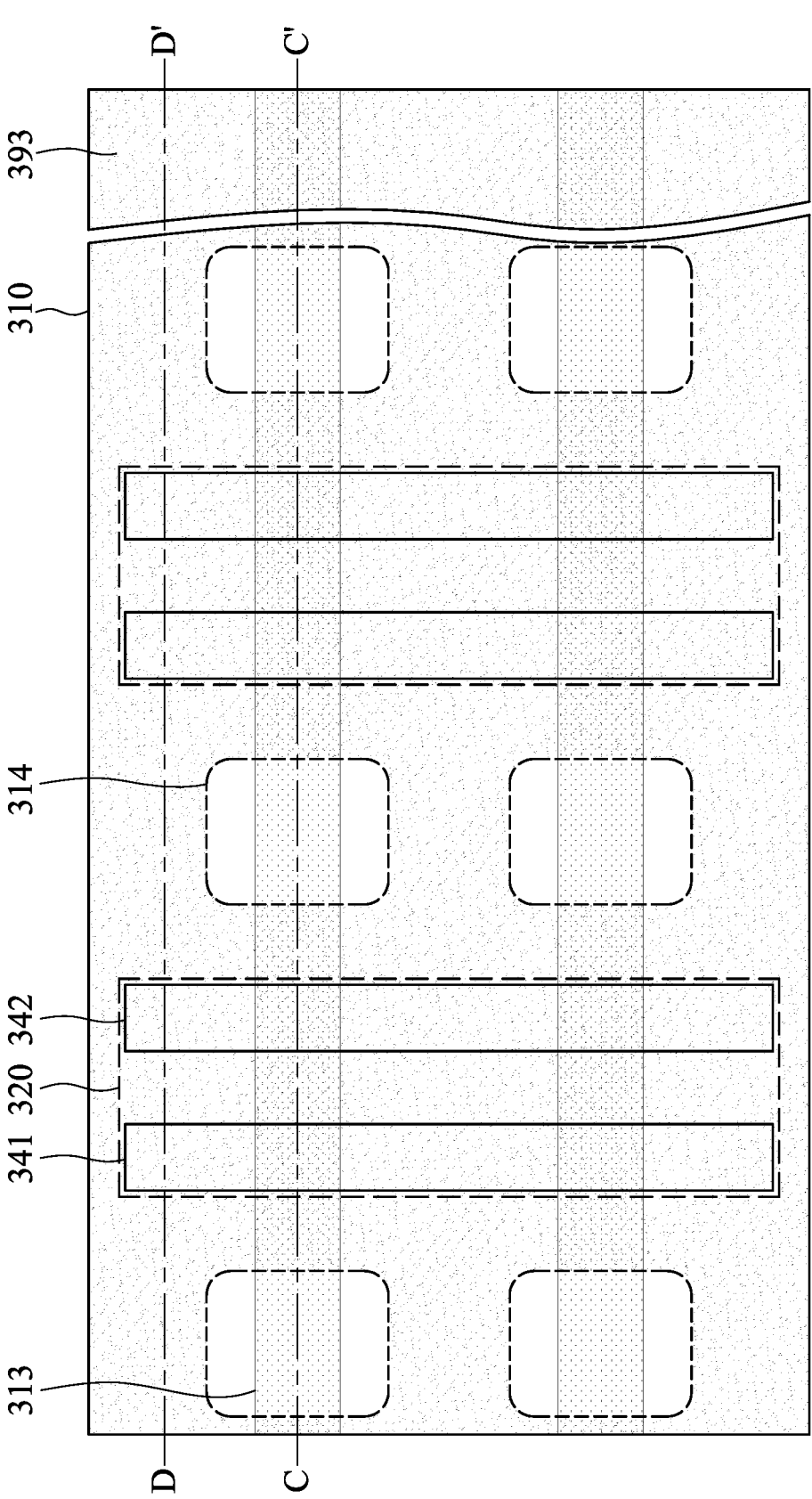
FIG. 32A, FIG. 32B, and FIG. 32C illustrate one or more stages of an exemplary method for manufacturing a semiconductor device according to some embodiments of the present disclosure in different perspectives.
Figure 32B:
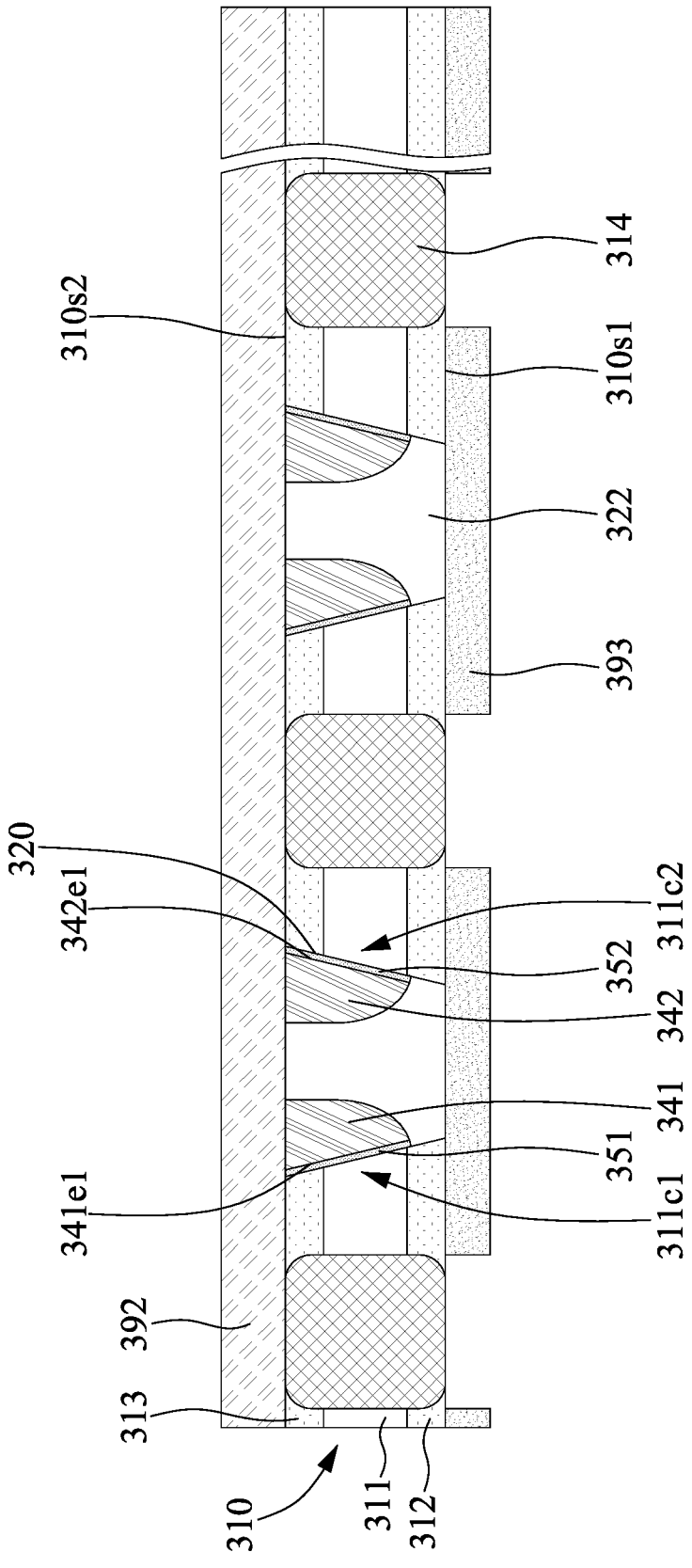
Figure 32C:
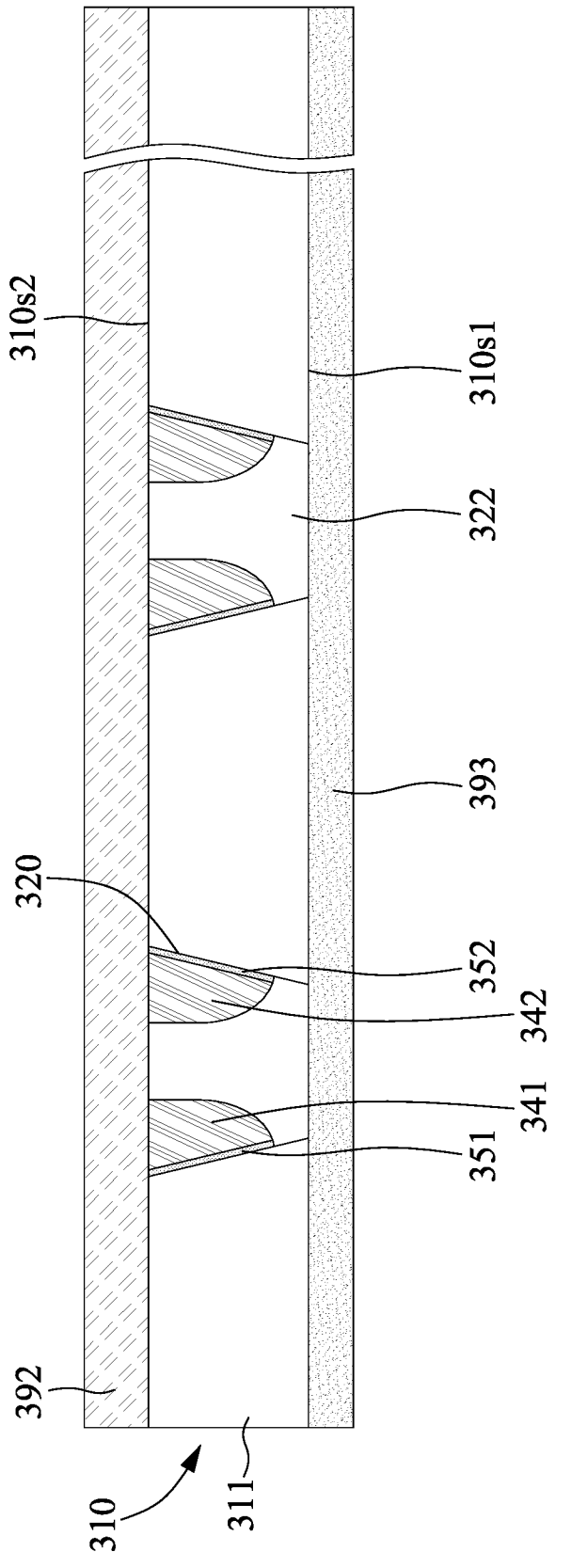

Referring to FIG. 32A, FIG. 32C, and FIG. 32C, a pattern 393 may be formed on the surface 310s1 of the substrate 310 to define a pattern of a doped region 314. The doped region 314 may be formed within the substrate 310. The doped region 314 may have a conductive type different from that of the doped region 312 (or 313).

Figure 33A:
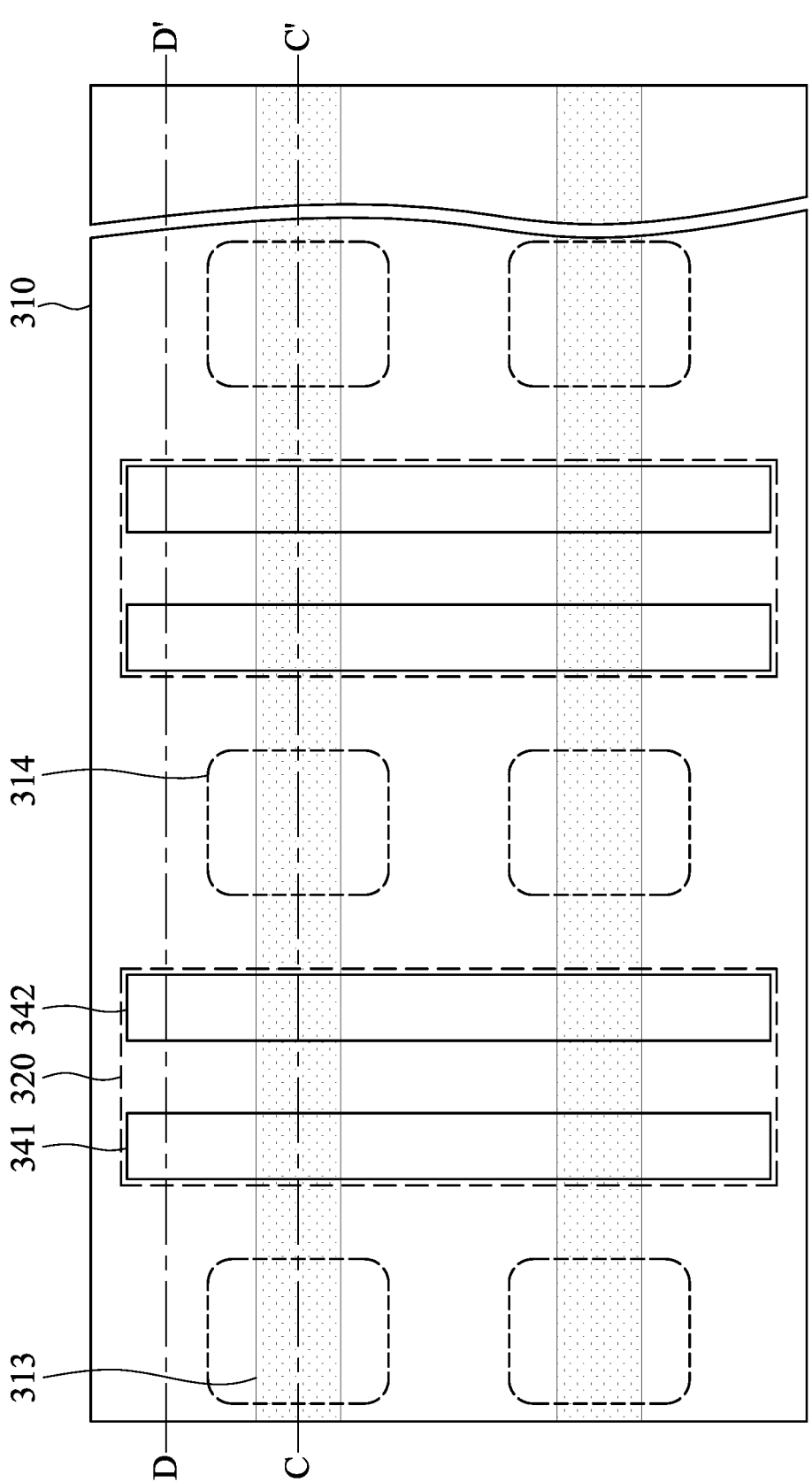
FIG. 33A, FIG. 33B, and FIG. 33C illustrate one or more stages of an exemplary method for manufacturing a semiconductor device according to some embodiments of the present disclosure in different perspectives.
Figure 33B:
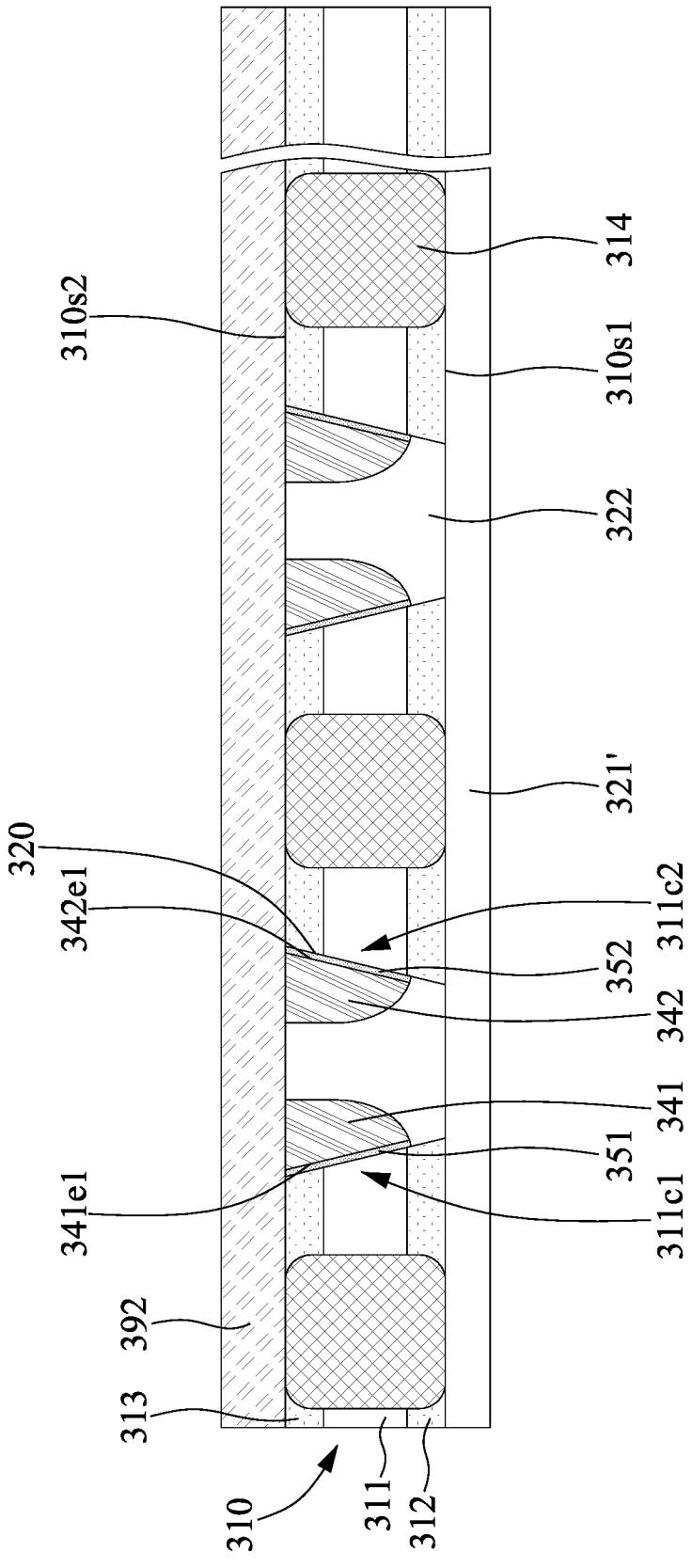
Figure 33C:
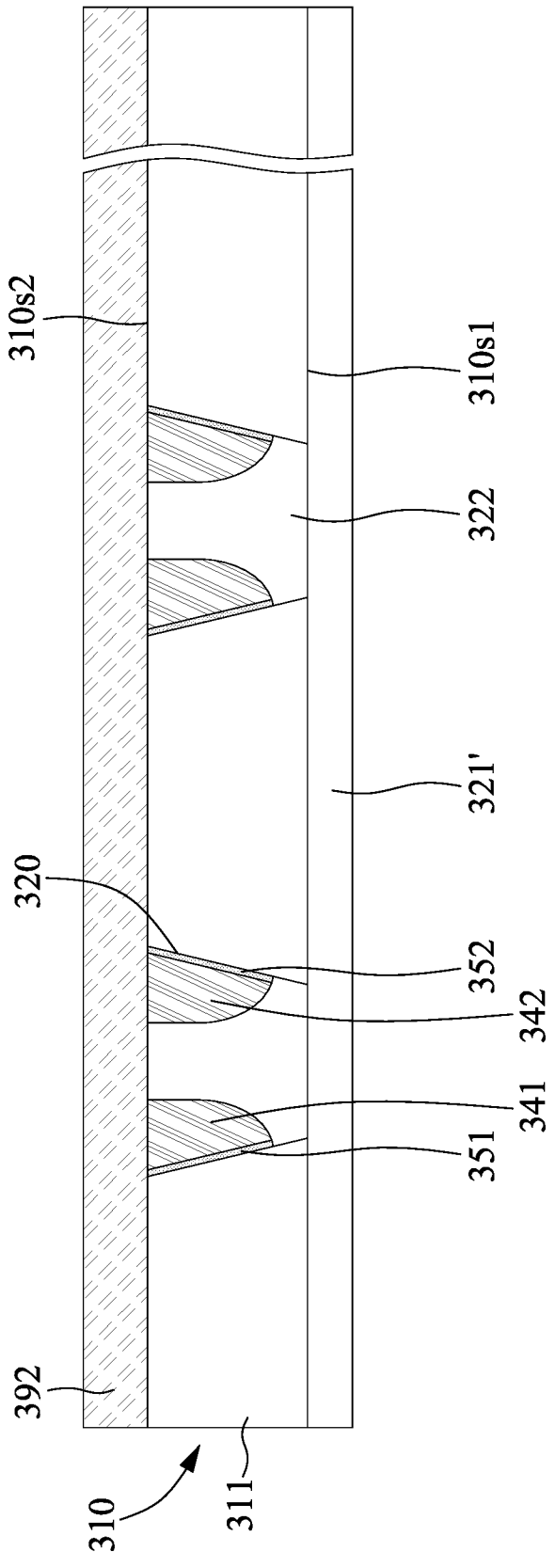

Referring to FIG. 33A, FIG. 33C, and FIG. 33C, the pattern 393 may be removed. A dielectric layer 321' may be formed on the surface 310s1 of the substrate 310. The dielectric layer 321' may include silicon oxide, silicon nitride, silicon oxynitride, or high-k dielectric material(s).

Figure 34A:
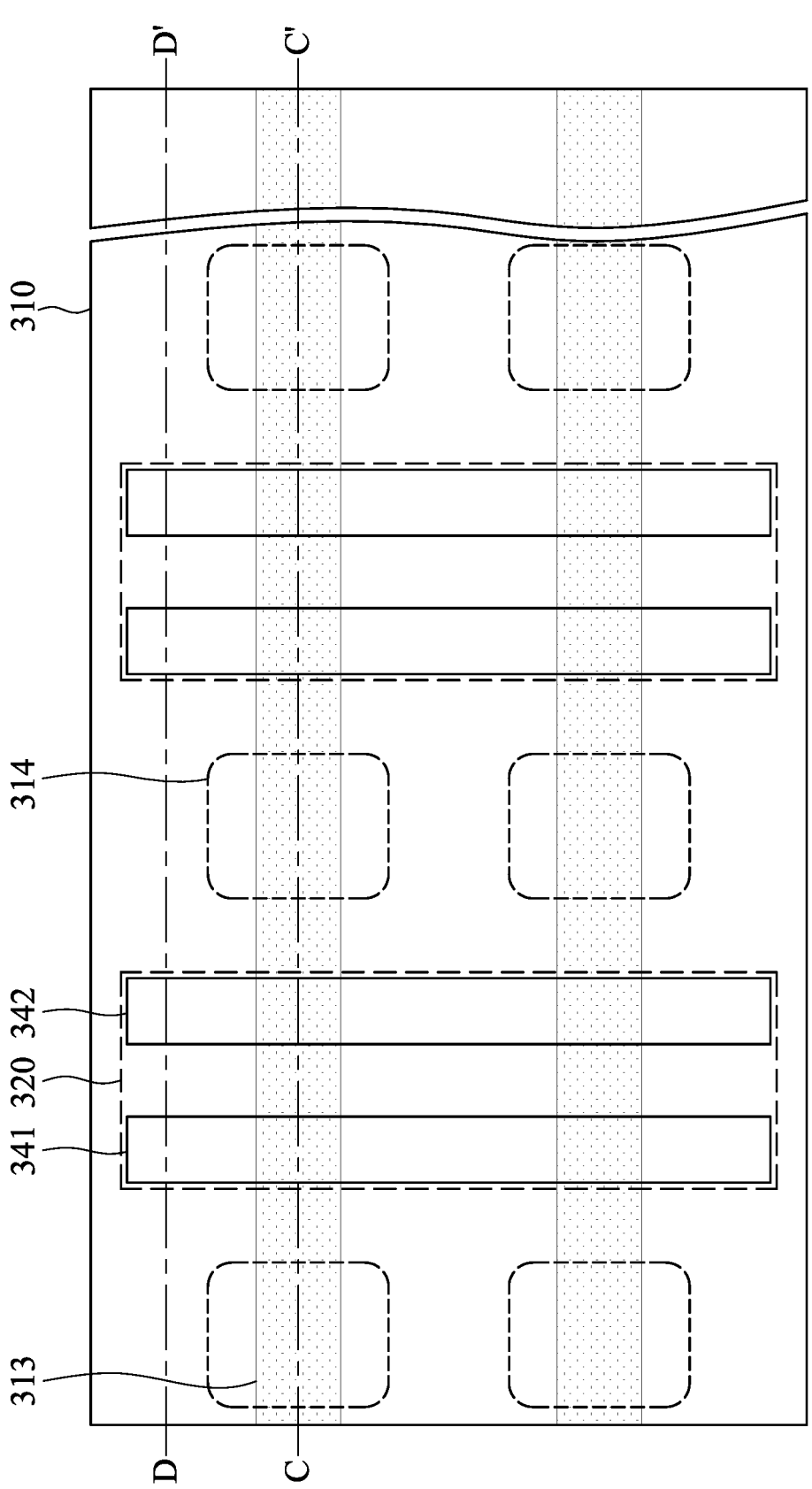
FIG. 34A, FIG. 34B, and FIG. 34C illustrate one or more stages of an exemplary method for manufacturing a semiconductor device according to some embodiments of the present disclosure in different perspectives.
Figure 34B:
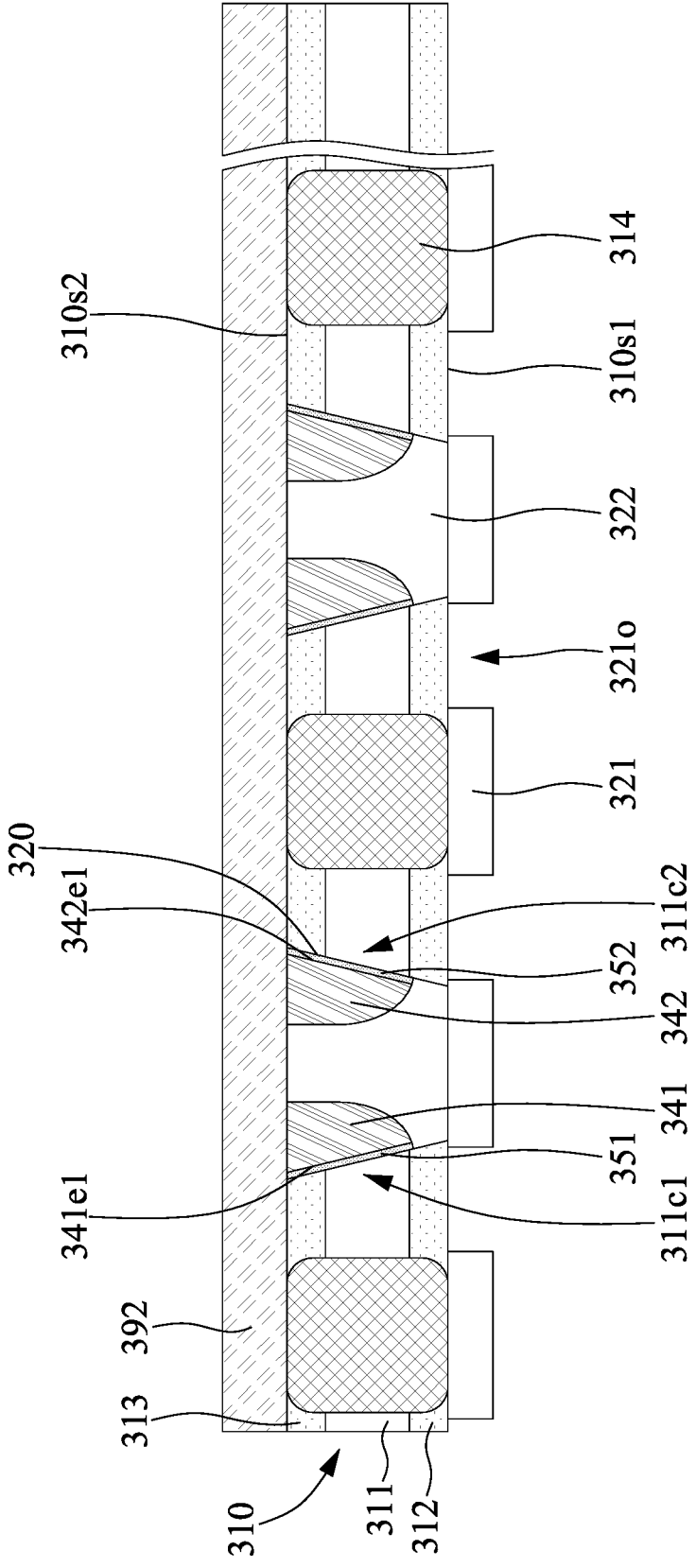
Figure 34C:
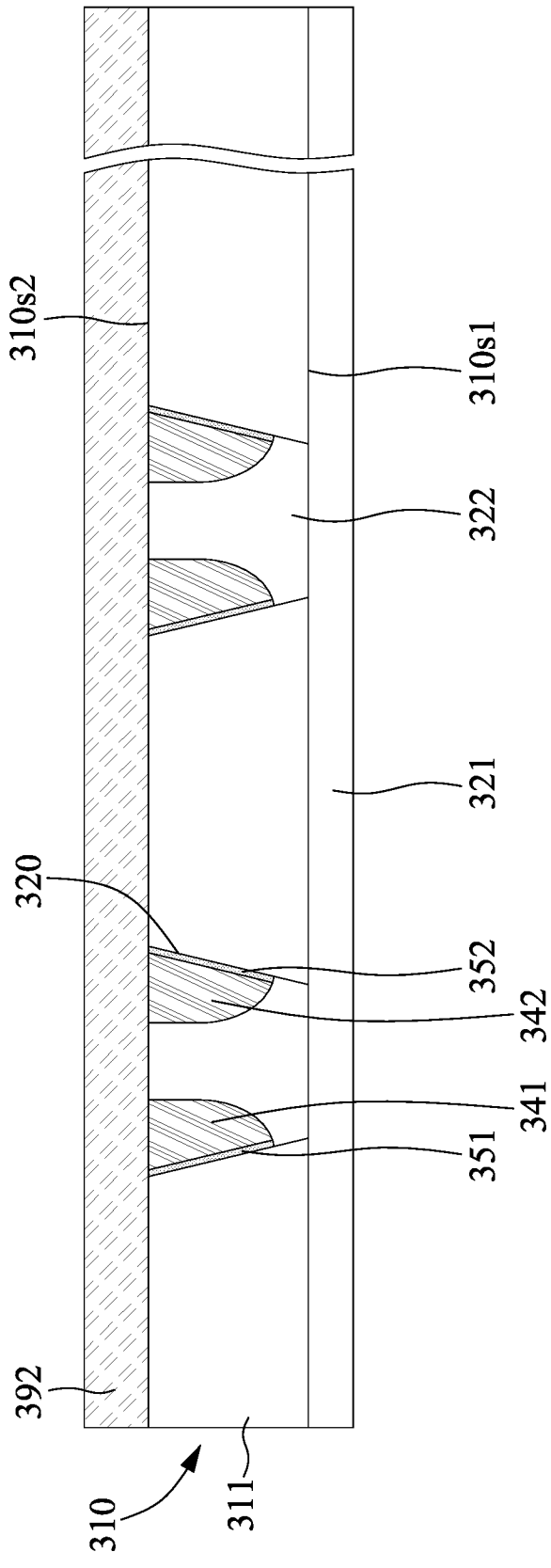

Referring to FIG. 34A, FIG. 34B, and FIG. 34C, the dielectric layer 321' may be patterned to form the dielectric layer 321. The dielectric layer 321 may have openings 3210 exposing the surface 310s1 of the substrate 310. The doped region 314 may be covered by the dielectric layer 321.

Figure 35A:
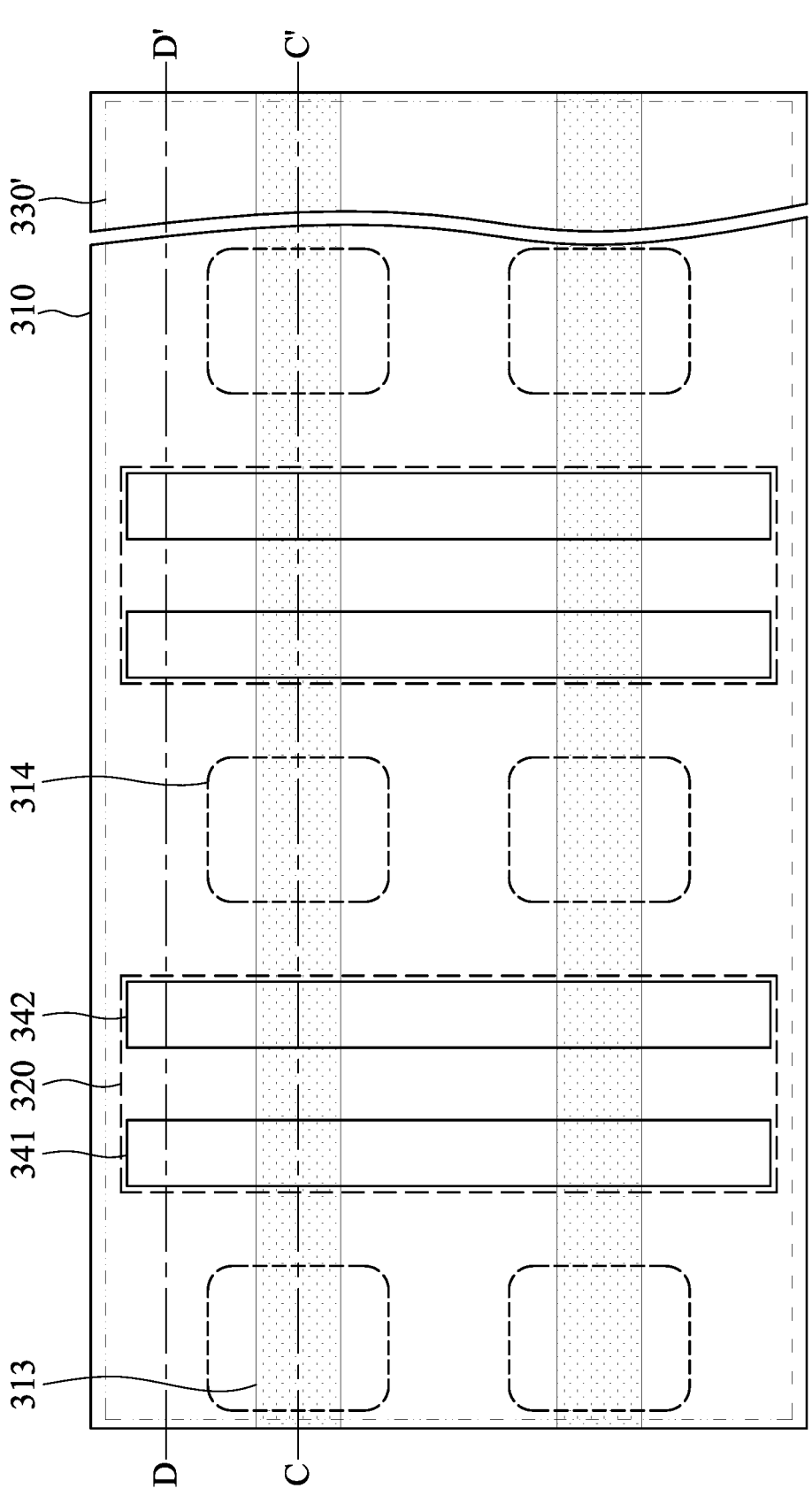
FIG. 35A, FIG. 35B, and FIG. 35C illustrate one or more stages of an exemplary method for manufacturing a semiconductor device according to some embodiments of the present disclosure in different perspectives.
Figure 35B:
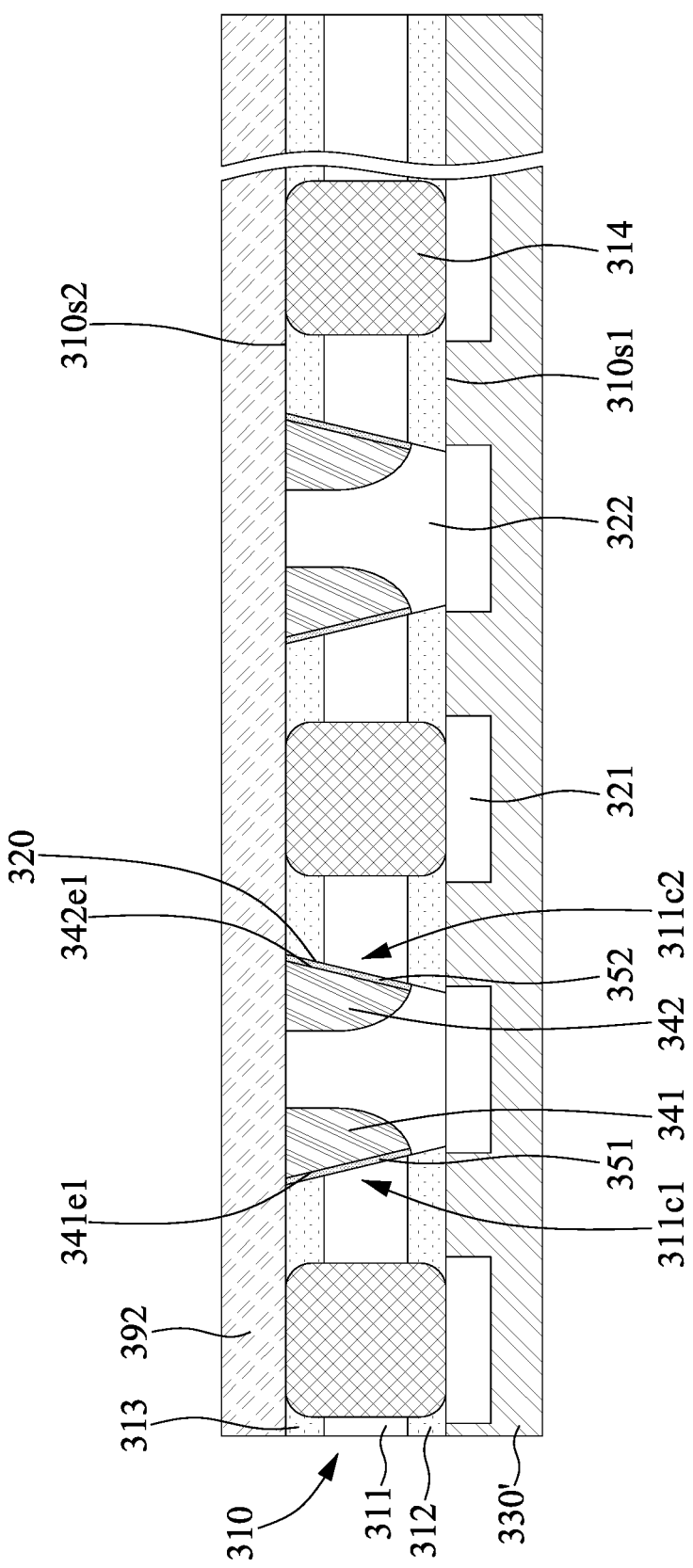
Figure 35C:
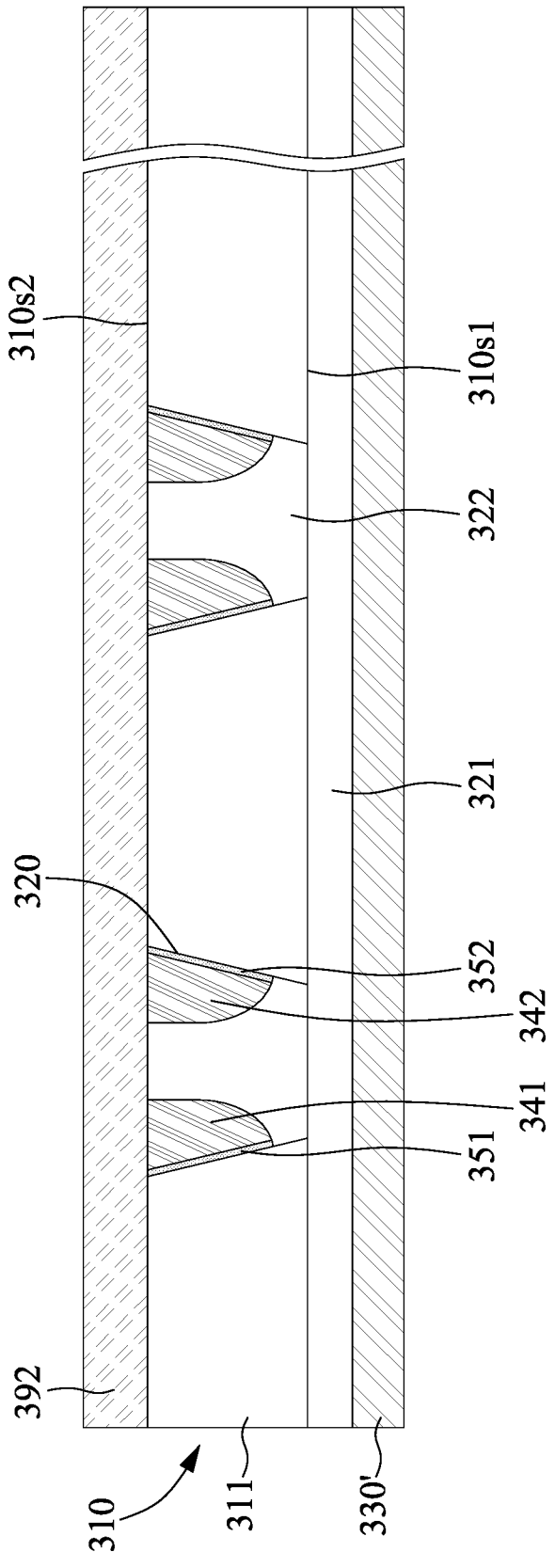

Referring to FIG. 35A, FIG. 35B, and FIG. 35C, a metallization layer 330' may be formed on the surface 310s1 of the substrate 310. The metallization layer 330' may fill the openings 3210 as shown in FIG. 35B. The metallization layer 330' may include conductive materials, such as tungsten, copper, aluminum, tantalum, tantalum nitride, titanium, titanium nitride, the like, and/or a combination thereof. The metallization layer 330' may be formed by PVD, CVD, ALD, LPCVD, PECVD, or other suitable processes.

Figure 36A:
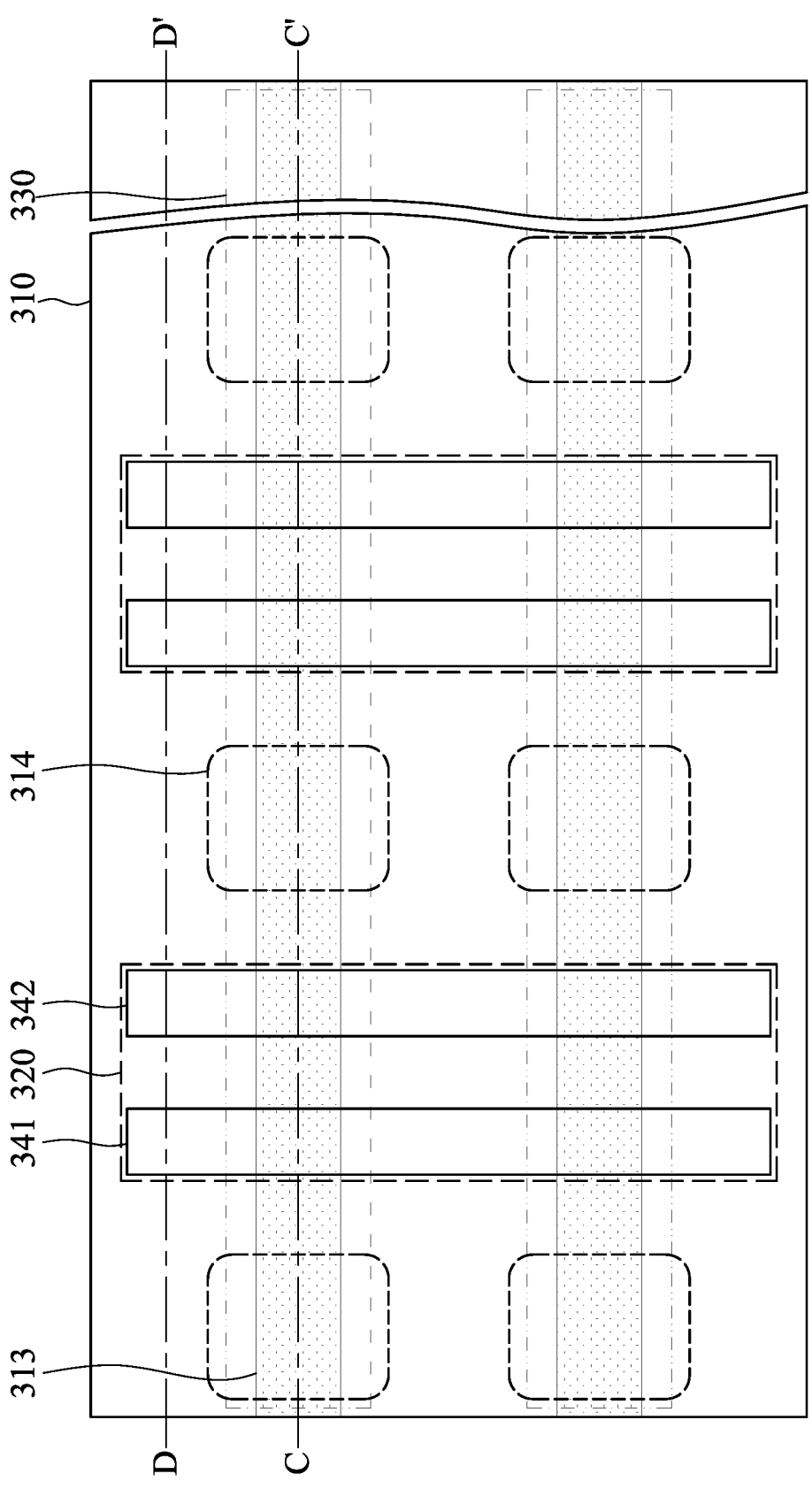
FIG. 36A, FIG. 36B, and FIG. 36C illustrate one or more stages of an exemplary method for manufacturing a semiconductor device according to some embodiments of the present disclosure in different perspectives.
Figure 36B:
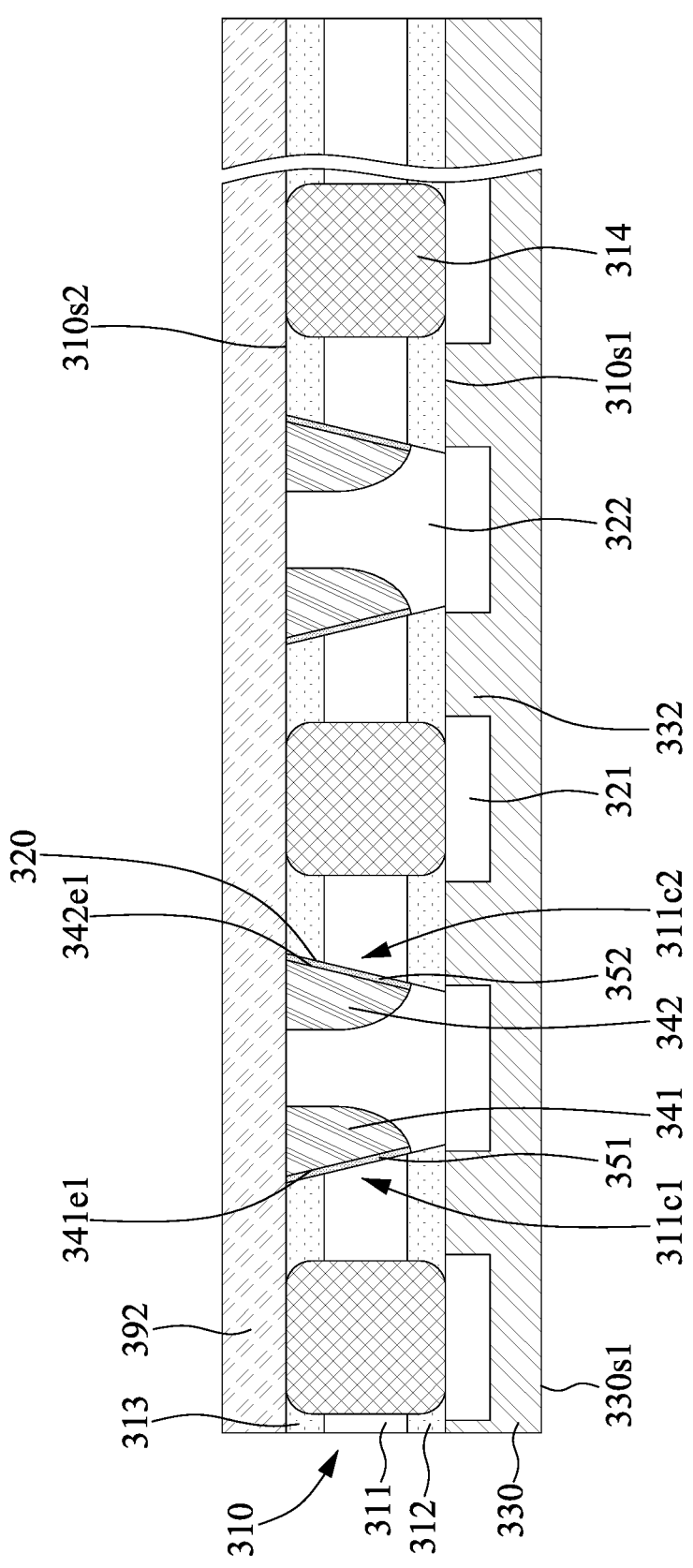
Figure 36C:
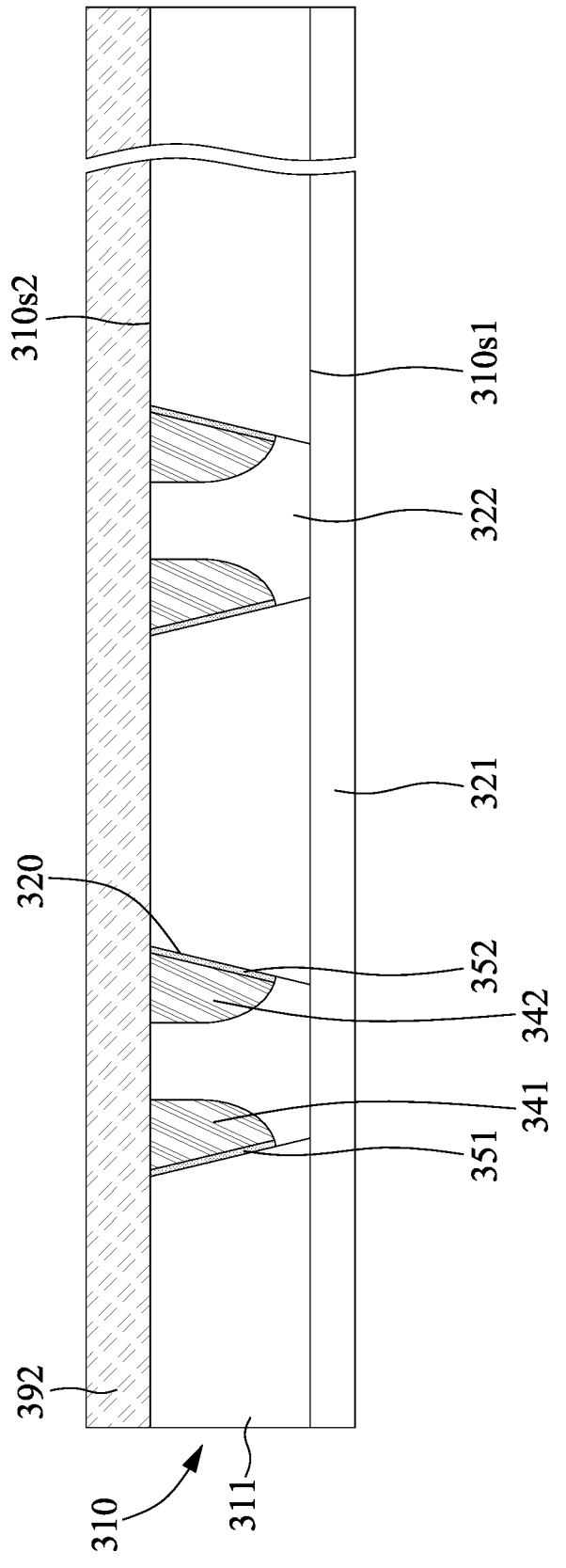

Referring to FIG. 36A, FIG. 36B, and FIG. 36C, the metallization layer 330' may be patterned to form bit lines 330 and conductive via 332 over the active region. In some embodiments, the bit line 330 may be protruded from the dielectric layer 321. The metallization layer 330' may be patterned by wet etching, dry etching, or other suitable processes.

Figure 37A:
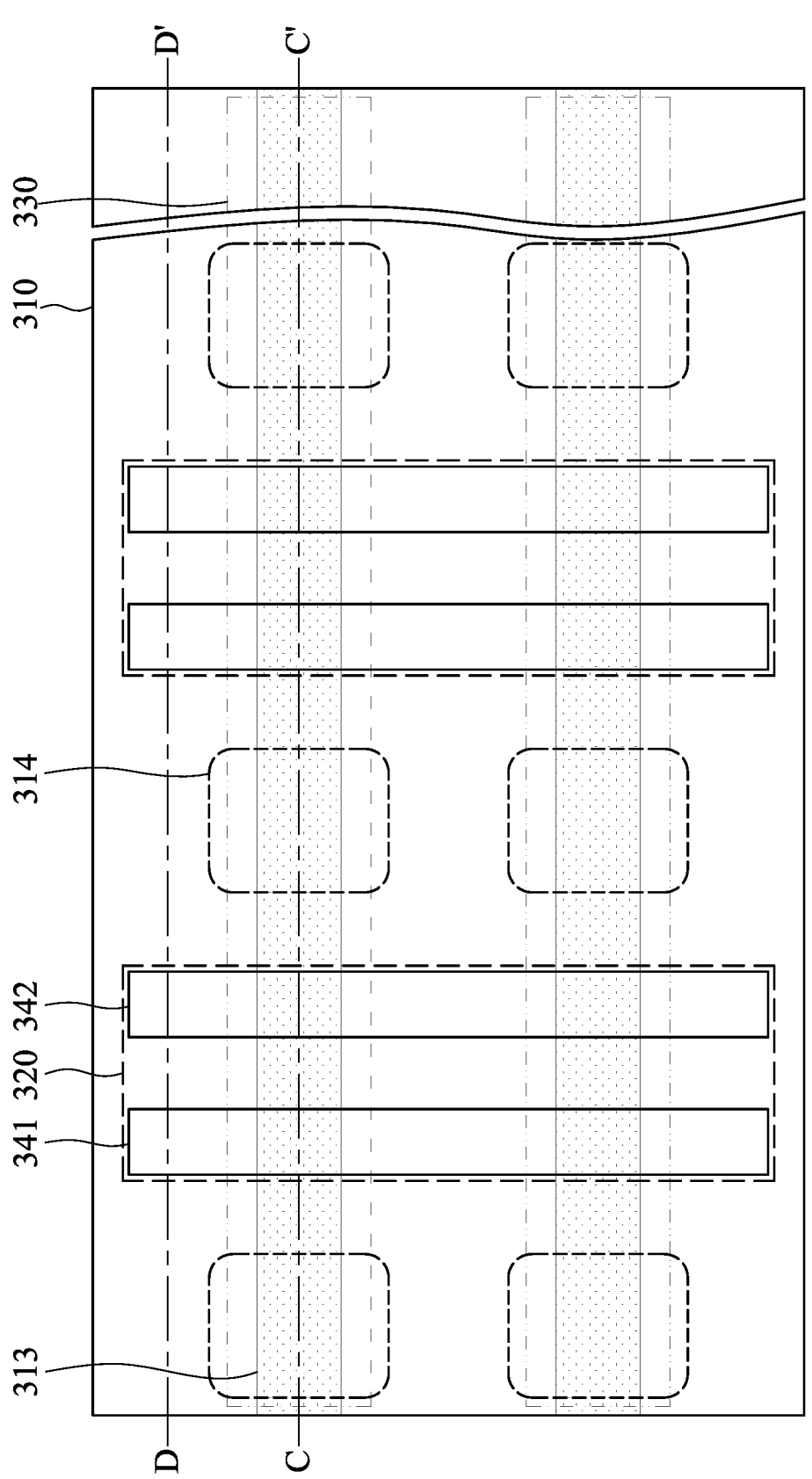
FIG. 37A, FIG. 37B, and FIG. 37C illustrate one or more stages of an exemplary method for manufacturing a semiconductor device according to some embodiments of the present disclosure in different perspectives.
Figure 37B:
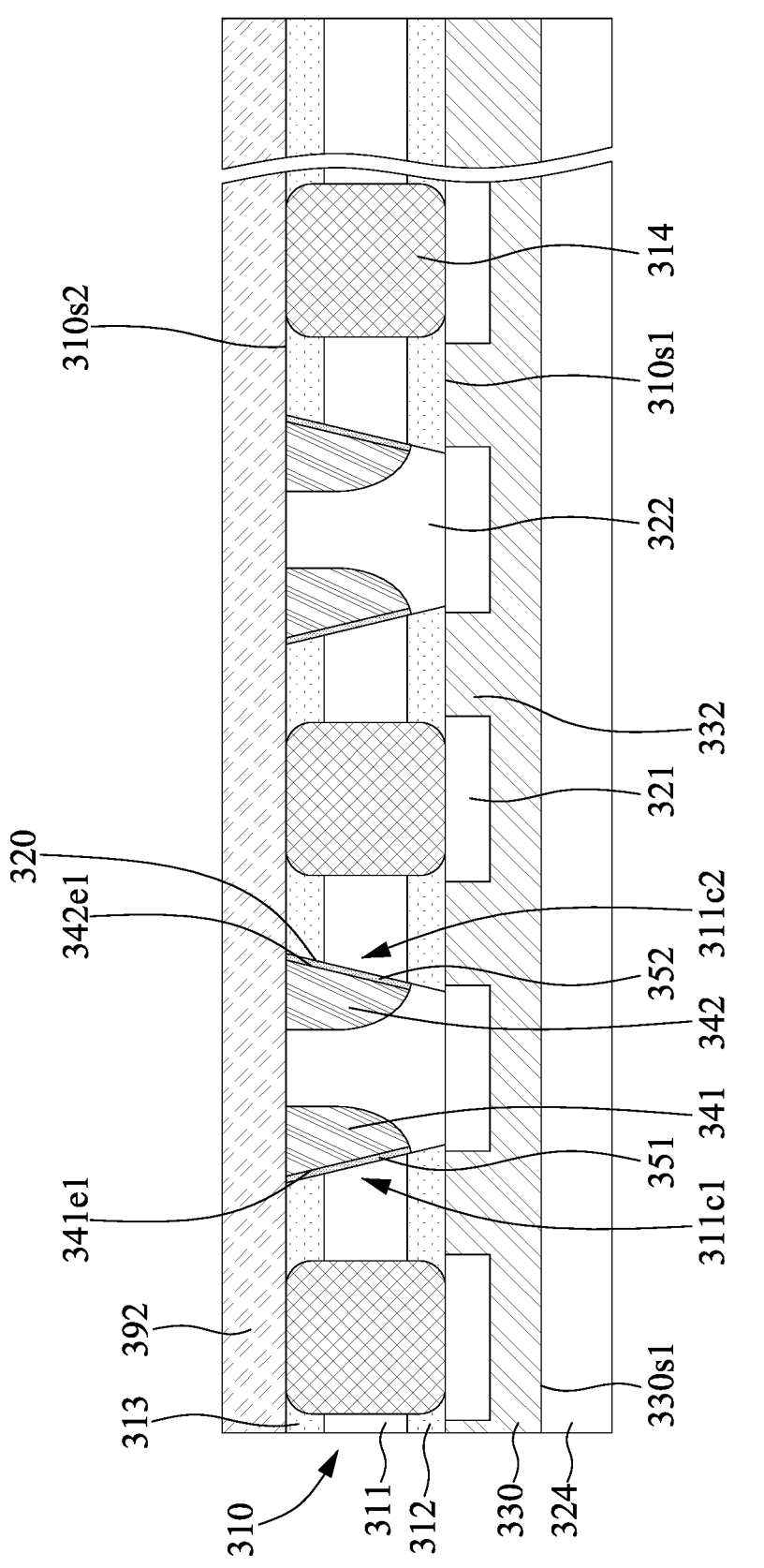
Figure 37C:
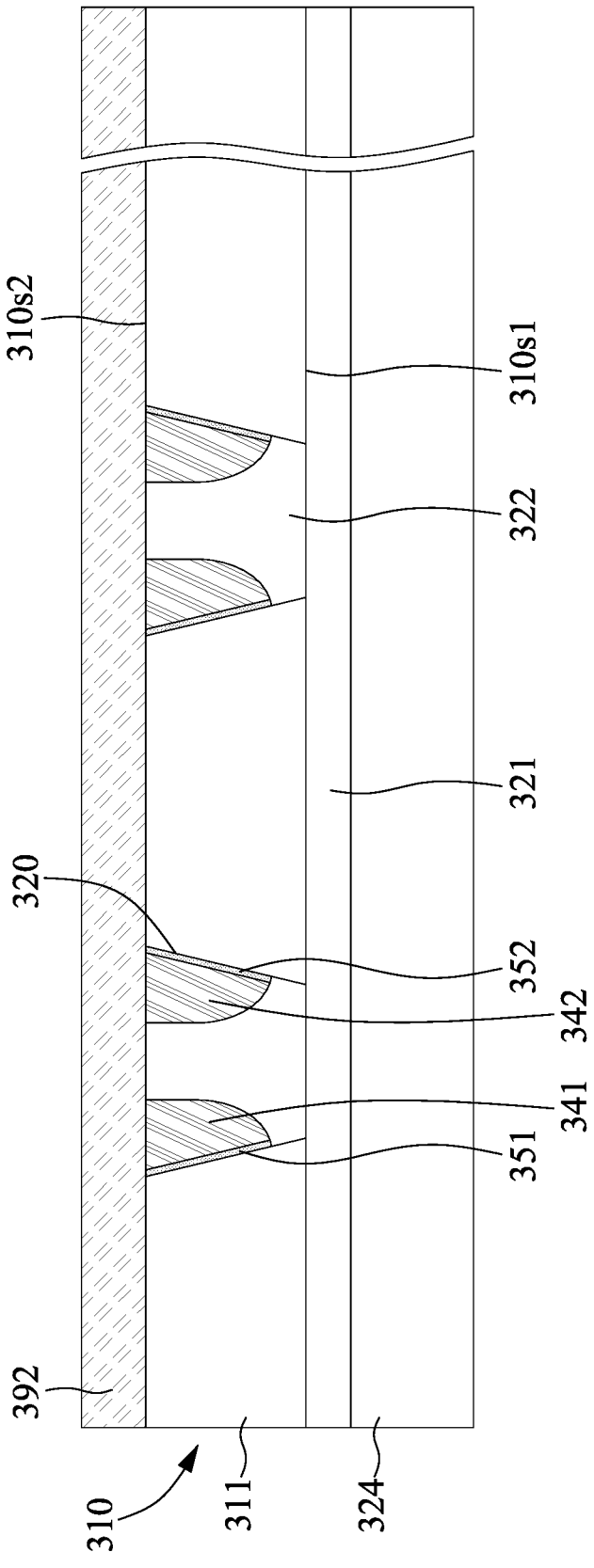

Referring to FIG. 37A, FIG. 37B, and FIG. 37C, a fill layer 324 may be formed. The fill layer 324 may cover the dielectric layer 321. The fill layer 324 may cover the bit line 330. The fill layer 324 may fill openings defined by the bit line 330. The fill layer 324 may be formed by CVD, ALD, LPCVD, PECVD, PVD, or other suitable processes.

Figure 38A:
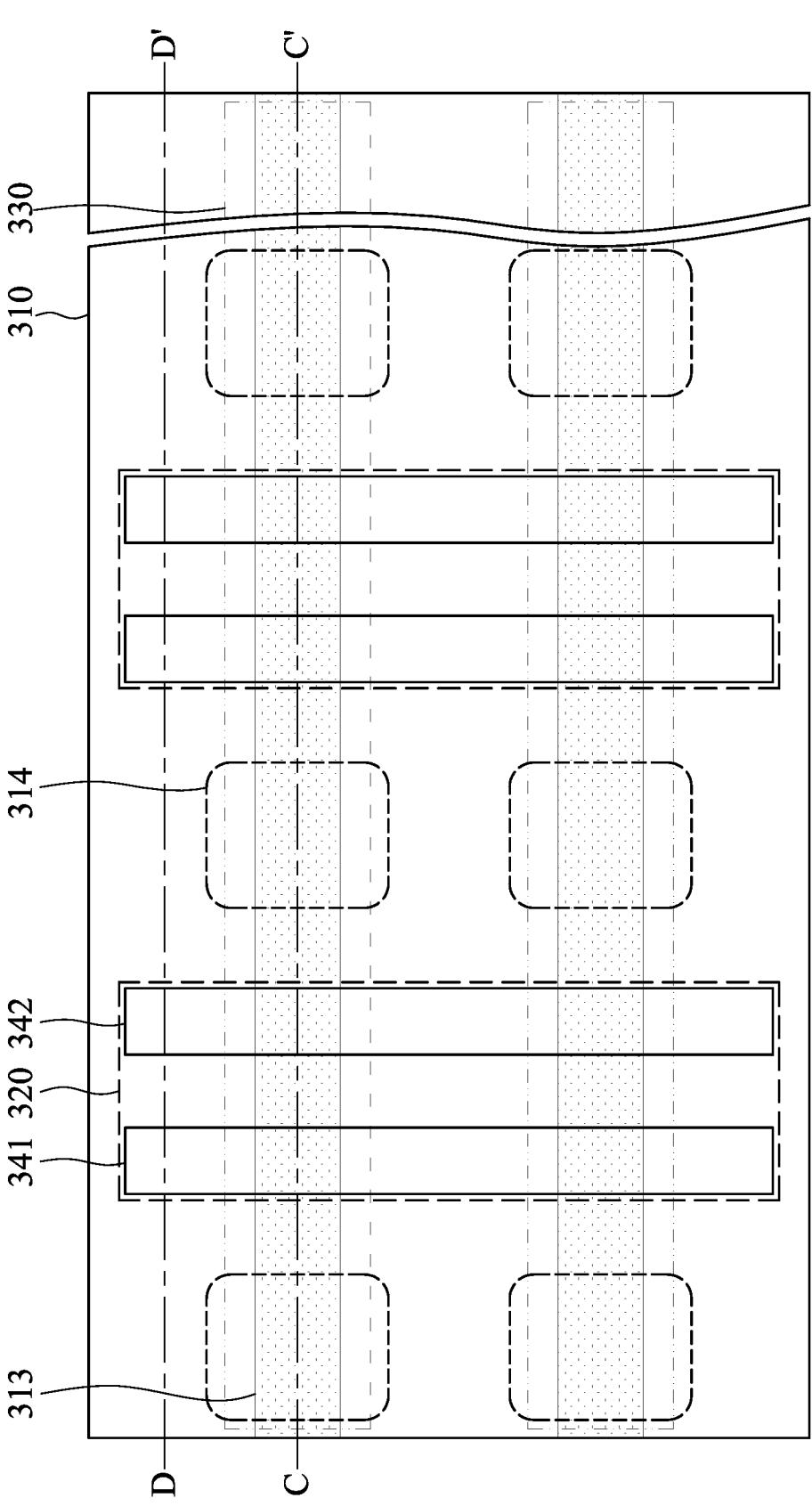
FIG. 38A, FIG. 38B, and FIG. 38C illustrate one or more stages of an exemplary method for manufacturing a semiconductor device according to some embodiments of the present disclosure in different perspectives.
Figure 38B:
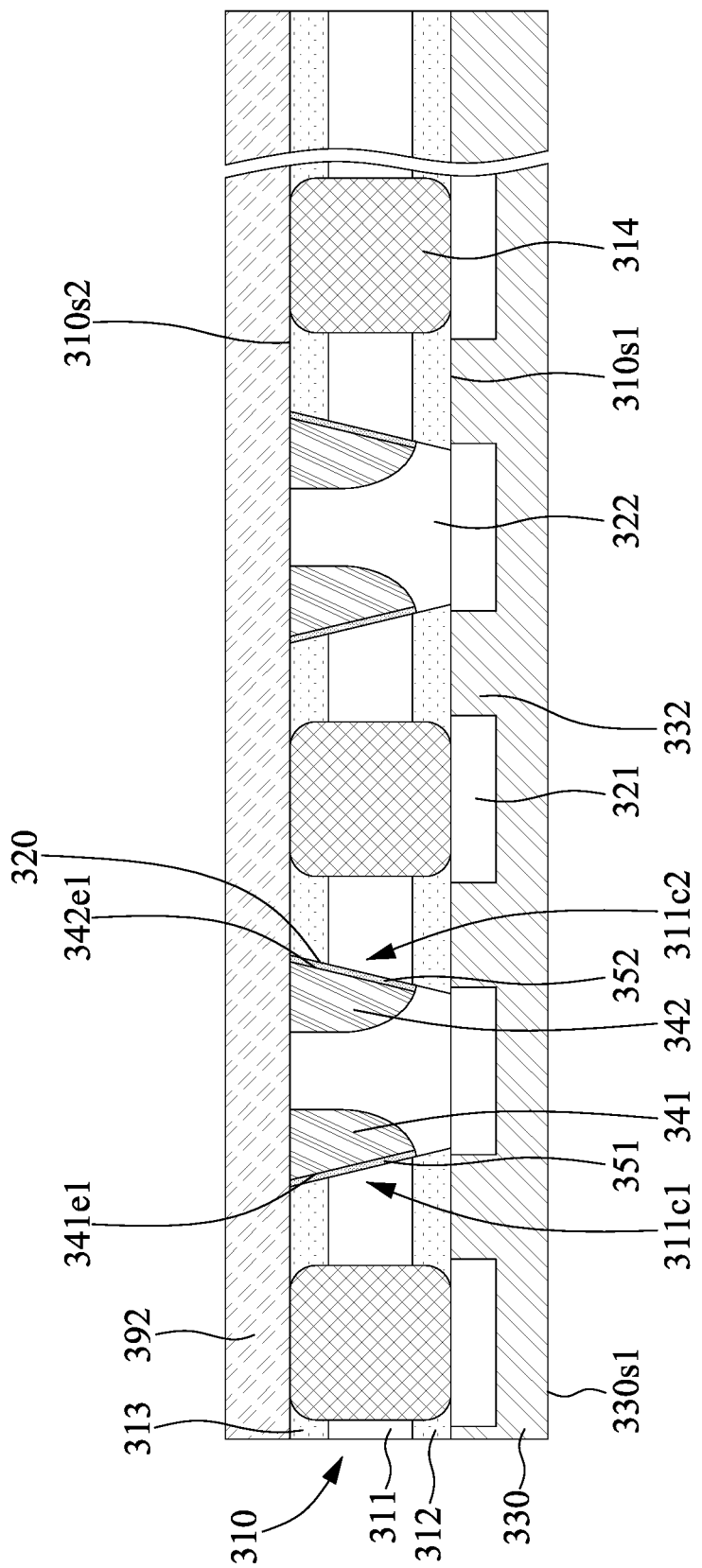
Figure 38C:
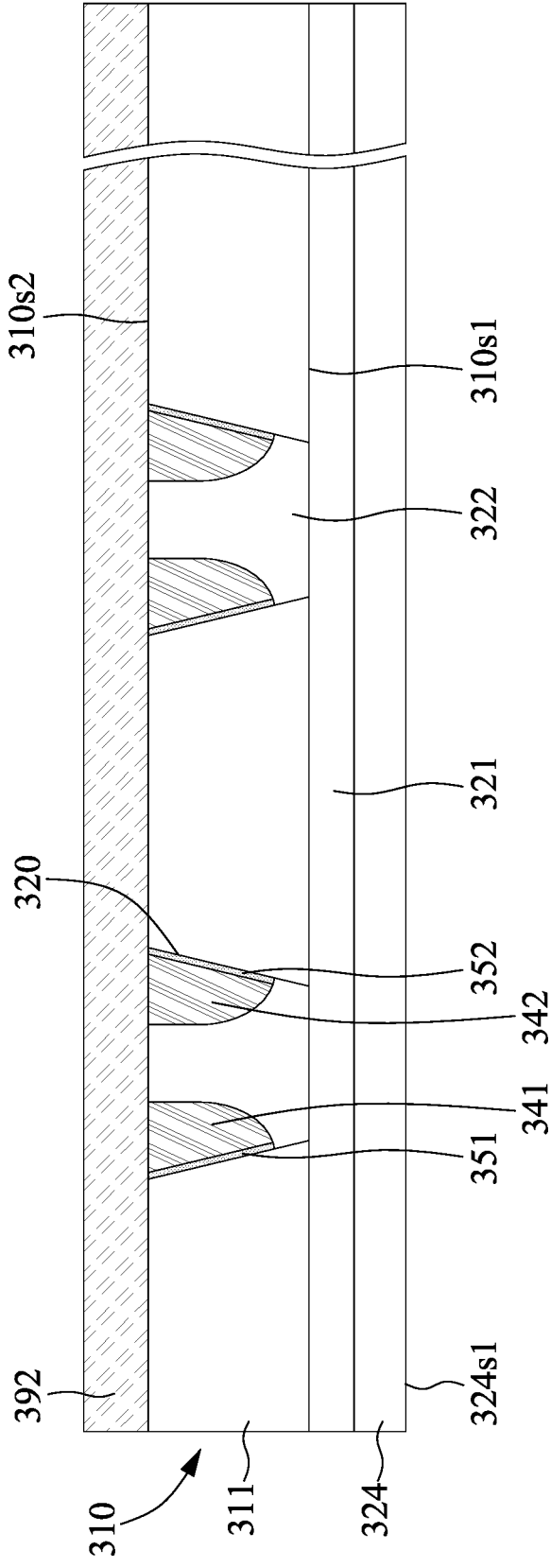

Referring to FIG. 38A, FIG. 38B, and FIG. 38C, a portion of the fill layer 324 may be removed. The surface 324s1 of the fill layer 324 may be coplanar with the surface 330s1 of the bit line 330. The fill layer 324 may be removed by, for example, CVD, grinding, or other suitable processes.

Figure 39A:
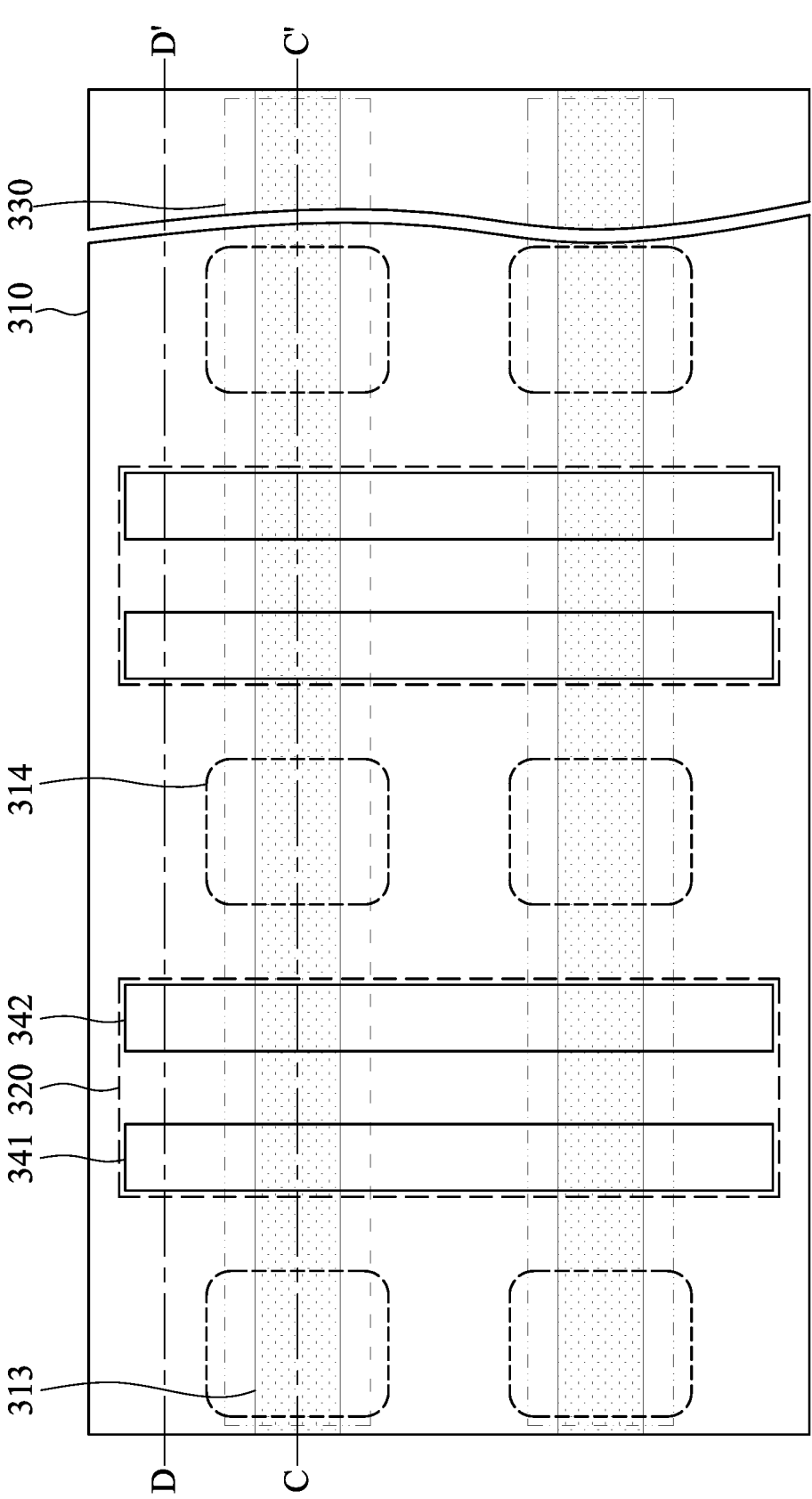
FIG. 39A, FIG. 39B, and FIG. 39C illustrate one or more stages of an exemplary method for manufacturing a semiconductor device according to some embodiments of the present disclosure in different perspectives.
Figure 39B:
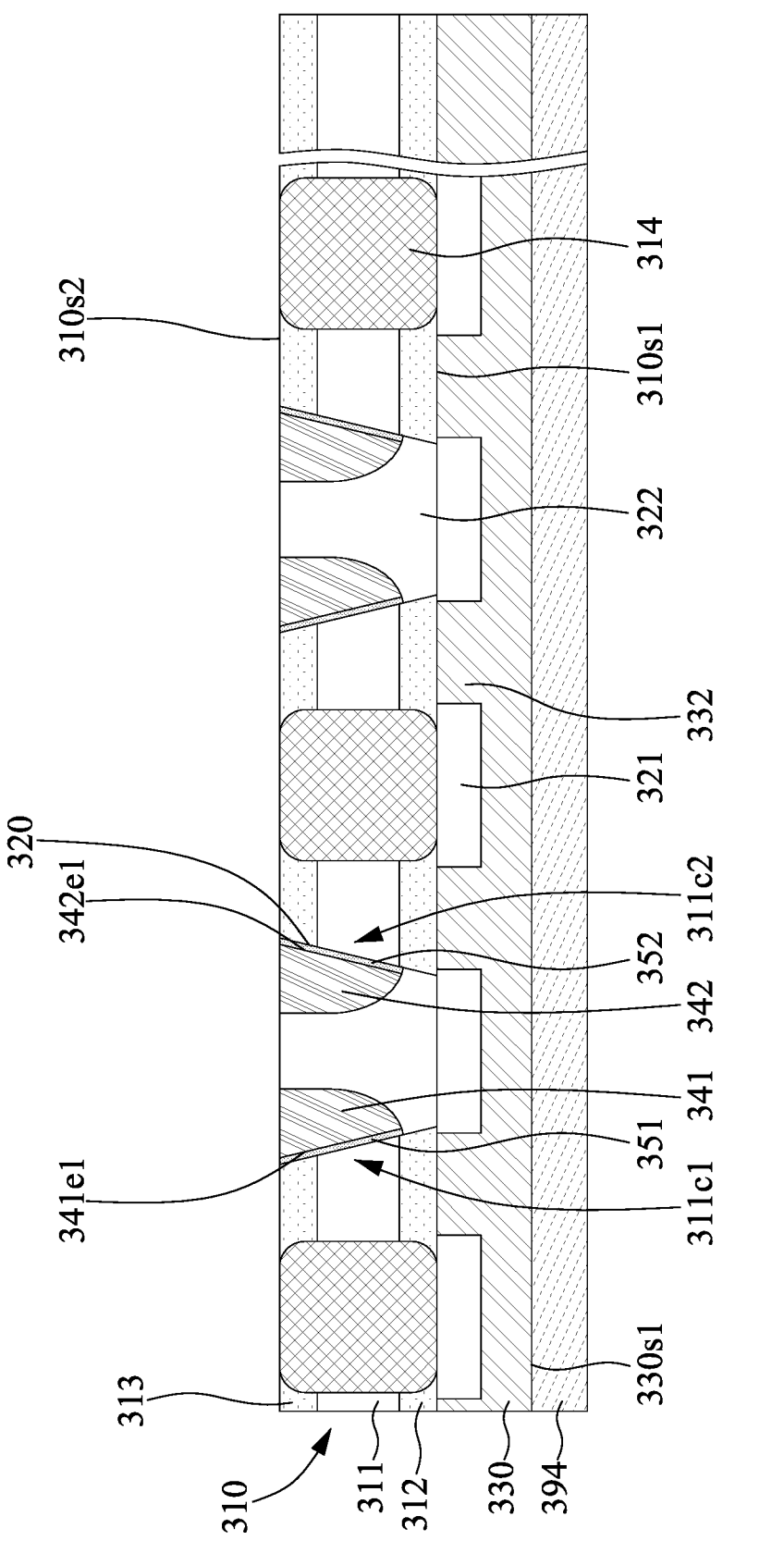
Figure 39C:
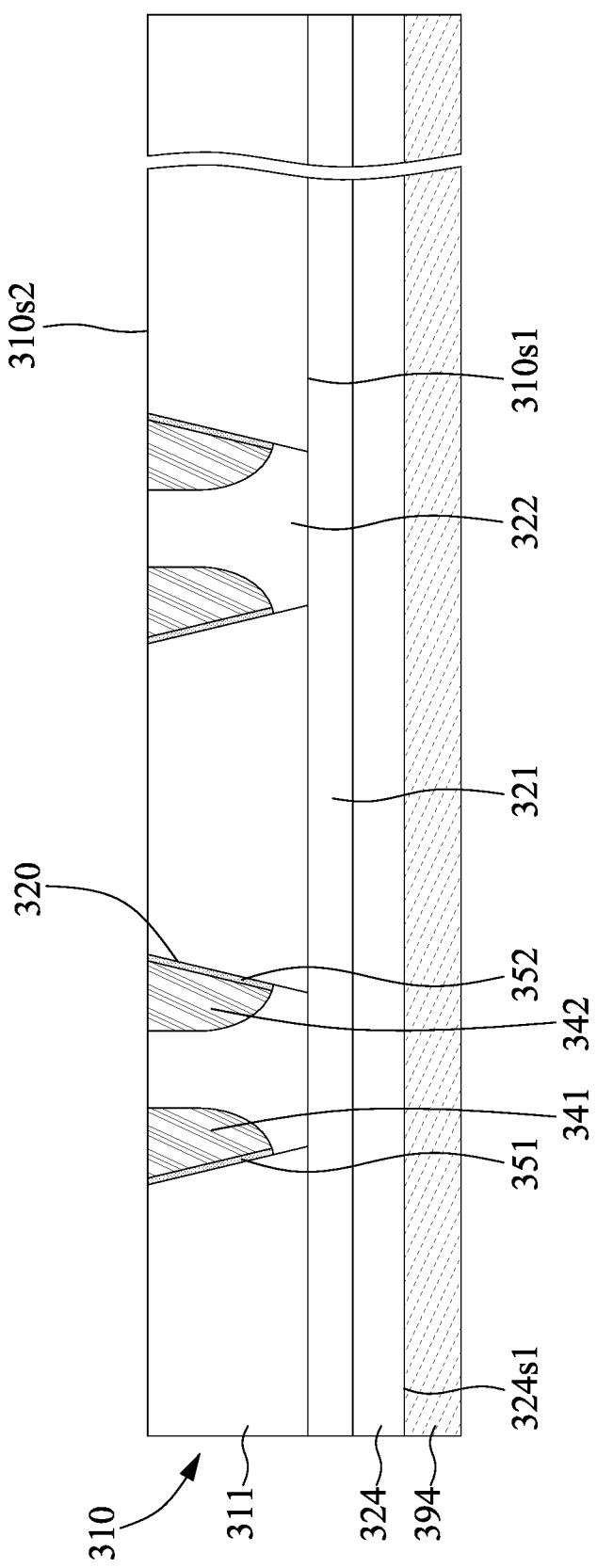

Referring to FIG. 39A, FIG. 39B, and FIG. 39C, the supporter 392 may be removed. The word lines 341 and 342 may be exposed. The bit line 330 and the fill layer 324 may be attached to a supporter 394. The supporter 394 may include a glass supporter, a ceramic supporter, or other suitable supporters.

Figure 40A:
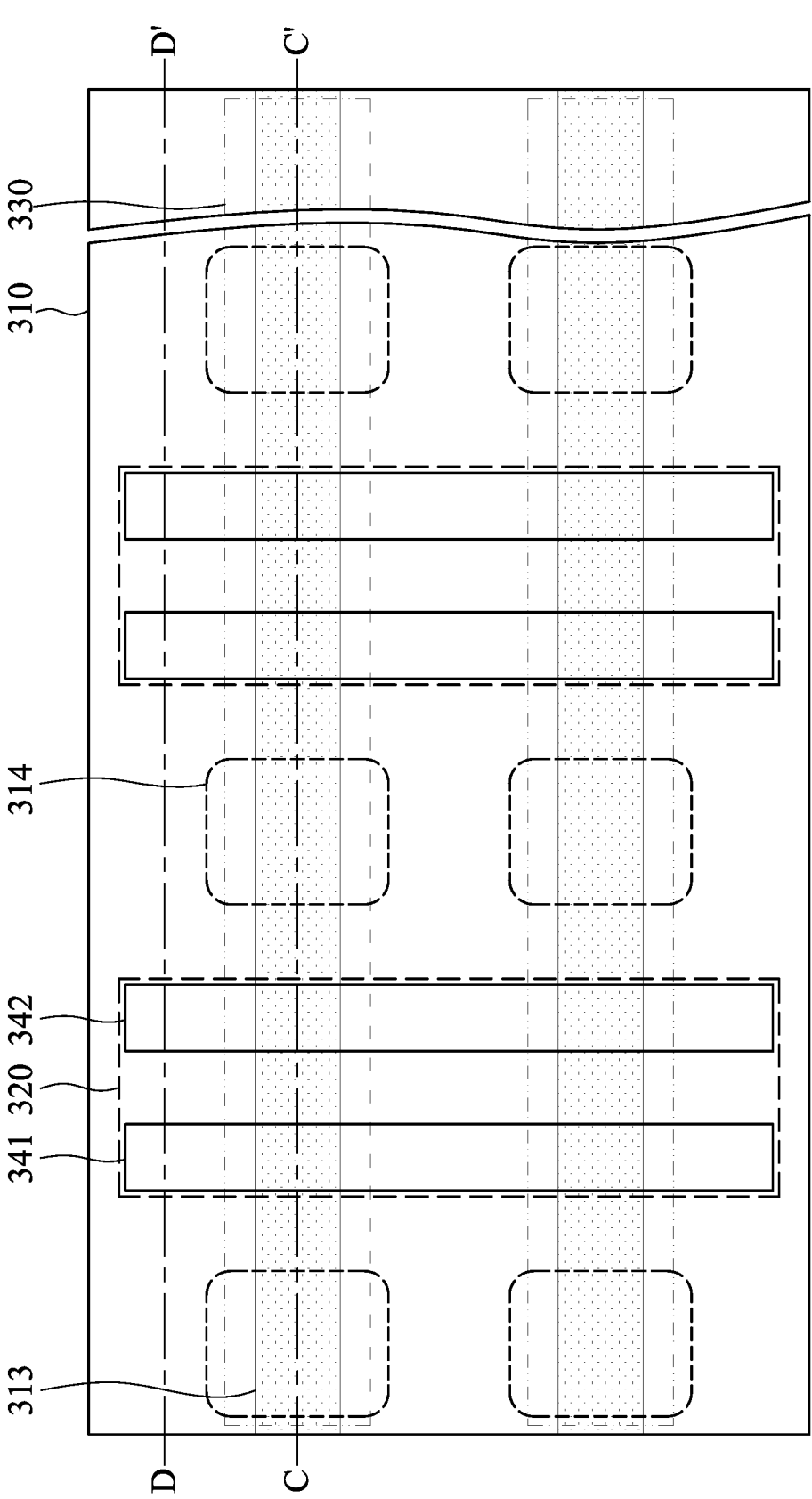
FIG. 40A, FIG. 40B, and FIG. 40C illustrate one or more stages of an exemplary method for manufacturing a semiconductor device according to some embodiments of the present disclosure in different perspectives.
Figure 40B:
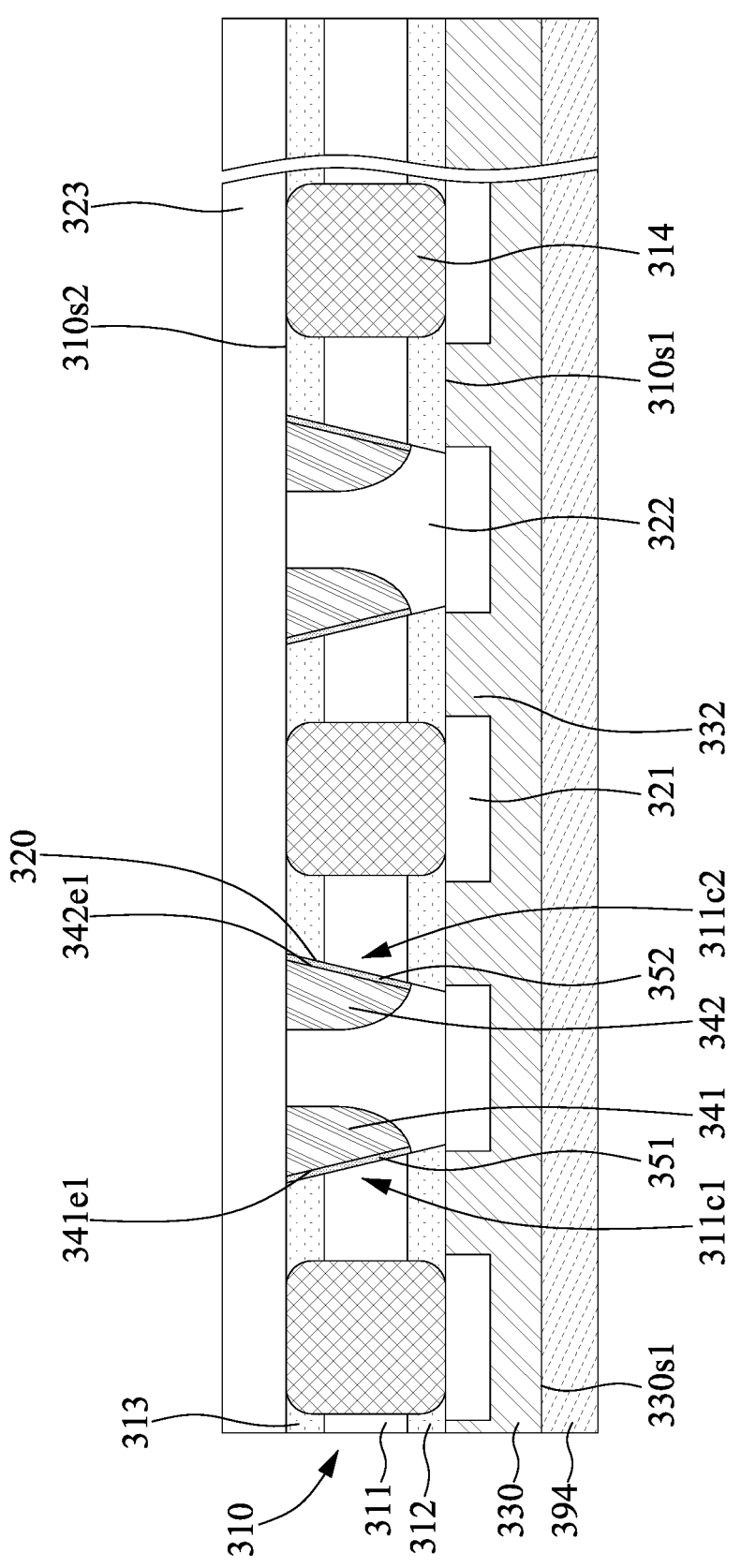
Figure 40C:
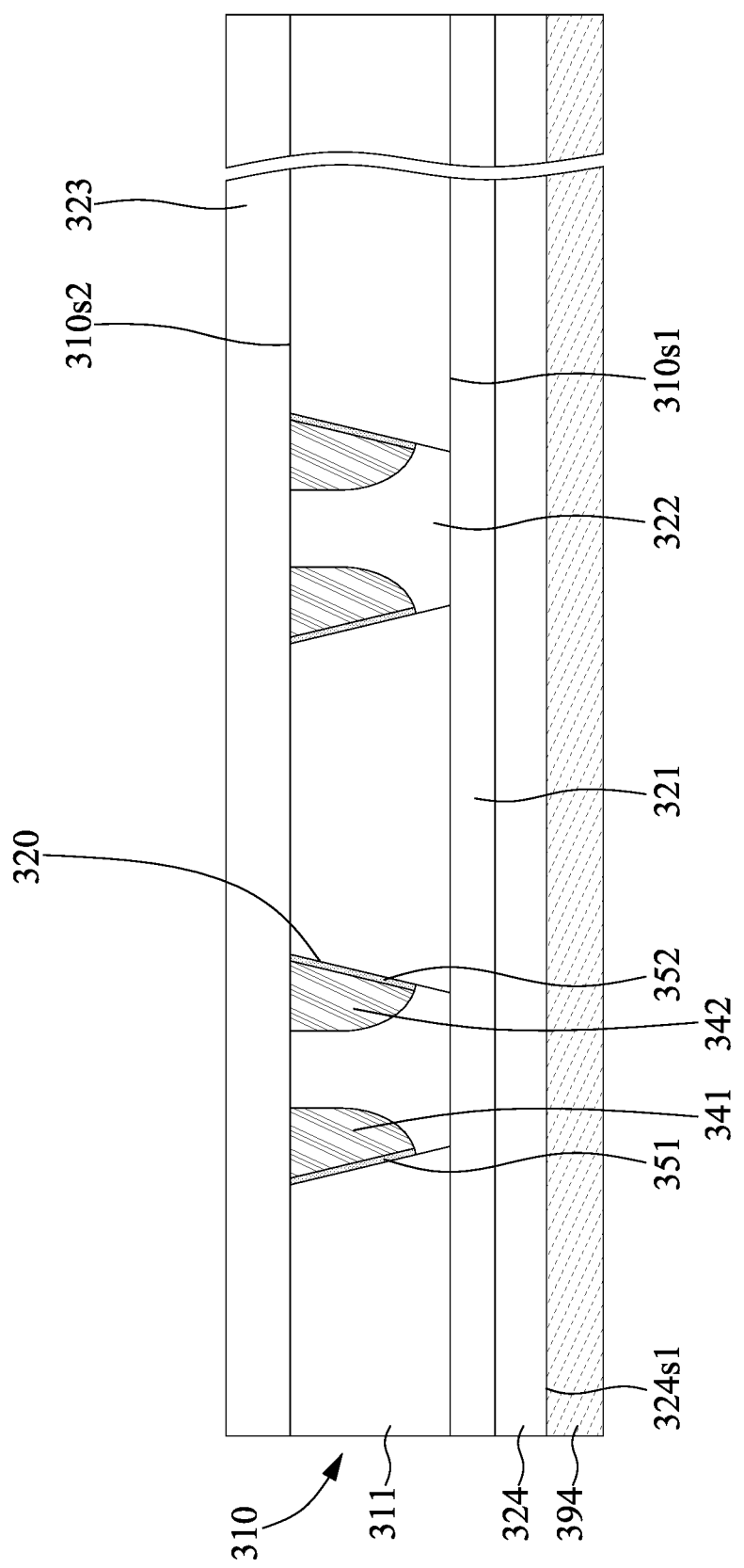

Referring to FIG. 40A, FIG. 40B, and FIG. 40C, a dielectric layer 323 may be formed on the word line 341. The dielectric layer 323 may be formed on the surface 310s2 of the substrate 310. The dielectric layer 323 may be formed by CVD, ALD, LPCVD, PECVD, PVD, or other suitable processes.

Figure 41A:
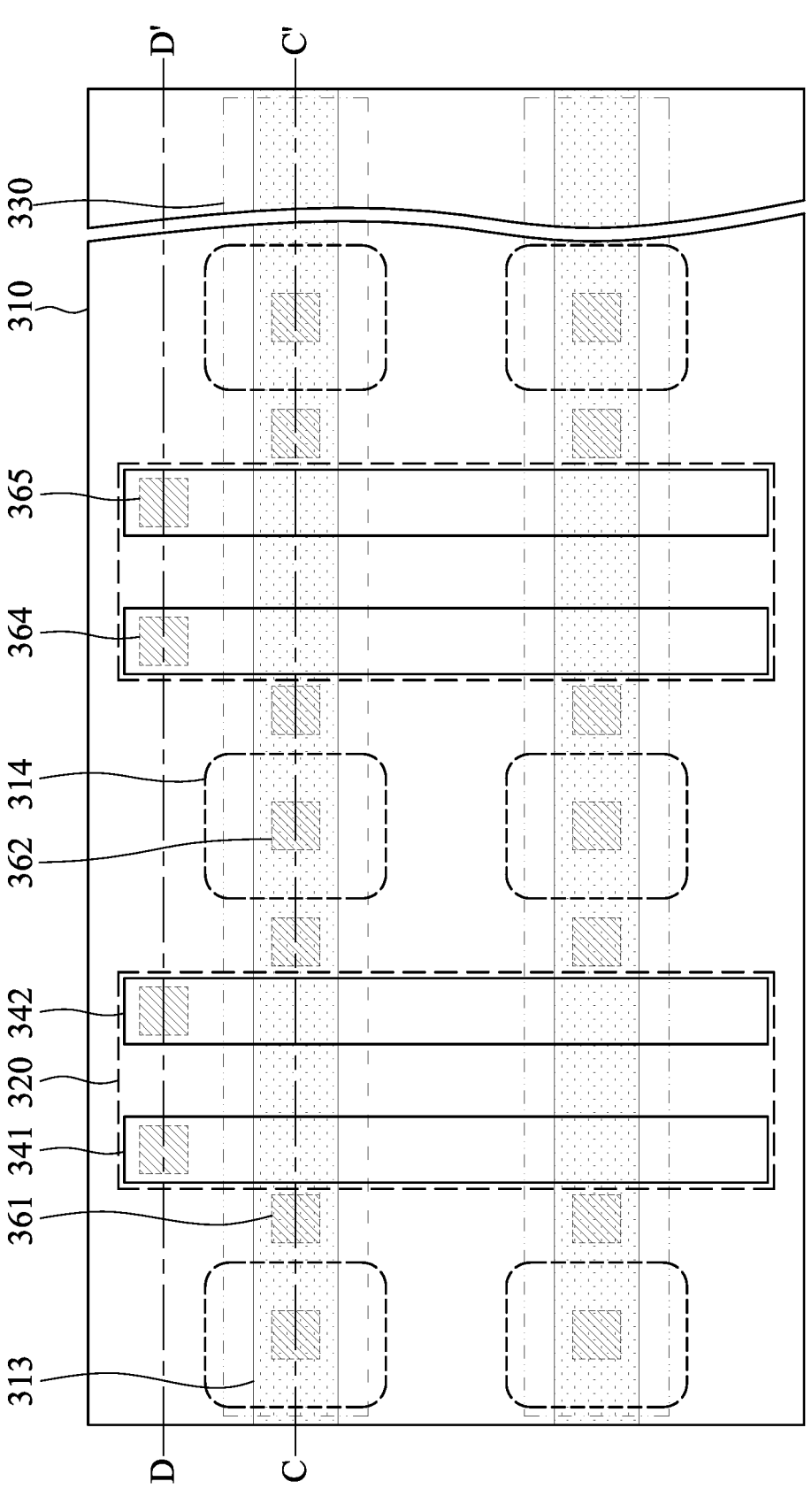
FIG. 41A, FIG. 41B, and FIG. 41C illustrate one or more stages of an exemplary method for manufacturing a semiconductor device according to some embodiments of the present disclosure in different perspectives.
Figure 41B:
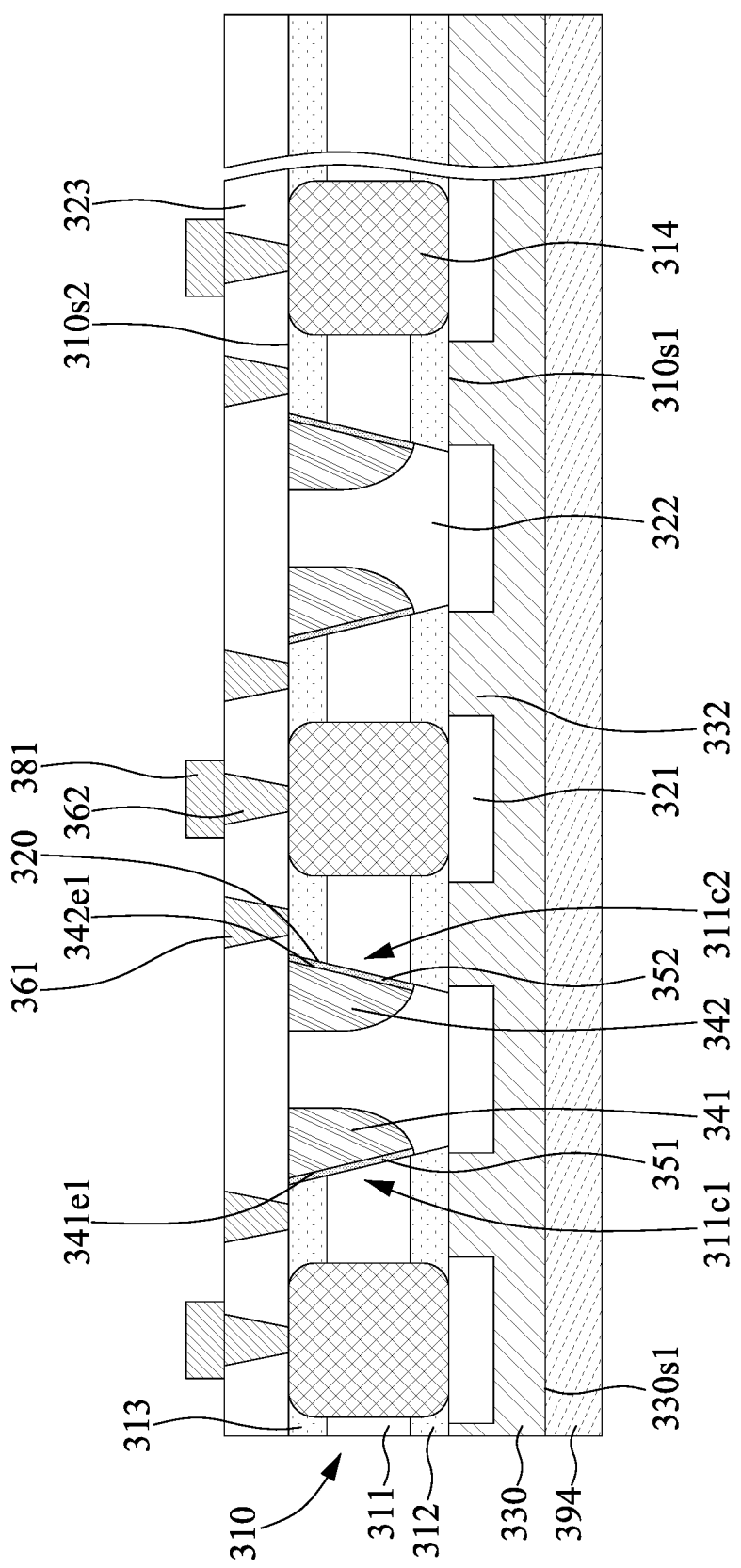
Figure 41C:
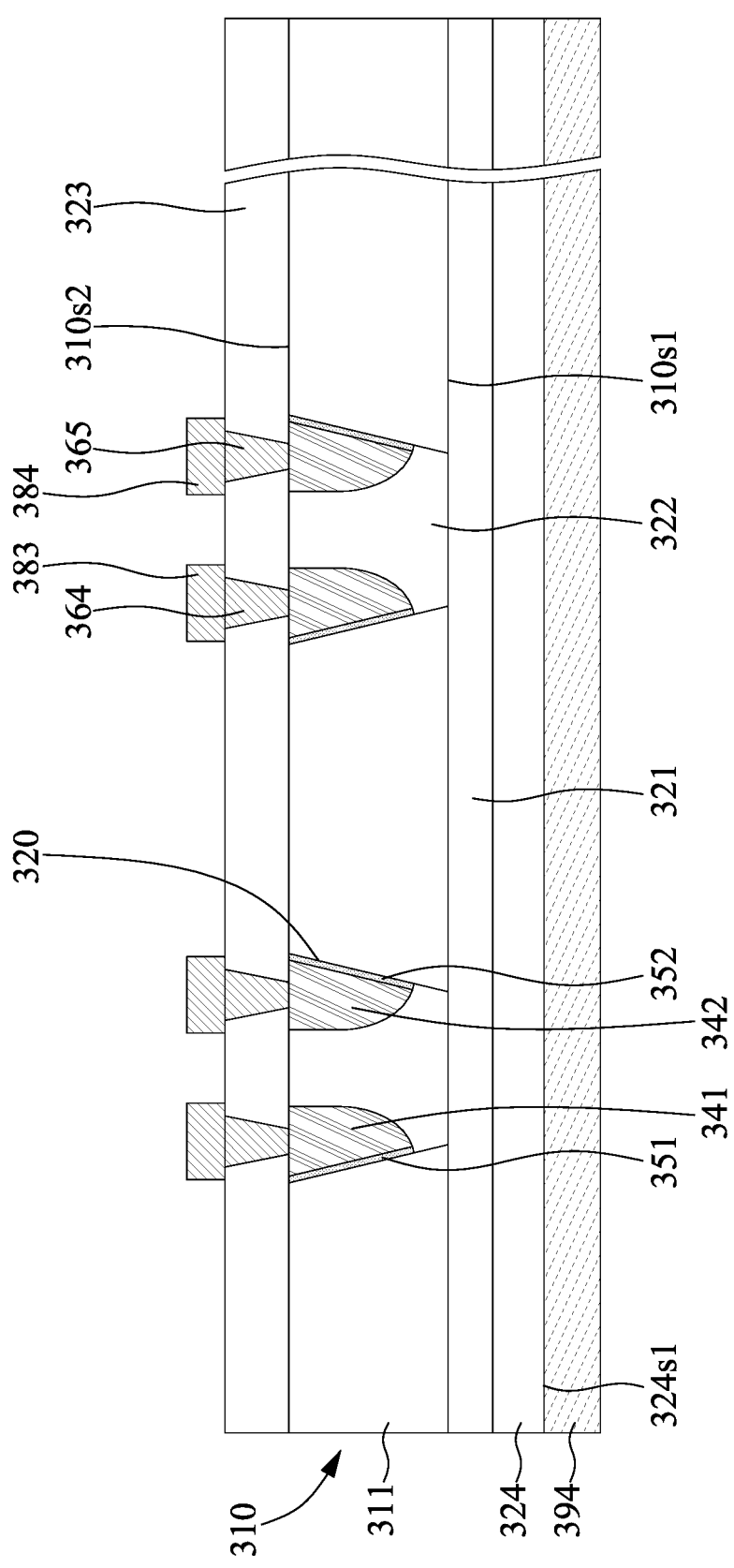

Referring to FIG. 41A, FIG. 41B, and FIG. 41C, conductive vias 361, 362, 364, and 365 may be formed. Conductive traces 381, 383 and 384 may be formed. The dielectric layer 323 may be patterned to define openings, a conductive layer may be formed on the dielectric layer 323 and fill the openings, and the conductive layer may be patterned to form the conductive vias 361, 362, 364, and 365 as well as the conductive traces 381, 383 and 384.

Figure 42A:
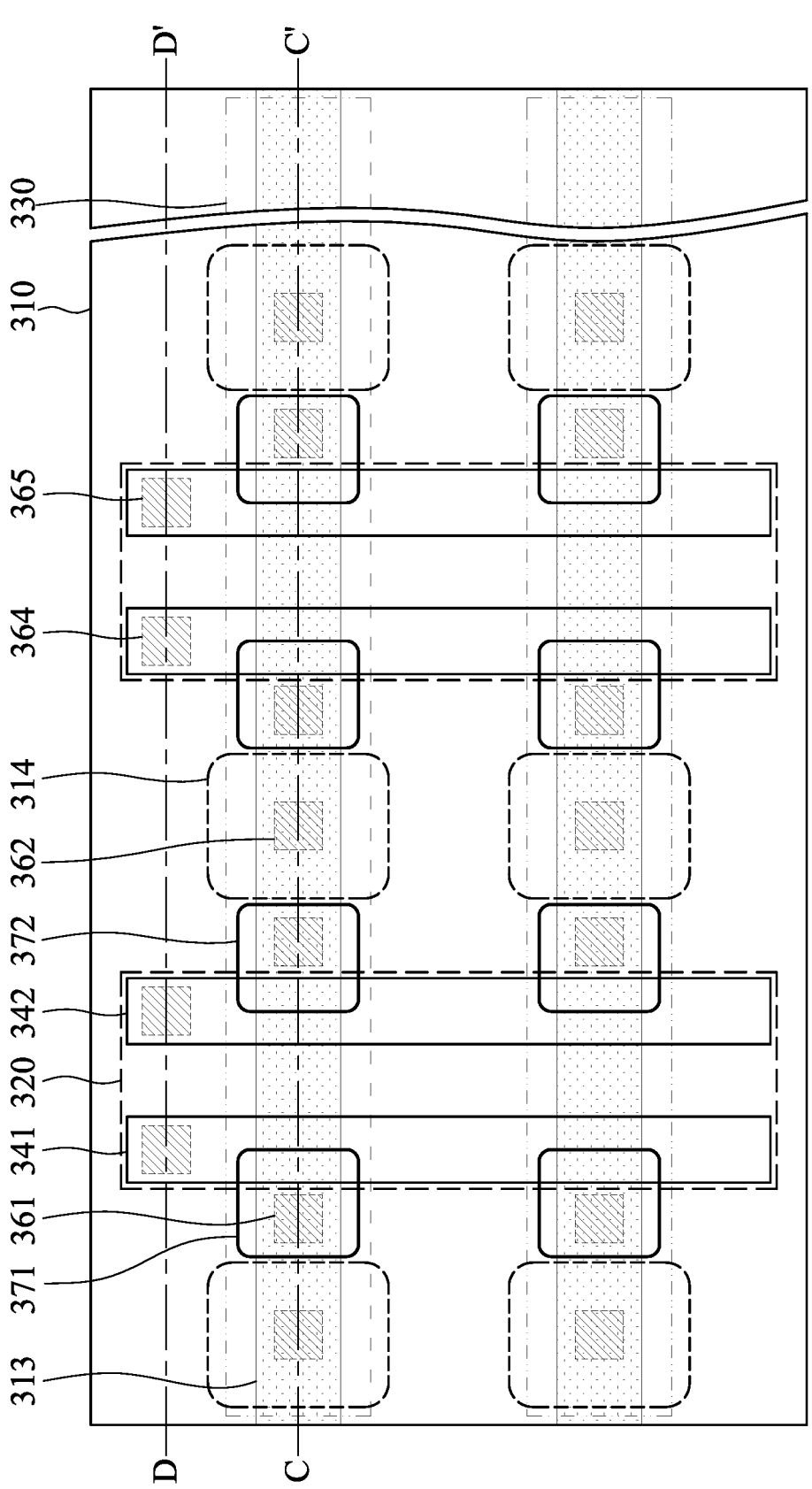
FIG. 42A, FIG. 42B, and FIG. 42C illustrate one or more stages of an exemplary method for manufacturing a semiconductor device according to some embodiments of the present disclosure in different perspectives.
Figure 42B:
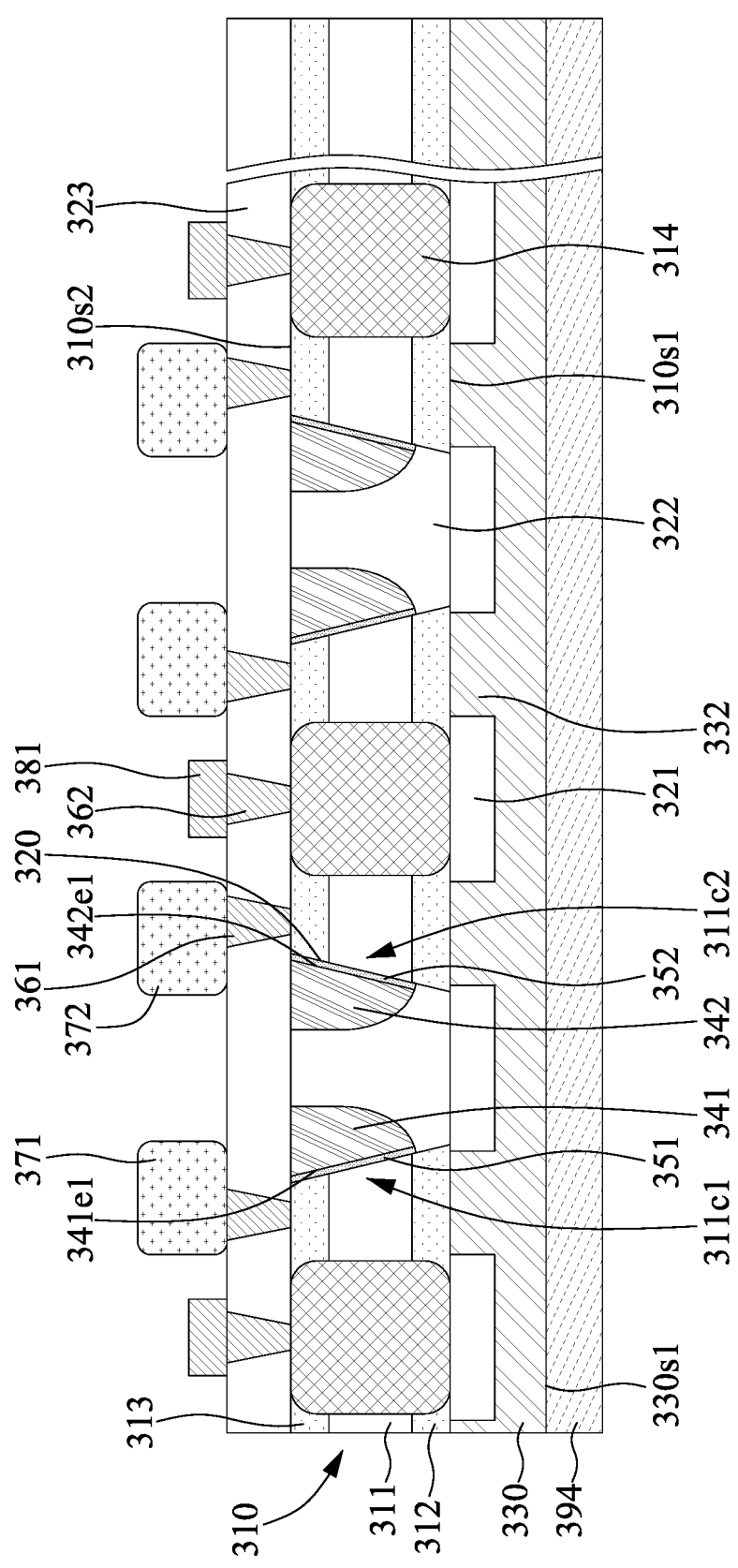
Figure 42C:
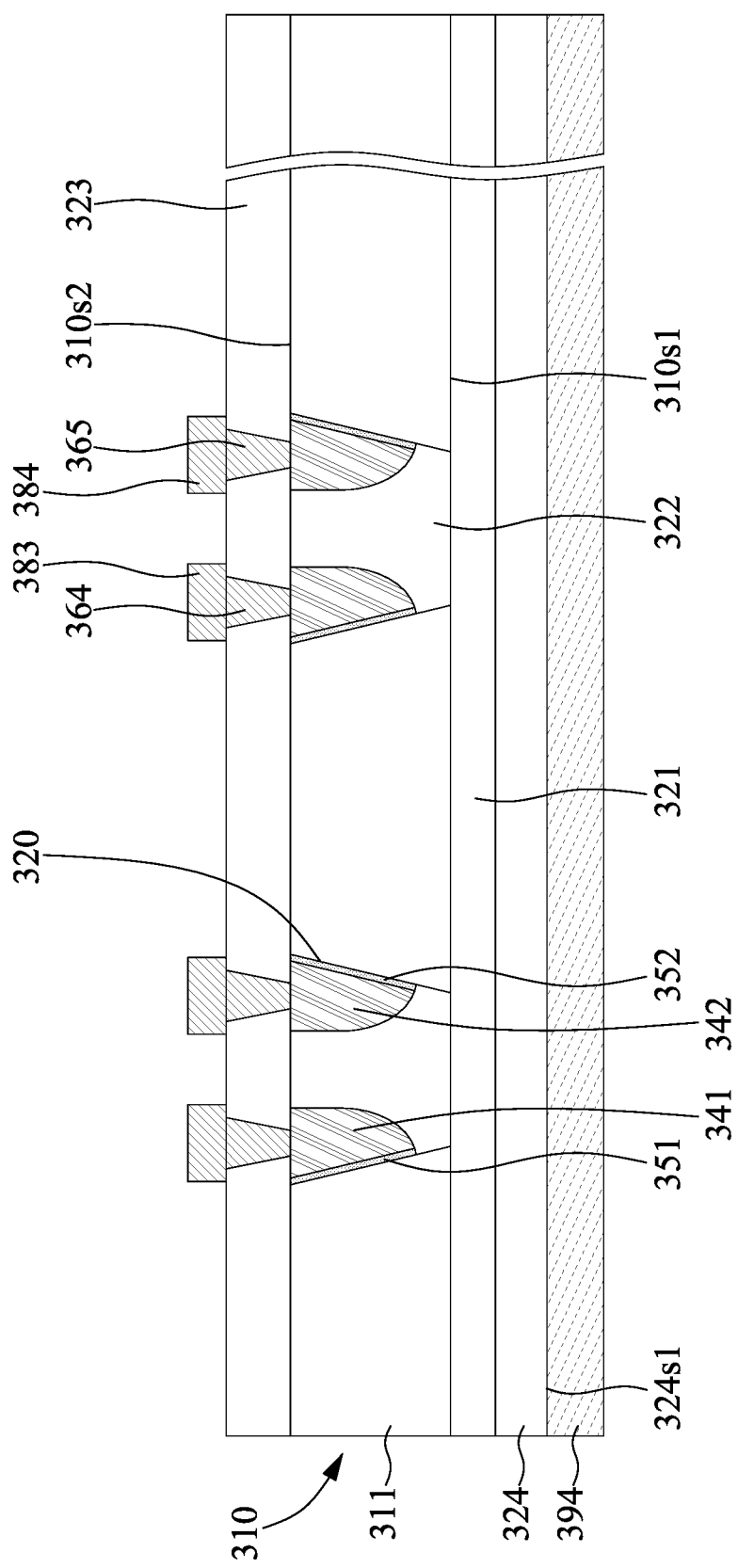

Referring to FIG. 42A, FIG. 42B, and FIG. 42C, capacitors 371 and 372 may be formed on the dielectric layer 323. The capacitor 371 may be electrically connected to or coupled the word line 341. The capacitor 372 may be electrically connected to or coupled to the word line 342.

Figure 43A:
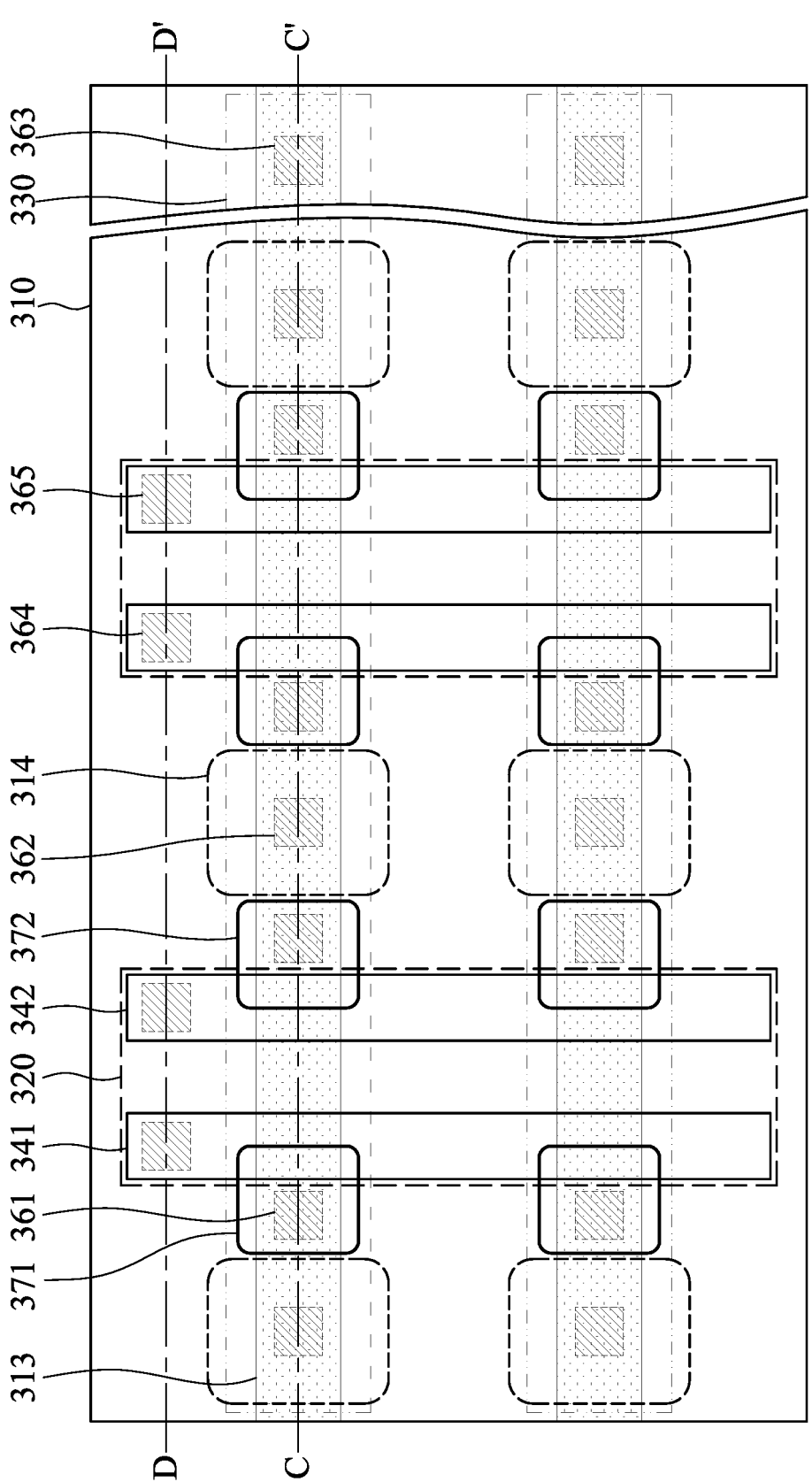
FIG. 43A, FIG. 43B, and FIG. 43C illustrate one or more stages of an exemplary method for manufacturing a semiconductor device according to some embodiments of the present disclosure in different perspectives.
Figure 43B:
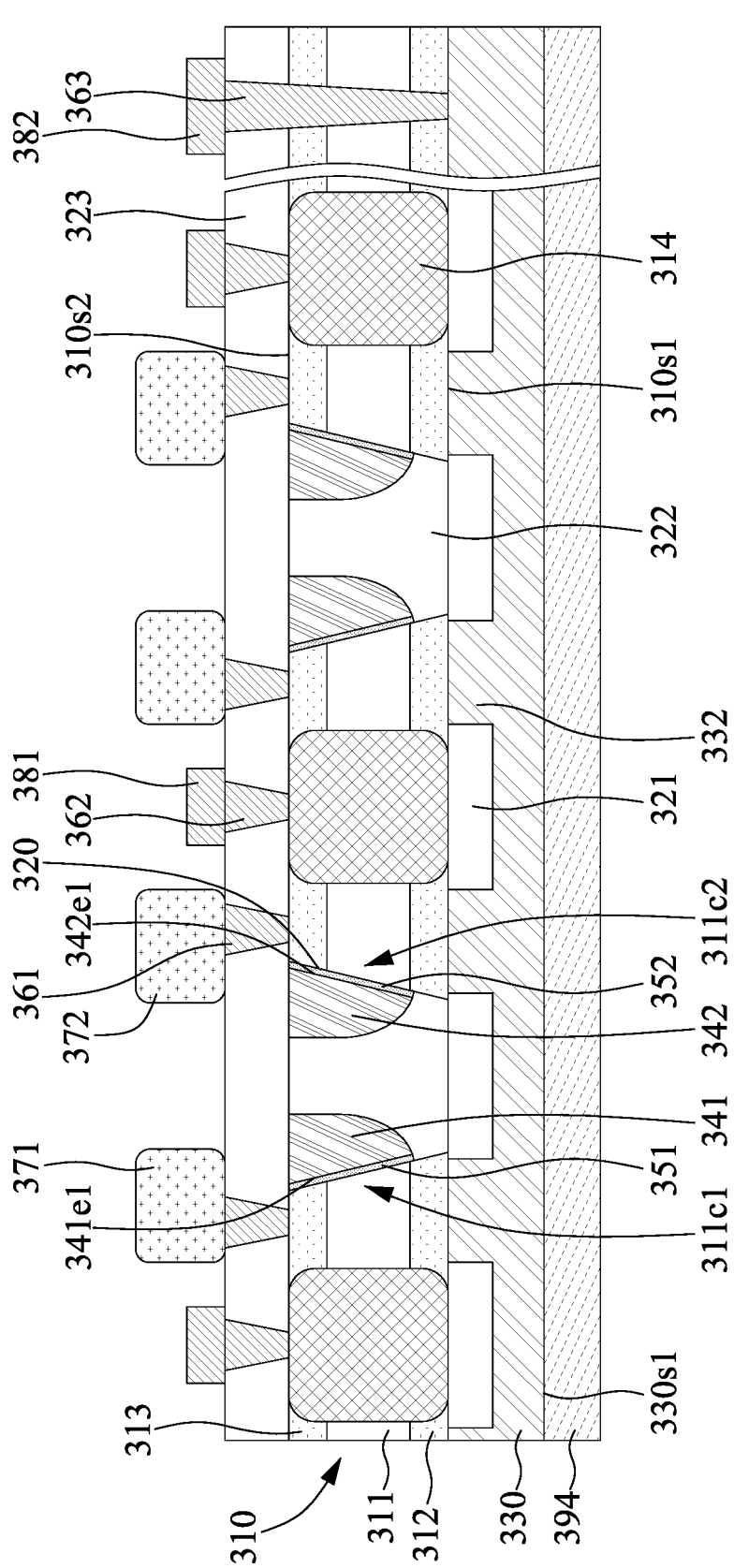
Figure 43C:
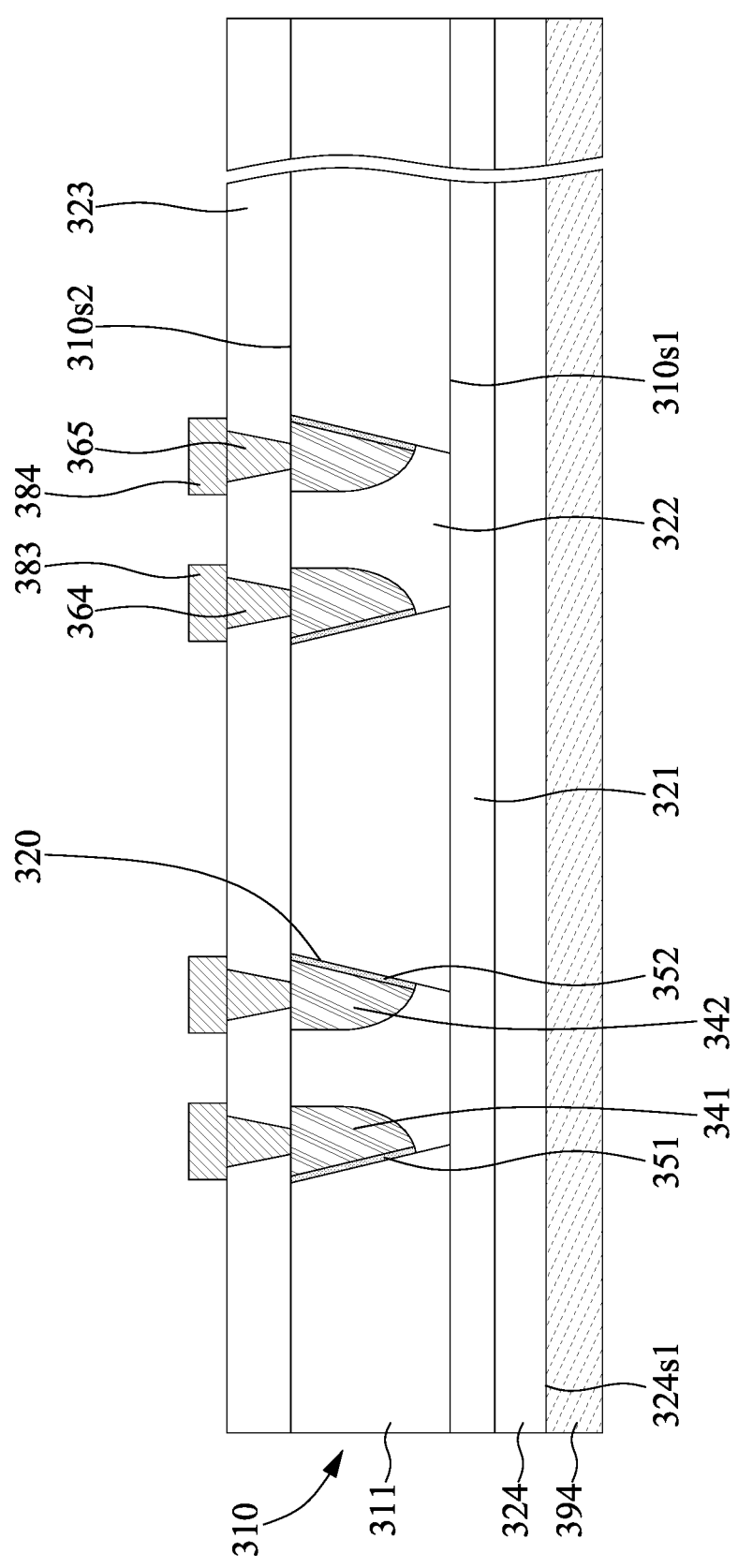

Referring to FIG. 43A, FIG. 43B, and FIG. 43C, a conductive via 363 and a conductive trace 382 may be formed. In some embodiments, an etching process, such as dry etching, may be performed to form an opening penetrating the dielectric layer 323 and the substrate 310 to expose the bit line 330, a conductive layer may be formed on the dielectric layer 323 and fill the openings, and the conductive layer may be patterned to form the conductive via 363 and the conductive trace 382.

Figure 44A:
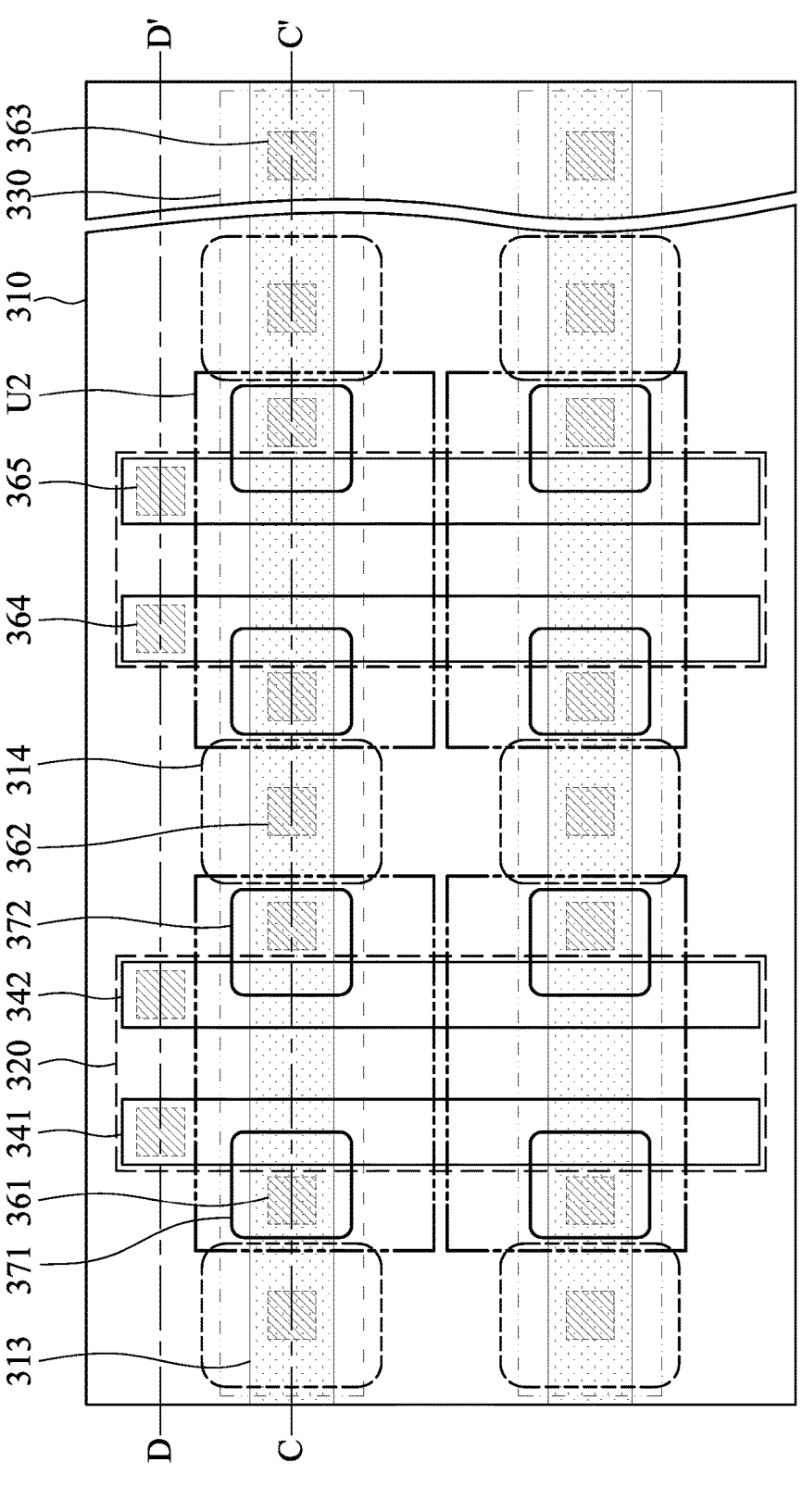
Figure 44C:
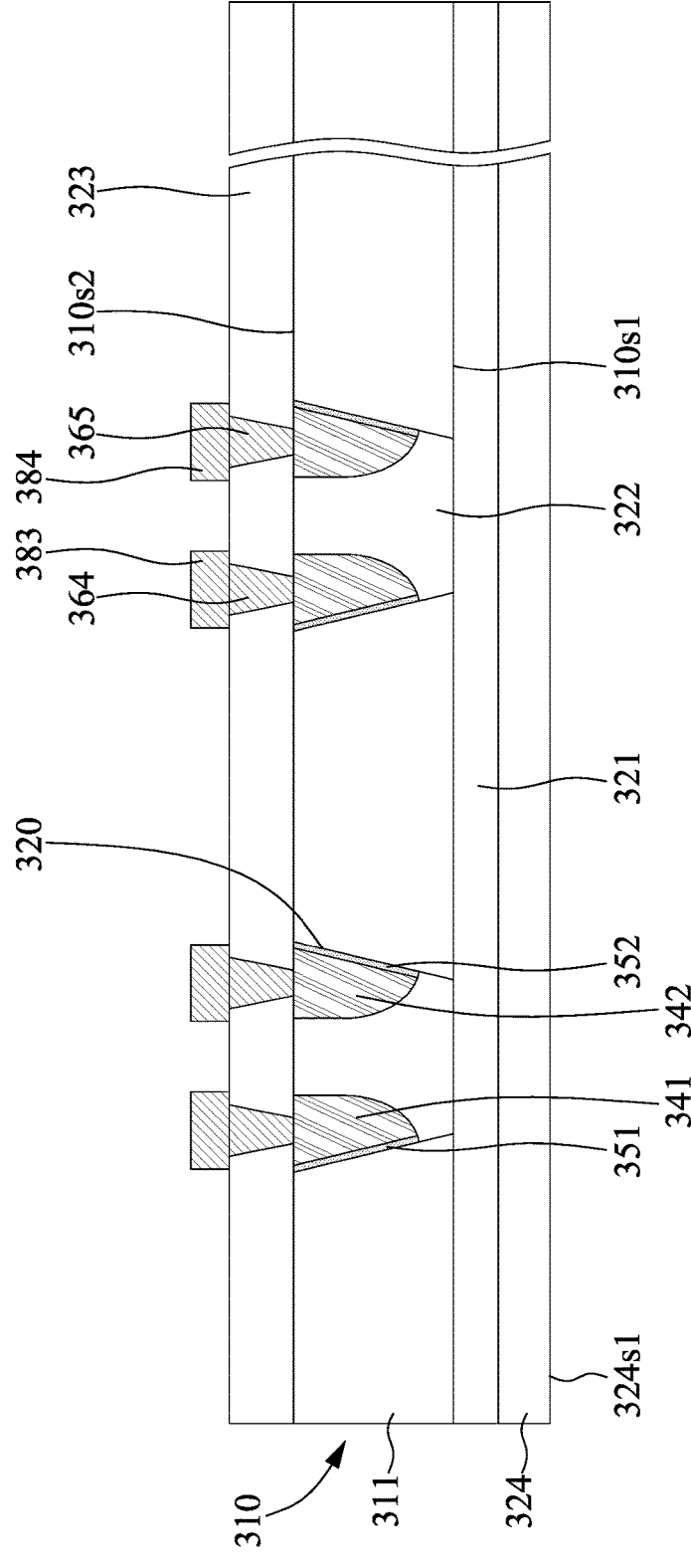

Referring to FIG. 44A, FIG. 44B, and FIG. 44C, the supporter 394 may be removed. As a result, a semiconductor device, such as the semiconductor device 300 as shown in FIG. 23A, FIG. 23B, and FIG. 23C, may be produced. The fill layer 324 and bit line 330 may collectively define a hybrid bonding structure so that the semiconductor device 300 may be bonded to another device.

One aspect of the present disclosure provides a semiconductor device. The semiconductor device includes a substrate, a first word line, a bit line, and a first capacitor. The substrate has a first surface and a second surface opposite to the first surface. The first word line is disposed within the substrate. The bit line is disposed on the first surface of the substrate. The first capacitor is disposed on the second surface of the substrate.

Another aspect of the present disclosure provides a semiconductor device. The semiconductor device includes a substrate, a first word line, a bit line and an isolation layer. The substrate has a first surface and a second surface opposite to the first surface. The first word line is embedded within the substrate and exposed from the second surface of the substrate. The first word line is exposed from the second surface of the substrate. The bit line is disposed on the first surface of the substrate. The isolation layer is covered by the first word line. The first word line is spaced apart from the bit line by the isolation layer.

Another aspect of the present disclosure provides a method for manufacturing a semiconductor device. The method includes: providing a substrate having a first surface and a second surface opposite to the first surface; forming a word line within the substrate; forming a bit line on the first surface of the substrate; and forming a first capacitor on the second surface of the substrate.

The embodiments of the present disclosure provide a semiconductor device. The semiconductor device includes a substrate, a word line, a bit line, and a capacitor. The word line is buried within the trench of the substrate. The bit line and the capacitor are disposed on two opposite sides of the substrate. Each units of the semiconductor device can define two transistors and a capacitor, which enhances the driving current. Further, the word line can function as a common switch to turn and/or turn off two transistors, which reduces the size of the semiconductor device. In comparison with conventional semiconductor devices, the semiconductor device of the present disclosure has a better performance.

Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having a first surface and a second surface opposite to the first surface, wherein the first surface and the second surface of the substrate are a bottom surface and a top surface of the substrate respectively;
   a first word line embedded within the substrate and exposed from the second surface of the substrate, wherein a top surface of the first word line is coplanar with the second surface of the substrate;
   a bit line abutting the first surface of the substrate; and
   an isolation layer covered by the first word line, wherein the isolation layer is formed between two sidewalls of the first word line;
   wherein the first word line is spaced apart from the bit line by the isolation layer.

2. The semiconductor device of claim 1, wherein the first word line has a width which is tapered along an axis perpendicular to the first surface of the substrate, wherein the width of the first word is defined between the two sidewalls thereof.

3. The semiconductor device of claim 2, further comprising a first gate dielectric layer between the substrate and the first word line, wherein a top surface of the first gate dielectric layer is coplanar with the second surface of the substrate.

4. The semiconductor device of claim 3, further comprising a second word line disposed embedded in the substrate, and the first word line is spaced apart from the second word line by the isolation layer, wherein a top surface of the second word line is coplanar with the second surface of the substrate.

5. The semiconductor device of claim 4, wherein the first gate dielectric layer is in contact with the isolation layer.

6. The semiconductor device of claim 4, wherein the isolation layer is exposed from the first surface of the substrate, wherein a bottom surface of the isolation layer is coplanar with the first surface of the substrate.

7. The semiconductor device of claim 1, wherein the substrate comprises a well region with a first conductive type and a doped region with a second conductive type different from the first conductive type, and the doped region continuously extends between the first surface and the second surface of the substrate.

8. The semiconductor device of claim 1, wherein the first word line, the substrate, and the bit line collectively define a first transistor and a second transistor.

9. The semiconductor device of claim 8, wherein the first word line of the first transistor has a curved surface abutting the isolation layer and the first word line of the second transistor has a curved surface abutting the isolation layer, wherein a top surface of the isolation layer is positioned below the second surface of the substrate.

10. The semiconductor device of claim 9, wherein the substrate defines a first channel on a first side of the first word line and a second channel on a second side of the first word line.

11. The semiconductor device of claim 1, further comprising a first capacitor disposed on the second surface of the substrate.

12. The semiconductor device of claim 1, wherein each of the sidewalls of the first word line has an inclined surface abutting the substrate and a curved surface abutting the isolation layer.

13. The semiconductor device of claim 1, wherein the first word line has an edge portion with a first thickness, and a center portion with a second thickness, wherein the first thickness is greater than the second thickness.

* * * * *